US007112493B2

(12) United States Patent
Bertin et al.

(10) Patent No.: US 7,112,493 B2
(45) Date of Patent: Sep. 26, 2006

(54) METHOD OF MAKING NON-VOLATILE FIELD EFFECT DEVICES AND ARRAYS OF SAME

(75) Inventors: Claude L. Bertin, South Burlington, VT (US); Thomas Rueckes, Boston, MA (US); Brent M. Segal, Woburn, MA (US)

(73) Assignee: Nantero, Inc., Woburn, MA (US)

( * ) Notice: Subject to any disclaimer, the term of this patent is extended or adjusted under 35 U.S.C. 154(b) by 0 days.

(21) Appl. No.: 10/864,751

(22) Filed: Jun. 9, 2004

(65) Prior Publication Data

US 2005/0074926 A1 Apr. 7, 2005

Related U.S. Application Data

(60) Provisional application No. 60/476,976, filed on Jun. 9, 2003.

(51) Int. Cl.
*H01L 21/8234* (2006.01)

(52) U.S. Cl. ........................ 438/275; 438/287; 438/52

(58) Field of Classification Search ............ 438/47–54, 438/275–279, 287–301
See application file for complete search history.

(56) References Cited

U.S. PATENT DOCUMENTS

| | | | | |
|---|---|---|---|---|
| 3,448,302 | A | 6/1969 | Shanefield | 307/318 |
| 4,044,343 | A | 8/1977 | Uchida et al. | |
| 4,845,533 | A | 7/1989 | Pryor et al. | 357/2 |
| 4,853,893 | A | 8/1989 | Eaton, Jr. et al. | 365/145 |
| 4,876,667 | A | 10/1989 | Ross et al. | 365/113 |
| 4,888,630 | A | 12/1989 | Paterson | 357/23.5 |
| 4,979,149 | A | 12/1990 | Popovic et al. | 365/244 |
| 5,198,994 | A | 3/1993 | Natori | 365/145 |
| 5,834,818 | A | 11/1998 | Beilstein, Jr. et al. | 257/390 |
| 5,920,101 | A | 7/1999 | Beilstein, Jr. et al. | 257/390 |
| 6,044,008 | A | 3/2000 | Choi | 365/145 |
| 6,048,740 | A | 4/2000 | Hsu et al. | 438/3 |
| 6,128,214 | A | 10/2000 | Kuekes et al. | 365/151 |
| 6,159,620 | A | 12/2000 | Heath et al. | 428/615 |
| 6,198,655 | B1 | 3/2001 | Heath et al. | 365/151 |
| 6,256,767 | B1 | 7/2001 | Kuekes et al. | 716/9 |
| 6,314,019 | B1 | 11/2001 | Kuekes et al. | 365/151 |

(Continued)

FOREIGN PATENT DOCUMENTS

WO WO 03/091486 11/2003

(Continued)

OTHER PUBLICATIONS

Choi, W.B. et al., "Carbon-Nanotube-Based Nonvolatile Memory with Oxide-Nitride-Oxide Film and Nanoscale Channel". *Applied Physics Letters*, 2003. 82 (2) 275-277.

(Continued)

*Primary Examiner*—H. Jey Tsai
(74) *Attorney, Agent, or Firm*—Wilmer Cutler Pickering Hale and Dorr LLP

(57) ABSTRACT

Methods of making non-volatile field effect devices and arrays of same. Under one embodiment, a method of making a non-volatile field effect device includes providing a substrate with a field effect device formed therein. The field effect device includes a source, drain and gate with a field-modulatable channel between the source and drain. An electromechanically-deflectable, nanotube switching element is formed over the field effect device. Terminals and corresponding interconnect are provided to correspond to each of the source, drain and gate such that the nanotube switching element is electrically positioned between one of the source, drain and gate and its corresponding terminal, and such that the others of said source, drain and gate are directly connected to their corresponding terminals.

23 Claims, 138 Drawing Sheets

U.S. PATENT DOCUMENTS

| | | | | |
|---|---|---|---|---|
| 6,430,511 | B1 | 8/2002 | Tour et al. | 702/19 |
| 6,459,095 | B1 | 10/2002 | Heath et al. | 257/14 |
| 6,462,977 | B1 | 10/2002 | Butz | 365/63 |
| 6,518,156 | B1 | 2/2003 | Chen et al. | 438/597 |
| 6,548,841 | B1 | 4/2003 | Frazier et al. | |
| 6,559,468 | B1 | 5/2003 | Kuekes et al. | 257/14 |
| 6,574,130 | B1 | 6/2003 | Segal et al. | 365/129 |
| 6,587,408 | B1 | 7/2003 | Jacobson et al. | 369/44.16 |
| 6,643,165 | B1 | 11/2003 | Segal et al. | 365/151 |
| 6,706,402 | B1 | 3/2004 | Rueckes et al. | 428/408 |
| 6,707,098 | B1 | 3/2004 | Hofmann et al. | 257/324 |
| 6,803,840 | B1 | 10/2004 | Hunt et al. | |
| 6,809,462 | B1 * | 10/2004 | Pelrine et al. | 310/319 |
| 6,809,465 | B1 | 10/2004 | Jin | |
| 2002/0130353 | A1 | 9/2002 | Lieber et al. | |
| 2003/0021141 | A1 | 1/2003 | Segal et al. | 365/129 |
| 2003/0021966 | A1 | 1/2003 | Segal et al. | 428/209 |
| 2003/0124325 | A1 | 7/2003 | Ruekes et al. | 428/209 |
| 2003/0165074 | A1 | 9/2003 | Segal et al. | 365/153 |
| 2003/0170930 | A1 | 9/2003 | Choi et al. | 438/99 |
| 2003/0199172 | A1 | 10/2003 | Rueckes et al. | 438/754 |
| 2004/0027889 | A1 | 2/2004 | Occhipinti et al. | 365/202 |
| 2004/0043148 | A1 | 3/2004 | Wei et al. | 427/249.1 |
| 2004/0085805 | A1 | 5/2004 | Segal et al. | 365/145 |
| 2004/0095837 | A1 | 5/2004 | Choi | 365/232 |
| 2004/0175856 | A1 | 9/2004 | Jaiprakash et al. | |
| 2004/0181630 | A1 | 9/2004 | Jaiprakash et al. | |
| 2005/0041465 | A1 | 2/2005 | Rueckes et al. | |
| 2005/0041466 | A1 | 2/2005 | Rueckes et al. | |
| 2005/0047244 | A1 | 3/2005 | Rueckes et al. | |
| 2005/0056877 | A1 | 3/2005 | Rueckes et al. | |
| 2005/0062035 | A1 | 3/2005 | Bertin et al. | |

FOREIGN PATENT DOCUMENTS

| | | |
|---|---|---|
| WO | WO 04/065655 | 8/2004 |
| WO | WO 04/065657 | 8/2004 |
| WO | WO 04/065671 | 8/2004 |

OTHER PUBLICATIONS

Cui, J.B. et al., "Carbon Nanotube Mamory Devices of High Charge Storage Stability,". *Applied Physics Letters*, 2002. 81 (17) 3260-3262.

Yoneya N. et al., "Charge transfer control by gate voltage in corssed nanotube junction", *Applied Physics Letters*, 2002. 81 (12) 2250-2252.

Kinaret, J.M. et al., "A carbon-nanotube-based nanorelay", *Applied Physics Letters*, 2003. 82 (8) 1287-1289.

Javey, Ali et al., "Carbon Nanotube Transistor Arrays for Multistage Complementary Logic and Ring Oscillators", *Nano Letters*, 2002. 2 (9) 929-932.

Fuhrer, M.S. et al., "High-Mobility Nanotube Transistor Memory", *Nano Letters*, 2002. 2 (7) 755-759.

Radosavljevic, M. et al., "Nonvolatile Molecular Memory Elements Based on Ambipolar Nanotube Field Effect Transistors", *Nano Letters*, 2002. 2 (7) 761-764.

Sapmaz, S. et al., "Carbon Nanotubes as Nanoelectromechanical Systems", *Physical Review B*, 2003. 67 23514-1-23514-7.

Rueckes, T. et al., "Carbon Nanotube-Based Nonvolatile Random Access Memory for Molecular Computing", *Science*, 2000. 289, 94-97.

Bachtold, A. et al., "Logic Circuits with Carbon Nanotube Transistor", *Scinece*, 2001. 294-1317-1320.

Brehob, M. et al., "The Potential of Carbon-based Memory Systems", 1-5.

Luyken, R.J. et al., "Concepts for hybrid CMOS-molecular non-volatile memories", *Nanotechnology*, 2003. 14, 273-276.

Collins, P.G., "Nanotubes for Electronics", *Scientific American*, Dec. 2000. 62-69.

Appenzeller, J., et al., "Optimized contact configuration for the study of transport phenomena in ropes of single-wall carbon nanotubes", *Applied Physics Letter*, 2001. 78 (21) 3313-3315.

Appenzeller, J., et al., "A 10 nm MOSFET Concept", *Microelectronic Engineering*, 2001. 56, 213-219.

Appenzeller, J. et al., "Field-Modulated Carrier Transport in Carbon Nanotube Transistors" *Physical Review Letters*, 2002. 89 (2) 126801-1-126801-6.

Appenzeller J. et al., "Carbon Nanotube Electronics", *IEEE Transactions on Nanotechnology*, 2002. 1 (4) 184-189.

Avouris Ph., "Carbon nanotube electronics", *Chemical Physics*, 2002. 281, 429-445.

Collins, P.G., et al., "Engineering Carbon Nanotubes and Nanotube Circuits Using Electrical Breakdown", *Science*, 2001. 292, 706-709.

Collins, P.G., "Current Saturation and Electrical Breakdown in Multiwalled Carbon Nanotubes", *Physical Review Letters*, 2001. 86 (14) 3128-3131.

Derycke, V., et al., "Carbon Nanotube Inter- and Intramolecular Logic Gates", *Nano Letters*, 2001. 1 (9) 453-456.

Derycke, V., "Controlling Doping and Carrier Injection in Carbon Nanotube Transistors", *Applied Physics Letters*, 2002. 80 (15) 2773-2775.

Heinze, S., "Carbon Nanotubes as Schottky Barrier Transistors" *Physical Review Letters*, 2002. 89 (10) 106801-1-106801-4.

Heinze, S., et al., "Unexpected Scaling of the Performance of Carbon Nanotube Transistors", published on the web Feb. 2003.

Heinze, S., et al., "Electrostatic engineering of nanotube transistors for improved performance", *Applied Physics Letters*, 2003. 83 (24) 5038-5040.

Martel, R., et al., "Single- and Multi-Wall Carbon Nanotube Field-Effect Transistors", *Applied Physics Letters*, 1998. 73 (17) 2447-2449.

Avouris, Ph., "Molecular Electronics with Carbon Nanotubes", Accounts of Chemical Research, 35 (12) 1022-1034.

Martel, R. et al., "Ambipolar Electrical Transport in Semiconducting Single-Wall Carbon Nanotubes", *Physical Review Letters*, 2001. 87 (25) 256805-1-256805-4.

Martel, R. et al., "Carbon Nanotube Field-Effect Transistors and Logic Circuits", *DAC*, 2002. 7.4 94-98.

Radosavljevic et al., "Drain Voltage Scaling in Carbon Nanotube Transistors", *Applied Physics Letters*, 2003. 83 (12) 2435-2437.

Radosavljevic et al., "High Performance of Potassium n-Doped Carbon Nanotube Field Effect Transistors", *Applied Physics Letters*, 2004. 84 (18) 3693-3695.

Rochefort, A. et al., "Switching Behavior of Semiconducting Carbon Nanotubes Under an External Electric Field", *Applied Physics Letters*, 2001. 78(17) 2521-2523.

Wind, S.J. et al., "Lateral Scaling in Carbon-Nanotube Field-Effect Transistors", *Physical Review Letters*, 2003. 91 (5) 058301-1-058301-4.

Wind, S.J. et al., "Transistor Structures for the Study of Scaling in Carbon Nanotubes", *J. Vac. Sci. Technol. B*, 2003. 21 (6) 2856-2859.

* cited by examiner

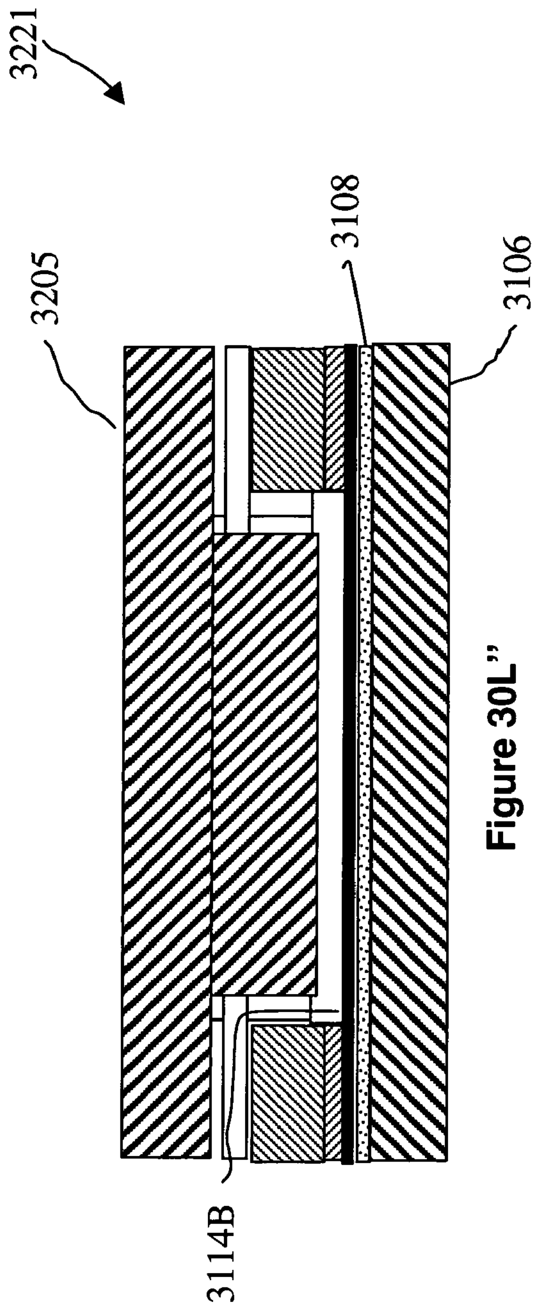
Figure 30L”
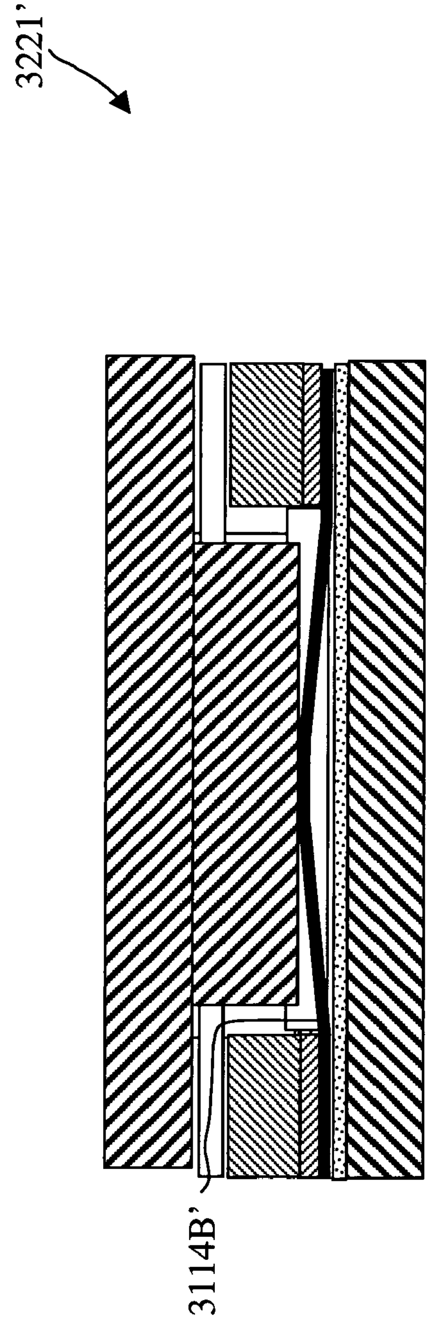
Figure 30L’’’

2000
REF
2500
WL
2200
RL
BL
2400
2300
2320
2420
2220
2040
T
2180
2160
2520
2140
2120
NT
2080
2060

2180
2160
2120
2140'
NT
Logic "1" (ON) State 2180
2160
2120
2140''
NT
Logic "0" (OFF) State 2180
2160
2120
2140'''
NT
Apparent Logic "0" (OFF) State Logic "1" (ON) State Logic "0" (OFF) State Logic "1" (ON) State Logic "0" (OFF) State

METHOD OF MAKING NON-VOLATILE FIELD EFFECT DEVICES AND ARRAYS OF SAME

CROSS REFERENCE TO RELATED APPLICATIONS

This application claims priority under 35 U.S.C. §119(e) to U.S. Provisional Patent Application No. 60/476,976, filed on Jun. 9, 2003, entitled Non-Volatile Electromechanical Field Effect Transistors and Methods of Forming Same, which is incorporated herein by reference in its entirety.

This application is related to the following U.S. applications, the contents of which are incorporated herein in their entirety by reference:

U.S. patent application Ser. No. 10/810,962, filed Mar. 26, 2004, entitled NRAM BIT SELECTABLE TWO-DEVICE NANOTUBE ARRAY;

U.S. patent application Ser. No. 10/810,963, filed Mar. 26, 2004, entitled NRAM BYTE/BLOCK RELEASED BIT SELECTABLE ONE-DEVICE NANOTUBE ARRAY;

U.S. patent application Ser. No. 10/811,191, filed Mar. 26, 2004, entitled SINGLE TRANSISTOR WITH INTEGRATED NANOTUBE (NT-FET); and U.S. patent application Ser. No. 10/811,356, filed Mar. 26, 2004, entitled NANOTUBE-ON-GATE FET STRUCTURES AND APPLICATIONS.

BACKGROUND

1. Technical Field

The present invention relates to field effect devices having non-volatile behavior as a result of control structures having nanotube components and to methods of forming such devices.

2. Discussion of Related Art

Semiconductor MOSFET transistors are ubiquitous in modem electronics. These field effect devices possess the simultaneous qualities of bistability, high switching speed, low power dissipation, high-reliability, and scalability to very small dimensions. One feature not typical of such MOSFET-based circuits is the ability to retain a digital state (i.e. memory) in the absence of applied power; that is, the digital state is volatile.

FIG. 1 depicts a prior art field effect transistor 10. The transistor 10 includes a gate node 12, a drain node 14, and a source node 18. Typically, the gate node 12 is used to control the device. Specifically, by applying an adequate voltage to the gate node 12 an electric field is caused that creates a conductive path between the drain 14 and source 18. In this sense, the transistor is referred to as switching on.

Currently, most memory storage devices utilize a wide variety of energy dissipating devices which employ the confinement of electric or magnetic fields within capacitors or inductors respectively. Examples of state of the art circuitry used in memory storage include FPGA, CPLD, ASIC, CMOS, ROM, PROM, EPROM, EEPROM, DRAM, MRAM and FRAM, as well as dissipationless trapped magnetic flux in a superconductor and actual mechanical switches, such as relays.

An FPGA (Field Programmable Gate Array) or a CPLD (Complex Programmable Logic Device) is a programmable logic device (PLD), a programmable logic array (PLA), or a programmable array logic (PAL) with a high density of gates, containing up to hundreds of thousands of gates with a wide variety of possible architectures. The ability to modulate (i.e. effectively to open and close) electrical circuit connections on an IC (i.e. to program and reprogram) is at the heart of the FPGA (Field programmable gate array) concept.

An ASIC (Application Specific Integrated Circuit) chip is custom designed (or semi-custom designed) for a specific application rather than a general-purpose chip such as a microprocessor. The use of ASICs can improve performance over general-purpose CPUs, because ASICs are "hardwired" to do a specific job and are not required to fetch and interpret stored instructions.

Important characteristics for a memory cell in electronic device are low cost, nonvolatility, high density, low power, and high speed. Conventional memory solutions include Read Only Memory (ROM), Programmable Read only Memory (PROM), Electrically Programmable Memory (EPROM), Electrically Erasable Programmable Read Only Memory (EEPROM), Dynamic Random Access Memory (DRAM) and Static Random Access Memory (SRAM).

ROM is relatively low cost but cannot be rewritten. PROM can be electrically programmed but with only a single write cycle. EPROM (Electrically-erasable programmable read-only memories) has read cycles that are fast relative to ROM and PROM read cycles, but has relatively long erase times and reliability only over a few iterative read/write cycles. EEPROM (or "Flash") is inexpensive, and has low power consumption but has long write cycles (ms) and low relative speed in comparison to DRAM or SRAM. Flash also has a finite number of read/write cycles leading to low long-term reliability. ROM, PROM, EPROM and EEPROM are all non-volatile, meaning that if power to the memory is interrupted the memory will retain the information stored in the memory cells.

DRAM (dynamic random access memory) stores charge on capacitors but must be electrically refreshed every few milliseconds complicating system design by requiring separate circuitry to "refresh" the memory contents before the capacitors discharge. SRAM does not need to be refreshed and is fast relative to DRAM, but has lower density and is more expensive relative to DRAM. Both SRAM and DRAM are volatile, meaning that if power to the memory is interrupted the memory will lose the information stored in the memory cells.

Consequently, existing technologies are either non-volatile but are not randomly accessible and have low density, high cost, and limited ability to allow multiple writes with high reliability of the circuit's function, or they are volatile and complicate system design or have low density. Some emerging technologies have attempted to address these shortcomings.

For example, magnetic RAM (MRAM) or ferromagnetic RAM (FRAM) utilizes the orientation of magnetization or a ferromagnetic region to generate a nonvolatile memory cell. MRAM utilizes a magnetoresistive memory element involving the anisotropic magnetoresistance or giant magnetoresistance of ferromagnetic materials yielding nonvolatility. Both of these types of memory cells have relatively high resistance and low-density. A different memory cell based upon magnetic tunnel junctions has also been examined but has not led to large-scale commercialized MRAM devices. FRAM uses circuit architecture similar to DRAM but which uses a thin film ferroelectric capacitor. This capacitor is purported to retain its electrical polarization after an externally applied electric field is removed yielding a nonvolatile memory. FRAM suffers from a large memory cell size, and it is difficult to manufacture as a large-scale integrated component. See U.S. Pat. Nos. 4,853,893; 4,888,630; 5,198,994, 6,048,740; and 6,044,008.

Another technology having non-volatile memory is phase change memory. This technology stores information via a structural phase change in thin-film alloys incorporating elements such as selenium or tellurium. These alloys are purported to remain stable in both crystalline and amorphous states allowing the formation of a bi-stable switch. While the nonvolatility condition is met, this technology appears to suffer from slow operations, difficulty of manufacture and poor reliability and has not reached a state of commercialization. See U.S. Pat. Nos. 3,448,302; 4,845,533; and 4,876, 667.

Wire crossbar memory (MWCM) has also been proposed. See U.S. Pat. Nos. 6,128,214; 6,159,620; and 6,198,655. These memory proposals envision molecules as bi-stable switches. Two wires (either a metal or semiconducting type) have a layer of molecules or molecule compounds sandwiched in between. Chemical assembly and electrochemical oxidation or reduction are used to generate an "ON" or "OFF" state. This form of memory requires highly specialized wire junctions and may not retain non-volatilely owing to the inherent instability found in redox processes.

Recently, memory devices have been proposed which use nanoscopic wires, such as single-walled carbon nanotubes, to form crossbar junctions to serve as memory cells. See WO 01/03208, Nanoscopic Wire-Based Devices, Arrays, and Methods of Their Manufacture; and Thomas Rueckes et al., "Carbon Nanotube-Based Nonvolatile Random Access Memory for Molecular Computing," Science, vol. 289, pp. 94–97, 7 Jul. 2000. Electrical signals are written to one or both wires to cause them to physically attract or repel relative to one another. Each physical state (i.e., attracted or repelled wires) corresponds to an electrical state. Repelled wires are an open circuit junction. Attracted wires are a closed state forming a rectified junction. When electrical power is removed from the junction, the wires retain their physical (and thus electrical) state thereby forming a non-volatile memory cell.

The use of an electromechanical bi-stable device for digital information storage has also been suggested (c.f. U.S. Pat. No. 4,979,149: Non-volatile memory device including a micro-mechanical storage element).

The creation and operation of a bi-stable nano-electro-mechanical switches based on carbon nanotubes (including mono-layers constructed thereof) and metal electrodes has been detailed in a previous patent application of Nantero, Inc. (U.S. Pat. Nos. 6,574,130, 6,643,165, 6,706,402; U.S. patent application Ser. Nos. 09/915,093, 10/033,323, 10/033,032, 10/128,117, 10/341,005, 10/341,055, 10/341, 054, 10/341,130, 10/776,059, and 10/776,572, the contents of which are hereby incorporated by reference in their entireties).

SUMMARY

The invention provides methods of making non-volatile field effect devices and arrays of same.

Under one aspect of the invention, a method of making a non-volatile field effect device includes providing a substrate with a field effect device formed therein. The field effect device includes a source, drain and gate with a field-modulatable channel between the source and drain. An electromechanically-deflectable, nanotube switching element is formed over the field effect device. Terminals and corresponding interconnect are provided to correspond to each of the source, drain and gate such that the nanotube switching element is electrically positioned between one of the source, drain and gate and its corresponding terminal, and such that the others of said source, drain and gate are directly connected to their corresponding terminals.

Under another aspect of the invention, forming an electromechanically-deflectable, nanotube switching element includes forming an article from nanotube fabric.

Under another aspect of the invention, the nanotube fabric is a porous nanotube fabric.

Under another aspect of the invention, forming an electromechanically-deflectable, nanotube switching element includes forming a fourth terminal to control operation of said nanotube switching element.

Under another aspect of the invention, the fourth terminal is covered with a dielectric material on a surface facing the article of nanotube fabric.

Under another aspect of the invention, forming an electromechanically-deflectable, nanotube switching element includes forming an article of nanofabric that is positioned between the fourth terminal and the one of the source, drain and gate.

Under another aspect of the invention, forming an electromechanically-deflectable, nanotube switching element includes forming an article of nanofabric that is suspended between the fourth terminal and the one of the source, drain and gate.

Under another aspect of the invention, forming an electromechanically-deflectable, nanotube switching element includes forming an article of nanofabric that is positioned between the fourth terminal and the one of the source, drain and gate, and wherein there is a gap between the article and the fourth terminal.

Under another aspect of the invention, forming an electromechanically-deflectable, nanotube switching element includes forming an article of nanofabric that is positioned between the fourth terminal and the one of the source, drain and gate, and wherein there is a gap between the one of the source, drain and gate.

Under another aspect of the invention, forming an electromechanically-deflectable, nanotube switching element includes forming an article of nanofabric that is horizontally suspended relative to a horizontal substrate surface and wherein the article is electrically positioned between the fourth terminal and the one of the source, drain and gate.

Under another aspect of the invention, the article is formed to have a suspended length that is sub-lithographic.

Under another aspect of the invention, forming an electromechanically-deflectable, nanotube switching element includes forming an sacrificial layer and then forming a porous fabric of nanotubes thereover, said fabric subsequently being lithographically patterned and subsequent to that said sacrificial material being removed to suspend the article with a gap existing where the sacrificial material previously existed.

Under another aspect of the invention, a second sacrificial layer is formed on a side of the patterned article opposite the side of the sacrificial layer, wherein both the sacrificial layer and the second sacrificial layer are removed to form gaps on either side of the article.

Under another aspect of the invention, the sacrificial material is anisotropically etchable.

Under another aspect of the invention, the sacrificial material is poly.

Under another aspect of the invention, a method of making a non-volatile field effect device includes providing a substrate with a field effect device formed therein. The field effect device includes a source, drain and gate with a field-modulatable channel between the source and drain. Terminals and corresponding interconnect are provided to correspond to each of the source, drain and gate. The drain and gate directly connected to their corresponding terminals. An electromechanically-deflectable, nanotube switching element is formed over the field effect device. The nanotube switching element is connected such that it is electrically positioned in series between the source and the terminal corresponding to the source.

Under another aspect of the invention, a method of making a non-volatile field effect device includes providing a substrate with a field effect device formed therein. The field effect device includes a source, drain and gate with a field-modulatable channel between the source and drain. Terminals and corresponding interconnect are provided to correspond to each of the source, drain and gate. The source and gate are directly connected to their corresponding terminals. An electromechanically-deflectable, nanotube switching element is formed over the field effect device. The nanotube switching element is connected such that it is electrically positioned in series between the drain and the terminal corresponding to the drain.

Under another aspect of the invention, a method of making a non-volatile field effect device includes providing a substrate with a field effect device formed therein. The field effect device includes a source, drain and gate with a field-modulatable channel between the source and drain. Terminals and corresponding interconnect are provided to correspond to each of the source, drain and gate. The source and drain are directly connected to their corresponding terminals. An electromechanically-deflectable, nanotube switching element is formed over the field effect device. The nanotube switching element is connected such that it is electrically positioned in series between the gate and the terminal corresponding to the gate.

DETAILED DESCRIPTION

Preferred embodiments of the invention provide a field effect device that acts like a FET in its ability to create an electronic communication channel between a drain and a source node, under the control of a gate node. However, the preferred field effect devices further include a separate control structure to non-volatilely control the electrical capabilities of the field effect device. More specifically, the control structure uses carbon nanotubes to provide non-volatile switching capability that independently control the operation of the drain, source, or gate node of the field effect device. By doing so, the control structure provides non-volatile state behavior to the field effect device. Certain embodiments provide non-volatile RAM structures. Preferred embodiments are scalable to large memory array structures. Preferred embodiments use processes that are compatible with CMOS circuit manufacture. While the illustrations combine NMOS FETs with carbon nanotubes, it should be noted that based on the principle of duality in semiconductor devices, PMOS FETs may replace NMOS FETs, along with corresponding changes in the polarity of applied voltages

Overview

FIGS. 2A–L illustrate schematics of three models of preferred embodiments of the invention. As will be explained further, below, a preferred field effect device includes a control structure using nanotubes to provide non-volatile behavior as a result of the control structure.

Field Effect Devices (FEDs) with Controllable Sources

Figure 1:
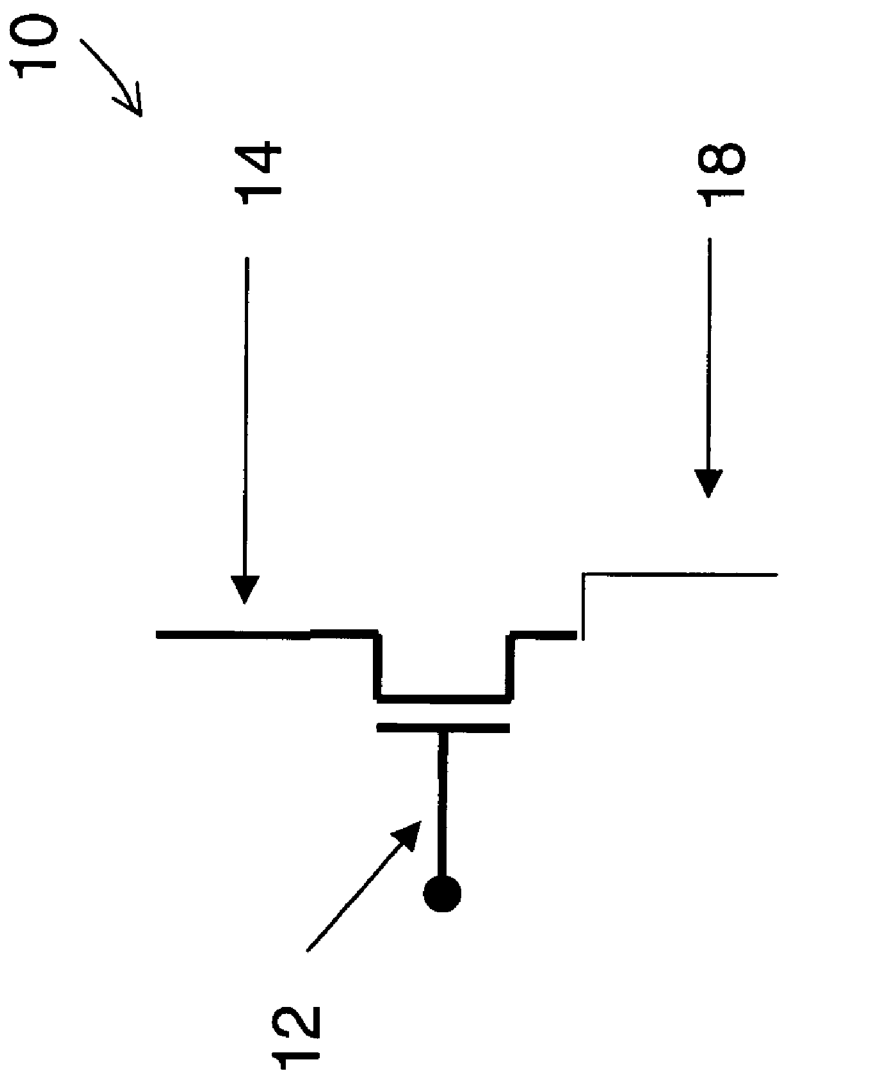
FIG. 1 is a schematic of a prior art field effect transistor.
Figure 2A:
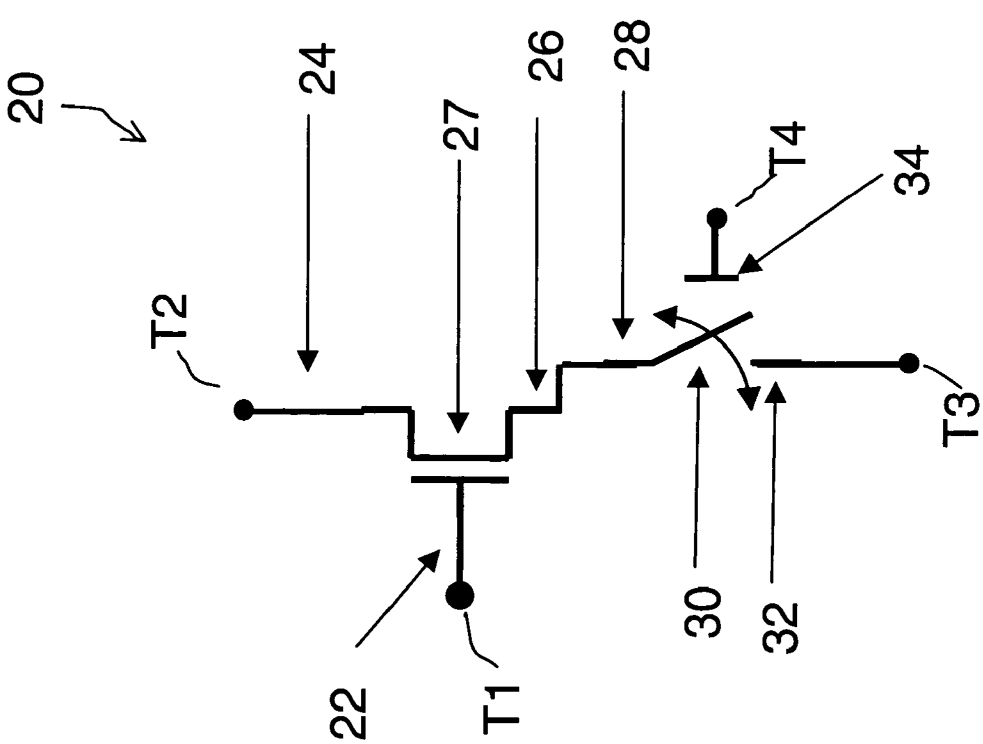
FIGS. 2A–L illustrate schematics of three models of preferred embodiments of the invention.

Field effect devices (FEDs) with controllable sources may also be referred to as nanotube (NT)-on-Source. FIG. 2A illustrates a schematic for field effect device (FED1) 20. The FED1 device 20 has a terminal T1 connected to gate 22, a terminal T2 connected to drain 24, and a controllable source 26. Like a typical field effect device (e.g., transistor 10 of FIG. 1) the gate node may be used to create a field to induce a conductive channel in channel region 27 between the drain 24 and a (controllable) source 26. In this case, the source 26 is controllable so that it may be in open or closed communication as illustrated with the switch 30. Switch 30, like all nanofabric articles referred to below, is fabricated using one or more carbon nanotubes (CNTs, or NTs) as described in incorporated references. Switch 30 is preferably physically and electrically connected to controllable source 26 by contact 28. Switch 30 may be displaced to contact switch-plate (switch-node) 32, which is connected to a terminal T3. Switch 30 may be displaced to contact release-plate (release-node) 34, which is connected to terminal T4. As will be explained below, the controllable gate utilizes nanotube components to create a non-volatile switching ability, meaning that the gate will retain its open or closed state even upon interruption of power to the circuit.

Figure 2B:
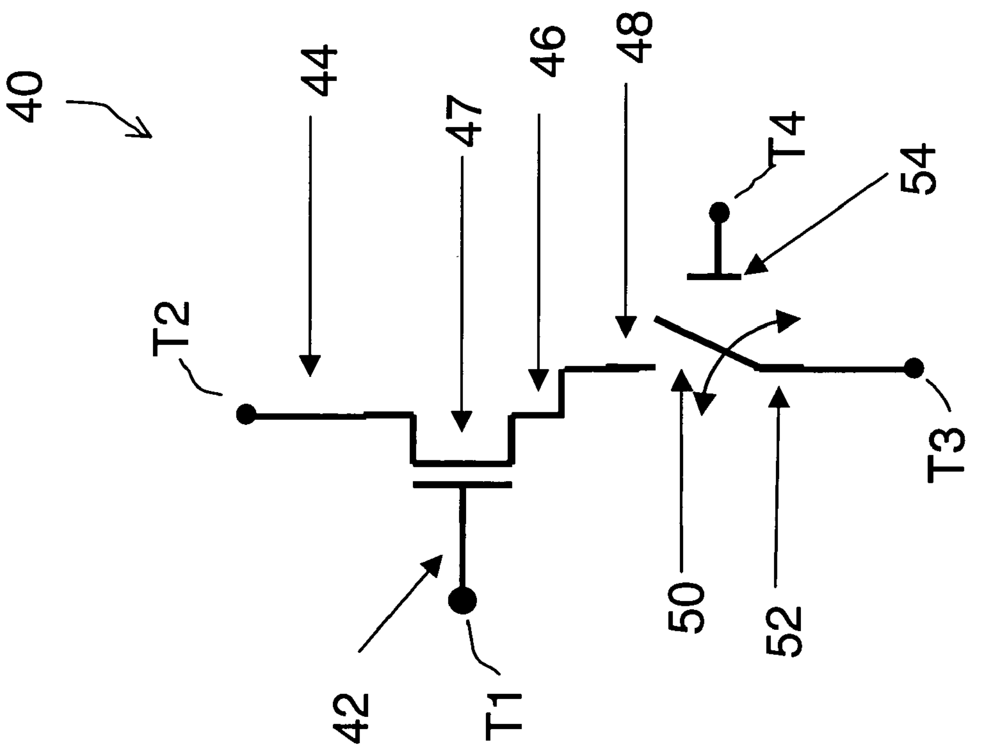

FIG. 2B illustrates a schematic for second field effect device (FED2) 40. The FED2 device 40 has a terminal T1 connected to gate 42, a terminal T2 connected to drain 44, and a controllable source 46. Like a typical field effect device (e.g., transistor 10 of FIG. 1) the gate node may be used to create a field to induce a conductive channel in channel region 47 between the drain 44 and a (controllable) source 46. In this case, the source 46 is controllable so that it may be in open or closed communication as illustrated with the depiction of switch 50. Switch 50 is fabricated using one or more carbon nanotubes (CNTs, or NTs). Switch 50 is preferably physically and electrically connected to contact 52, which is connected to a terminal T3. Switch 50 may be displaced to contact a switch-plate 48, which is connected to a controllable source 46. Switch 50 may be displaced to contact release-plate 54, which is connected to terminal T4. As will be explained below, the controllable gate utilizes nanotube components to create a non-volatile switching ability, meaning that the gate will retain its open or closed state even upon interruption of power to the circuit.

Figure 2D:
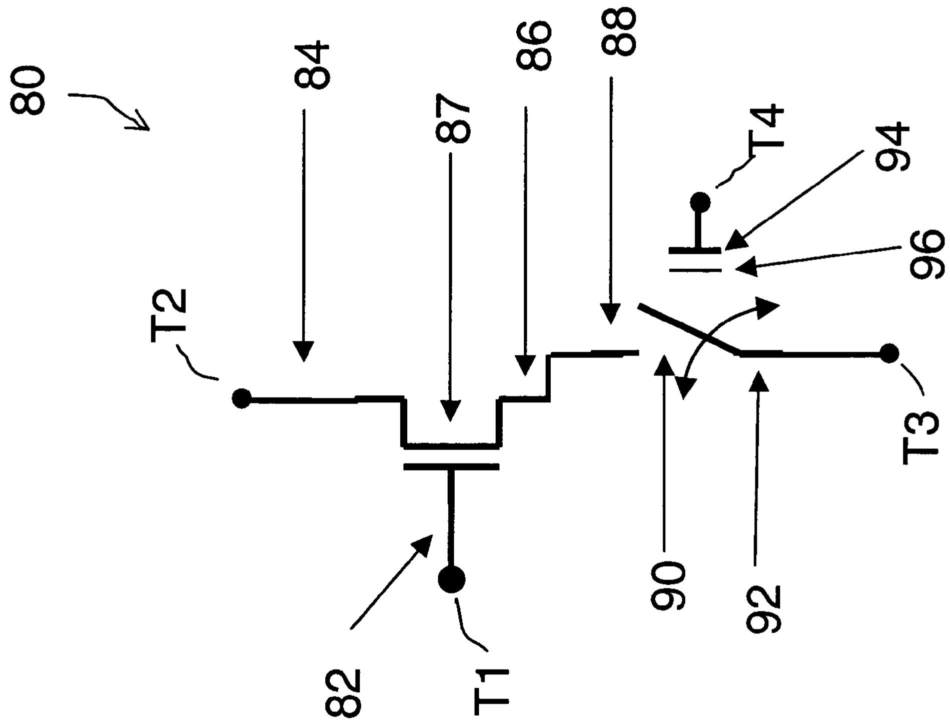
Figure 2C:
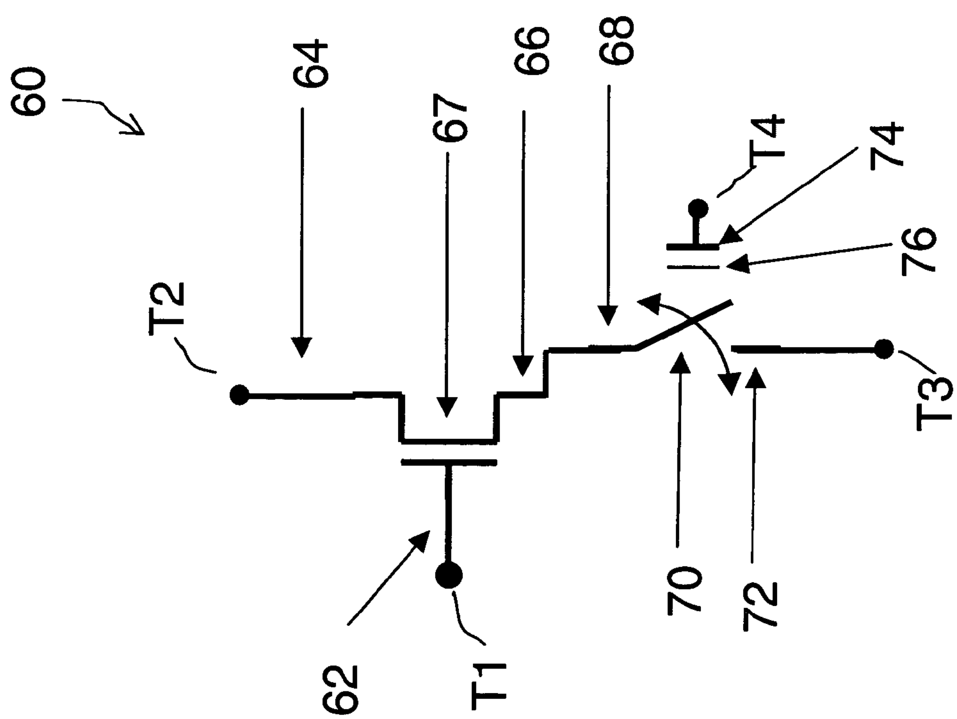

FIG. 2C illustrates a schematic of third field effect device (FED3) 60. The FED3 device 60 has a terminal T1 connected to gate 62, a terminal T2 connected to drain 64, and a controllable source 66. Like a typical field effect device (e.g., transistor 10 of FIG. 1) the gate node may be used to create a field to induce a conductive channel in channel region 67 between the drain 64 and a (controllable) source 66. In this case, the source 66 is controllable so that it may be in open or closed communication as illustrated with the depiction of switch 70. Switch 70 is fabricated using one or more carbon nanotubes (CNTs, or NTs). Switch 70 is preferably physically and electrically connected to controllable source 66 by contact 68. Switch 70 may be displaced to contact switch-plate 72, which is connected to a terminal T3. Switch 70 may be displaced to contact dielectric surface of release-plate 76 on release-plate 74, which is connected to terminal T4. As will be explained below, the controllable gate utilizes nanotube components to create a non-volatile switching ability, meaning that the gate will retain its open or closed state even upon interruption of power to the circuit, such non-volatilely is more fully described in incorporated references and will not be repeated here for the sake of brevity.

FIG. 2D illustrates a schematic of fourth field effect device (FED4) 80. The FED4 device 80 has a terminal T1 connected to gate 82, a terminal T2 connected to drain 84, and a controllable source 86. Like a typical field effect device (e.g., transistor 10 of FIG. 1) the gate node may be used to create a field to induce a conductive channel in channel region 87 between the drain 84 and a (controllable) source 86. In this case, the source 86 is controllable so that it may be in open or closed communication as illustrated with by the depiction of switch 90. Switch 90 is fabricated using one or more carbon nanotubes (CNTs, or NTs) as described in incorporated references. Switch 90 is preferably physically and electrically connected to contact 92, which is connected to a terminal T3. Switch 90 may be displaced to contact a switch-plate 88, which is connected to a controllable source 86. Switch 90 may be displaced to contact release-plate dielectric surface 96 on release-plate 94, which is connected to terminal T4. As will be explained below, the controllable gate utilizes nanotube components to create a non-volatile switching ability, meaning that the gate will retain its open or closed state even upon interruption of power to the circuit.

Field Effect Devices (FEDs) with Controllable Drains

Field effect devices (FEDs) with controllable drains may also be referred to as nanotube (NT)-on-Drain. FIG. 2E illustrates a schematic of fifth field effect device (FED5) 100. The FED5 device 100 has a terminal T1 connected to gate 102, a controllable drain 104, and a source 106 connected to a terminal T3. Like a typical field effect device (e.g., transistor 10 of FIG. 1) the gate node may be used to create a field to induce a conductive channel in channel region 107 between the (controllable) drain 104 and a source 106. In this case, the drain 104 is controllable so that it may be in open or closed communication as illustrated by the depiction of switch 110. Switch 110 is fabricated using one or more carbon nanotubes (CNTs, or NTs). Switch 110 is preferably physically and electrically connected to controllable drain 104 by contact 108. Switch 110 may be displaced to contact switch-plate 112, which is connected to a terminal T2. Switch 110 may be displaced to contact release-plate 114, which is connected to terminal T4. As will be explained below, the controllable gate utilizes nanotube components to create a non-volatile switching ability, meaning that the gate will retain its open or closed state even upon interruption of power to the circuit.

Figure 2F:
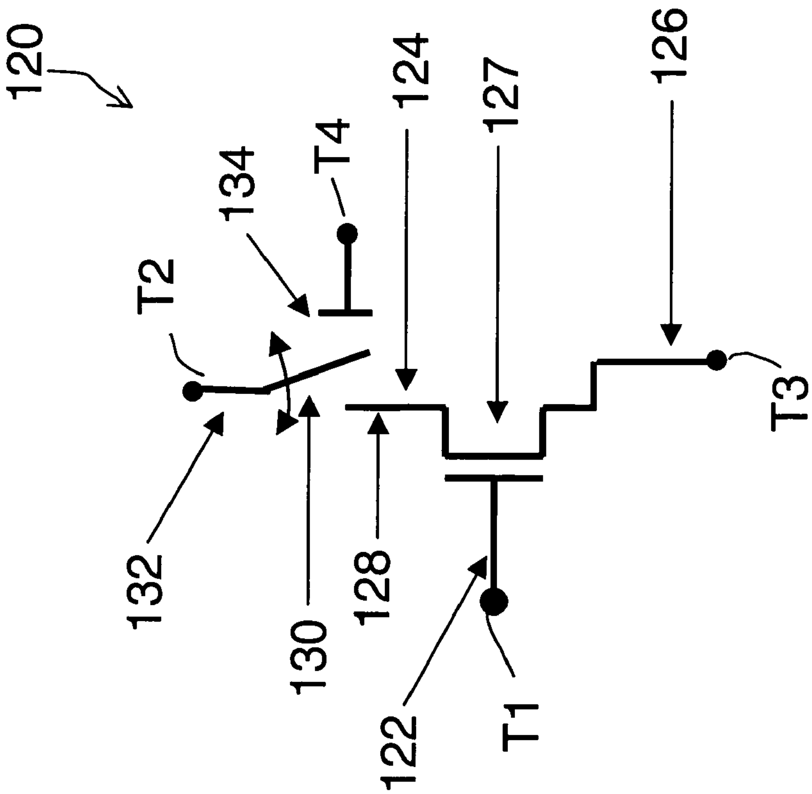
Figure 2E:
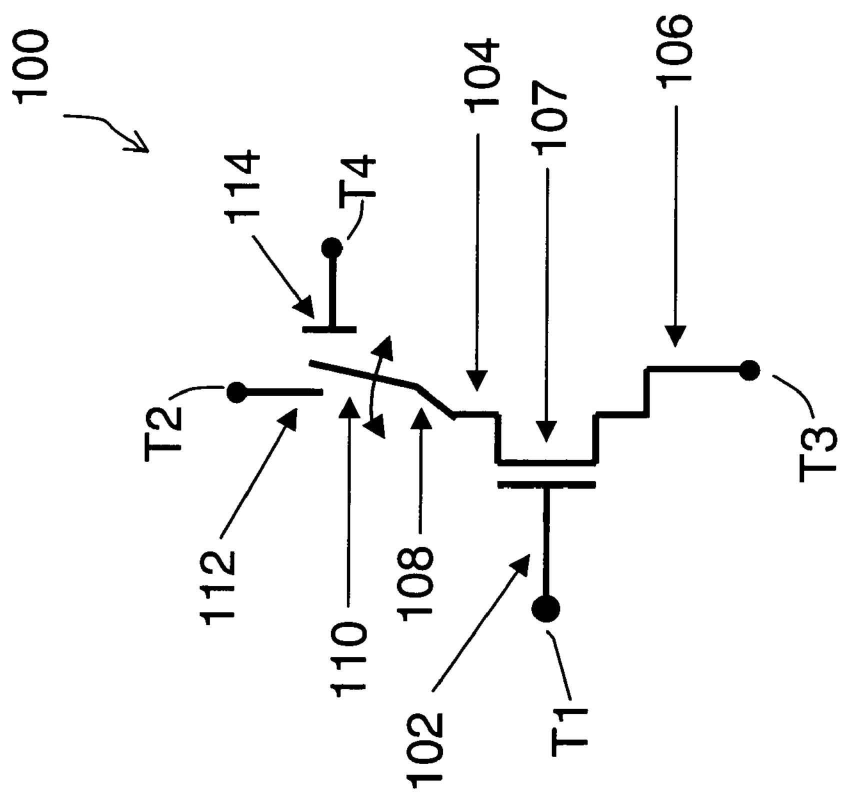

FIG. 2F illustrates a schematic of sixth field effect device (FED6) 120. The FED6 device 120 has a terminal T1 connected to gate 122, a controllable drain 124, and a source 126 connected to a terminal T3. Like a typical field effect device (e.g., transistor 10 of FIG. 1) the gate node may be used to create a field to induce a conductive channel in channel region 127 between the drain 124 and a (controllable) source 126. In this case, the drain 124 is controllable so that it may be in open or closed communication as illustrated by the depiction of switch 130. Switch 130 is fabricated using one or more carbon nanotubes (CNTs, or NTs). Switch 130 is preferably physically and electrically connected to contact 132, which is connected to terminal T2. Switch 130 may be displaced to contact a switch-plate 128, which is connected to a controllable drain 124. Switch 130 may be displaced to contact release-plate 134, which is connected to terminal T4. As will be explained below, the controllable gate utilizes nanotube components to create a non-volatile switching ability, meaning that the gate will retain its open or closed state even upon interruption of power to the circuit.

Figure 2H:
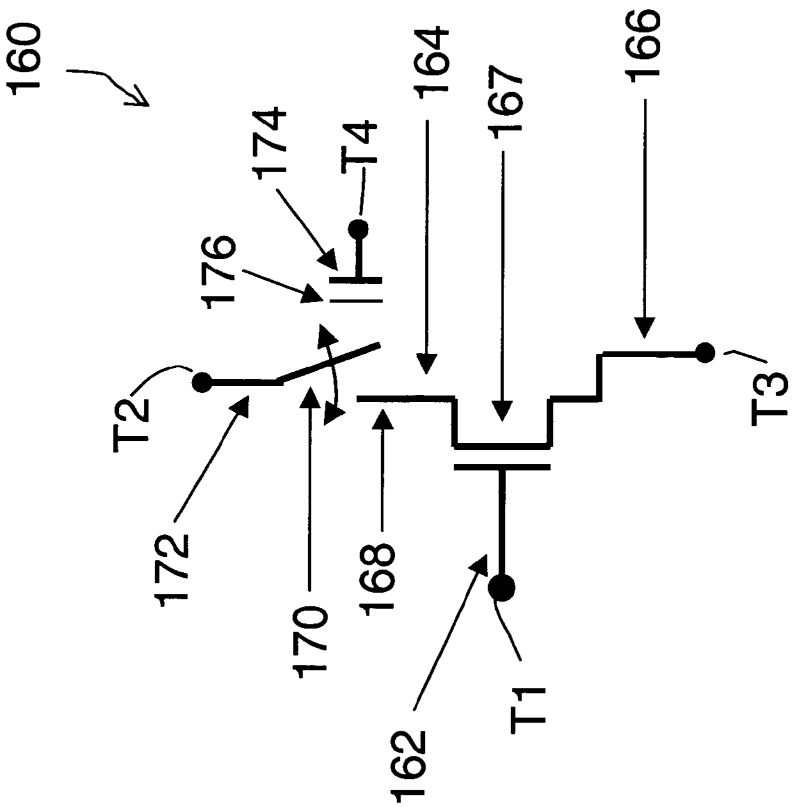
Figure 2G:
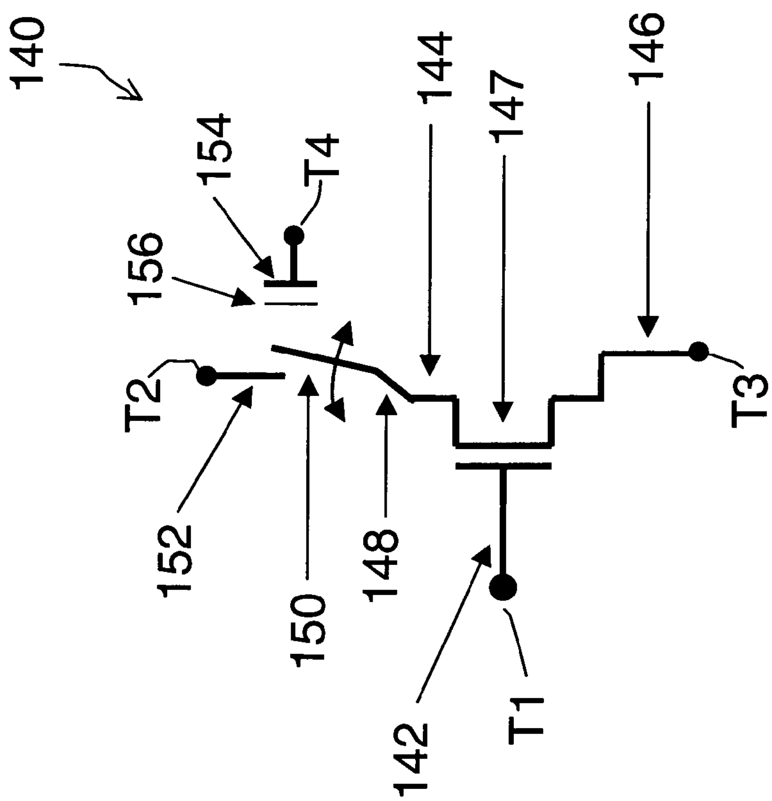

FIG. 2G illustrates a schematic of seventh field effect device (FED7) 140. The FED7 device 140 has a terminal T1 connected to gate 142, a controllable drain 144, and a source 146 connected to a terminal T3. Like a typical field effect device (e.g., transistor 10 of FIG. 1) the gate node may be used to create a field to induce a conductive channel in channel region 147 between the (controllable) drain 144 and a source 146. In this case, the drain 144 is controllable so that it may be in open or closed communication as illustrated by the depiction of switch 150. Switch 150 is fabricated using one or more carbon nanotubes (CNTs, or NTs). Switch 150 is preferably physically and electrically connected to controllable drain 144 by contact 148. Switch 150 may be displaced to contact switch-plate 152, which is connected to a terminal T2. Switch 150 may be displaced to contact release-plate dielectric surface 156 on release-plate 154, which is connected to terminal T4. As will be explained below, the controllable gate utilizes nanotube components to create a non-volatile switching ability, meaning that the gate will retain its open or closed state even upon interruption of power to the circuit.

FIG. 2H illustrates a schematic of eighth field effect device (FED8) 160. The FED8 device 160 has a terminal T1 connected to gate 162, a controllable drain 164, and a source 166 connected to a terminal T3. Like a typical field effect device (e.g., transistor 10 of FIG. 1) the gate node may be used to create a field to induce a conductive channel in channel region 167 between the (controllable) drain 164 and a source 166. In this case, the drain 164 is controllable so that it may be in open or closed communication as illustrated by the depiction of switch 170. Switch 170 is fabricated using one or more carbon nanotubes (CNTs, or NTs). Switch 170 is preferably physically and electrically connected to contact 172, which is connected to terminal T2. Switch 170 may be displaced to contact a switch-plate 168, which is connected to a controllable drain 164. Switch 170 may be displaced to contact release-plate dielectric surface 176 on release-plate 174, which is connected to terminal T4. As will be explained below, the controllable gate utilizes nanotube components to create a non-volatile switching ability, meaning that the gate will retain its open or closed state even upon interruption of power to the circuit.

Field Effect Devices (FEDs) with Controllable Gates

Figure 2I:
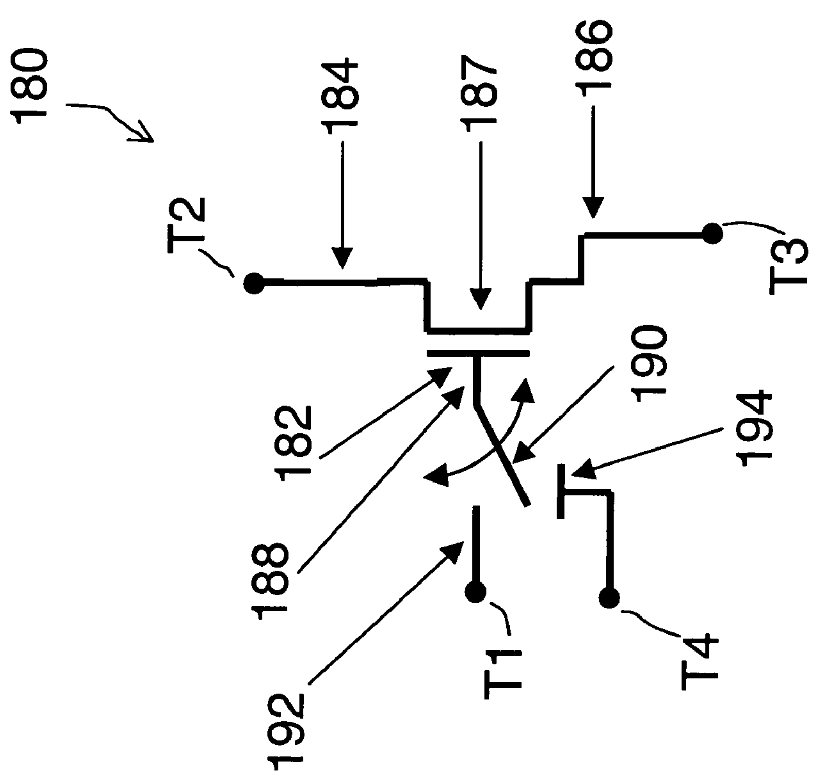

Field effect devices (FEDs) with controllable gates may also be referred to as nanotube (NT)-on-Gate. FIG. 2I illustrates a schematic of ninth field effect device (FED9) 180. The device 180 has a controllable gate 182, a drain 184 connected to terminal T2, and a source 186 connected to a terminal T3. Like a typical field effect device (e.g., transistor 10 of FIG. 1) the gate node may be used to create a field to induce a conductive channel in channel region 187 between a drain 184 and a source 186. In this case, the gate 182 is controllable so that it may be in open or closed communication as illustrated by the depiction of switch 190. Switch 190 is fabricated using one or more carbon nanotubes (CNTs, or NTs). Switch 190 is preferably physically and electrically connected to controllable gate 182 by contact 188. Switch 190 may be displaced to contact switch-plate 192, which is connected to a terminal T1. Switch 190 may be displaced to contact release-plate 194, which is connected to terminal T4. As will be explained below, the controllable gate utilizes nanotube components to create a non-volatile switching ability, meaning that the gate will retain its open or closed state even upon interruption of power to the circuit.

Figure 2J:
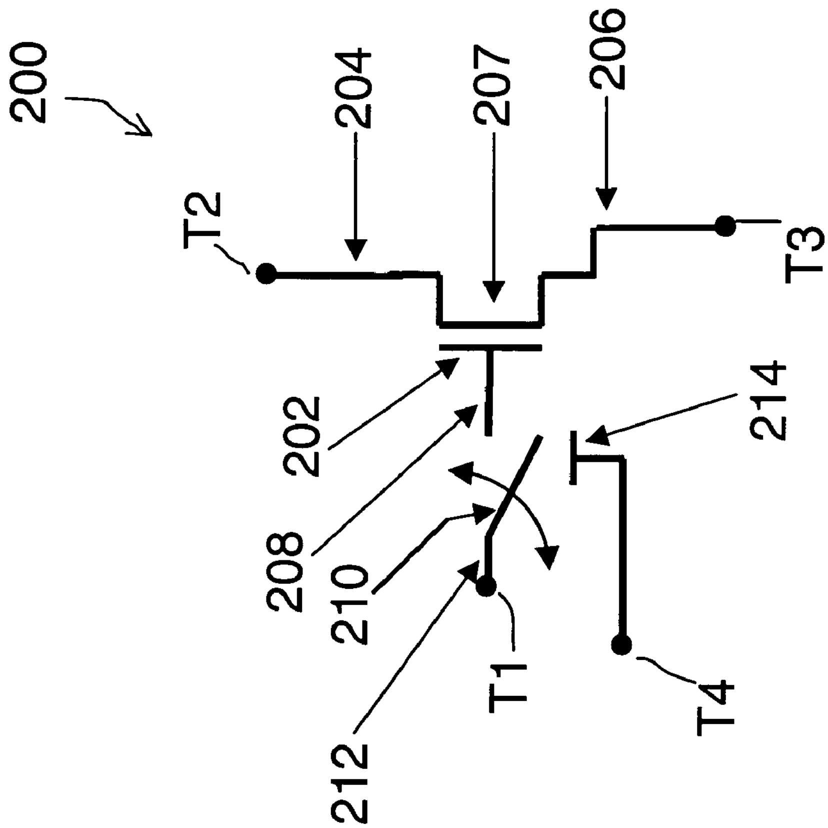

FIG. 2J illustrates a schematic of tenth field effect device (FED10) 200. The FED10 device 200 has a terminal controllable gate 202, a drain 204 connected to a terminal T2, and a source 206 connected to a terminal T3. Like a typical field effect device (e.g., transistor 10 of FIG. 1) the gate node may be used to create a field to induce a conductive channel in channel region 207 between the drain 204 and source 206. In this case, the gate 202 is controllable so that it may be in open or closed communication as illustrated by the depiction of switch 210. Switch 210 is fabricated using one or more carbon nanotubes (CNTs, or NTs). Switch 210 is preferably physically and electrically connected to contact 212, which is connected to terminal T1. Switch 210 may be displaced to contact a switch-plate 208, which is connected to a controllable gate 202. Switch 210 may be displaced to contact release-plate 214, which is connected to terminal T4. As will be explained below, the controllable gate utilizes nanotube components to create a non-volatile switching ability, meaning that the gate will retain its open or closed state even upon interruption of power to the circuit.

Figure 2L:
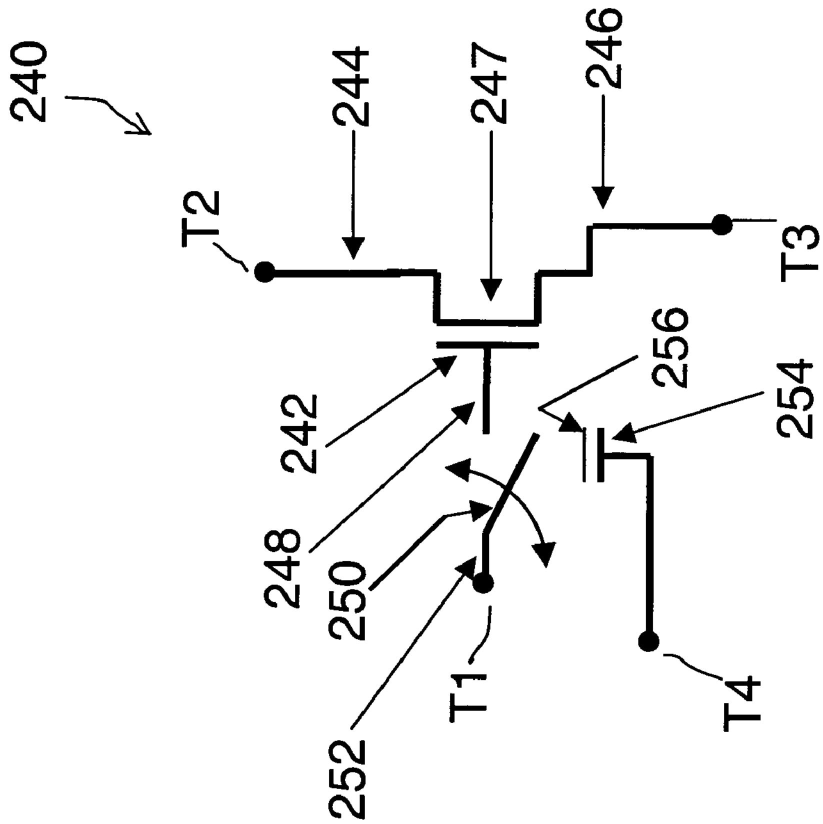
Figure 2K:
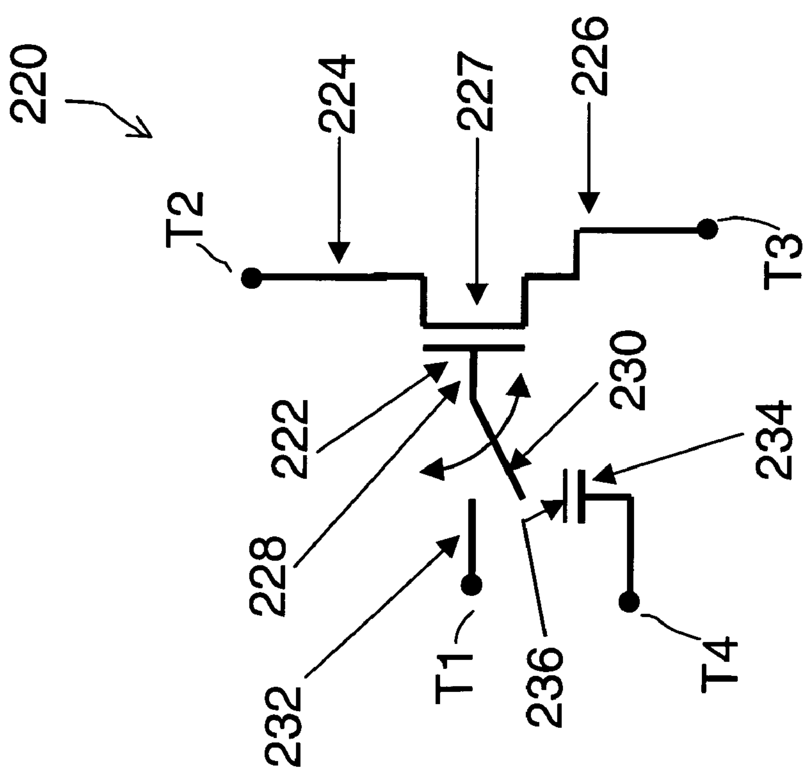

FIG. 2K illustrates a schematic of eleventh field effect device (FED11) 220. The device 220 has a controllable gate 222, a drain 224 connected to a terminal T2, and a source 226 connected to a terminal T3. Like a typical field effect device (e.g., transistor 10 of FIG. 1) the gate node may be used to create a field to induce a conductive channel in channel region 227 between a drain 224 and a source 226. In this case, the gate 222 is controllable so that it may be in open or closed communication as illustrated by the depiction of switch 230. Switch 230 is fabricated using one or more carbon nanotubes (CNTs, or NTs). Switch 230 is preferably physically and electrically connected to controllable gate 222 by contact 228. Switch 230 may be displaced to contact switch-plate 232, which is connected to a terminal T1. Switch 230 may be displaced to contact release-plate dielectric surface 236 on release-plate 234, which is connected to terminal T4. As will be explained below, the controllable gate utilizes nanotube components to create a non-volatile switching ability, meaning that the gate will retain its open or closed state even upon interruption of power to the circuit.

FIG. 2L illustrates a schematic of twelfth field effect device (FED12) 240. The FED12 device 240 has a controllable gate 242, a drain 244 connected to a terminal T2, and a source 246 connected to a terminal T3. Like a typical field effect device (e.g., transistor 10 of FIG. 1) the gate node may be used to create a field to induce a conductive channel in channel region 247 between the (controllable) drain 244 and a source 246. In this case, the gate 242 is controllable so that it may be in open or closed communication as illustrated by the depiction of switch 250. Switch 250 is fabricated using one or more carbon nanotubes (CNTs, or NTs). Switch 250 is preferably physically and electrically connected to contact 252, which is connected to terminal T1. Switch 250 may be displaced to contact a switch-plate 248, which is connected to a controllable gate 242. Switch 250 may be displaced to contact release-plate dielectric surface 256 on release-plate 254, which is connected to terminal T4. As will be explained below, the controllable gate utilizes nanotube components to create a non-volatile switching ability, meaning that the gate will retain its open or closed state even upon interruption of power to the circuit.

As will be explained below, the controllable structures are implemented using nanotube technology. More specifically, non-volatile switching elements are made of ribbons of matted fabric of carbon nanotubes. These elements may be electromechanically deflected into an open or closed state relative to a respective source, drain, or gate node using electrostatic forces. Under preferred embodiments, the construction of the control structures is such that once switched "ON" inherent van der Waals forces are sufficiently large (relative to a restoring force inherent in the device geometry) so that the switching element will retain its non-volatilized state; that is, the element will retain its state even in the event of power interruption.

Operation of Field Effect Devices with Controllable Sources

Four schematics of field effect devices (FEDs) with controllable sources have been described (FIGS. 2A–D). FIGS. 3A through FIG. 9 illustrate the operation of field effect devices with controllable sources for two of the FED configurations, device 80 (FIG. 2D) and device 20 (FIG. 2A). FED devices with controllable sources are also referred to as NT-on-Source devices. For each of these two FED configurations, at least one switch-mode setting operation is described, followed by an example of full voltage swing circuit operation (digital switching), and an example of small signal analog circuit operation.

Figure 3A:
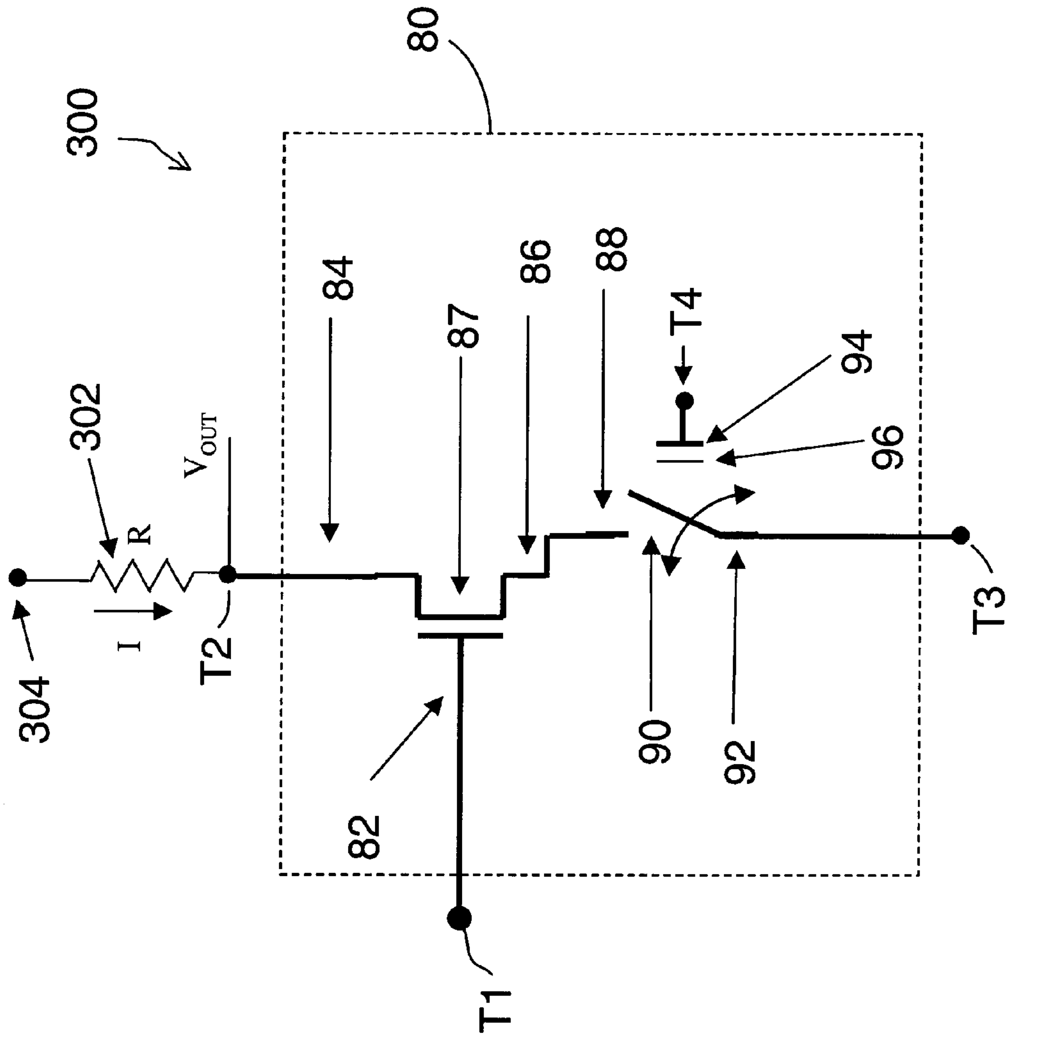
FIGS. 3A–C illustrate the operation of field effect devices with controllable sources for two of the FED configurations.

FIG. 3A illustrates a first FED configuration; field effect device 80 is combined with resistor 302 of value R, such that one terminal of resistor 302 is attached to FED device 80 terminal T2, and the other side of resistor 302 is attached to power supply terminal 304 to form circuit schematic 300. FIG. 3B illustrates circuit schematic 310 in which switch 90 has been activated to position 90' to electrically connect switch-plate 88 with contact 92 as illustrated in FIG. 3B. Controllable source 86 is electrically connected to terminal T3 by means of the established continuous electrical path formed by source 86 connected to switch-plate 88, switch-plate 88 connected to one side of switch 90', the opposite side of switch 90' connected to contact 92, and contact 92 connected to terminal T3.

Figure 3C:
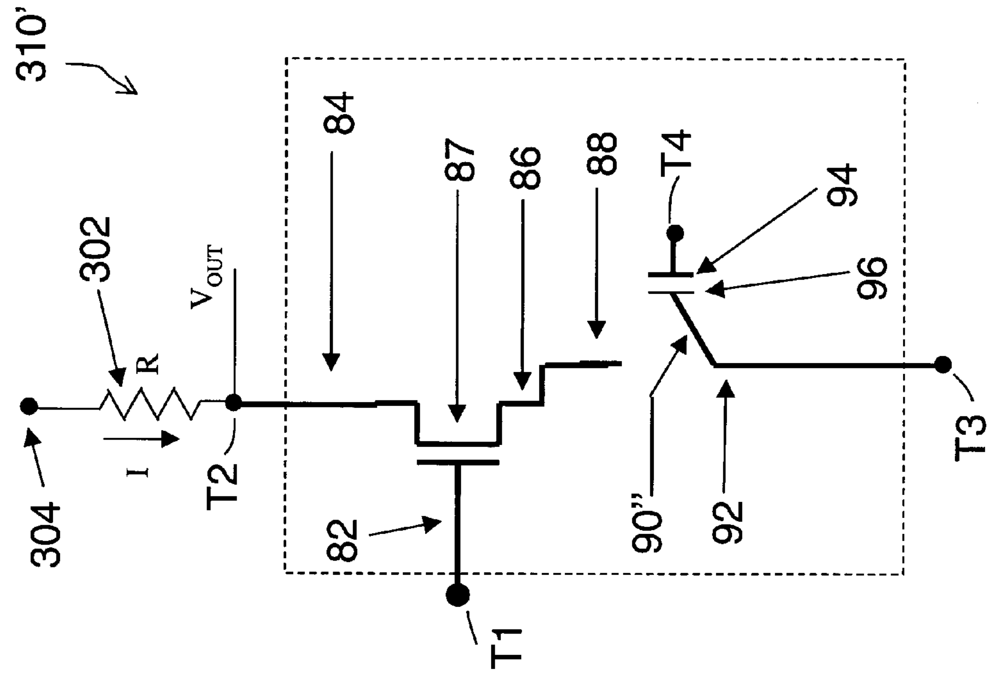
Figure 3B:
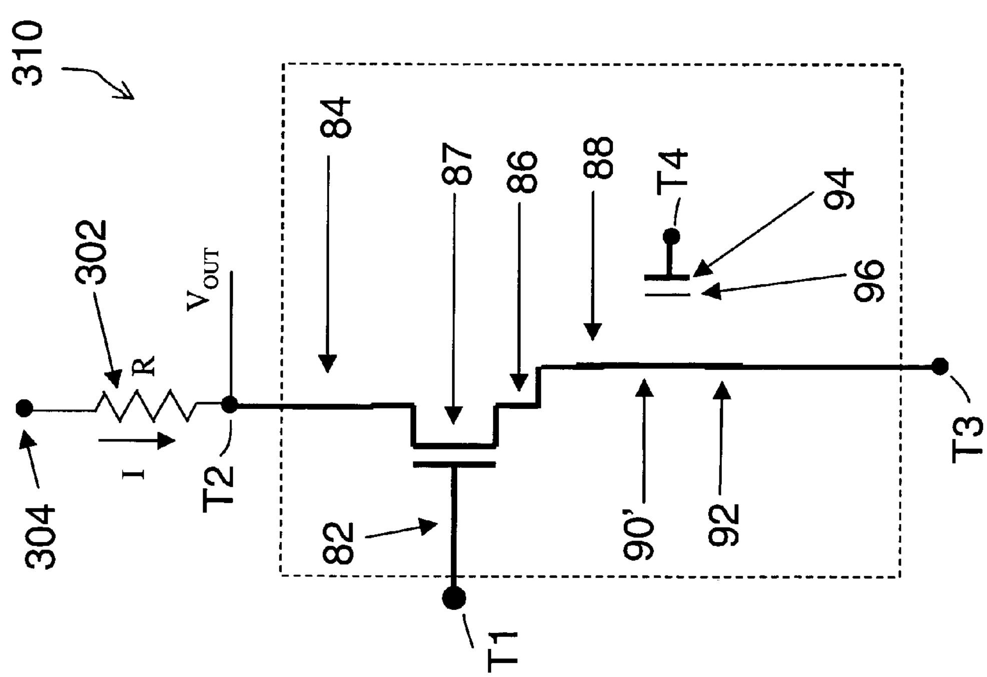

FIG. 3C illustrates circuit schematic 310' in which switch 90 has been activated to position 90" to electrically release-plate dielectric surface 96. Controllable source 86 is an electrically open circuited, and has no continuous electrical path to any FED4 80 device terminals. The mode-setting electrical signals applied to the terminals T1, T2, T3, and T4 of schematics 300, 310, and 310' to cause switch 90 to switch to position 90' or position 90" are illustrated in FIG. 4.

Figure 4:
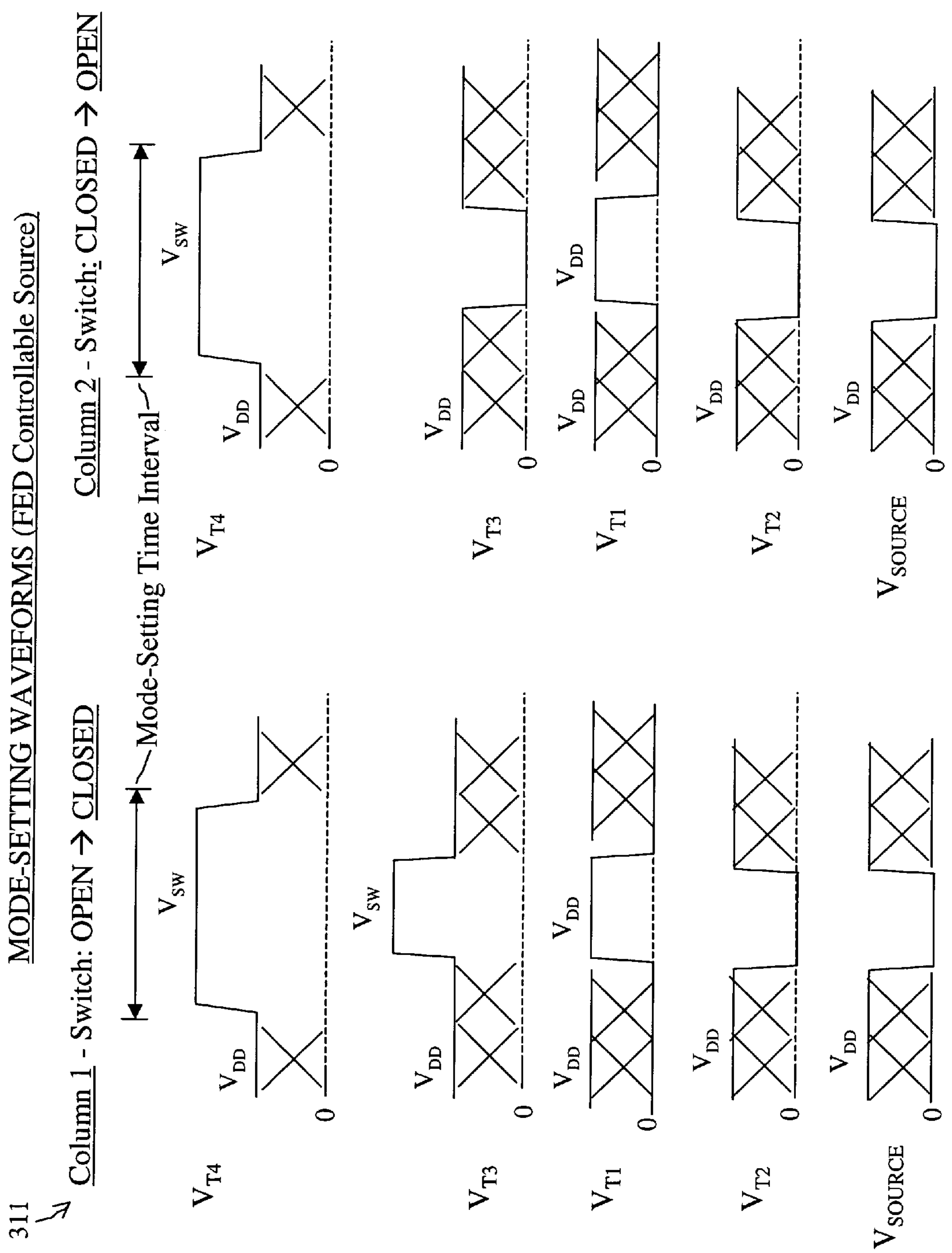
FIGS. 4–6 illustrate waveforms for exemplary operation of devices according to certain aspects of the invention.

FIG. 4 illustrates the operational mode-setting voltage waveforms 311 applied to terminals T1, T2, T3, and T4 to activate switch 90. Control signals are applied to terminals T1–T4 by a control circuit (not shown) using control lines (not shown). There is no electrical signal applied to electrical terminal 304 during mode-setting. Column 1 illustrates the electrical signals used to change switch 90 from position 90", (also referred to as the open (off) position), to position 90', (also referred to as the closed (on) position). Column 2 illustrates the electrical signals used to change switch 90 from position 90', (also referred to as the closed position), to position 90", (also referred to as the open position). The mode-setting waveforms are valid within the mode-setting time interval illustrated under columns 1 and 2 in FIG. 4. Other time intervals contain cross-hatched lines between voltages 0 and $V_{DD}$, indicating that these waveforms can be anywhere within this voltage range, and represent the circuit operating range. $V_{DD}$ is selected to be less than the voltage switching voltage $V_{SW}$ to ensure that switch 90 is not activated (resulting in mode-change) during circuit operation.

Mode-setting is based on electromechanical switching of carbon nanotube (NT) switch using electrostatic forces. The behavior of a NT fabric is similar to that of a single NT, see U.S. Pat. No. 6,643,165, where the electrostatic attractive force is due to oppositely charged surfaces 1 and 2, and where the electrostatic $F_E=K(V_1-V_2)^2/(R_{12})^2$. For an applied voltage, an equilibrium position of the NT, or NT fabric, is defined by the balance of the elastic, electrostatic, and van der Waals forces. As the NT, or NT fabric deflects, the elastic forces change. When the applied potential (voltage) difference between the nanotube and a reference electrode exceeds a certain voltage, the NT or NT fabric becomes unstable and collapses onto the reference electrode. The voltage difference between a NT or NT fabric, and a reference electrode that causes the NT or NT fabric to collapse, may be referred to as the pull-in voltage, or the collapse voltage, or the nanotube threshold voltage $V_{NT-TH}$. The reference electrode may be a switch-plate, or a release-plate, or a release-plate with a dielectric layer. Once the NT or NT fabric is in contact with, or in very close proximity to, the reference electrode (in a region of strong van der Waals force), the electrostatic force $F_E$ may be reduced to zero by removing the voltage difference between NT or NT fabric and the reference electrode. Power may be removed, and the NT or NT fabric remains in contact, and thus stores information in a non-volatile mode.

Column 1 of FIG. 4 illustrates the voltage and timing waveforms applied to terminals T1–T4 of FED4 80 that force a transition of NT switch 90 from position 90", in contact with insulator surface 96 on release-plate 94 as illustrated in FIG. 3C, to position 90', in contact with switch-plate 88 as illustrated in FIG. 3B. Switch 90 transitions from open to closed. Voltage $V_{T4}$, applied to terminal T4, transitions to switching voltage $V_{SW}$. Voltage $V_{T2}$ applied to terminal T2 transitions to zero (0) volts. $V_{T3}$ applied to terminal T3 transitions to switching voltage $V_{SW}$. Terminal T1 (connected to gate 82) transitions from zero to $V_{DD}$ forming a channel in channel region 87, thereby driving controllable source 86 voltage $V_{SOURCE}$ to zero. The electrostatic force between switch 90 in position 90" and release-plate 94 is zero. The electrostatic force between switch 90 in position 90" and switch-plate 88 is $F_E=K(V_{SW})^2/(R_{12})^2$, where $R_{12}$ is the gap separating switch 90 from switch-plate 88. Typical $V_{NT-TH}$ voltages may range from 2 to 3 volts, for example, any appropriate potential difference however, is within the scope of the invention. $V_{NT-TH}$ is a function of the suspended length of NT switch 90 and the gap (separation) between NT switch 90 and the switch-plate and release-plate electrodes. Typical NT switch suspended length is 130 to 180 nm, with gaps of 10 to 20 nm, for example, but other geometries are possible so long as the switching properties work appropriately.

Column 2 of FIG. 4 illustrates the voltage and timing waveforms applied to terminals T1–T4 of FED4 80 that force a transition of NT switch 90 from position 90', in contact with switch-plate 88 as illustrated in FIG. 3B, to position 90", in contact with release-plate dielectric surface 96 on release-plate 94 as illustrated in FIG. 3C. Switch 90 transitions from closed to open. Voltage $V_{T4}$, applied to terminal T4, transitions to switching voltage $V_{SW}$. Voltage $V_{T2}$ applied to terminal T2 transitions to zero (0) volts. $V_{T3}$ applied to terminal T3 transitions to zero volts. Terminal T1 (connected to gate 82) transitions from zero to $V_{DD}$ forming a channel in channel region 87, thereby driving controllable source 86 voltage $V_{SOURCE}$ to zero. The electrostatic force between switch 90 in position 90' and switch-plate 88 is zero. The electrostatic force between switch 90 in position 90' and release-plate 94 is $F_E=K(V_{SW})^2/(R_{12})^2$, where $R_{12}$ is the gap separating switch 90 from release-plate 94. Typical $V_{NT-TH}$ voltages may range from 2 to 3 volts, for example. The threshold voltage for switch 90 transitions between open and closed, and closed and open positions may be different, without effecting the operation of the device. If $V_{SW}$ exceeds $V_{NT-TH}$, then mode-setting will take place. Circuit operating voltages range from 0 to $V_{DD}$. In order to avoid unwanted mode-setting during circuit operation, $V_{DD}$ is less than $V_{NT-TH}$.

Figure 5:
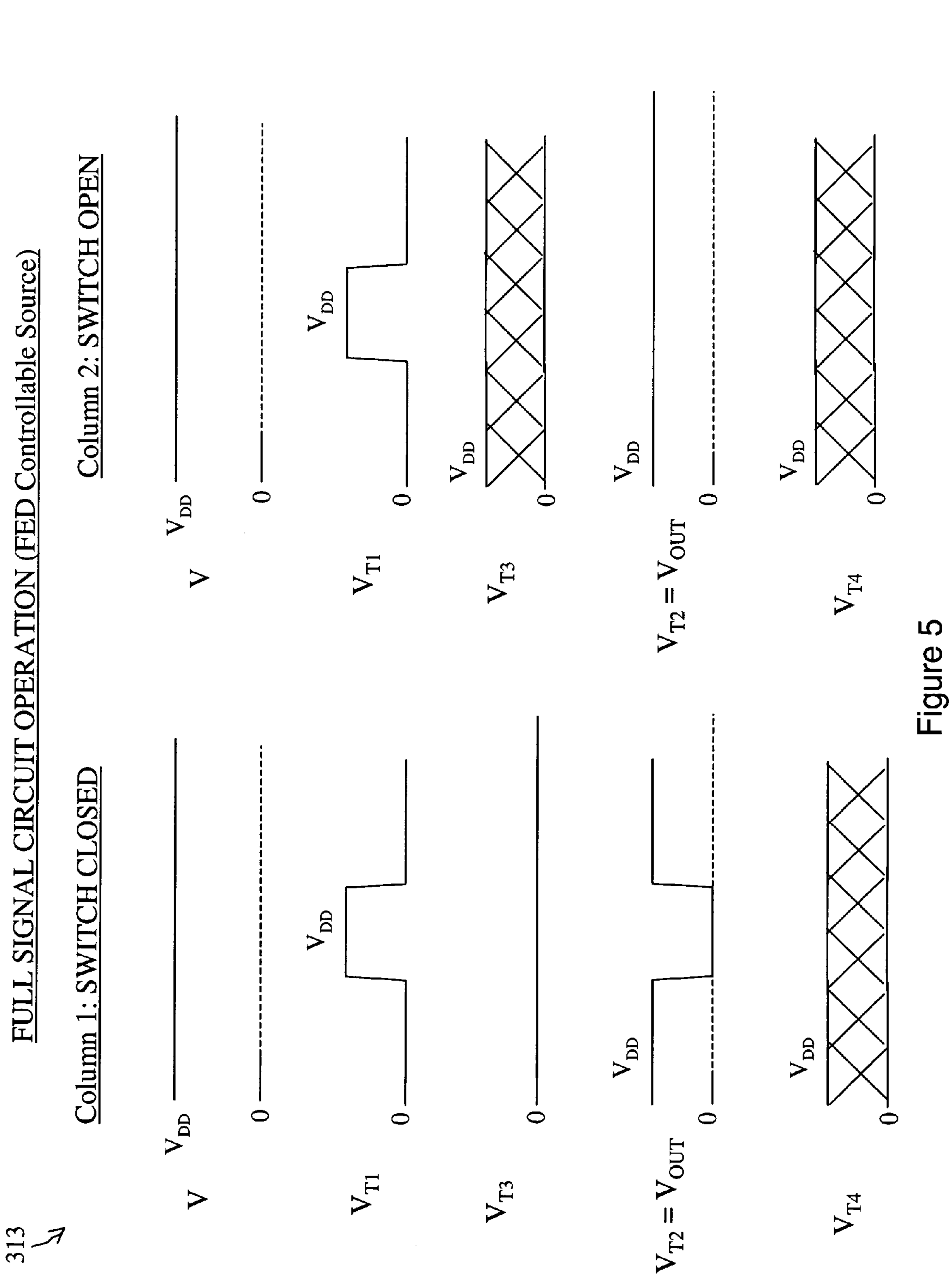

FIG. 5 illustrates the full signal (voltage) swing waveform 313 operation of circuit 300, with waveforms applied to terminals T1, T2, T3, and T4. Column 1 illustrates the electrical signals applied to terminal T1–T4 for circuit schematic 310 when switch 90 is in the closed position 90' as illustrated in FIG. 3B. Column 2 illustrates the electrical signals applied to terminals T1–T4 for circuit schematic 310' when switch 90 is in the open position 90" as illustrated in FIG. 3C. Circuit schematic 310 illustrates the FED used in a simple inverter configuration with load resistor 302 of value R connected to voltage terminal 304 at voltage $V=V_{DD}$. For $V_{NT-TH}$ in the 2 to 3 volt range, for example, $V_{DD}$ is selected as less than 2 volts, 1.0 to 1.8 volts, for example. The operation of circuit 310 is as illustrated in FIG. 5, column 1. With switch 90 in the 90' position, the voltage $V_{T4}$ on terminal T4 can be any value. Voltage $V_{T3}$ applied to terminal T3 is set to zero volts. A pulse $V_{T1}$ of amplitude $V_{DD}$ is applied to terminal T1. When $V_{T1}=0$, no FET conductive path is activated, the electrical path between terminals T2 and T3 of FED4 80 is open, current I=0, and $V_{OUT}=V_{DD}$. When $V_{T1}=V_{DD}$, FET 80 channel of resistance $R_{FET}$ is formed, in series with $R_{SWITCH}$ of switch 90', connecting terminals T2 and T3. The resistance of FED4 80 between terminals T2 and T3 is $R_{FED}=R_{FET}+R_{SWITCH}$. $R_{FET}$ is the FET channel resistance, and $R_{SWITCH}$ is the resistance of NT switch 90'. $R_{SWITCH}$ includes the resistance between switch-plate 88 and NT 90', the NT 90' resistance (typically much less than the contact resistances), and the contact resistance between contact 92 and NT 90'. $R_{FET}$ is determined by the FET electrical parameters and the width to length ratio used in the FET design (Reference: Baker et al., "CMOS Circuit Design, Layout, and Simulation", IEEE Press, 1998, Chapter 5 "the MOSFET", pages 83–106). By selecting W/L ratio values, $R_{FET}$ may range from less than 10 Ohms to more than 10,000 Ohms. The quantum contact resistance between metal electrodes and the NT fabric varies as a function of the fabric density (number of NTs per unit area) and the width of the contact. The contact resistance per fiber may vary from less than 100 Ohms to more than 100,000 Ohms. When $V_{T1}=V_{DD}$, current $I=V_{DD}/(R+R_{FED})$, and $V_{T2}=V_{OUT}=V_{DD}\times(R_{FED})/(R+R_{FED})$. If $R_{FED}<<R$, then $V_{T2}=V_{OUT}\approx 0$ volts, illustrated in FIG. 5, column 1.

Circuit schematic 310' illustrates FED4 80 used in a simple inverter configuration with load resistor 302 of value R connected to voltage terminal 304 at voltage $V=V_{DD}$. The full signal (voltage) swing operation of circuit 310' is as illustrated in FIG. 5, column 2. With switch 90 in position 90", the FED electrical path between terminals T2 and T3 is open, terminal T4 is insulated, therefore current I=0, and $V_{T2}=V_{OUT}=V_{DD}$ for all applied voltages.

Figure 6:
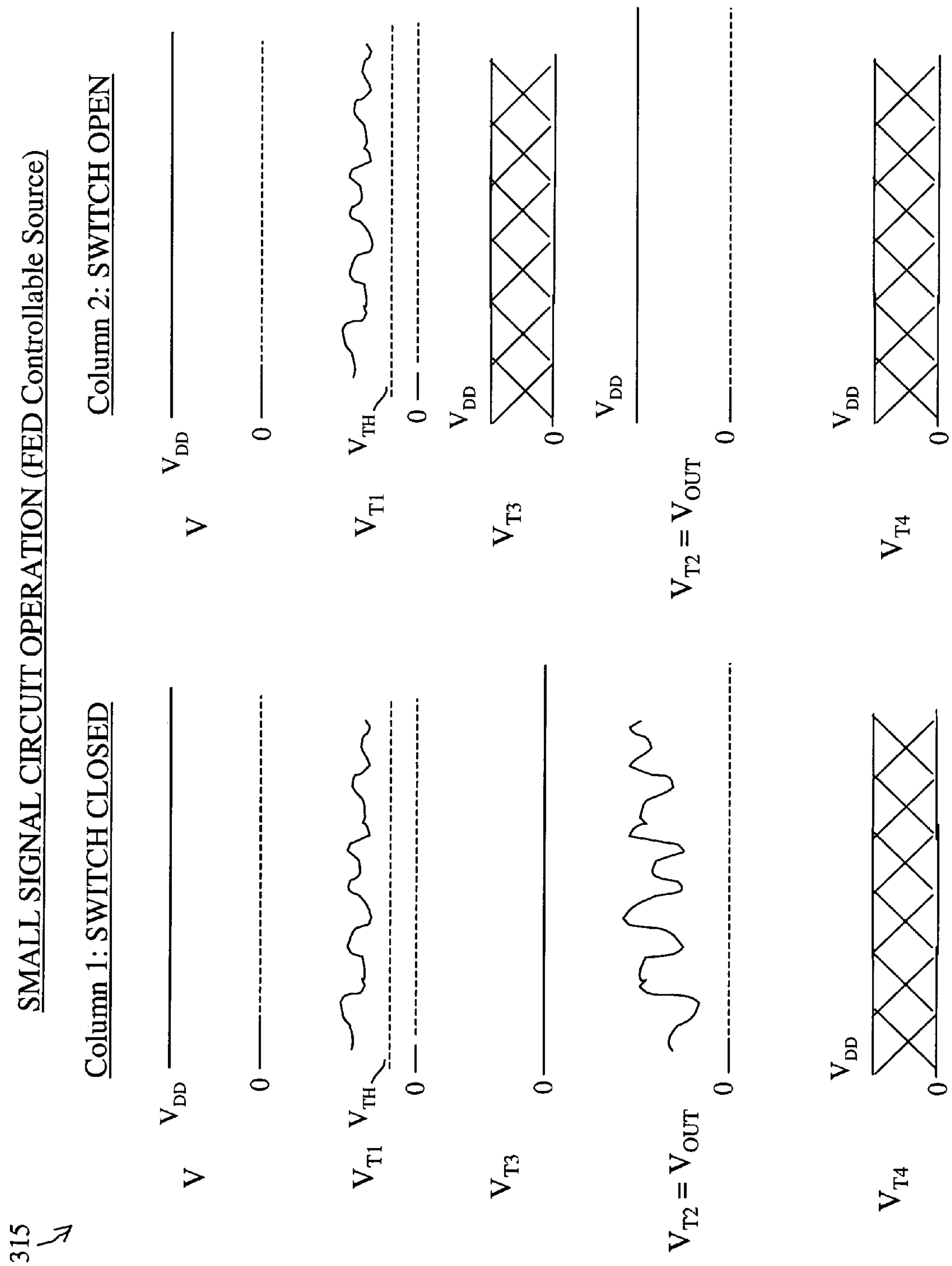

FIG. 6 illustrates the small signal (voltage) swing waveforms 315 operation of circuit 300, with waveforms applied to terminals T1, T2, T3, and T4. Column 1 illustrates the electrical signals applied to terminal T1–T4 for circuit schematic 310 when switch 90 is in the closed position 90' as illustrated in FIG. 3B. Circuit schematic 310 illustrates the FED used in a simple inverter configuration with load resistor 302 of value R connected to voltage terminal 304 at voltage $V=V_{DD}$. For $V_{NT-TH}$ in the 2 to 3 volt range, for example, $V_{DD}$ is selected as less than 2 volts, 1.0 to 1.8 volts, for example. The operation of circuit 310 for small signal (analog) amplification is as illustrated in FIG. 5, column 1.

With switch 90 in position 90', the voltage $V_{T4}$ on terminal T4 can be any value. Voltage $V_{T3}$ applied to terminal T3 is set to zero volts. A signal $V_{T1}$ of with amplitude exceeding FET threshold voltage $V_{FET-TH}$ ($V_{FET-TH}$=0.3–0.7 volts, for example) is applied to terminal T1. Since $V_{T1}>V_{FET-TH}$, a path between terminals T2 and T3 is maintained. If $R_{SWITCH}$ is less than $R_{FET}$, then the output $V_{T2}=V_{OUT}$ of circuit 310 inverts the input signal and exhibits gain as illustrated in FIG. 6, column 1. Circuit gain can be calculated as described in Baker et al., "CMOS Circuit Design, Layout, and Simulation", IEEE Press, 1998, Chapter 9 "the MOSFET", pages 165–181.

Circuit schematic 310' illustrates FED4 80 used in a simple inverter configuration with load resistor 302 of value R connected to voltage terminal 304 at voltage $V=V_{DD}$. The small signal (voltage) swing operation of circuit 310' is as illustrated in FIG. 6, column 2. With switch 90 in position 90", the FED electrical path between terminals T2 and T3 is open, terminal T4 is insulated, therefore current I=0, and $V_{T2}=V_{OUT}=V_{DD}$ for all applied voltages.

Figure 7A:
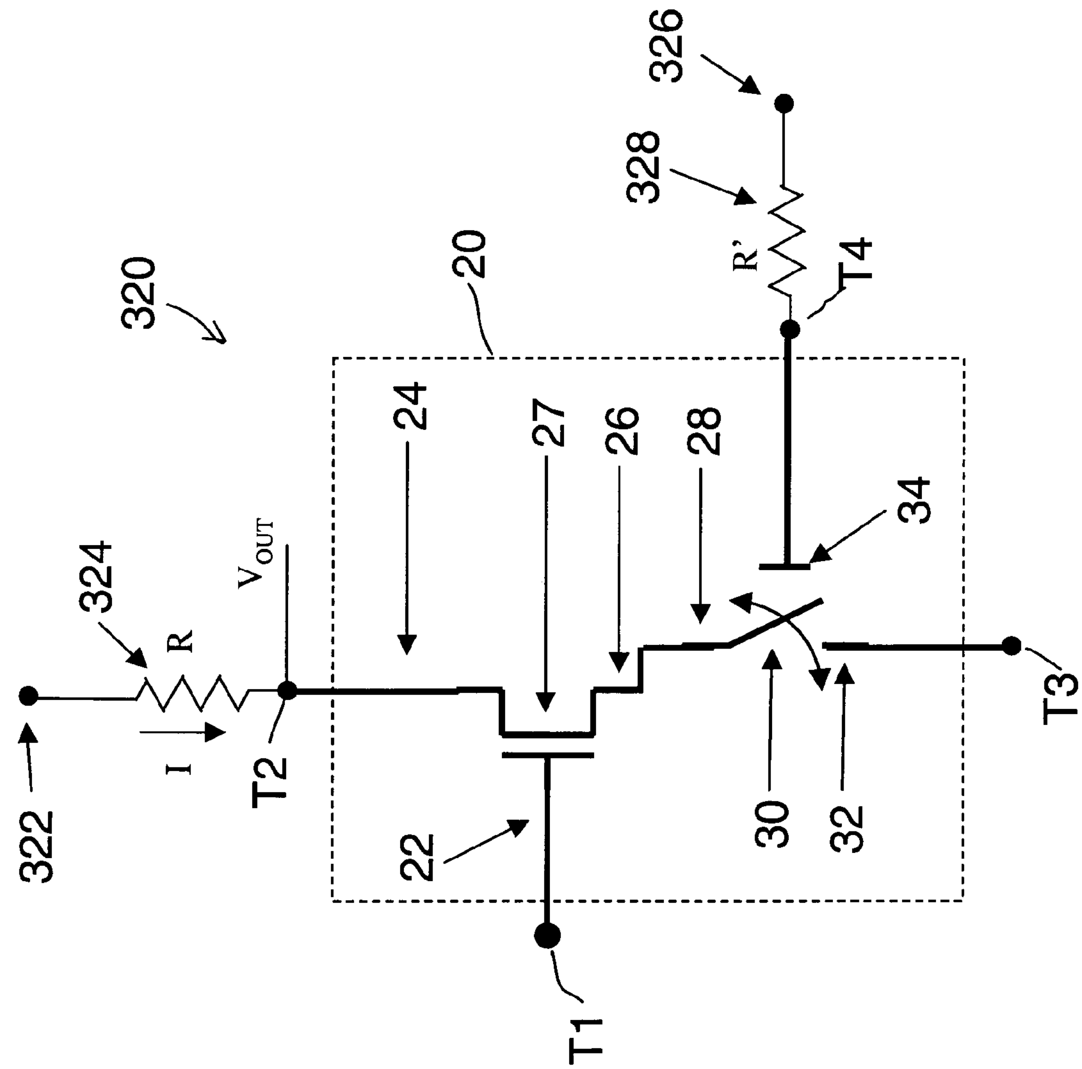
FIGS. 7A–C illustrate the operation of field effect devices according to certain aspects of the invention.

In the second FED configuration, field effect device 20 is combined with first resistor 324 of value R, such that one terminal of resistor 324 is attached to FED device 20 terminal T2, and the other side of resistor 324 is attached to power supply terminal 322 as illustrated in FIG. 7A. A second resistor 328 of value R' is attached to FED device 20 terminal T4, and the other side of resistor 328 is attached to power supply 326 to form the circuit schematic illustrated in FIG. 7A. Such configurations are exemplary and other working configurations are within the scope of the invention.

Figure 7C:
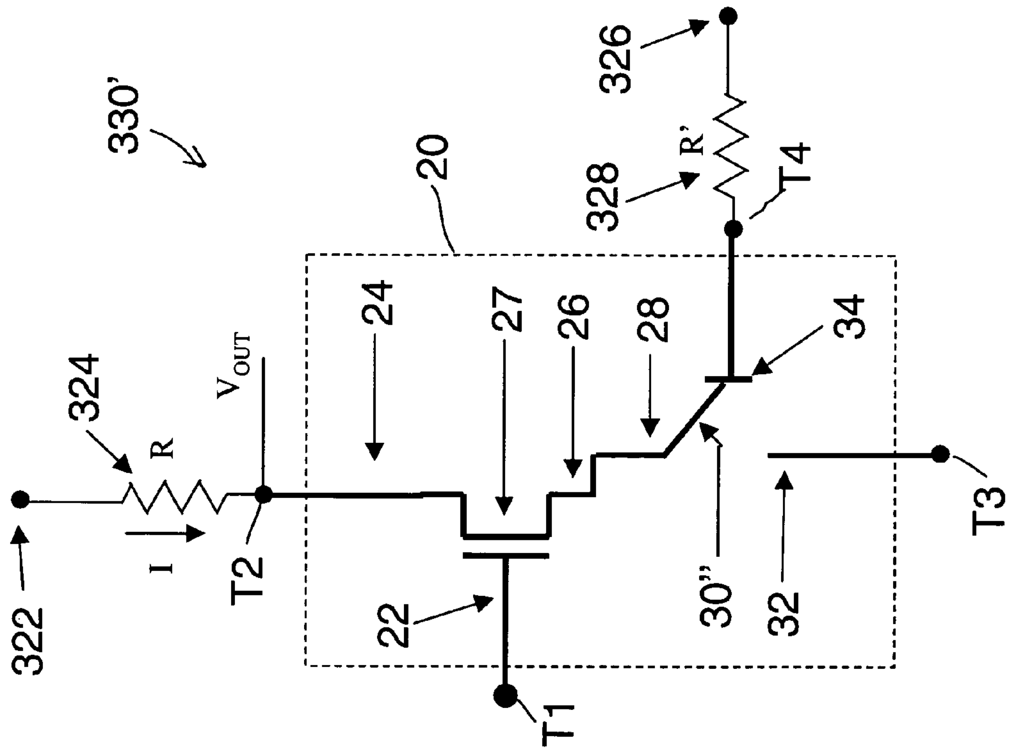
Figure 7B:
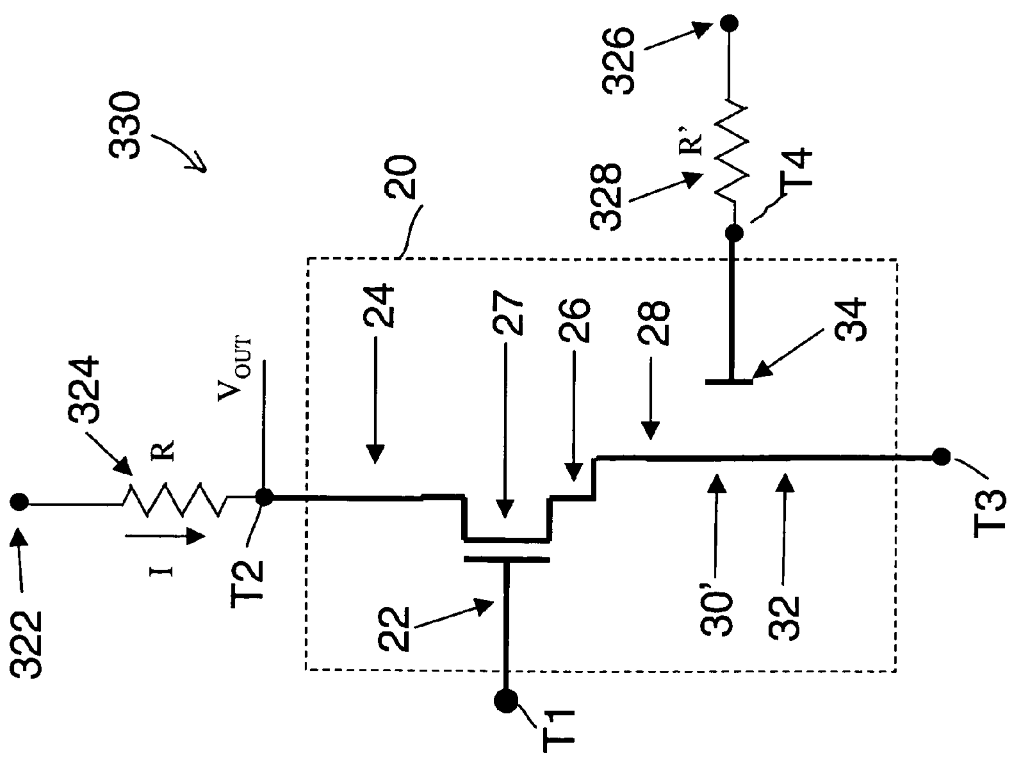

FIG. 7B illustrates a schematic of circuit 330 in which switch 30 has been activated to first position 30' to electrically connect contact 28 to switch-plate 32. Controllable source 26 is electrically connected to terminal T3 by means of the established continuous electrical path formed by source 26 connected to contact 28; contact 28 connected to one side of switch 30'; the opposite side of switch 30' connected to switch-plate 32; switch-plate 32 connected to terminal T3. FIG. 7C illustrates a schematic of circuit 330' in which switch 30 has been activated to second position 30" and contacts release-plate 34. Controllable source 26 is electrically connected to FED1 20 device terminal T4. The mode-setting electrical signals applied to the terminals T1, T2, T3, and T4 of schematics 320, 330, and 330' that cause switch 30 to switch to first position 30' or second position 30" are illustrated in FIG. 8.

Figure 8:
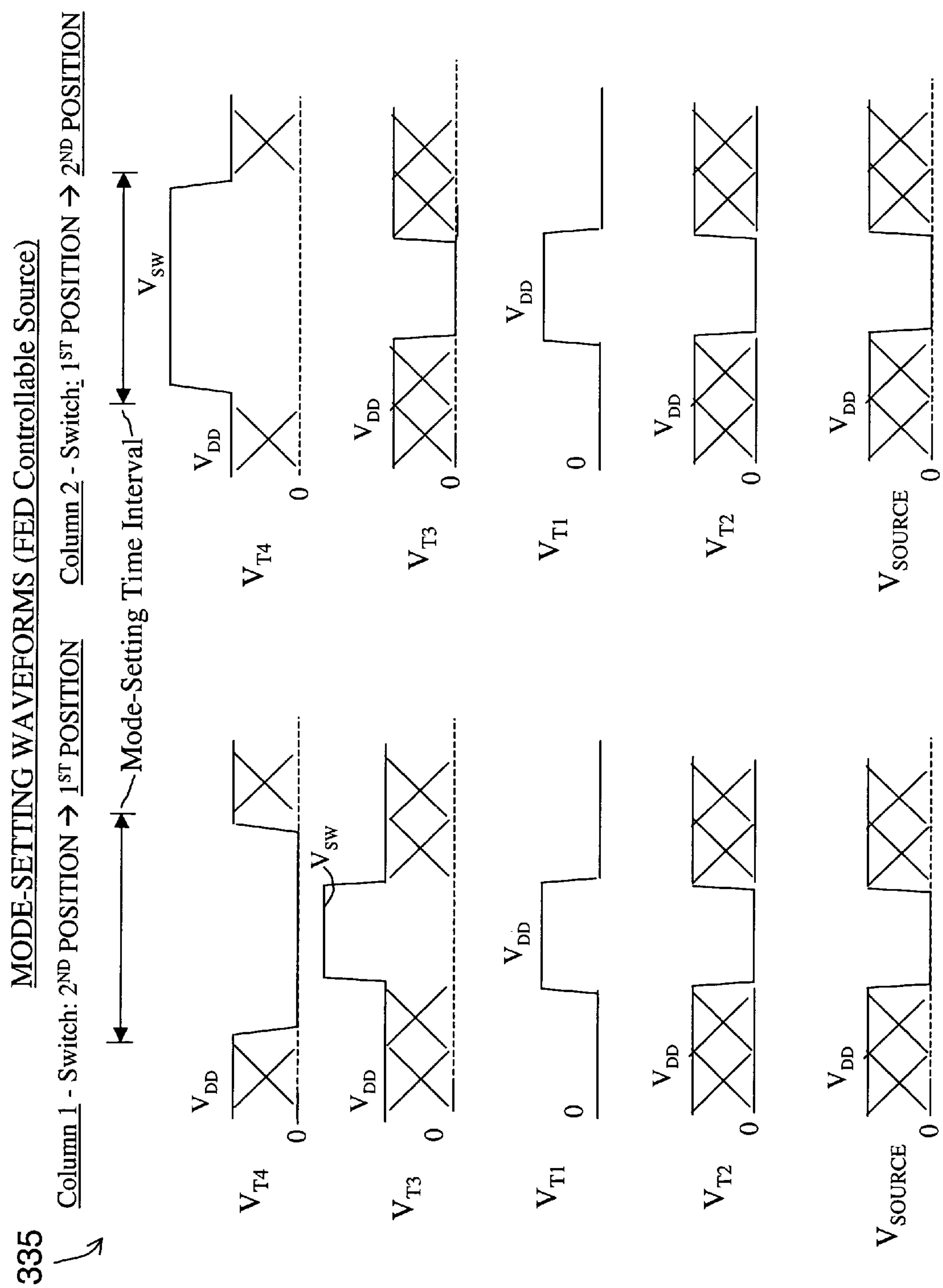
FIGS. 8 and 9 illustrate waveforms for exemplary operation of devices according to certain aspects of the invention.

FIG. 8 illustrates the operational mode-setting waveforms 335 applied to terminals T1, T2, T3, and T4 to activate switch 30. Control signals are applied to terminals T1–T4 by a control circuit (not shown) using control lines (not shown). There is no electrical signal applied to electrical terminals 322 and 326 during mode-setting. Column 1 illustrates the electrical signals used to change switch 30 from position 30", also referred to as the second position, to position 30', also referred to as the first position. Column 2 illustrates the electrical signals used to change switch 30 from position 30', also referred to as the first position, to position 30", also referred to as the second position. The mode-setting waveforms are valid within the mode-setting time interval illustrated under columns 1 and 2 in FIG. 8. Other time intervals contain cross-hatched lines between voltages 0 and $V_{DD}$, indicating that these waveforms can be anywhere within this voltage range, and represent the circuit operating range. $V_{DD}$ is selected to be less than the voltage switching voltage $V_{SW}$ to ensure that switch 30 is not activated (resulting in mode-resetting) during circuit operation.

Mode-setting is based on electromechanical switching of carbon nanotube (NT) switch using electrostatic forces. The behavior of a NT fabric is similar to that of a single NT, as stated above, where the electrostatic attractive force is due to oppositely charged surfaces. Column 1 of FIG. 8 illustrates the voltage and timing waveforms applied to terminals T1–T4 of FED1 20 that force a transition of NT switch 30 from second position 30", in contact with release-plate 94 as illustrated in FIG. 7C, to first position 30', in contact with switch-plate 32 as illustrated in FIG. 7B. Voltage $V_{T4}$, applied to terminal T4, transitions to zero volts. Voltage $V_{T2}$ applied to terminal T2 transitions to zero (0) volts. $V_{T3}$ applied to terminal T3 transitions to switching voltage $V_{SW}$. Terminal T1 (connected to gate 22) transitions from zero to $V_{DD}$ forming a channel in channel region 27, thereby driving controllable source 26 voltage $V_{SOURCE}$ to zero. The electrostatic force between switch 30 in position 30" and release-plate 34 is zero. The electrostatic force between switch 30 in position 30" and switch-plate 32 is $F_E=K(V_{SW})^2/(R_{12})^2$, where $R_{12}$ is the gap separating switch 30 from switch-plate 32. Typical $V_{NT-TH}$ voltages may range from 2 to 3 volts, for example. Typical NT switch suspended length is 130 to 180 nm, with gaps of 10 to 20 nm, for example.

Column 2 of FIG. 8 illustrates the voltage and timing waveforms applied to terminals T1–T4 of FED 20 that force a transition of NT switch 30 from first position 30', in contact with switch-plate 32 as illustrated in FIG. 7B, to second position 30", in contact with release-plate 34 as illustrated in FIG. 7C. Voltage $V_{T4}$, applied to terminal T4, transitions to switching voltage $V_{SW}$. Voltage $V_{T2}$ applied to terminal T2 transitions to zero (0) volts. $V_{T3}$ applied to terminal T3 transitions to zero volts, terminal T1 (connected to gate 22) transitions from zero to $V_{DD}$ forming a channel in channel region 27, thereby driving controllable source 26 voltage $V_{SOURCE}$ to zero. The electrostatic force between switch 30 in position 30' and switch-plate 28 is zero. The electrostatic force between switch 30 in position 30' and release-plate 34 is $F_E=K(V_{SW})^2/(R_{12})^2$, where $R_{12}$ is the gap separating switch 30 from release-plate 34. Typical $V_{NT-TH}$ voltages may range from 2 to 3 volts, for example. The threshold voltage for switch 30 transitions between second and first, and first and second positions may be different, without effecting the operation of the device. If $V_{SW}$ exceeds $V_{NT-TH}$, then mode-setting will take place. Circuit operating voltages range from 0 to $V_{DD}$. In order to avoid unwanted mode-setting during circuit operation, $V_{DD}$ is less than $V_{NT-TH}$.

Figure 9:
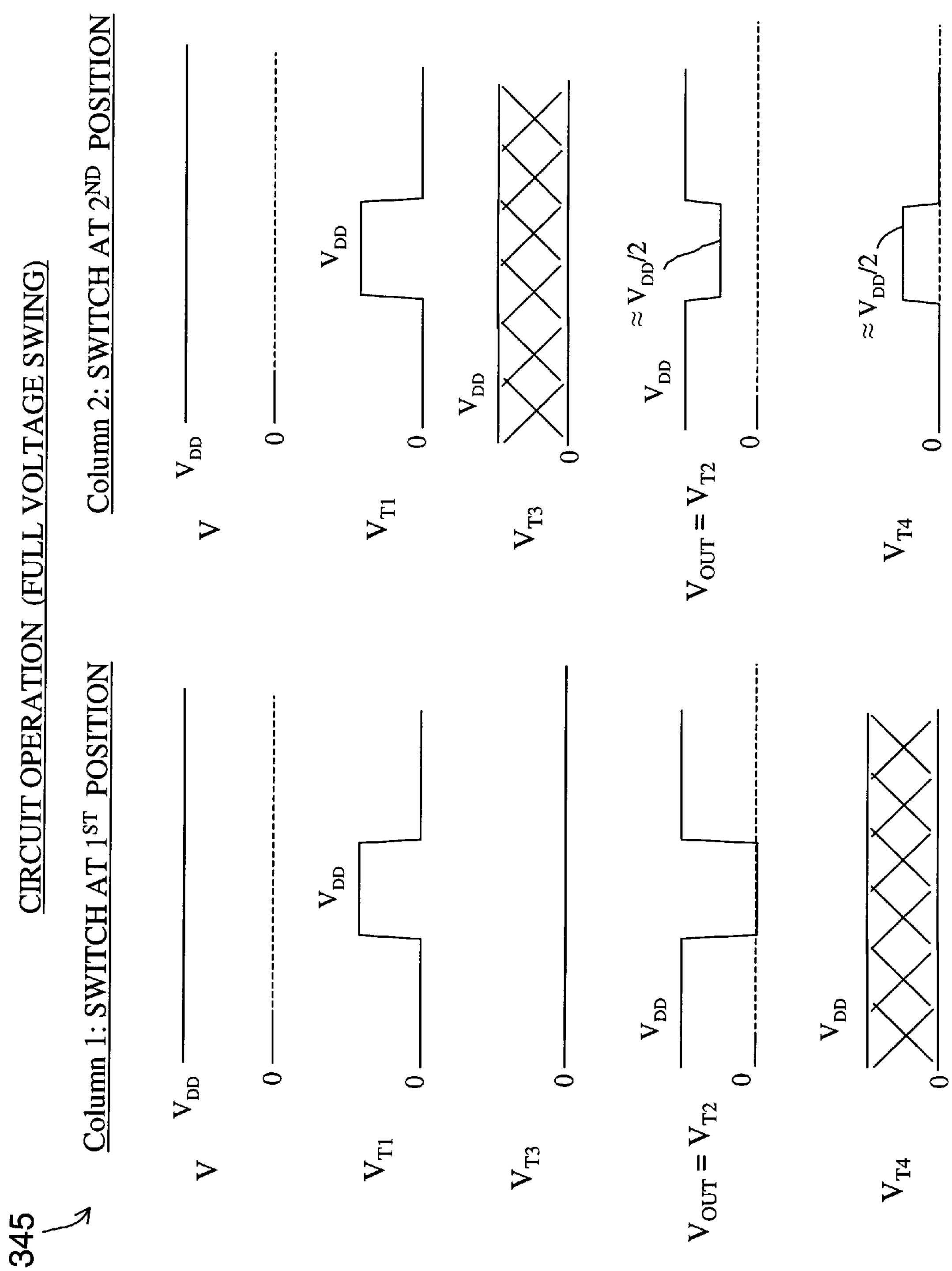

FIG. 9 illustrates the full signal (voltage) swing waveforms 345 operation of circuit 320, with waveforms applied to terminals T1, T2, T3, and T4. Column 1 illustrates the electrical signals applied to terminal T1–T4 for circuit 330 when switch 30 is in the first position 30' as illustrated in FIG. 7B. Column 2 illustrates the electrical signals applied to terminals T1–T4 for circuit 330' when switch 30 is in the second position 30" as illustrated in FIG. 7C. Circuit 330 illustrates a FED used in a simple inverter configuration with load resistor 324 of value R connected to voltage terminal 322 at voltage $V=V_{DD}$. For $V_{NT-TH}$ in the 2 to 3 volt range, for example, $V_{DD}$ is selected as less than 2 volts, 1.0 to 1.8 volts, for example. The operation of circuit 330 is as illustrated in FIG. 9, column 1. With switch 30 in the 30' position, the voltage $V_{T4}$ on terminal T4 can be any value. Voltage $V_{T3}$ applied to terminal T3 is set to zero volts. A pulse $V_{T1}$ of amplitude $V_{DD}$ is applied to terminal T1. When $V_{T1}=0$, no FET conductive path is activated, the electrical path between terminals T2 and T3 of FED 20 is open, current I=0, and $V_{T2}=V_{OUT}=V_{DD}$. When $V_{T1}=V_{DD}$, FET channel 27 of resistance $R_{FET}$ is formed, in series with $R_{SWITCH}$ of switch 30', connecting terminals T2 and T3. The resistance of FED 20 between terminals T2 and T3 is $R_{FED}=R_{FET}+^{RSW}{}_{ITCH}$. $R_{FET}$ is the FET channel resistance, and $R_{SWITCH}$ is the resistance of NT switch 30'. $R_{SWITCH}$ includes the resistance between contact 28 and NT 30', the NT 30' resistance (typically much less than the contact resistances), and the resistance between switch-plate 32 and NT 30'. $R_{FET}$ is determined by the FET electrical parameters and the width to length ratio used in the FET design (Reference: Baker et al., "CMOS Circuit Design, Layout, and Simulation", IEEE Press, 1998, Chapter 5 "the MOSFET", pages 83–106). By selecting W/L ratio values, $R_{FET}$ may range from less than 10 Ohms to more than 10,000 Ohms. The quantum contact resistance between metal electrodes and the NT fabric varies as a function of the fabric density (number of NTs per unit area) and the width of the contact. The contact resistance may vary from less than 100 Ohms to more than 100,000 Ohms. When $V_{T1}=V_{DD}$, current $I=V_{DD}/(R+R_{FED})$, and $V_{T2}=V_{OUT}=V_{DD}\times(R_{FED})/(R+R_{FED})$. If $R_{FED}<<R$, then $V_{T2}=V_{OUT}\approx 0$ volts, illustrated in FIG. 9, column 1.

The schematic of circuit 330' illustrates a FED used in a more complex circuit configuration with load resistor 324 of value R connected to voltage terminal 322 at voltage $V=V_{DD}$, and resistor 328 of value R' connected to voltage terminal 326 at voltage zero. For $V_{NT-TH}$ in the 2 to 3 volt range, for example, $V_{DD}$ is selected as less than 2 volts, 1.0 to 1.8 volts, for example. The operation of circuit 330' is as illustrated in FIG. 9, column 2. With switch 30 in the 30' position, the voltage $V_{T3}$ on terminal T3 can be any value. A pulse $V_{T1}$ of amplitude $V_{DD}$ is applied to terminal T1. When $V_{T1}=0$, no FET conductive path is activated, the electrical path between terminals T2 and T4 of FED1 20 is open, current I=0, and $V_{T2}=V_{OUT}=V_{DD}$, and $V_{T4}=0$. When $V_{T1}=V_{DD}$, FET channel 27 of resistance $R_{FET}$ is formed, in series with $R_{SWITCH}$ of switch 30", connecting terminals T2 and T4. The resistance of FED 20 between terminals T2 and T4 is $R_{FED}=R_{FET}+R_{SWITCH}$. $R_{FET}$ is the FET channel resistance, and $R_{SWITCH}$ is the resistance of NT switch 30". $R_{SWITCH}$ includes the resistance between contact 28 and NT 30", the NT 30" resistance (usually much less than the contact resistances), and the resistance between release-plate 34 and NT 30". $R_{FET}$ is determined by the FET electrical parameters and the width to length ratio used in the FET design. By selecting W/L ratio values, $R_{FET}$ may range from less than 10 Ohms to more than 10,000 Ohms. The quantum contact resistance between metal electrodes and the NT fabric varies as a function of the fabric density (number of NTs per unit area) and the width of the contact. The contact resistance may vary from less than 100 Ohms to more than 100,000 Ohms When $V_{T1}=V_{DD}$, current $I=V_{DD}/(R+R'+R_{FED})$, $V_{T2}=V_{OUT}=V_{DD}\times(R'+R_{FED})/(R+R'+R_{FED})$, and $V_{T4}=V_{DD}\times(R')/(R+R'+R_{FED})$. If $R_{FED}<<R$, and R'=R, then $V_{T2}=V_{OUT}=V_{DD}/2$, and $V_{T4}=V_{DD}/2$, as illustrated in FIG. 9, column 2.

In the example of the operation of circuit 320 (FIG. 7A), circuit operation for two switch-mode settings were described, one for switch 30 in first position 30' as illustrated in FIG. 7B, and the other for switch 30 in the second position 30" as illustrated in FIG. 7C. The voltages on FED terminals T2 and T4 varied as a function of the switch-mode settings. FED1 20 may also be used in other applications. For example, a first network may be connected to terminal T2, a second network may be connected to terminal T3, and a third network may be connected to terminal T4. When FED1 20 switch 30 is in the first position 30' (FIG. 7B), a first network connected to terminal T2 is connected to a second network connected to terminal T3. When FED1 20 switch 30 is in the second position 30", a first network connected to terminal T2 is connected to a third network connected to terminal T4. Thus, in this application, FED1 20 is used to route signals from a first network to a second network, or instead, to a third network. The network configuration remains in place even if power is turned off because FED1 20 is a non-volatile device.

Operation of Field Effect Devices with Controllable Drains

Four schematics of field effect devices (FEDs) with controllable drains have been described (FIGS. 2E–H). FIGS. 10A–12 illustrates the operation of field effect devices with controllable drains for one of the FED configurations, FED8 device 160 (FIG. 2H). As stated above, FED devices with controllable drains are also referred to as NT-on-Drain devices. A switch-mode setting operation is described, followed by an example of full voltage swing circuit operation (digital switching).

Figure 10A:
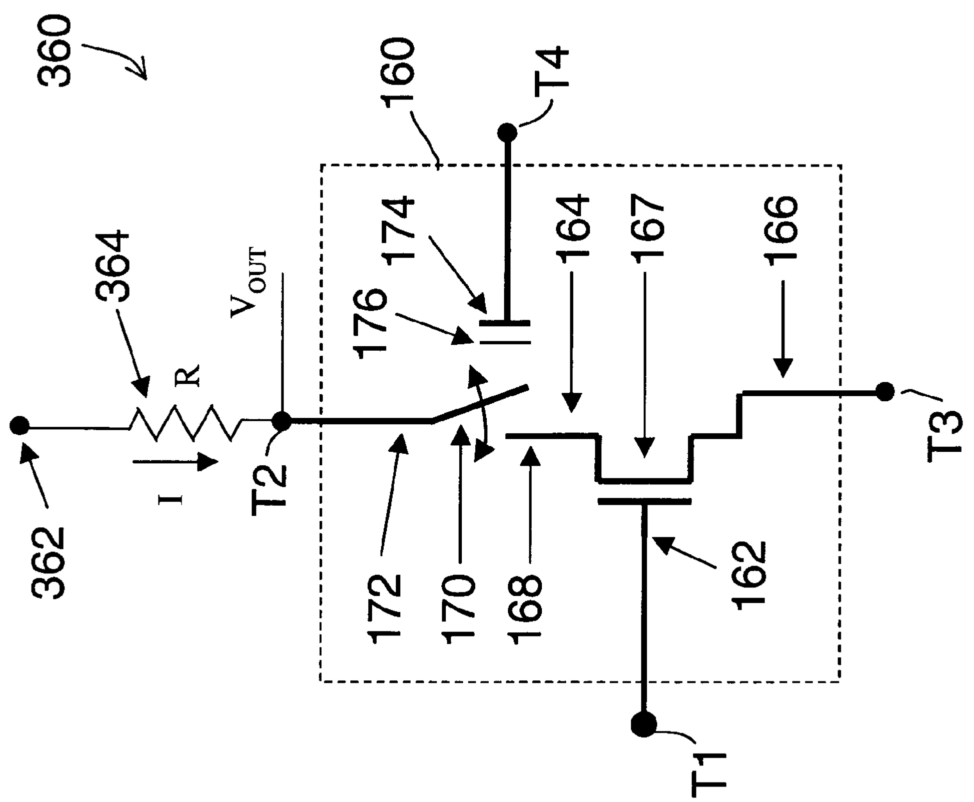
FIGS. 10A–12 illustrate the operational waveforms for field effect devices according to certain aspects of the invention.

Field effect device FED8 160 is combined with resistor 364 of value R, such that one terminal of resistor 364 is attached to FED8 device 160 terminal T2, and the other side of resistor 364 is attached to power supply terminal 362 to form circuit schematic 360 as illustrated in FIG. 10A.

Figure 10C:
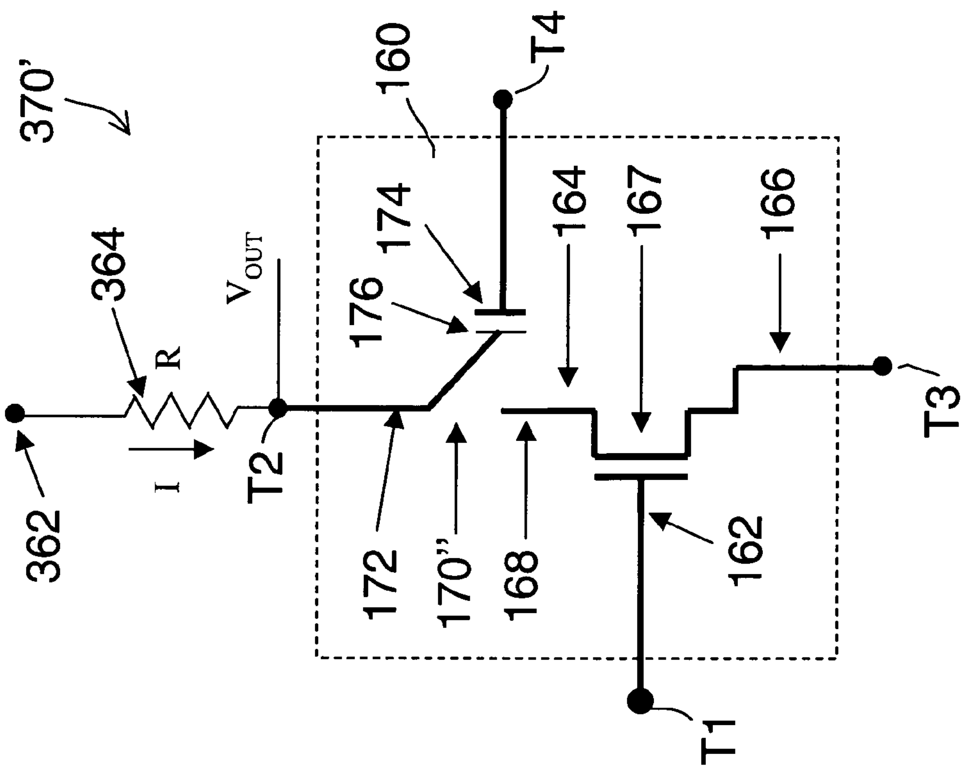
Figure 10B:
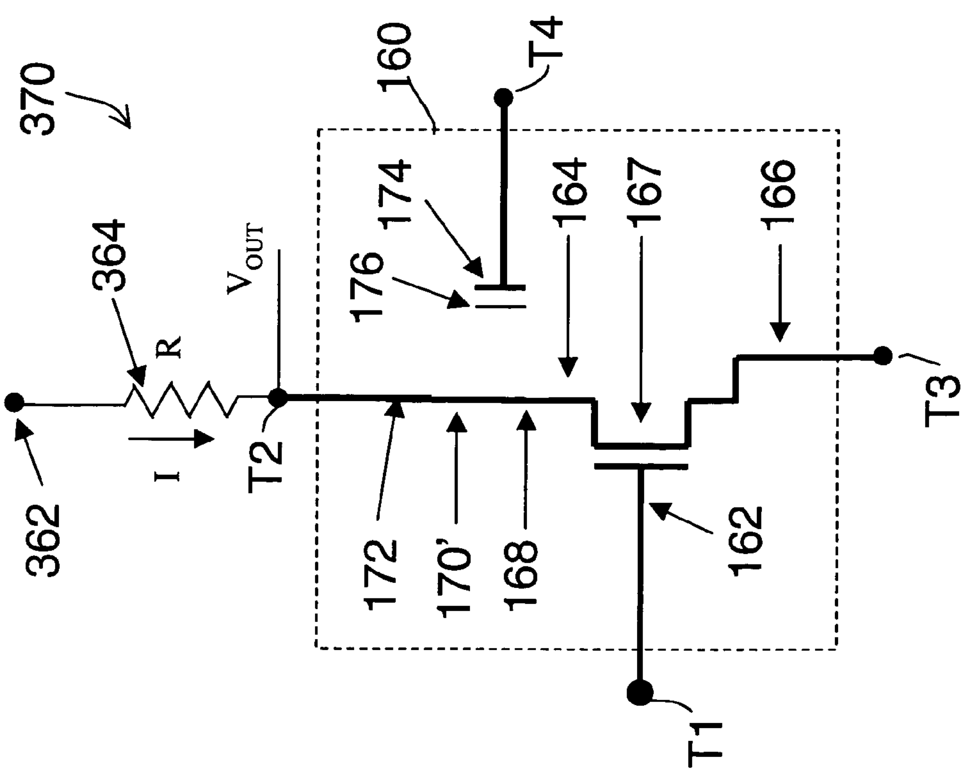

FIG. 10B illustrates circuit schematic 370 in which switch 170 has been activated to position 170' to electrically connect switch-plate 168 to contact 172. Controllable drain 164 is electrically connected to terminal T2 by means of the established continuous electrical path formed by drain 164 connected to switch-plate 168; switch-plate 168 connected to one side of switch 170'; the opposite side of switch 170' connected to contact 172; contact 172 connected to terminal T2.

FIG. 10C illustrates circuit schematic 370' in which switch 170 has been activated to position 170" to contact release-plate dielectric surface 176. Controllable drain 164 is electrically open circuited, and has no continuous electrical path to any terminals of FED8 160 device. The mode-setting electrical signals applied to the terminals T1, T2, T3, and T4 of schematics 360, 370, and 370' to cause switch 170 to switch to position 170' or position 170" are illustrated in FIG. 11.

Figure 11:
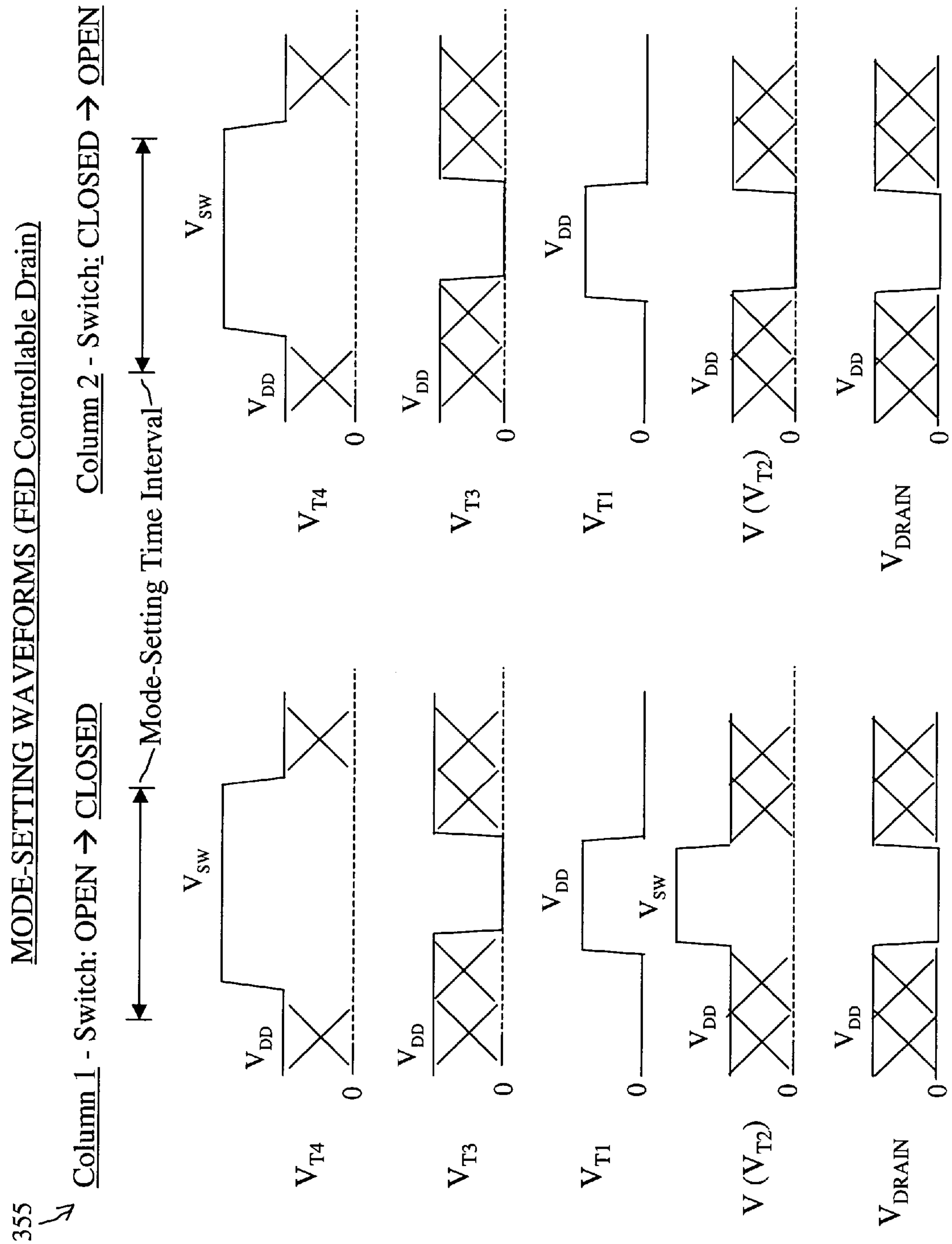

FIG. 11 illustrates the operational mode-setting waveforms 355 applied to terminals T1, T2, T3, and T4 to activate switch 170. Control signals are applied to terminals T1–T4 by a control circuit (not shown) using control lines (not shown). There is no electrical signal applied to electrical terminal 362. Column 1 illustrates the electrical signals used to change switch 170 from position 170", also referred to as the open position, to position 170', also referred to as the closed position. Column 2 illustrates the electrical signals used to change switch 170 from position 170', also referred to as the closed position, to position 170", also referred to as the open position. The mode-setting waveforms are valid within the mode-setting time interval illustrated under columns 1 and 2 in FIG. 11. Other time intervals contain cross-hatched lines between voltages 0 and $V_{DD}$, indicating that these waveforms can be anywhere within this voltage range, and represent the circuit operating range. $V_{DD}$ is selected to be less than the voltage switching voltage $V_{SW}$ to ensure that switch 170 is not activated (resulting in mode-resetting) during circuit operation.

Mode-setting is based on electromechanical switching of carbon nanotube (NT) switch using electrostatic forces. As stated above, the behavior of a NT fabric is similar to that of a single NT, where the electrostatic attractive force is due to oppositely charged surfaces. Column 1 of FIG. 11 illustrates the voltage and timing waveforms applied to terminals T1–T4 of FED8 160 that force a transition of NT switch 170 from position 170", in contact with insulator surface 176 on release-plate 174 as illustrated in FIG. 10C, to position 170', in contact with switch-plate 168 as illustrated in FIG. 10B. Switch 170 transitions from open to closed. Voltage $V_{T4}$, applied to terminal T4, transitions to switching voltage $V_{SW}$. Voltage $V_{T2}$ applied to terminal T2 transitions switching voltage $V_{SW}$. $V_{T3}$ applied to terminal T3 transitions to zero volts. Terminal T1 (connected to gate 162) transitions from zero to $V_{DD}$ forming a channel in channel region 167, thereby driving controllable drain 164 voltage $V_{DRAIN}$ to zero. The electrostatic force between switch 170 in position 170" and release-plate 174 is zero. The electrostatic force between switch 170 in position 170" and switch-plate 168 is $F_E=K(V_{SW})^2/(R_{12})^2$, where $R_{12}$ is the gap separating switch 170 from switch-plate 168. Typical $V_{NT-TH}$ voltages may range from 2 to 3 volts, for example. $V_{NT-TH}$ is a function of the suspended length of NT switch 170 and the gap (separation) between NT switch 170 and the switch-plate and release-plate electrodes. Typical, but non-exclusive exemplary ranges for NT switch suspended length is 130 to 180 nm, with gaps of 10 to 20 nm.

Column 2 of FIG. 11 illustrates the voltage and timing waveforms applied to terminals T1–T4 of FED8 160 that force a transition of NT switch 170 from position 170', in contact with switch-plate 168 as illustrated in FIG. 10B, to position 170", in contact with release-plate dielectric surface 176 on release-plate 174 as illustrated in FIG. 10C. Switch 170 transitions from closed to open. Voltage $V_{T4}$, applied to terminal T4, transitions to switching voltage $V_{SW}$. Voltage $V_{T2}$ applied to terminal T2 transitions to zero (0) volts. $V_{T3}$ applied to terminal T3 transitions to zero volts. Terminal T1 (connected to gate 162) transitions from zero to $V_{DD}$ forming a channel in channel region 167, thereby driving controllable drain 164 voltage $V_{DRAIN}$ to zero. The electrostatic force between switch 170 in position 170' and switch-plate 168 is zero. The electrostatic force between switch 170 in position 170' and release-plate 174 is $F_E=K(V_{SW})^2/(R_{12})^2$, where $R_{12}$ is the gap separating switch 170 from release-plate 174. Typical $V_{NT-TH}$ voltages may range from 2 to 3 volts, for example. The threshold voltage for switch 170 transitions between open and closed, and closed and open positions may be different, without effecting the operation of the device. If $V_{SW}$ exceeds $V_{NT-TH}$, then mode-setting will take place. Circuit operating voltages range from 0 to $V_{DD}$. In order to avoid unwanted mode-setting during circuit operation, $V_{DD}$ is less than $V_{NT-TH}$.

Figure 12:
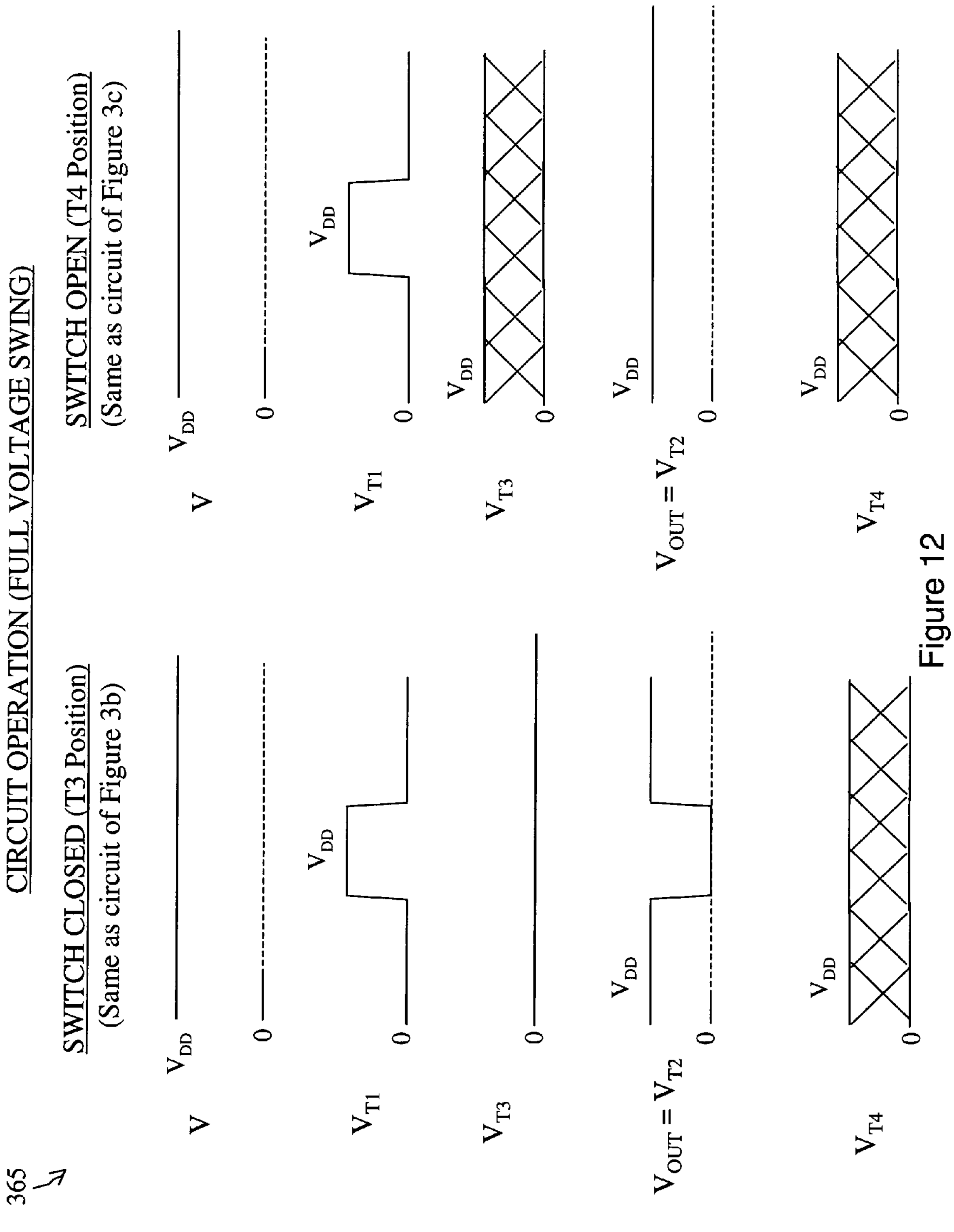

FIG. 12 illustrates the full signal (voltage) swing waveforms 365 operation of circuit 360, with waveforms applied to terminals T1, T2, T3, and T4. Column 1 illustrates the electrical signals applied to terminal T1–T4 for circuit schematic 370 when switch 170 is in the closed position 170' as illustrated in FIG. 10B. Column 2 illustrates the electrical signals applied to terminals T1–T4 for circuit schematic 370' when switch 170 is in the open position 170" as illustrated in FIG. 10C. Circuit schematic 370 illustrates the FED used in a simple inverter configuration with load resistor 364 of value R connected to voltage terminal 362 at voltage $V=V_{DD}$. For $V_{NT-TH}$ in the 2 to 3 volt range, for example, $V_{DD}$ is selected as less than 2 volts, 1.0 to 1.8 volts, for example. The operation of circuit 370 is as illustrated in FIG. 12, column 1. With switch 170 in the 170' position, the voltage $V_{T4}$ on terminal T4 can be any value. Voltage $V_{T3}$ applied to terminal T3 is set to zero volts. A pulse $V_{T1}$ of amplitude $V_{DD}$ is applied to terminal T1. When $V_{T1}=0$, no FET conductive path is activated, the electrical path between terminals T2 and T3 of FED8 160 is open, current I=0, and $V_{OUT}=V_{DD}$. When $V_{T1}=V_{DD}$, FET 167 channel of resistance $R_{FET}$ is formed, in series with $R_{SWITCH}$ of switch 170', connecting terminals T2 and T3. The resistance of FED8 160 between terminals T2 and T3 is $R_{FED}=R_{FET}+R_{SWITCH}$. $R_{FET}$ is the FET channel resistance, and $R_{SWITCH}$ is the resistance of NT switch 170'. $R_{SWITCH}$ includes the resistance between switch-plate 168 and NT 170', the NT 170' resistance (typically much less than the contact resistances), and the contact resistance between contact 172 and NT 170'. $R_{FET}$ is determined by the FET electrical parameters and the width to length ratio used in the FET design. By selecting W/L ratio values, $R_{FET}$ may range from less than 10 Ohms to more than 10,000 Ohms. The quantum contact resistance between metal electrodes and the NT fabric varies as a function of the fabric density (number of NTs per unit area) and the width of the contact. The contact resistance may vary from less than 100 Ohms to more than 100,000 Ohms. When $V_{T1}=V_{DD}$, current $I=V_{DD}/(R+R_{FED})$, and $V_{T2}=V_{OUT}=V_{DD}\times(R_{FED})/(R+R_{FED})$. If $R_{FED}<<R$, then $V_{T2}=V_{OUT}\approx 0$ volts, illustrated in FIG. 12, column 1.

Circuit schematic 370' illustrates FED8 160 used in a simple inverter configuration with load resistor 364 of value R connected to voltage terminal 362 at voltage $V=V_{DD}$. The full signal (voltage) swing operation of circuit 370' is as illustrated in FIG. 12, column 2. With switch 90 in position 90", the FED electrical path between terminals T2 and T3 is open, terminal T4 is insulated, therefore current I=0, and $V_{T2}=V_{OUT}=V_{DD}$ for all applied voltages.

Operation of Field Effect Devices with Controllable Gates

Four schematics of field effect devices (FEDs) with controllable gates have been described (FIGS. 2I–L). FIGS. 13A–16 illustrates the operation of field effect devices with controllable gates for one of the FED configurations, FED11 device 240 (FIG. 2L). FED devices with controllable gates are also referred to as NT-on-Gate devices. A switch-mode setting operation is described, followed by an example of full voltage swing circuit operation (digital switching).

Figure 13A:
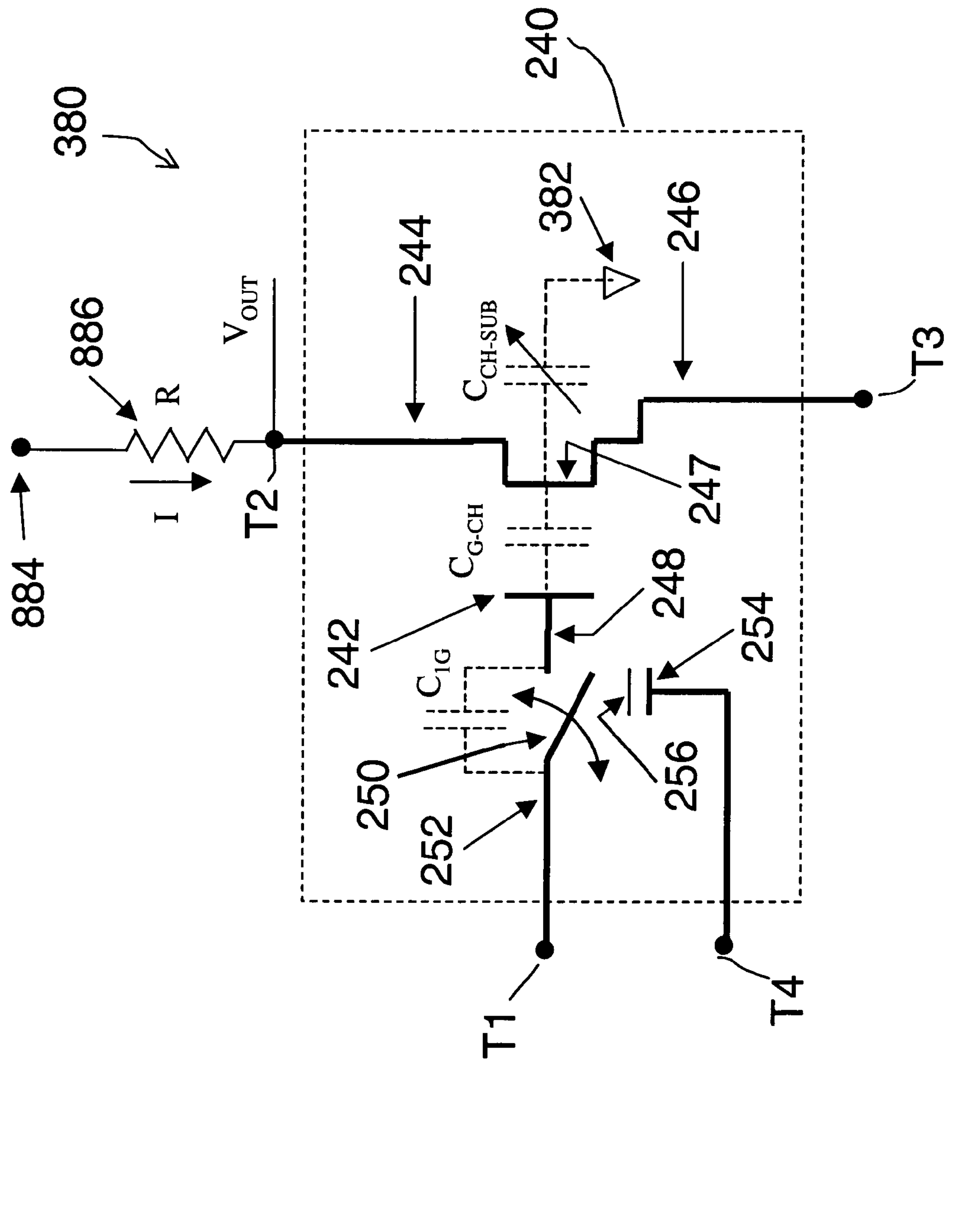
FIGS. 13A–C illustrate schematic representations of preferred embodiments of the invention.

FIG. 13A illustrates FED11 240. FED11 240 is combined with resistor 886 of value R, such that one terminal of resistor 886 is attached to FED 11 device 240 terminal T2, and the other side of resistor 886 is attached to power supply terminal 884 to form circuit schematic. FED11 240 terminal T2 is connected to FET drain 244; terminal T3 is connected to FET source 246; terminal T4 is connected to release plate 254. FIG. 13B illustrates circuit schematic 390 in which switch 250 has been activated to position 250' to electrically connect switch-plate 248 to contact 252. Controllable gate 242 is electrically connected to terminal T1 by means of the established continuous electrical path formed by gate 242 connected to switch-plate 248; switch-plate 248 connected to one side of switch 250'; the opposite side of switch 250' connected to contact 252; contact 252 connected to terminal T1. The combination of contact 252 area and NT fabric layer switch 250 area may be referred to as the NT control gate, because the voltage applied to this control gate controls the FET channel region 247 electrical characteristics.

Figure 13C:
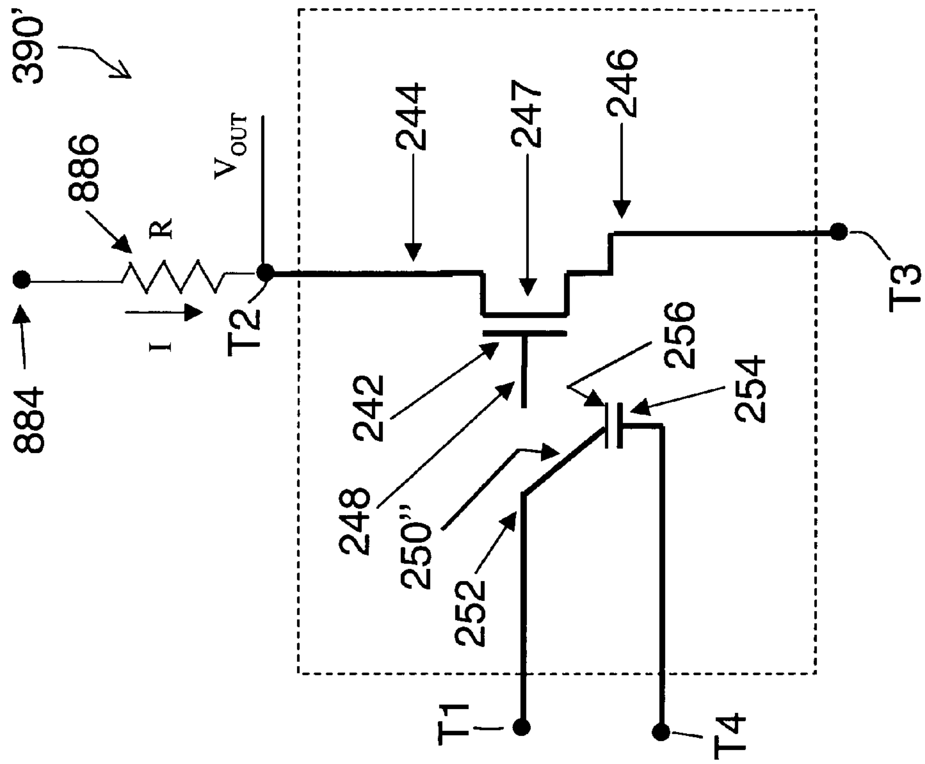
Figure 13B:
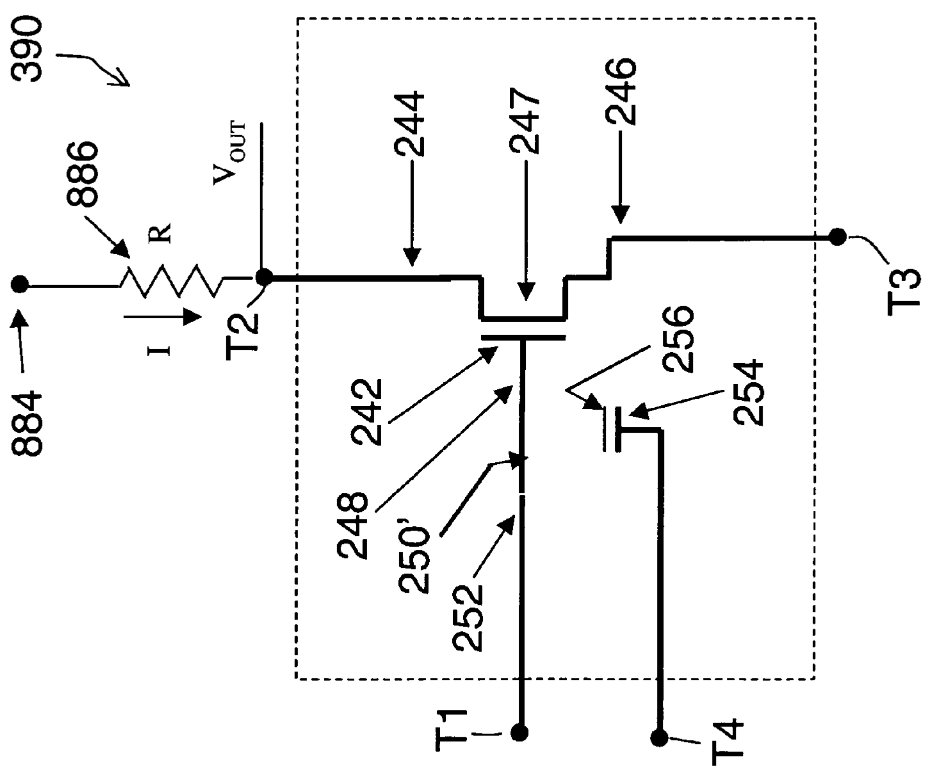

FIG. 13C illustrates circuit schematic 390' in which switch 250 has been activated to position 250" to contact release-plate dielectric surface 256. Controllable gate 242 is electrically open circuited, and has no continuous electrical path to any FED 249 device terminals.

Figure 14:
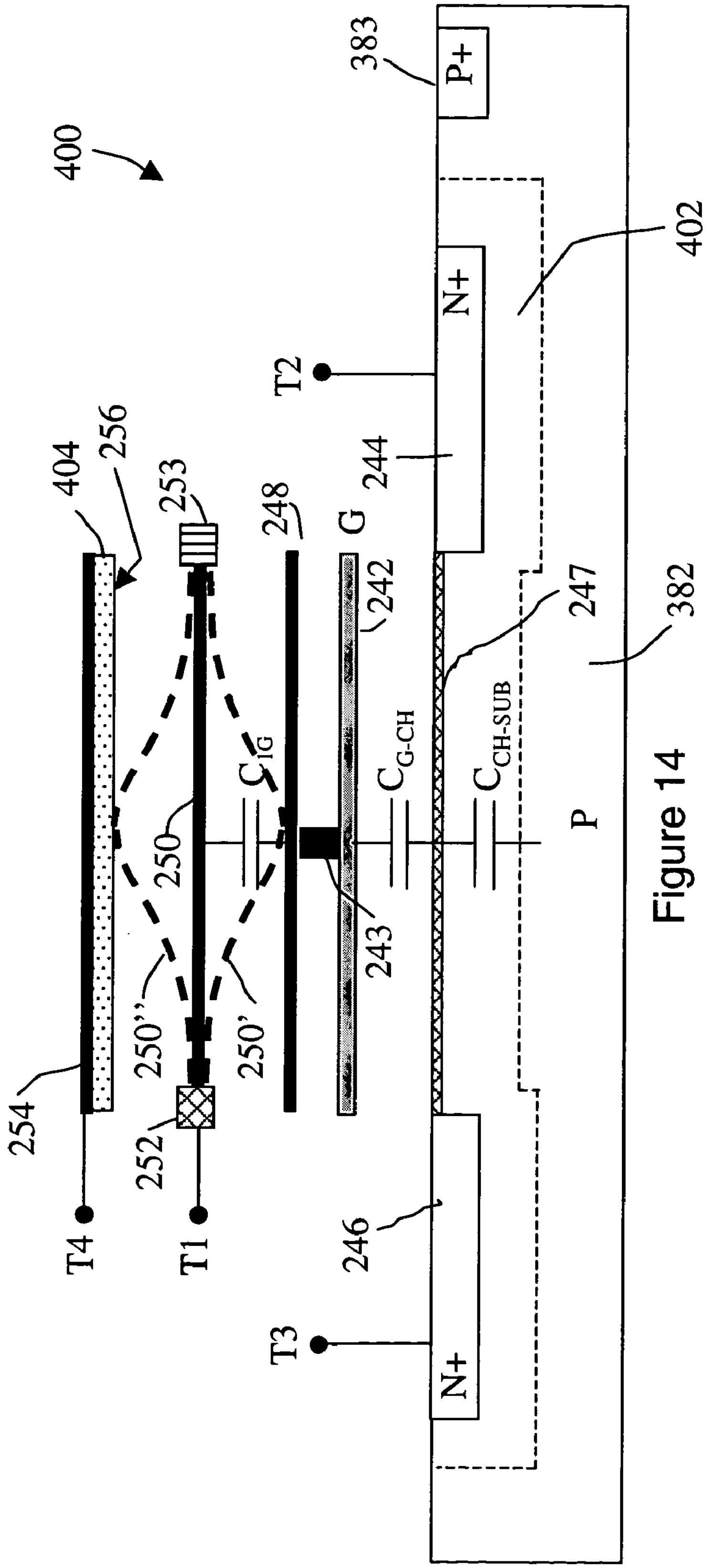
FIG. 14 illustrates a cross section of one embodiment of the invention.

FIG. 13A also depicts a FED11 240 with the coupling capacitances both inherent in the device and designed for the device, and corresponds to FIG. 14 which illustrates cross section 400 of the FED11 240. Capacitance $C_{1G}$ is the capacitance between contact 252 and switch 250 combined areas (i.e., nanotube fabric-based switch 250) and switch-plate 248 area that connects to polysilicon gate 242 using connecting contact (connecting stud, for example) 243. $C_{G-CH}$ is the capacitance between the polysilicon gate 242 and the channel region 247 (FET gate oxide capacitance). $C_{CH-SUB}$ is the depletion capacitance, in depleted region 402, between the channel region 247 and substrate 382. The substrate 382 voltage is controlled using substrate contact 383, and is at zero volts in this example. Source diffusion 246 is connected to FED11 240 terminal T3, and drain diffusion 244 is connected to FED11 240 terminal T2. The nanotube (NT) fabric layer switch 250 is mechanically supported at both ends. Contact 252 acts as both electrical contact and mechanical support, and support 253 provides the other mechanical support (support 253 may also provide an additional electrical connection as well) as illustrated in FIG. 14.

Switch 250 in closed position 250' (FIG. 13B) is illustrated by the deflected NT fabric layer in contact with switch-plate 248. The closed position is the "ON" state, the polysilicon gate 242 is in contact with the nanotube fabric layer switch 250 (i.e., it is not floating) by contact 243. The polysilicon gate voltage is defined by the voltage of the nanotube control gate. The nanotube control gate includes the contact 252 area and the NT fabric-based switch 250 area (not drawn to scale).

Switch 250 in open position 250" is illustrated by the deflected NT fabric layer in contact with surface 256 of insulator 404. FED11 device 240 terminal T4 is connected to release-plate 254 with insulator 404. The open position is the "OFF" state, the polysilicon gate is not in contact with the nanotube control gate. Thus, the polysilicon gate voltage floats, and the floating gate (FG) voltage has a value that depends on the capacitance coupling network in the device. The value of diffusion capacitance $C_{CH-SUB}$ can be modulated by the voltage applied to the drain 244 (source 246 may float, or may be at the voltage applied to drain 244), and may be used to set the floating gate (FG) voltage when switch 250 is in open position 250". However, as used during write, drain 244 voltage ($V_{DRAIN}$=0) and $C_{CH-SUB}$ is not part of the network, and voltage $V_{T1}$ is used to set the state of switch 250. The principle of FET channel modulation using drain voltage is illustrated in U.S. Pat. No. 6,369,671.

If voltage on drain 244 equals zero ($V_{DRAIN}$=0), the channel 247 remains as an inverted region, and capacitor $C_{CH-SUB}$ is not part of the capacitor network. Capacitor $C_{G-CH}$ holds polysilicon gate 242 at a relatively low voltage, which is transmitted to switch plate 248 by contact 243. Therefore, a relatively high voltage appears between switch 250 and switching plate 248, across capacitor $C_{1G}$, and nanotube fabric layer switch 250 switches from open ("OFF") position 250" to closed ("ON") position 250'.

Figure 15:
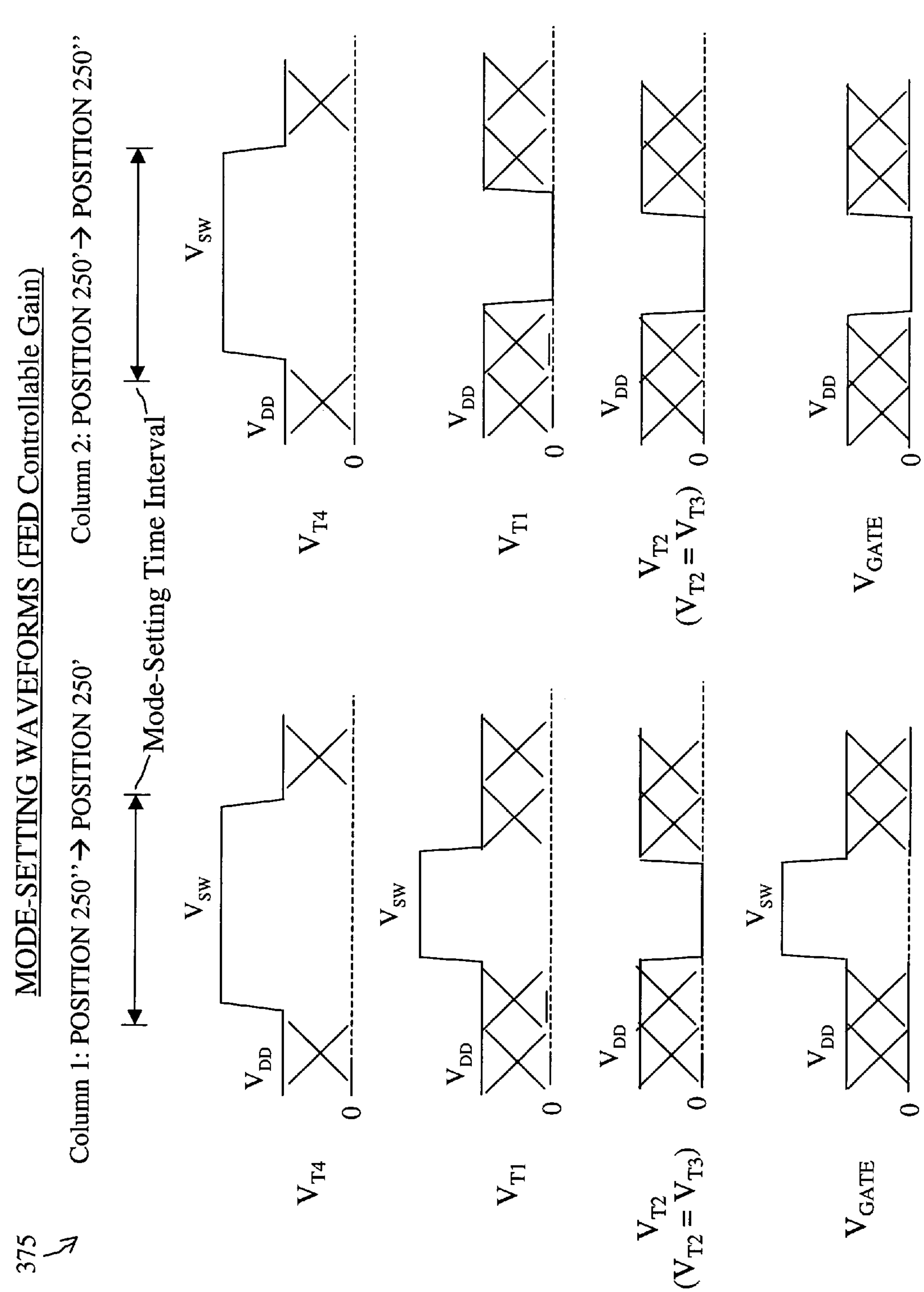
FIG. 15 illustrates operational waveforms for field effect devices according to certain aspects of the invention.

FIG. 15 illustrates mode-setting electrical signals applied to the terminals T1, T2, T3, and T4 of schematics 380, 390, and 390' to cause switch 250 to switch to position 250' or position 250". FIG. 15 illustrates the operational mode-setting waveforms 375 applied to terminals T1, T2, T3, and T4 of FED11 240 to activate switch 250. Control signals are applied to terminals T1–T4 by a control circuit (not shown) using control lines (not shown). There is no electrical signal applied to electrical terminal 884 during mode-setting. Column 1 of FIG. 15 illustrates the electrical signals used to change switch 250 from position 250", also referred to as the open ("OFF") position, to position 250', also referred to as the closed ("ON") position. Column 2 illustrates the electrical signals used to change switch 250 from position 250', also referred to as the closed ("ON") position, to position 250", also referred to as the open ("OFF") position. The mode-setting waveforms are valid within the mode-setting time interval illustrated under columns 1 and 2 in FIG. 15. Other time intervals contain cross-hatched lines between voltages 0 and $V_{DD}$, indicating that these waveforms can be anywhere within this voltage range, and represent the circuit operating range. $V_{DD}$ is selected to be less than the voltage switching voltage $V_{SW}$ to ensure that switch 250 is not activated (resulting in mode-resetting) during circuit operation.

Mode-setting is based on electromechanical switching of carbon nanotube (NT) switch using electrostatic forces. Column 1 of FIG. 15 illustrates the voltage and timing waveforms applied to terminals T1–T4 of FED11 240 that force a transition of NT switch 250 from position 250", in contact with insulator surface 256 on release-plate 254 as illustrated in FIGS. 13C and 14A, to position 250', in contact with switch-plate 248 as illustrated in FIG. 13B and 14A. Switch 250 transitions from open to closed. Voltage $V_{T4}$, applied to terminal T4, transitions to switching voltage $V_{SW}$. Voltage $V_{T2}$ applied to terminal T2 transitions to zero. $V_{T3}$ applied to terminal T3 transitions to zero volts. Terminal T1 (connected to NT fabric switch 250 through control gate contact 252) transitions from zero to switching voltage $V_{SW}$ forming a channel in channel region 247. The electrostatic force between switch 250 in position 250" and release-plate 254 is zero. The electrostatic force between switch 250 in position 250" and switch-plate 248 is $F_E=K(V_{SW}-V_G)^2/(R_{12})^2$, where $R_{12}$ is the gap separating switch 250 from switch-plate 248. $V_G$ is determined by the relative values of capacitances $C_{1G}$ and $C_{G-CH}$ (FIG. 14). $C_{1G}$ is typically designed to be 0.25 times the capacitance $C_{G-CH}$ ($C_{1G}$=0.25 $C_{G-CH}$). Gate voltage $V_G=V_{SW}\times C_{1G}/(C_{1G}+C_{G-CH})$; $V_G=0.2V_{SW}$. If the voltage difference required between switch 250 and switch-plate 248 to activate switch 250 is 2.5 volts, for example, then switching voltage $V_{SW}$ greater than approximately 3.2 volts is required.

Column 2 of FIG. 15 illustrates the voltage and timing waveforms applied to terminals T1–T4 of FED11 240 that force a transition of NT switch 250 from position 250', in contact with switch-plate 248 as illustrated in FIGS. 13B and 14A, to position 250", in contact with release-plate dielectric surface 256 on release-plate 254 as illustrated in FIG. 13C. Switch 250 transitions from closed to open. Voltage $V_{T4}$, applied to terminal T4, transitions to switching voltage $V_{SW}$. Voltage $V_{T2}$ applied to terminal T2 transitions is between zero and 1 volt (as high as $V_{DD}$ is acceptable). $V_{T3}$ applied to terminal T3 transitions to zero to 1 volt (as high as $V_{DD}$ is acceptable). Terminal T1 (connected to NT switch 250 by contact 252) transitions to zero volts. The electrostatic force between switch 250 in position 250' and switch-plate 248 is zero. The electrostatic force between switch 250 in position 250' and release-plate 254 is $F_E=K(V_{SW})^2/(R_{12})^2$, where $R_{12}$ is the gap separating switch 250 from release-plate 254. Typical $V_{NT-TH}$ voltages may range from 2 to 3 volts, for example. The threshold voltage for switch 250 transitions between open ("OFF") and closed ("ON"), and closed ("ON") and open ("OFF") positions may be different, without effecting the operation of the device. If $V_{SW}$ exceeds $V_{NT-TH}$, then mode-setting will take place. Circuit operating voltages range from 0 to $V_{DD}$. In order to avoid unwanted mode-setting during circuit operation, $V_{DD}$ is less than $V_{NT-TH}$.

Figure 16:
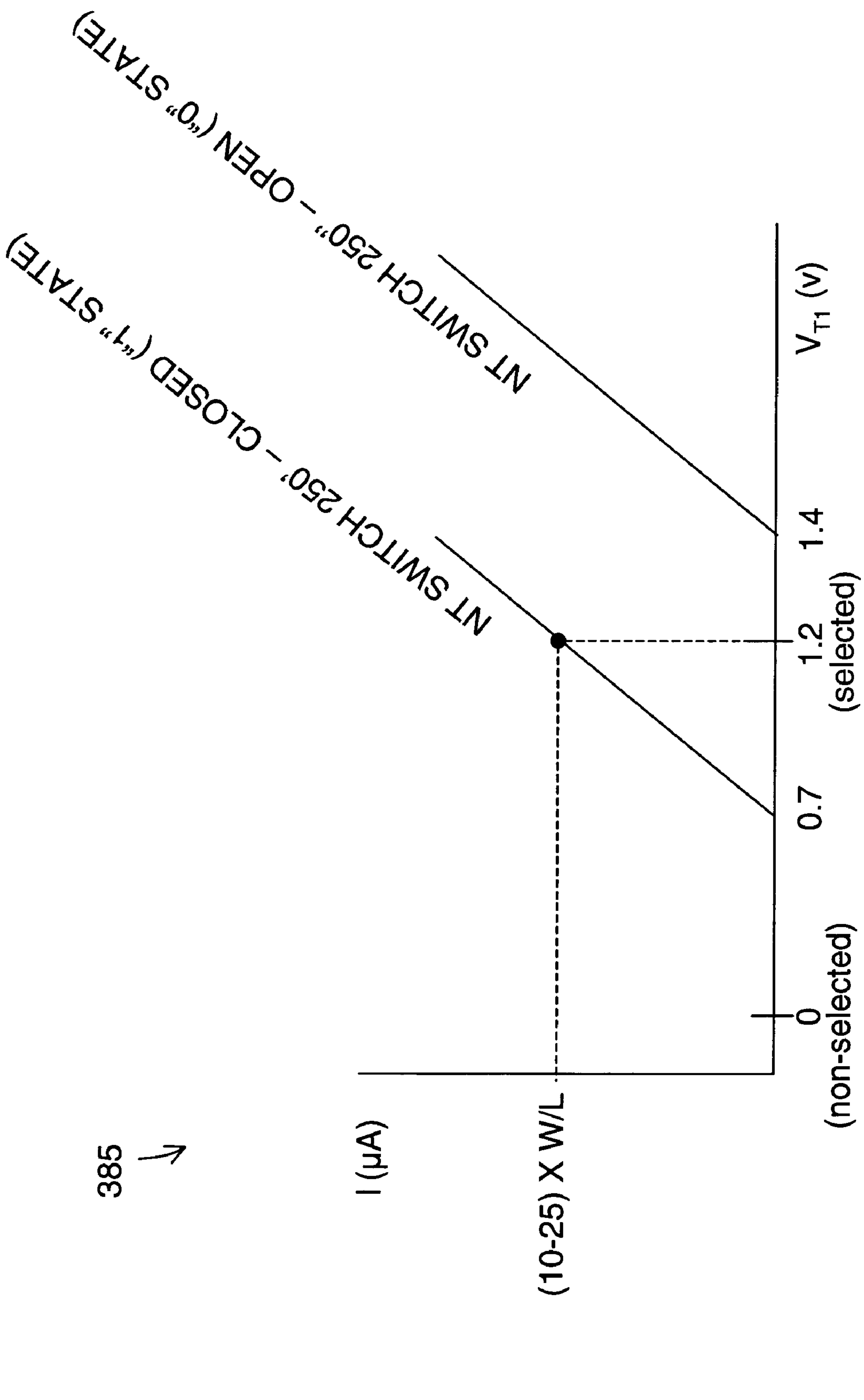
FIG. 16 illustrates electrical (I/V) characteristics of devices according to one aspect of the invention.

The threshold voltage $V_{FET-TH}$ of the FET device with gate 242, drain 244, and source 246 that forms a portion of FED11 240 is modulated by the position of NT fabric switch 250. FIG. 16 illustrates the current-voltage (I-V) characteristic 385 of FED11 240 for switch 250 in the closed ("ON") state (switch 250 in position 250') and the open ("OFF") state (switch 250 in position 250"). For switch 250 in the closed state, $V_G=V_{T1}$, current I flows when $V_{T1}=V_G$ is greater than FET threshold voltage $V_{FET\text{-}TH}$=0.4 to 0.7 volts. Current I flows between terminals T2 and T3 of FED11 240. For switch 250 is in the open state, current I flows between terminals T2 and T3 of FED11 240 when $V_{T1}$ is greater than 1.4 volts. At $V_{T1}$=1.4 volts, capacitive coupling raises FET gate voltage $V_G$ to greater than 0.7 volts, and current flows between terminals of FED11 240 device. The state of FED11 240 device may be detected by applying $V_{T1}$ voltage of 1.2 volts. If FED11 240 is in the closed state (also referred to as the written or programmed state), then current I will flow when $V_{T1}$=1.2 volts. If FED11 240 is in the open state (also referred to as the released or erased state), then no current (I=0) will flow when $V_{T1}$=1.2 volts.

Nanotube Random Access Memory using FEDs with Controllable Sources

Nanotube Random Access Memory (NRAM) Systems and Circuits, with Same

Non-volatile field effect devices (FEDs) 20, 40, 60, and 80 with controllable sources may be used as cells and interconnected into arrays to form non-volatile nanotube random access memory (NRAM) systems. The memory cells contain one select device (transistor) T and one non-volatile nanotube storage element NT (1T/1NT cells). By way of example, FED4 80 (FIG. 2D) is used to form a non-volatile NRAM memory cell that is also referred to as a NT-on-Source memory cell.

NT-on-Source NRAM Memory Systems and Circuits with Parallel Bit and Reference Lines, and Parallel Word and Release Lines NRAM 1T/1NT memory arrays are wired using four lines. Word line WL is used to gate select device T, bit line BL is attached to a shared drain between two adjacent select devices. Reference line REF is used to control the NT switch voltage of storage element NT, and release line RL is used to control the release-plate of storage element NT. In this NRAM array configuration, REF is parallel to BL and acts as second bit line, and RL is parallel to WL and acts as a second word line. The NT-on-source with REF line parallel to BL and RL parallel WL is the preferred NT-on-source embodiment.

Figures 17A, 17B, 17C, 17D:
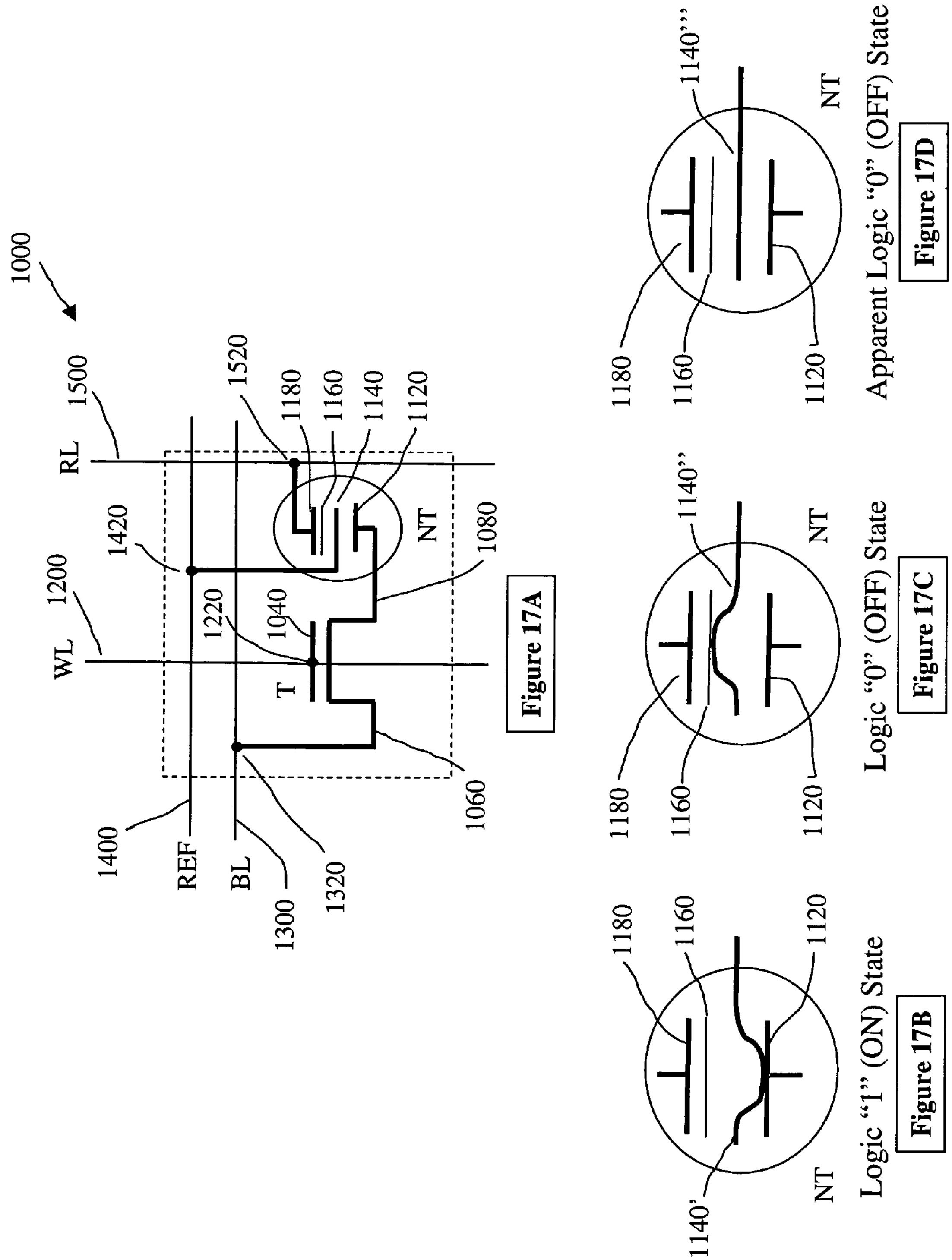
FIGS. 17A–D illustrate a schematic representation of devices according to one aspect of the invention along with depictions of memory states of such a device.

FIG. 17A depicts non-volatile field effect device FED4 80 with memory cell wiring to form NT-on-Source memory cell 1000 schematic. Memory cell 1000 operates in a source-follower mode. Word line (WL) 1200 connects to terminal T1 1220 of FED4 80; bit line (BL) 1300 connects to terminal T2 1320 of FED4 80; reference line (REF) 1400 connects to terminal T3 1420 of FED4 80; and release line (RL) 1500 connects to terminal T4 1520 of FED4 80. Memory cell 1000 performs write and read operations, and stores the information in a non-volatile state. The FED4 80 layout dimensions and operating voltages are selected to optimize memory cell 1000. Memory cell 1000 FET select device (T) gate 1040 corresponds to gate 82; drain 1060 corresponds to drain 84; and controllable source 1080 corresponds to controllable source 86. Memory cell 1000 nanotube (NT) switch-plate 1120 corresponds to switch-plate 88; NT switch 1140 corresponds to NT switch 90; release-plate insulator layer surface 1160 corresponds to release-plate insulator layer surface 96; and release-plate 1180 corresponds to release-plate 94. The interconnections between the elements of memory cell 1000 schematic correspond to the interconnection of the corresponding interconnections of the elements of FED4 80. BL 1300 connects to drain 1060 through contact 1320; REF 1400 connects to NT switch 1140 through contact 1420; RL 1500 connects to release-plate 1180 by contact 1520; WL 1200 interconnects to gate 1040 by contact 1220. The non-volatile NT switching element 1140 may be caused to deflect toward switch-plate 1120 via electrostatic forces to closed ("ON") position 1140' to store a logic "1" state as illustrated in FIG. 17B. The van der Waals force holds NT switch 1140 in position 1140'. Alternatively, the non-volatile NT switching element 1140 may be caused to deflect to insulator surface 1160 on release-plate 1180 via electrostatic forces to open ("OFF") position 1140" to store a logic "0" state as illustrated in FIG. 17C. The van der Waals force holds NT switch 1140 in position 1140". Non-volatile NT switching element 1140 may instead be caused to deflect to an open ("OFF") near-mid point position 1140'" between switch-plate 1120 and release-plate 1180, storing an apparent logic "0" state as illustrate in FIG. 17D. However, the absence of a van der Waals retaining force in this open ("OFF") position is likely to result in a memory cell disturb that causes NT switch 1140 to unintentionally transition to the closed ("ON") position, and is not desirable. Sufficient switching voltage is needed to ensure that the NT switch 1140 open ("OFF") position is position 1140". The non-volatile element switching via electrostatic forces is as depicted by element 90 in FIG. 2D. Voltage waveforms 311 used to generate the required electrostatic forces are illustrated in FIG. 4.

NT-on-Source schematic 1000 forms the basis of a non-volatile storage (memory) cell. The device may be switched between closed storage state "1" (switched to position 1140') and open storage state "0" (switched to position 1140"), which means the controllable source may be written to an unlimited number of times to as desired. In this way, the device may be used as a basis for a non-volatile nanotube random access memory, which is referred to here as a NRAM array, with the 'N' representing the inclusion of nanotubes.

Figure 18:
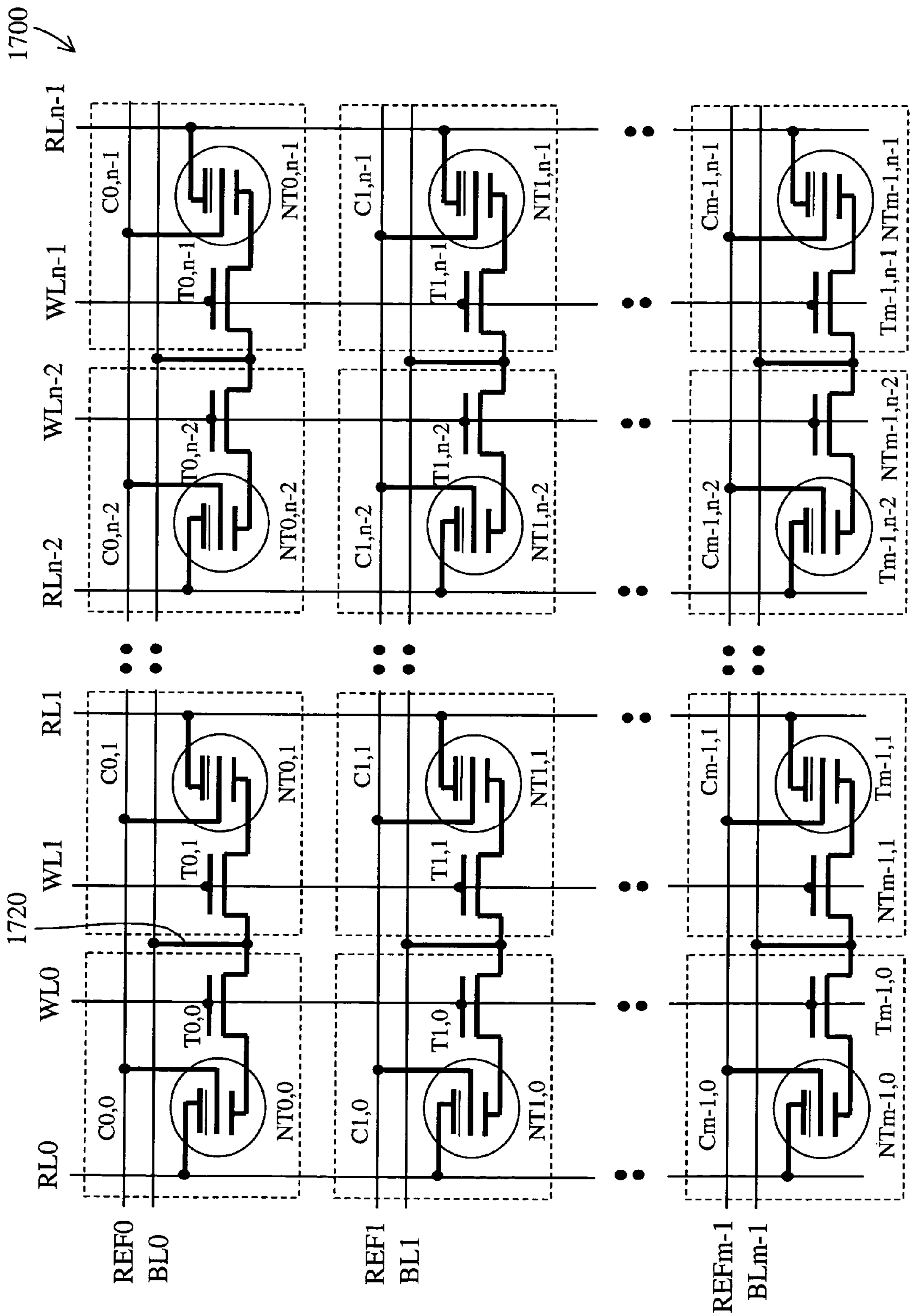
FIG. 18 illustrates schematics of an NRAM system according to preferred embodiments of the invention.

FIG. 18 represents an NRAM memory array 1700, according to preferred embodiments of the invention. Under this arrangement, an array is formed with m×n (only exemplary portion being shown) of non-volatile cells ranging from cell C0,0 to cell Cm-1,n-1. NRAM memory array 1700 may be designed using one large m×n array, or several smaller sub-arrays, where each sub-array if formed of m×n cells. To access selected cells, the array uses read and write word lines (WL0, WL1, . . . WLn-1), read and write bit lines (BL0, BL1, . . . BLm-1), read and write reference lines (REF0, REF1, . . . REFm-1), and read and write release lines (RL0, RL1, . . . RLn-1). Non-volatile cell C0,0 includes a select device T0,0 and non-volatile storage element NT0,0. The gate of T0,0 is coupled to WL0, and the drain of T0,0 is coupled to BL0. NT0 is the non-volatilely switchable storage element where the NT0,0 switch-plate is coupled to the source of T0,0, the switching NT element is coupled to REF0, and the release-plate is coupled to RL0. Connection 1720 connects BL0 to shared drain of select devices T0,0 and T0,1. Word, bit, reference, and release decoders/drivers are explained further below.

Under preferred embodiments, nanotubes in NRAM array 1700 may be in the "ON" "1" state or the "OFF" "0" state. The NRAM memory allows for unlimited read and write operations per bit location. A write operation includes both a write function to write a "1" and a release function to write a "0". By way of example, a write "1" to cell C0,0 and a write "0" to cell C1,0 is described. For a write "1" operation to cell C0,0, select device T0,0 is activated when WL0 transitions from 0 to $V_{DD}$, BL0 transitions from $V_{DD}$ to 0 volts, REF0 transitions from $V_{DD}$ to switching voltage $V_{SW}$, and RL0 transitions from $V_{DD}$ to switching voltage $V_{SW}$. The release-plate and NT switch of the non-volatile storage element NT0,0 are each at $V_{SW}$ resulting in zero electrostatic force (because the voltage difference is zero). The zero BL0 voltage is applied to the switch-plate of non-volatile storage element NT0,0 by the controlled source of select device T0,0. The difference in voltage between the NT0,0 switch-plate and NT switch is $V_{SW}$ and generates an attracting electrostatic force. If $V_{SW}$ exceeds the nanotube threshold voltage $V_{NT\text{-}TH}$, the nanotube structure switches to "ON" state or logic "1" state, that is, the nanotube NT switch and switch-plate are electrically connected as illustrated in FIG. 17B. The near-Ohmic connection between switch-plate 1120 and NT switch 1140 in position 1140' represents the "ON" state or "1" state. If the power source is removed, cell C0,0 remains in the "ON" state.

For a write "0" (release) operation to cell C1,0, select device T1,0 is activated when WL0 transitions from 0 to $V_{DD}$, BL1 transitions from $V_{DD}$ to 0 volts, REF 1 transitions from $V_{DD}$ to zero volts, and RL0 transitions from $V_{DD}$ to switching voltage $V_{SW}$. The zero BL1 voltage is applied to the switch-plate of non-volatile storage element NT1,0 by the controlled source of select device T1,0, and zero volts is applied the NT switch by REF1, resulting in zero electrostatic force between switch-plate and NT switch. The non-volatile storage element NT1,0 release-plate is at switching voltage $V_{SW}$ and the NT switch is at zero volts generating an attracting electrostatic force. If $V_{SW}$ exceeds the nanotube threshold voltage $V_{NT\text{-}TH}$, the nanotube structure switches to the "OFF" state or logic "0" state, that is, the nanotube NT switch and the surface of the release-plate insulator are in contact as illustrated in FIG. 17C. The non-conducting contact between insulator surface 1160 on release-plate 1180 and NT switch 1140 in position 1140" represents the "OFF" state or "0" state. If the power source is removed, cell C1,0 remains in the "OFF" state.

An NRAM read operation does not change (destroy) the information in the activated cells, as it does in a DRAM, for example. Therefore the read operation in the NRAM is characterized as a non-destructive readout (or NDRO) and does not require a write-back after the read operation has been completed. For a read operation of cell C0,0, BL0 is driven high to $V_{DD}$ and allowed to float. WL0 is driven high to $V_{DD}$ and select device T0,0 turns on. REF0 is at zero volts, and RL0 is at $V_{DD}$. If cell C0,0 stores an "ON" state ("1" state) as illustrated in FIG. 17B, BL0 discharges to ground through a conductive path that includes select device T0,0 and non-volatile storage element NT0,0 in the "ON" state, the BL0 voltage drops, and the "ON" state or "1" state is detected by a sense amplifier/latch circuit (not shown) that records the voltage drop by switching the latch to a logic "1" state. BL0 is connected by the select device T0,0 conductive channel of resistance $R_{FET}$ to the switch-plate of NT0,0. The switch-plate of NT0,0 in the "ON" state contacts the NT switch with contact resistance and the NT switch contacts reference line REF0 with contact resistance $R_C$. The total resistance in the discharge path is $R_{FET}+R_{SW}+R_C$. Other resistance values in the discharge path, including the resistance of the NT switch, are much smaller and may be neglected.

For a read operation of cell C1,0, BL1 is driven high to $V_{DD}$ and allowed to float. WL0 is driven high to $V_{DD}$ and select device T1,0 turns on. REF1=0, and RL0 is at $V_{DD}$. If cell C1,0 stores an "OFF" state ("0" state) as illustrated in FIG. 17C, BL1 does not discharge to ground through a conductive path that includes select device T1,0 and non-volatile storage element NT1,0 in the "OFF" state, because the switch-plate is not in contact with the NT switch when NT1,0 is in the "OFF" state, and the resistance $R_{SW}$ is large. Sense amplifier/latch circuit (not shown) does not detect a voltage drop and the latch is set to a logic "0" state.

Figure 19:
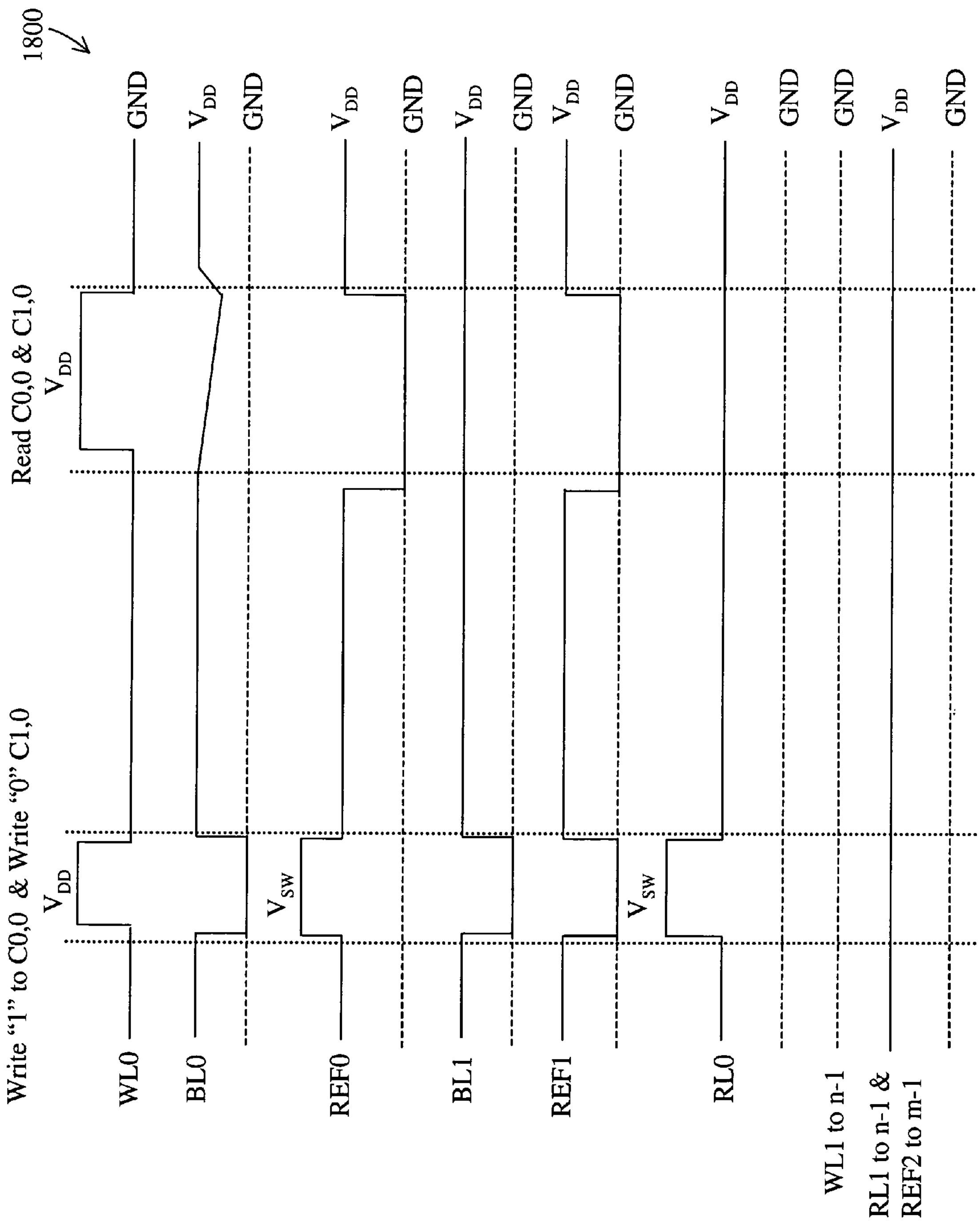
FIG. 19 illustrates operational waveforms for memory devices according to certain aspects of the invention.

FIG. 19 illustrates the operational waveforms 1800 of NRAM memory array 1700 of FIG. 18 during read, write "1", and write "0" operations for selected cells, while not disturbing unselected cells (no change to unselected cell-stored logic states). Waveforms 1800 illustrate voltages and timings to write logic state "1" in cell C0,0, write a logic state "0" in cell C1,0, read cell C0,0, and read cell C1,0. Waveforms 1800 also illustrate voltages and timings to prevent disturbing the stored logic states (logic "1" state and logic "0" state) in partially selected (also referred to as half-selected) cells. Partially selected cells are cells in memory array 1700 that receive applied voltages because they are connected to (share) word, bit, reference, and release lines that are activated as part of the read or write operation to the selected cells. Cells in memory array 1700 tolerate unlimited read and write operations at each memory cell location.

At the start of the write cycle, WL0 transitions from zero to $V_{DD}$, activating select devices T0,0, T1,0, . . . Tm-1,0. Word lines WL1, WL2 . . . WLn-1 are not selected and remain at zero volts. BL0 transitions from $V_{DD}$ to zero volts, connecting the switch-plate of non-volatile storage element NT0,0 to zero volts. BL1 transitions from $V_{DD}$ to zero volts connecting the switch-plate of non-volatile storage element NT1,0 to zero volts. BL2, BL3 . . . BLm-1 remain at $V_{DD}$ connecting the switch-plate of non-volatile storage elements NT2,0, NT3,0, . . . NTm-1,0 to $V_{DD}$. REF0 transitions from $V_{DD}$ to switching voltage $V_{SW}$, connecting the NT switches of non-volatile storage elements NT0,0, NT0,1, . . . NT0,n-2, NT0,n-1 to $V_{SW}$. REF1 transitions from $V_{DD}$ to zero volts, connecting the NT switches of non-volatile storage elements NT1,0, NT1,1 . . . NT1,n-2,NT1,n-1 to zero volts. REF2, REF3, . . . REFm-1 remain at $V_{DD}$, connecting the NT switches of non-volatile storage elements NT3,0 to NTm-1,n-1 to VDD. REL0 transitions from $V_{DD}$ to switching voltage $V_{SW}$, connecting release-plates of non-volatile storage elements NT0,0, NT1,0, . . . NTm-1,0 to $V_{SW}$. RL1, RL2 . . . RLn-1 remain at $V_{DD}$, connecting release-plates of non-volatile storage elements NT0,1 to NTn-1,n-1 to $V_{DD}$.

NT0,0 may be in "ON" ("1" state) or "OFF" ("0" state) state at the start of the write cycle. It will be in "ON" state at the end of the write cycle. If NT0,0 in cell C0,0 is "OFF" ("0" state) it will switch to "ON" ("1" state) since the voltage difference between NT switch and release-plate is zero, and the voltage difference between NT switch and switch-plate is $V_{SW}$. If NT0,0 in cell C0,0 is in the "ON" ("1" state), it will remain in the "ON" ("1") state. NT1,0 may be in "ON" ("1" state) or "OFF" ("0" state) state at the start of the write cycle. It will be in "OFF" state at the end of the write cycle. If NT1,0 in cell C1,0 is "ON" ("1" state) it will switch to "OFF" ("0" state) since the voltage difference between NT switch and switch-plate is zero, and the voltage difference between NT switch and release-plate is $V_{SW}$. If NT1,0 in cell C1,0 is "OFF" ("0" state), it will remain "OFF" ("0" state). If for example, $V_{SW}$=3.0 volts, $V_{DD}$=1.5 volts, and NT switch threshold voltage range is $V_{NT\text{-}TH}$=1.7 to 2.8 volts, then for NT0,0 and NT1,0 a difference voltage $V_{SW}>V_{NT-TH}$ ensuring write states of "ON" ("1" state) for NT0,0 and "OFF" ("0" state) for NT1,0.

Cells C0,0 and C 1,0 have been selected for the write operation. All other cells have not been selected, and information in these other cells must remain unchanged (undisturbed). Since in an array structure some cells other than selected cells C0,0 and C1,0 in array 1700 will experience partial selection voltages, often referred to as half-select voltages, it is necessary that half-select voltages applied to non-volatile storage element terminals be sufficiently low (below nanotube activation threshold $V_{NT-TH}$) to avoid disturbing stored information. For storage cells in the "ON" state, it is also necessary to avoid parasitic current flow (there cannot be parasitic currents for cells in the "OFF" state because the NT switch is not in electrical contact with switch-plate or release-plate). Potential half-select disturb along activated array lines WL0 and RL0 includes cells C3,0 to Cm-1,0 because WL0 and RL0 have been activated. Storage elements NT3,0 to NTm-1,0 will have BL2 to BLm-1 electrically connected to the corresponding storage element switch-plate by select devices T3,0 to Tm-1,0. All release-plates in these storage elements are at write voltage $V_{SW}$. To prevent undesired switching of NT switches, REF2 to REFm-1 reference lines are set at voltage $V_{DD}$. BL2 to BLm-1 voltages are set to $V_{DD}$ to prevent parasitic currents. The information in storage elements NT2,0 to NTm-1,0 in cells C2,0 to Cm-1,0 is not disturbed and there is no parasitic current. For those cells in the "OFF" state, there can be no parasitic currents (no current path), and no disturb because the voltage differences favor the "OFF" state. For those cells in the "ON" state, there is no parasitic current because the voltage difference between switch-plates (at $V_{DD}$) and NT switches (at $V_{DD}$) is zero. Also, for those cells in the "ON" state, there is no disturb because the voltage difference between corresponding NT switches and release-plate is $V_{SW}-V_{DD}=1.5$ volts, when $V_{SW}=3.0$ volts and $V_{DD}=1.5$ volts. Since this voltage difference of 1.5 volts is less than the minimum nanotube threshold voltage $V_{NT-TH}$ of 1.7 volts, no switching takes place.

Potential half-select disturb along activated array lines REF0 and BL0 includes cells C0,1 to C0, n-1 because REF0 and BL0 have been activated. Storage elements NT0,1 to NT0, n-1 all have corresponding NT switches connected to switching voltage $V_{SW}$. To prevent undesired switching of NT switches, RL1 to RLn-1 are set at voltage $V_{DD}$. WL1 to WL n-1 are set at zero volts, therefore select devices T0,1 to T0,n-1 are open, and switch-plates (all are connected to select device source diffusions) are not connected to bit line BL0. All switch-plates are in contact with a corresponding NT switch for storage cells in the "ON" state, and all switch plates are only connected to corresponding "floating" source diffusions for storage cells in the "OFF" state. Floating diffusions are at approximately zero volts because of diffusion leakage currents to semiconductor substrates. However, some floating source diffusions may experience disturb voltage conditions that may cause the source voltage, and therefore the switch-plate voltage, to increase up to 0.6 volts as explained further below. The information in storage elements NT0,1 to NT0,n-1 in cells C0,1 to C0,n-1 is not disturbed and there is no parasitic current. For cells in both "ON" and "OFF" states there can be no parasitic current because there is no current path. For cells in the "ON" state, the corresponding NT switch and switch-plate are in contact and both are at voltage $V_{SW}$. There is a voltage difference of $V_{SW}-V_{DD}$ between corresponding NT switch and release-plate. For $V_{SW}=3.0$ volts and $V_{DD}=1.5$ volts, the voltage difference of 1.5 volts is below the minimum $V_{NT-TH}=1.7$ volts for switching. For cells in the "OFF" state, the voltage difference between corresponding NT switch and switch-plate ranges from $V_{SW}$ to $V_{SW}-0.6$ volts. The voltage difference between corresponding NT switch and switch-plate may be up to 3.0 volts, which exceeds the $V_{NT-TH}$ voltage, and would disturb "OFF" cells by switching them to the "ON" state. However, there is also a voltage difference between corresponding NT switch and release-plate of $V_{SW}-V_{DD}$ of 1.5 volts with an electrostatic force in the opposite direction that prevents the disturb of storage cells in the "OFF" state. Also very important is that NT 1140 is in position 1140" in contact with the storage-plate dielectric, a short distance from the storage plate, thus maximizing the electric field that opposes cell disturb. Switch-plate 1140 is far from the NT 1140 switch greatly reducing the electric field that promotes disturb. In addition, the van der Waals force also must be overcome to disturb the cell.

Potential half-select disturb along activated array lines REF1 and BL1 includes cells C1,1 to C1, n-1 because REF1 and BL1 have been activated. Storage elements NT1,1 to NT1, n-1 all have corresponding NT switches connected to zero volts. To prevent undesired switching of NT switches, RL1 to RLn-1 are set at voltage $V_{DD}$. WL1 to WL n-1 are set at zero volts, therefore select devices T1,1 to T1,n-1 are open, and switch-plates (all are connected to select device source diffusions) are not connected to bit line BL1. All switch-plates are in contact with a corresponding NT switch for storage cells in the "ON" state, and all switch plates are only connected to corresponding "floating" source diffusions for storage cells in the "OFF" state. Floating diffusions are at approximately zero volts because of diffusion leakage currents to semiconductor substrates. However, some floating source diffusions may experience disturb voltage conditions that may cause the source voltage, and therefore the switch-plate voltage, to increase up to 0.6 volts as explained further below. The information in storage elements NT1,1 to NT1,n-1 in cells C1,1 to C1,n-1 is not disturbed and there is no parasitic current. For cells in both "ON" and "OFF" states there can be no parasitic current because there is no current path. For cells in the "ON" state, the corresponding NT switch and switch-plate are in contact and both are at zero volts. There is a voltage difference of $V_{DD}$ between corresponding NT switch and release-plate. For $V_{DD}=1.5$ volts, the voltage difference of 1.5 volts is below the minimum $V_{NT-TH}=1.7$ volts for switching. For cells in the "OFF" state, the voltage of the switch-plate ranges zero to 0.6 volts. The voltage difference between corresponding NT switch and switch-plate may be up to 0.6 volts. There is also a voltage difference between corresponding NT switch and release-plate of $V_{DD}=1.5$ volts. $V_{DD}$ is less than the minimum $V_{NT-TH}$ of 1.7 volts the "OFF" state remains unchanged.

For all remaining memory array 1700 cells, cells C2,1 to Cm-1,n-1, there is no electrical connection between NT2,1 to NTm-1,n-1 switch-plates connected to corresponding select device source and corresponding bit lines BL2 to BLm-1 because WL1 to WLn-1 are at zero volts, and select devices T2,1 to Tm-1,n-1 are open. Reference line voltages for REF2 to REFm-1 are set at $V_{DD}$ and release line voltages for RL1 to RLn-1 are set at $V_{DD}$. Therefore, all NT switches are at $V_{DD}$ and all corresponding release-plates are at $V_{DD}$, and the voltage difference between corresponding NT switches and release-plates is zero. For storage cells in the "ON" state, NT switches are in contact with corresponding switch-plates and the voltage difference is zero. For storage cells in the "OFF" state, switch plate voltages are zero to a maximum of 0.6 volts. The maximum voltage difference between NT switches and corresponding switch-plates is $V_{DD}$=1.5 volts, which is below the $V_{NT-TH}$ voltage minimum voltage of 1.7 volts. The "ON" and "OFF" states remain undisturbed.

Figure 20A:
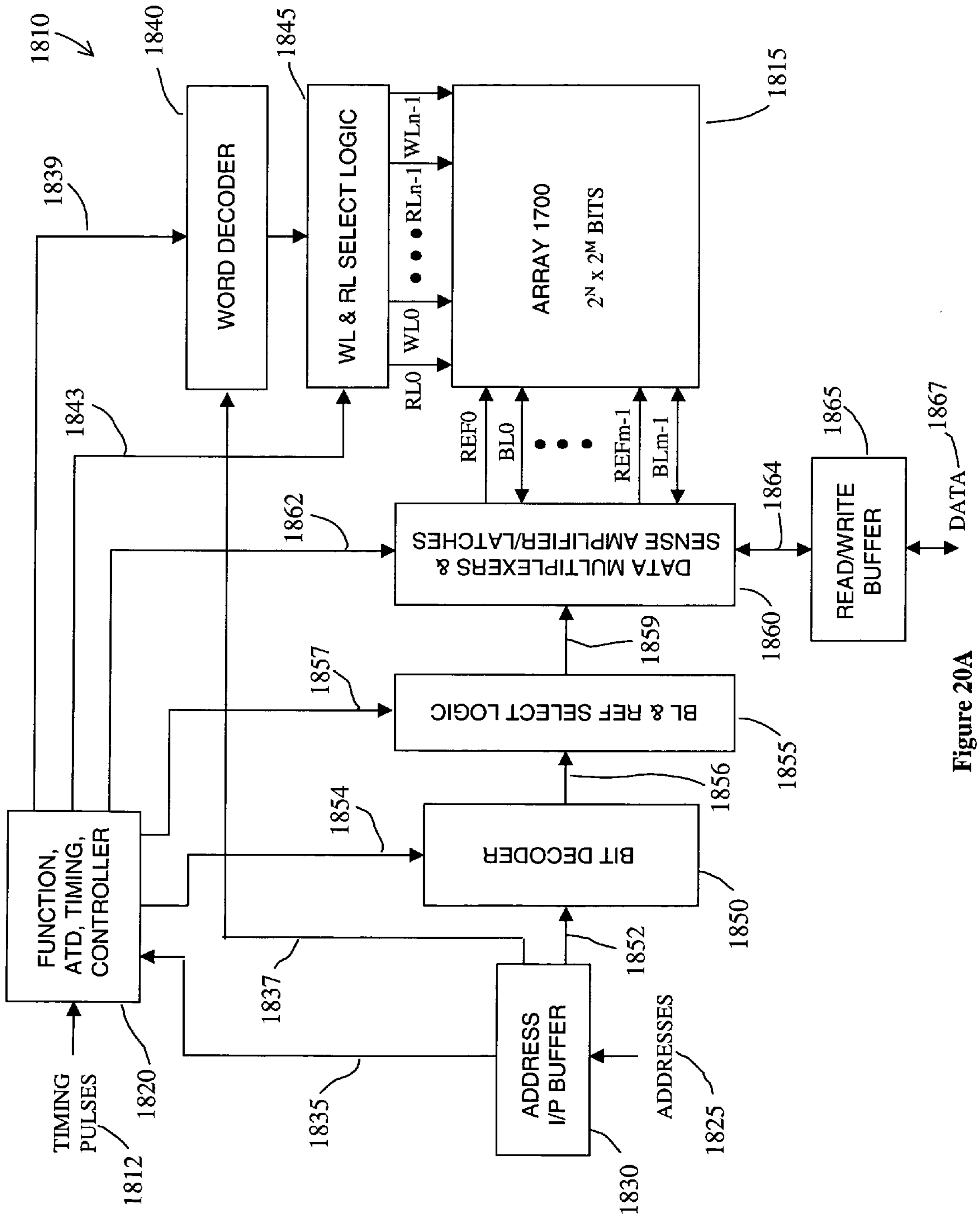
FIG. 20A illustrates a memory array flow chart according to one aspect of the invention.

Non-volatile NT-on-source NRAM memory array 1700 with bit lines parallel to reference lines is shown in FIG. 18 contains $2^N \times 2^M$ bits, is a subset of non-volatile NRAM memory system 1810 illustrated as memory array 1815 in FIG. 20A. NRAM memory system 1810 may be configured to operate like an industry standard asynchronous SRAM or synchronous SRAM because nanotube non-volatile storage cells 1000 shown in FIG. 17A, in memory array 1700, may be read in a non-destructive readout (NDRO) mode and therefore do not require a write-back operation after reading, and also may be written (programmed) at CMOS voltage levels (5, 3.3, and 2.5 volts, for example) and at nanosecond and sub-nanosecond switching speeds. NRAM read and write times, and cycle times, are determined by array line capacitance, and are not limited by nanotube switching speed. Accordingly, NRAM memory system 1810 may be designed with industry standard SRAM timings such as chip-enable, write-enable, output-enable, etc., or may introduce new timings, for example. Non-volatile NRAM memory system 1810 may be designed to introduce advantageous enhanced modes such as a sleep mode with zero current (zero power—power supply set to zero volts), information preservation when power is shut off or lost, enabling rapid system recovery and system startup, for example. NRAM memory system 1810 circuits are designed to provide the memory array 1700 waveforms 1800 shown in FIG. 19.

Figure 21:
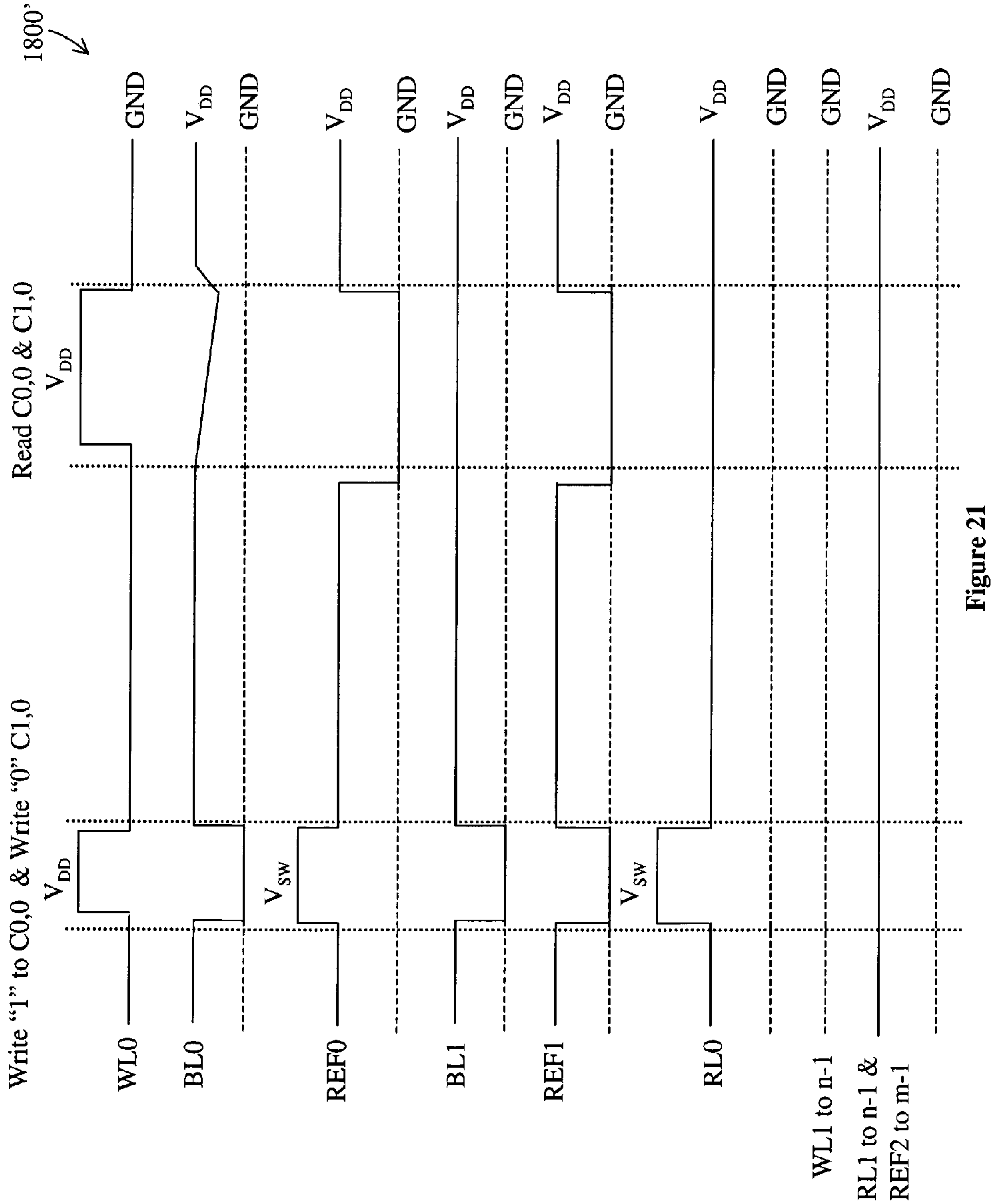
FIG. 21 illustrates waveforms for a memory system according to certain aspects of the invention.

NRAM memory system 1810 accepts timing inputs 1812, accepts address inputs 1825, and accepts data 1867 from a computer, or provides data 1867 to a computer using a bidirectional bus sharing input/output (I/O) terminals. Alternatively, inputs and outputs may use separate (unshared) terminals (not shown). Address input (I/P) buffer 1830 receives address locations (bits) from a computer system, for example, and latches the addresses. Address I/P buffer 1830 provides word address bits to word decoder 1840 via address bus 1837; address I/P buffer 1830 provides bit addresses to bit decoder 1850 via address bus 1852; and address bus transitions provided by bus 1835 are detected by function generating, address transition detecting (ATD), timing waveform generator, controller (controller) 1820. Controller 1820 provides timing waveforms on bus 1839 to word decoder 1840. Word decoder 1840 selects the word address location within array 1815. Word address decoder 1840 is used to decode both word lines WL and corresponding release lines RL (there is no need for a separate RL decoder) and drives word line (WL) and release line (RL) select logic 1845. Controller 1820 provides function and timing inputs on bus 1843 to WL & RL select logic 1845, resulting in NRAM memory system 1810 on-chip WL and RL waveforms for both write-one, write-zero, read-one, and read-zero operations as illustrated by waveforms 1800' shown in FIG. 21. FIG. 21 NRAM memory system 1810 waveforms 1800' correspond to memory array 1700 waveforms 1800 shown in FIG. 19.

Bit address decoder 1850 is used to decode both bit lines BL and corresponding reference lines REF (there is no need for a separate REF decoder) and drive bit line (BL) and reference (REF) select logic 1855 via bus 1856. Controller 1820 provides timing waveforms on bus 1854 to bit decoder 1850. Controller 1820 also provides function and timing inputs on bus 1857 to BL & REF select logic 1855. BL & REF select logic 1855 uses inputs from bus 1856 and bus 1857 to generate data multiplexer select bits on bus 1859. The output of BL and REF select logic 1855 on bus 1859 is used to select control data multiplexers using combined data multiplexers & sense amplifiers/latches (MUXs & SAs) 1860. Controller 1820 provides function and timing inputs on bus 1862 to MUXs & SAs 1860, resulting in NRAM memory system 1810 on-chip BL and REF waveforms for both write-one, write-zero, read-one, and read-zero operations as illustrated by waveforms 1800' corresponding to memory array 1700 waveforms 1800 shown in FIG. 19. MUXs & SAs 1860 are used to write data provided by read/write buffer 1865 via bus 1864 in array 1815, and to read data from array 1815 and provide the data to read/write buffer 1865 via bus 1864 as illustrated in waveforms 1800'.

Figure 20B:
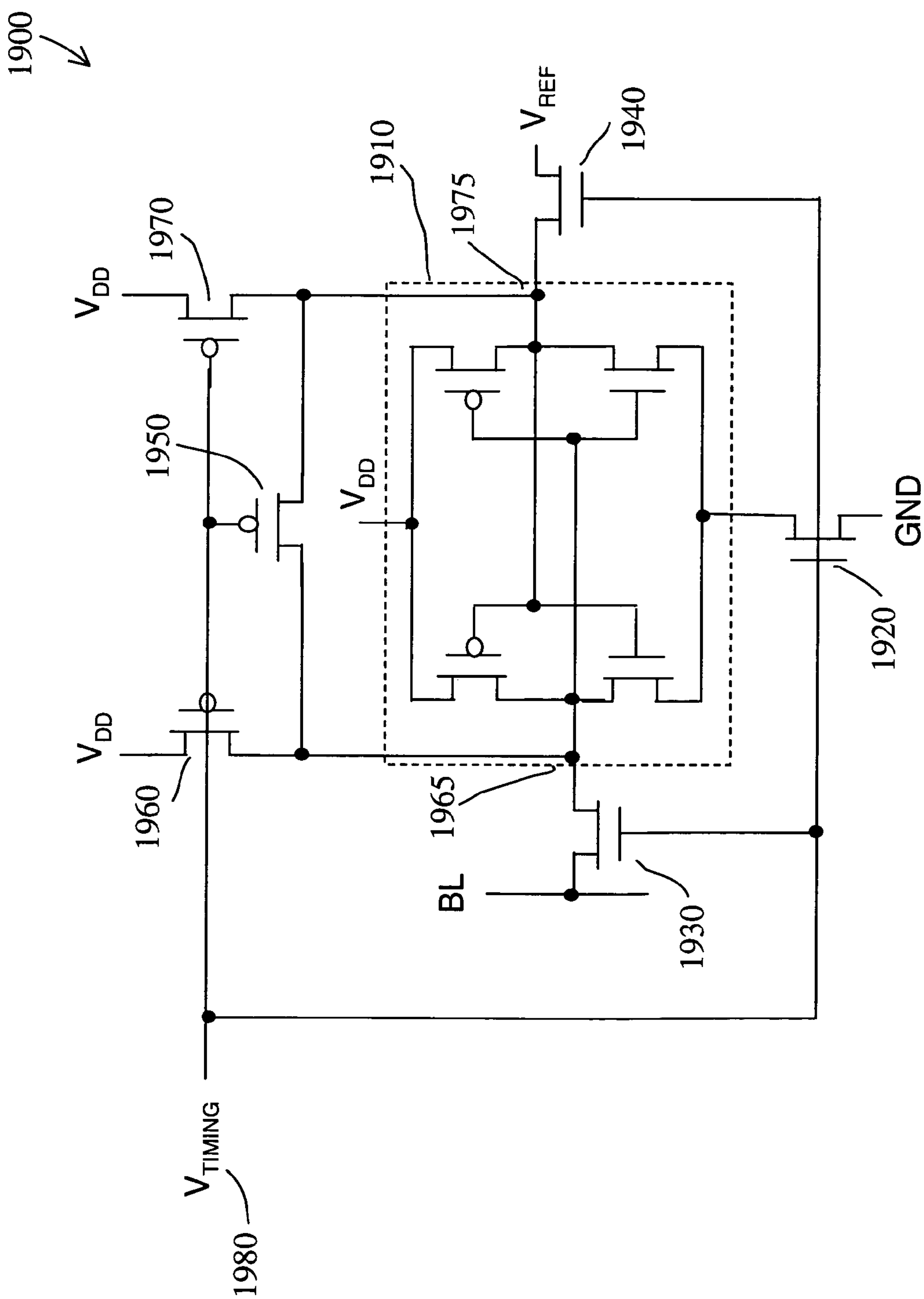
FIG. 20B illustrates a schematic of a switch amplifier/latch according to certain aspects of the invention.

Sense amplifier/latch 1900 is illustrated in FIG. 20B. Flip flop 1910, comprising two back-to-back inverters is used to amplify and latch data inputs from array 1815 or from read/write buffer 1865. Transistor 1920 connects flip flop 1910 to ground when activated by a positive voltage supplied by control voltage $V_{TIMING}$ 1980, which is provided by controller 1820. Gating transistor 1930 connects a bit line BL to node 1965 of flip flop 1910 when activated by a positive voltage. Gating transistor 1940 connects reference voltage $V_{REF}$ to flip flop node 1975 when activated by a positive voltage. Transistor 1960 connects voltage $V_{DD}$ to flip flop 1910 node 1965, transistor 1970 connects voltage $V_{DD}$ to flip flop 1910 node 1975, and transistor 1950 ensures that small voltage differences are eliminated when transistors 1960 and 1970 are activated. Transistors 1950, 1960, and 1970 are activated (turned on) when gate voltage is low (zero, for example).

In operation, $V_{TIMING}$ voltage is at zero volts when sense amplifier 1900 is not selected. NFET transistors 1920, 1930, and 1940 are in the "OFF" (non-conducting) state, because gate voltages are at zero volts. PFET transistors 1950, 1960, and 1970 are in the "ON" (conducting) state because gate voltages are at zero volts. $V_{DD}$ may be 5, 3.3, or 2.5 volts, for example, relative to ground. Flip flop 1910 nodes 1965 and 1975 are at $V_{DD}$. If sense amplifier/latch 1900 is selected, $V_{TIMING}$ transitions to $V_{DD}$, NFET transistors 1920, 1930, and 1940 turn "ON", PFET transistors 1950, 1960, and 1970 are turned "OFF" , and flip flop 1910 is connected to bit line BL and reference voltage $V_{REF}$. $V_{REF}$ is connected to $V_{DD}$ in this example. As illustrated by waveforms BL0 and BL1 of waveforms 1800', bit line BL is pre-charged prior to activating a corresponding word line (WL0 in this example). If cell 1000 of memory array 1700 (memory system array 1815) stores a "1", then bit line BL in FIG. 20B corresponds to BL0 in FIG. 21, BL is discharged by cell 1000, voltage droops below $V_{DD}$, and sense amplifier/latch 1900 detects a "1" state. If cell 1000 of memory array 1700 (memory system array 1815) stores a "0", then bit line BL in FIG. 20B corresponds to BL1 in FIG. 21, BL is not discharged by cell 1000, voltage does not droop below $V_{DD}$, and sense amplifier/latch 1900 detect a "0" state. The time from sense amplifier select to signal detection by sense amplifier/latch 1900 is referred to as signal development time. Sense amplifier/latch 1900 typically requires 100 to 200 mV relative to $V_{REF}$ in order to switch. It should be noted that cell 1000 requires a nanotube "OFF" resistance to "ON" resistance ratio of greater than about 10 to 1 for successful operation. A typical bit line BL has a capacitance value of 250 fF, for example. A typical nanotube storage device (switch) or dimensions 0.2 by 0.2 um typically has 8 nanotube filaments across the suspended region, for example, as illustrated further below. For a combined contact and switch resistance of 50,000 Ohms per filament, as illustrated further below, the nanotube "ON" resistance of cell 1000 is 6,250 Ohms. For a bit line of 250 fF, the time constant RC=1.6 ns. The sense amplifier signal development time is less than RC, and for this example, is between 1 and 1.5 nanoseconds.

Non-volatile NRAM memory system 1810 operation may be designed for high speed cache operation at 5 ns or less access and cycle time, for example. Non-volatile NRAM memory system 1810 may be designed for low power operation at 60 or 70 ns access and cycle time operation, for example. For low power operation, address I/P buffer 1830 operation requires 8 ns; controller 1820 operation requires 16 ns; bit decoder 1850 operation plus BL & select logic 1855 plus MUXs & SA 1860 operation requires 12 ns (word decoder 1840 operation plus WL & RL select logic 1845 ns require less than 12 ns); array 1815 delay is 8 ns; sensing 1900 operation requires 8 ns; and read/write buffer 1865 requires 12 ns, for example. The access time and cycle time of non-volatile NRAM memory system 1810 is 64 ns. The access time and cycle time may be equal because the NDRO mode of operation of nanotube storage devices (switches) does not require a write-back operation after access (read).

Method of Making Field Effect Device with Controllable Source and NT-on-Source Memory System and Circuits with Parallel Bit and Reference Array Lines, and Parallel Word and Release Array Lines Non-volatile field effect devices (FEDs) 20, 40, 60, and 80 with controllable sources may be used as cells and interconnected into arrays to form non-volatile nanotube random access memory (NRAM) systems. The memory cells contain one select device (transistor) T and one non-volatile nanotube storage element NT (1T/1NT) cells). By way of example, FED4 80 (FIG. 2D) devices are fabricated and interconnected to form a non-volatile NRAM memory cell that is also referred to as a NT-on-Source memory cell with parallel bit and reference array lines, and parallel word and release array lines.

Figure 22:
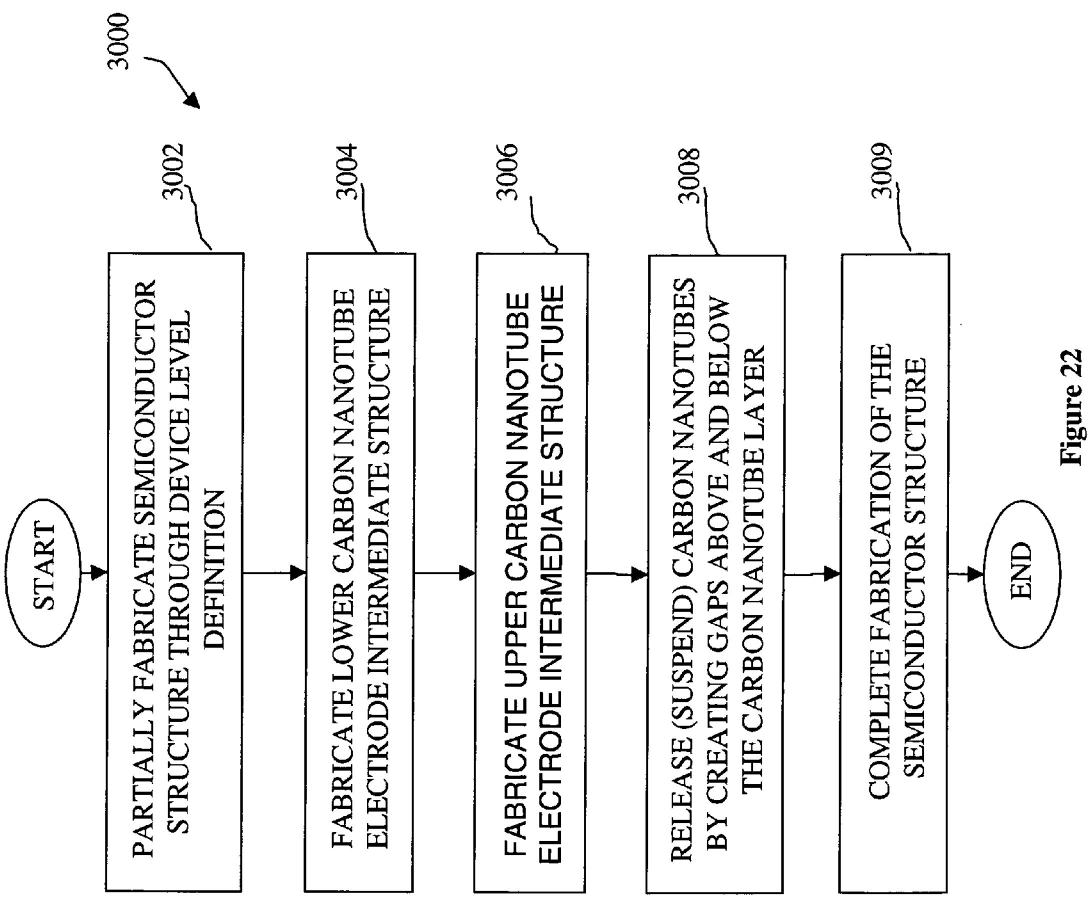
FIG. 22 is a flow chart of a method of manufacturing preferred embodiments of the invention.

FIG. 22 describes the basic method 3000 of manufacturing preferred embodiments of the invention. The following paragraphs describe such method in specific relation to an NRAM NT-on-source structure. However, this method is sufficient to cover the manufacturer of all the preferred field effect devices described.

In general, preferred methods first form 3002 a field effect device similar to a MOSFET, having drain, source, and gate nodes. Such a structure may be created with known techniques and thus is not described here. Such a structure defines a base layer on which a nanotube control structure may be created.

Once the semiconductor structure is defined in the substrate, preferred methods then 3004 a lower carbon nanotube intermediate control structure having nanotube electromechanical, non-volatile switches. FIGS. 24A, 24B, 24C, 24D, and 24E depict five exemplary structures that are NT-on-source devices.

Figure 24A:
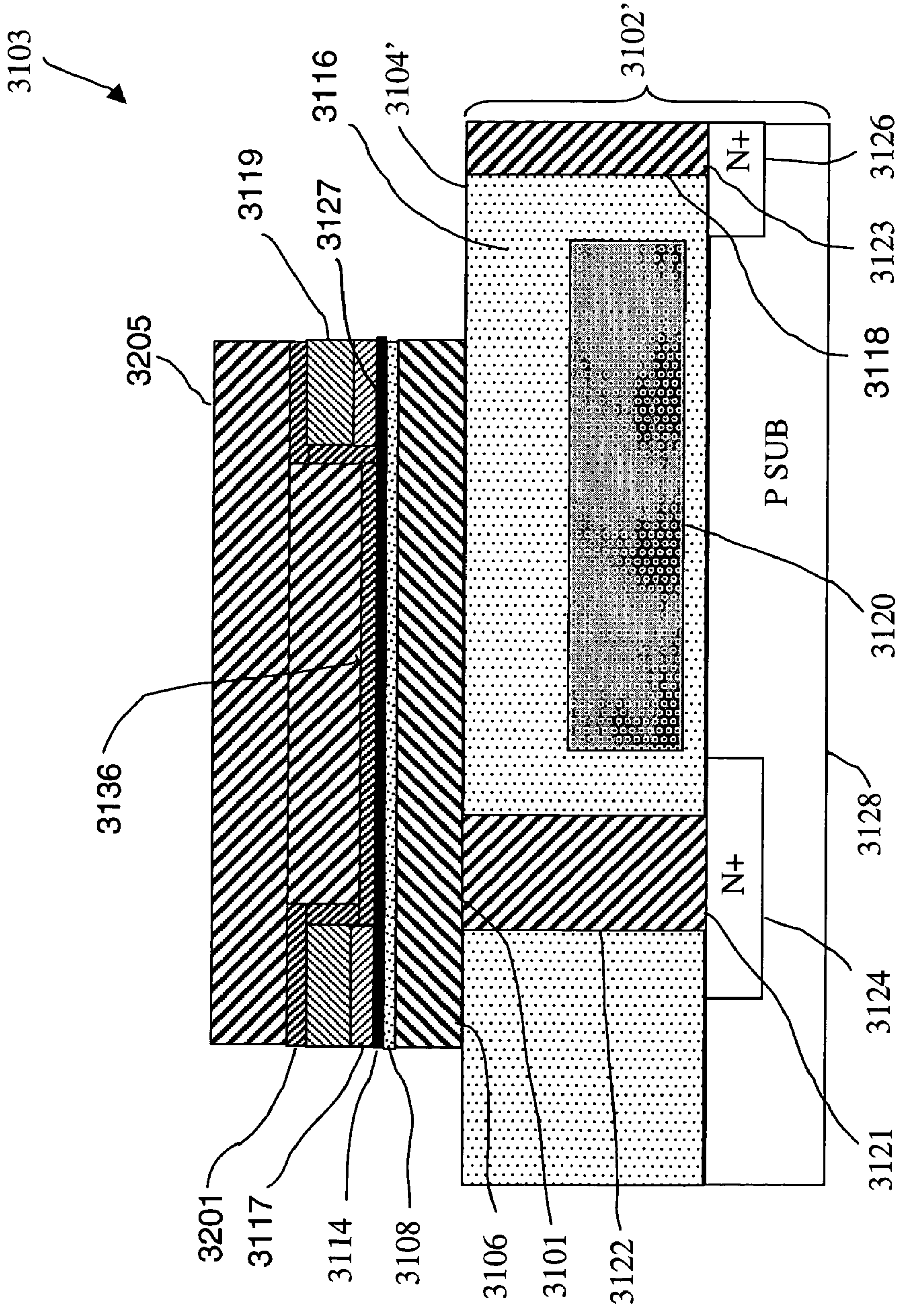
FIGS. 24A–F illustrate exemplary structures according to aspects of the invention.

FIG. 24A illustrates a cross section of intermediate structure 3103. Intermediate structure 3103 includes an intermediate base structure 3102' (formed in step 3002) with an intermediate nanotube control structure on top. The base structure 3102' includes N+ drain regions 3126, and N+ doped source regions 3124 in p-type monocrystalline silicon substrate 3128. Polysilicon gates 3120 control the channel region between drain and source. Shared conductive stud 3118 contacts drain 3126 in contact region 3123. Contact studs 3122, one for each nanotube structure, physically and electrically connect the base structure 3102' to the NT control structure. Specifically stud 3122 connects to electrode 3106 at contact region 3101, and to source 3124 at contacting region 3121.

The NT structure is disposed over the planar oxide region 3116. The NT structure includes electrode (switch-plate) 3106, a first sacrificial gap layer 3108 on electrode 3106, a nanotube fabric (porous) element 3114 deposited on first sacrificial gap layer 3108, a nanotube conductive contact layer 3117 providing mechanical support (nanotube fabric element pinning between layers 3108 and 3117) and electrical contact, and conductive layer 3119 deposited on nanotube contact layer 3117 for enhanced electrical conductivity, and to act as an etch mask for layer 3117. At this point, lower carbon nanotube intermediate control structures 3109 and 3109', illustrated in FIGS. 25E–25G and FIGS. 25EE–25GG, respectively, have been formed. The material of electrode 3106 may be tungsten, aluminum, copper, gold, nickel, chrome, platinum, palladium, or combinations of conductors such as chrome-copper-gold. Electrode 3106 thickness is in the range of 25 to 200 nm. The material of electrode 3106 is selected for reliable near-ohmic low contact resistance $R_{SW}$ between electrode 3106 and nanotube fabric layer 3114, and cyclability (number or contact-release cycles) after gap formation (shown below), when switching fabric layer 3114 switches in-out-of contact with electrode 3106 during product operation. $R_{SW}$ may be in the range of 1,000 to 100,000 Ohms per contacted fiber in fabric layer 3114. For a fabric layer 3114 with 10 contacted fibers, for example, contact resistance $R_{SW}$ may be in the range of 100 to 10,000 Ohms, for example.

Once the lower carbon nanotube intermediate control structures 3109 and 3109' are formed, then fabricate 3006 an upper carbon nanotube electrode intermediate structure. Opening 3136 defines the dimensions of the nanotube fabric element 3114 to be suspended, including that portion of first sacrificial gap layer 3108 to be removed. The material from which nanotube fabric conductive contact layer 3117 is chosen depends upon desired electrical contact 3127 resistance $R_C$ properties, such as a near-ohmic low resistance contact between conductor 3117 and nanotube fabric element 3114. Combined nanotube fabric element 3114 below opening 3136, and combined electrical conductors 3117 and 3119 in adjacent mechanical and electrical contact region 3127, form a low resistance $R_C$ local NT to conductor contact 3127 region. $R_C$ may be in the range of 1,000 to 100,000 Ohms per contacted fiber in fabric layer 3114. For a fabric layer 3114 with 10 contacted fibers, for example, contact resistance $R_C$ may be in the range of 100 to 10,000 Ohms, for example. This local conductor region surrounds opening 3136 and may be referred to as a picture frame region, with nanotube contact layer 3114 element pinned between conductor 3117 and a portion of first sacrificial gap layer 3108 that remains in the final product structure. In a picture frame region as illustrated in FIG. 24A, each end of a fiber is electrically connected to the picture frame, such that the resistance connection to the switch is $R_C/2$. Combined electrical conductors 3117 and 3119 form a low resistance interconnect NT structure.

At this stage of the method, electrode (release-plate) 3205 is formed. A conformal second sacrificial gap layer 3201 deposited on patterned conductor 3119, and electrode 3205 is deposited on second sacrificial gap layer 3201, planarized, and layers of material for electrode 3205 and 3201 are patterned. The thickness of first sacrificial gap layer 3108 situated between nanotube fabric layer 3114 and electrode 3106 is typically in the range of 5 to 20 nm. The film thickness of second sacrificial gap layer 3201 situated between nanotube fabric layer 3114 and electrode 3205 is typically in the range of 5 to 40 nm. Film thicknesses are in the range of 100 to 200 nm, typical of 130 nm minimum dimension (half-period) semiconductor technology. Nanotube fabric layer 3114 film thickness is on the order of 0.5–5 nm, for example. Nanotube fabric layer 3114 minimum dimension is typically 130 nm. As will be explained below, once the sacrificial materials are removed, the suspended length of the nanotube fabric element 3114 in the NT device region is on the order of 100 to 150 nm, but may be scaled to a suspended length of 20 to 40 nm, for example. The channel length between drain 3126 and source 3124 can be on the order of 100 to 130 nm as defined by polysilicon gate 3120, but may be scaled to the 30 to 90 nm range, for example. The integrated semiconductor structure defines a surface 3104' on which the NT structure is formed.

Figure 24B:
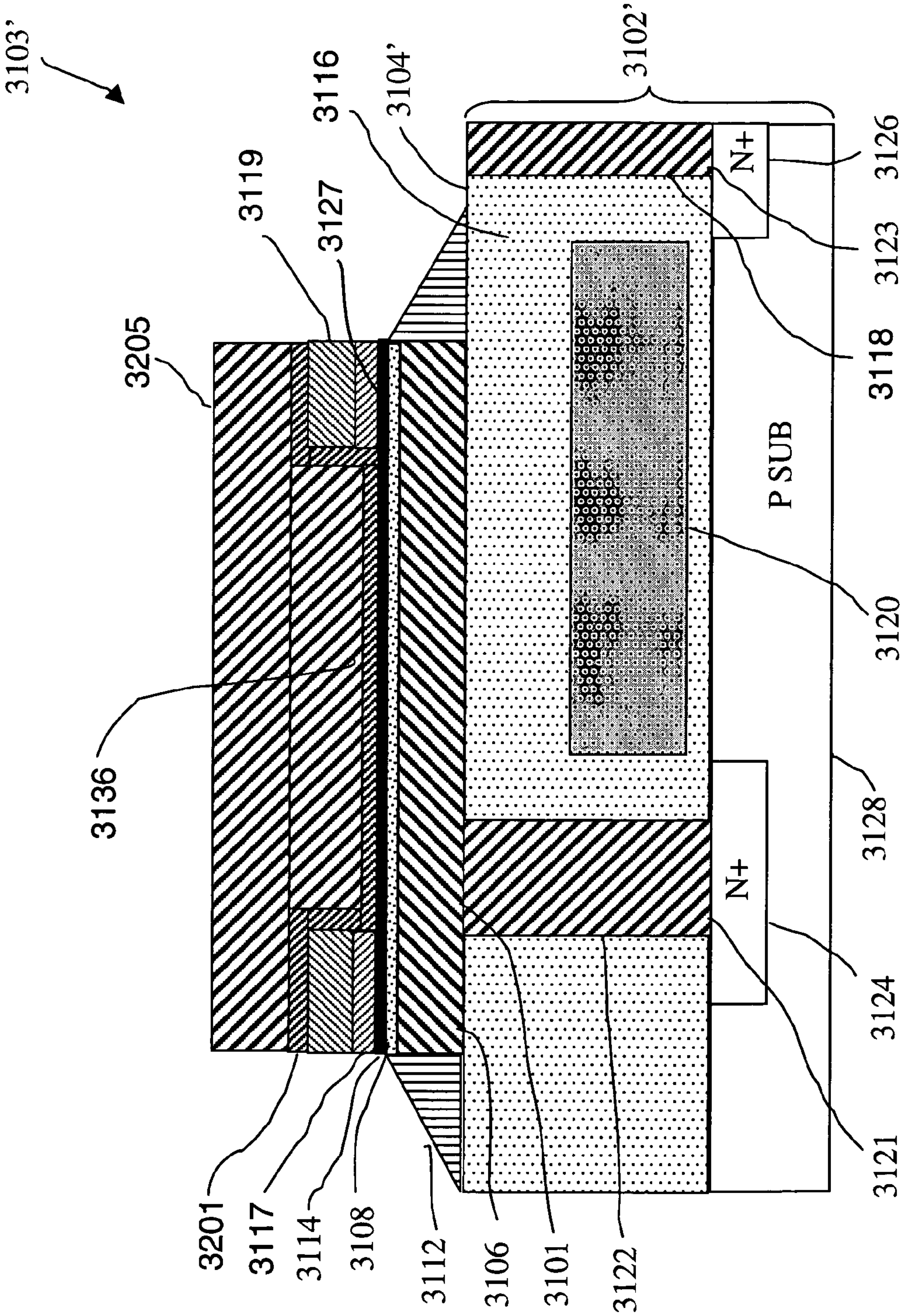

FIG. 24B illustrates a cross section of intermediate structure 3103'. Intermediate structure 3103' is similar to structure 3103 of FIG. 24A, but adds additional nanotube layer element 3114 angled (non-horizontal) supports 3112 (nanotube layer contact to supports 3112 is not visible in this cross sectional view).

Figure 24C:
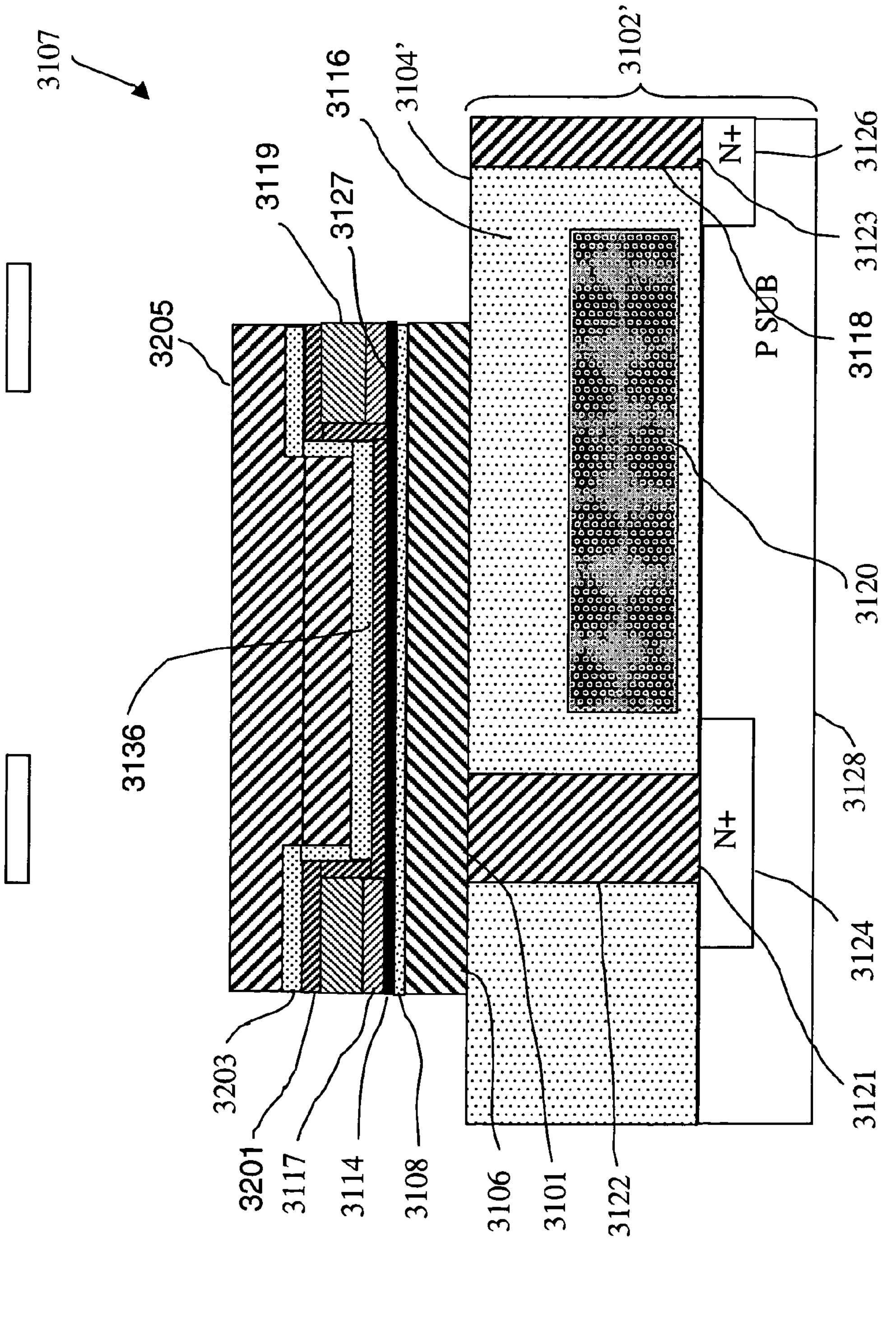

FIG. 24C illustrates a cross section of intermediate structure 3107. Intermediate structure 3107 is similar to structure 3103 of FIG. 24A, but has an additional insulating layer 3203 between second sacrificial gap layer 3201 and electrode 3205. Insulating layer 3201 thickness is typically in the range of 5 to 20 nm. Structure 3107 with insulating layer 3203 on the underside of electrode 3205 forms a release-plate of the nanotube switch above nanotube fabric layer 3114 as discussed further below. Electrode 3106 forms a switch-plate of the nanotube switch below nanotube fabric layer 3114 as discussed further below.

Figure 24D:
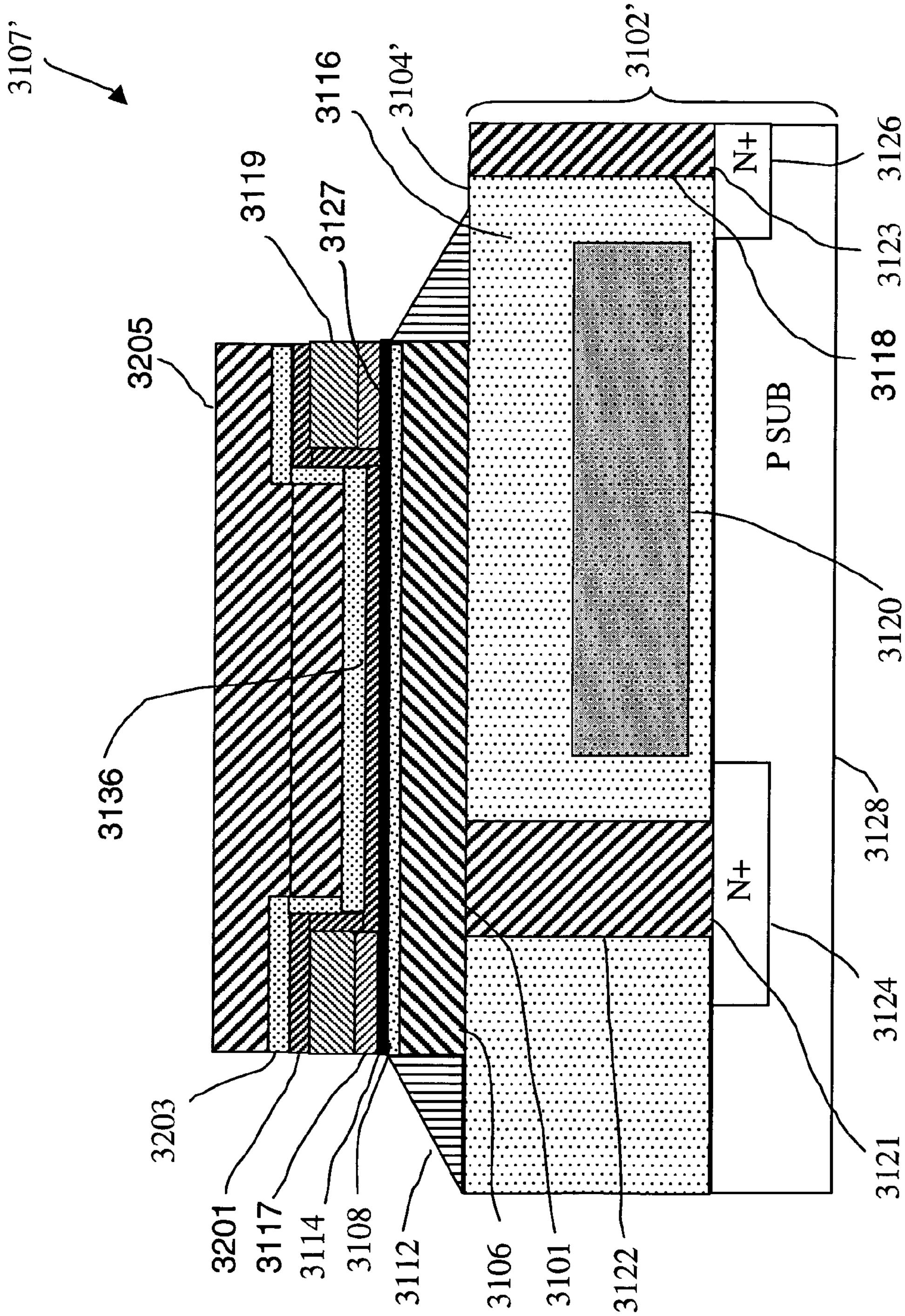

FIG. 24D illustrates a cross section of intermediate structure 3107'. Intermediate structure 3107' is similar to structure 3107 of FIG. 24C, but adds additional nanotube layer 3114 element angled (non-horizontal) supports 3112 (contact region is not visible in this cross sectional view).

Figure 24E:
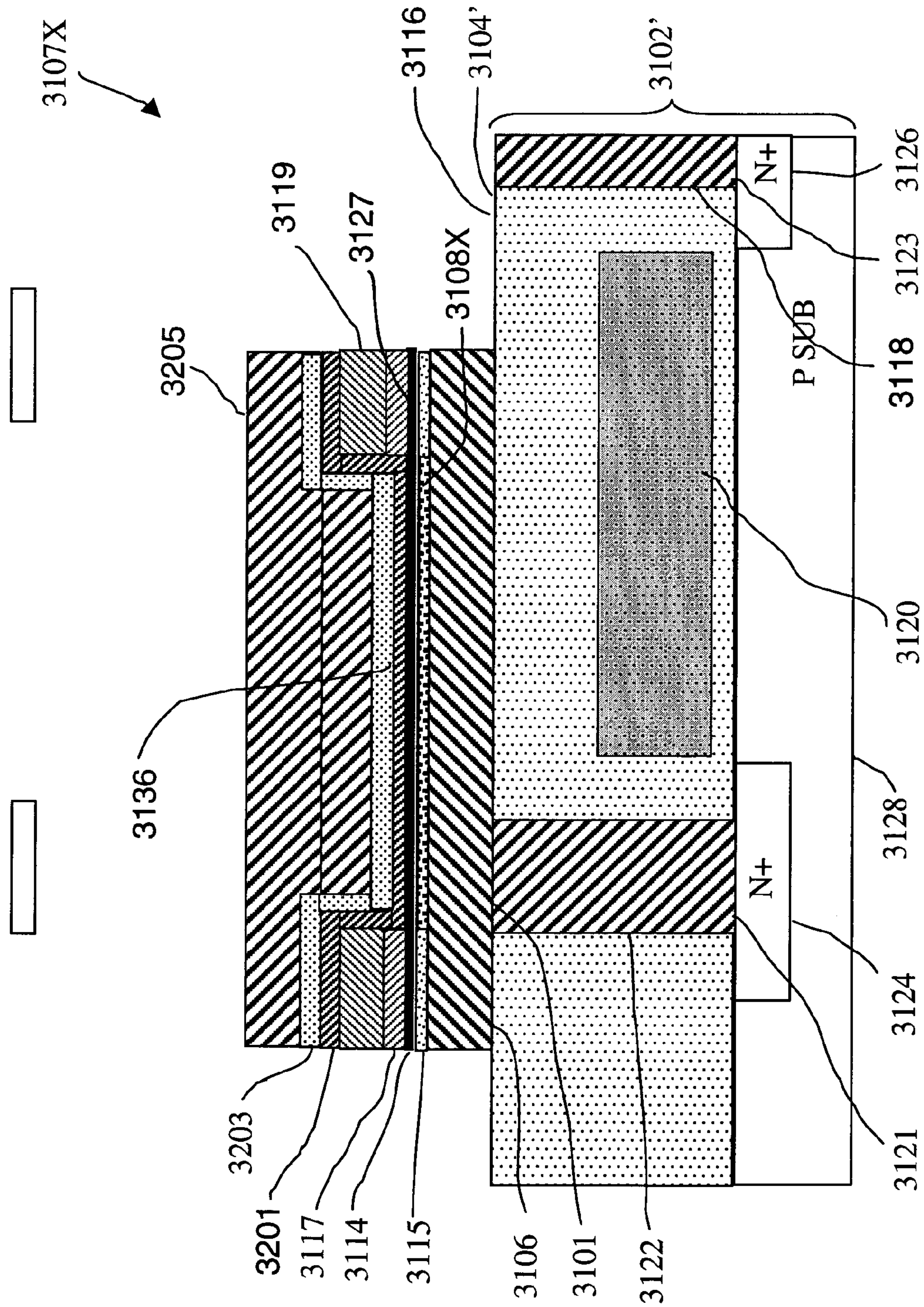

FIG. 24E illustrates a cross section of intermediate structure 3107X. Intermediate structure 3107X is similar to structure 3107 of FIG. 24C, except that first sacrificial layer 3108 insulator, $Si_3N_4$, for example, is replaced by first sacrificial layer 3108X semiconductor or conductor, silicon (Si), for example, and an insulator border region 3115, where region 3115 may be $SiO_2$ or $Si_3N_4$, for example. First sacrificial layer 3108X dimensions correspond to the suspended region of the nanotube switch structure. Insulator border region 3115 is used as part of a nanotube pinning structure (explained further below) under the nanotube fabric required to support nanotube 3114 when elongated during switching.

Figure 24F:
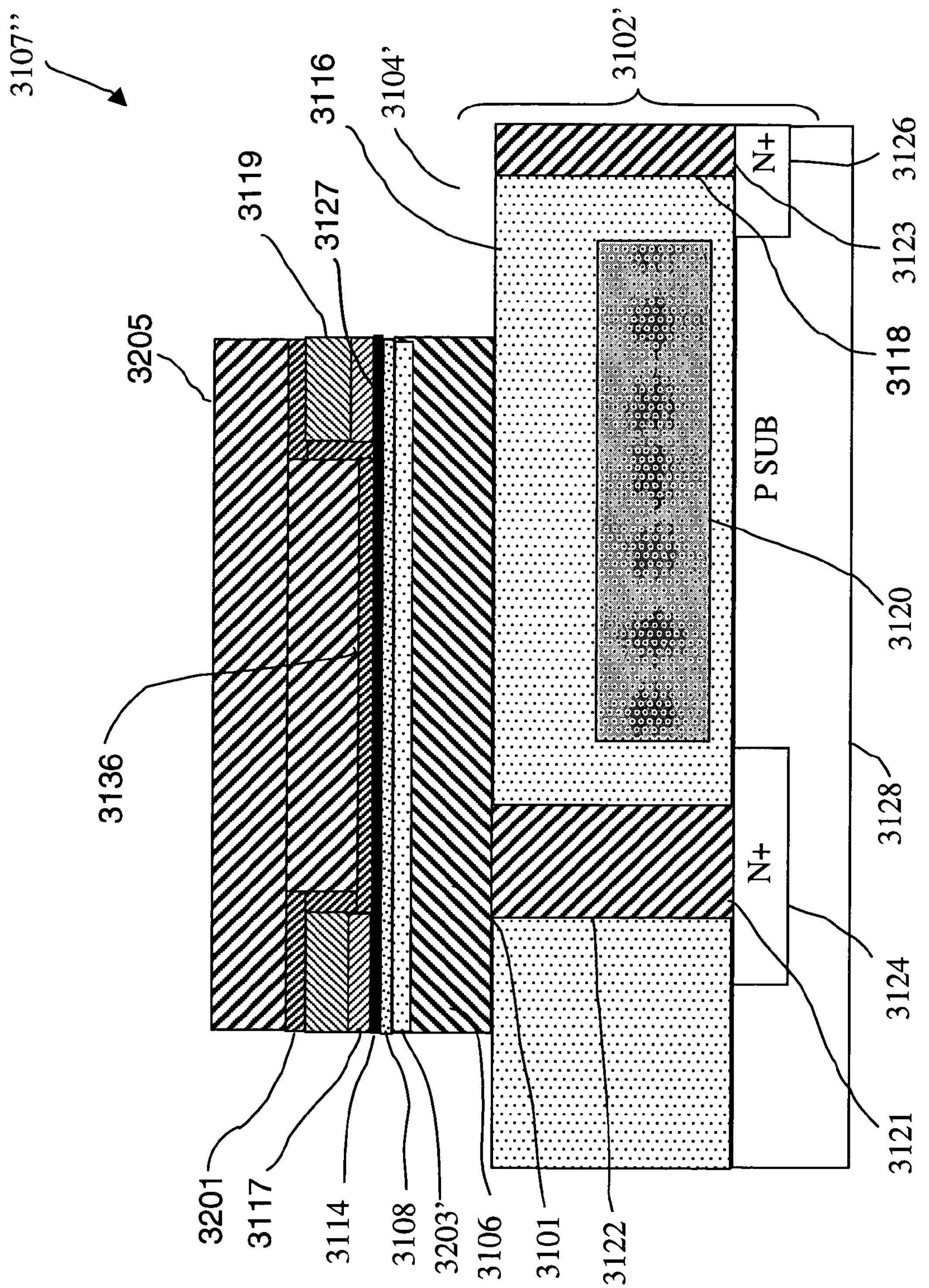

FIG. 24F illustrates a cross section of intermediate structure 3107''. Intermediate structure 3107'' is similar to structure 3103 of FIG. 24A, but has an additional insulating layer 3203' between first sacrificial gap layer 3108 and electrode 3106. Insulating layer 3203' thickness is typically in the range of 5 to 20 nm. Structure 3107'' with insulating layer 3203' on the topside of electrode 3106 forms a release-plate of the nanotube switch below nanotube fabric 3114 as discussed further below. Electrode 3205 forms switch-plate of the nanotube switch above nanotube fabric layer 3114 as discussed further below. In other words, the roles of bottom and top electrodes in FIGS. 24C and 24E are reversed, however, after fabrication is completed and the nanotubes are released (gap regions are formed), both nanotube switches exhibit the same electrical operational characteristics. Fabrication methods used to fabricate the structures illustrated in FIGS. 24A–24D also may be used to fabricate structure 24F, with slight modifications as discussed further below.

Figure 30A:
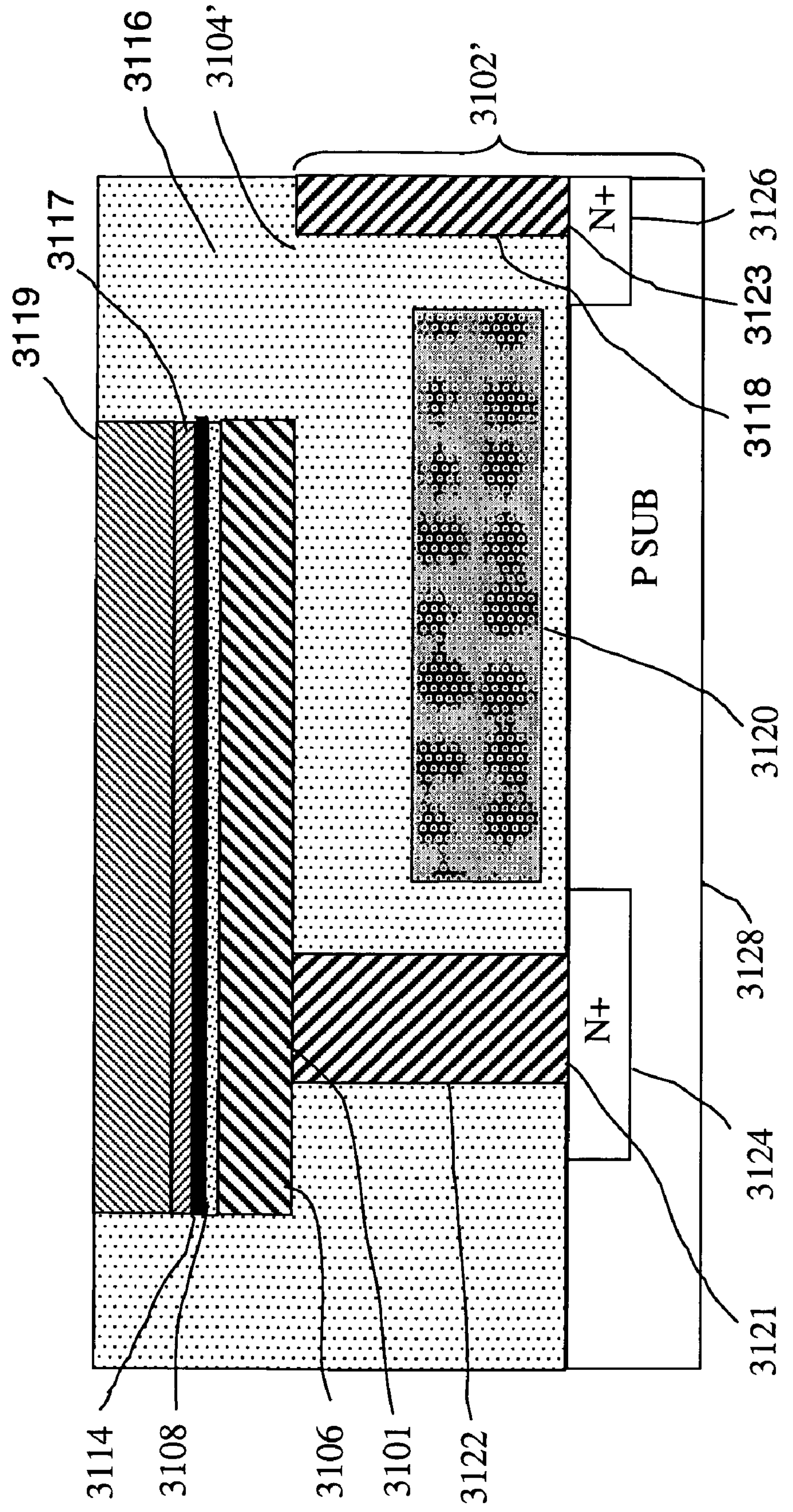
FIGS. 30A–P illustrate intermediate structures according to certain aspects of the invention.
Figure 30A:
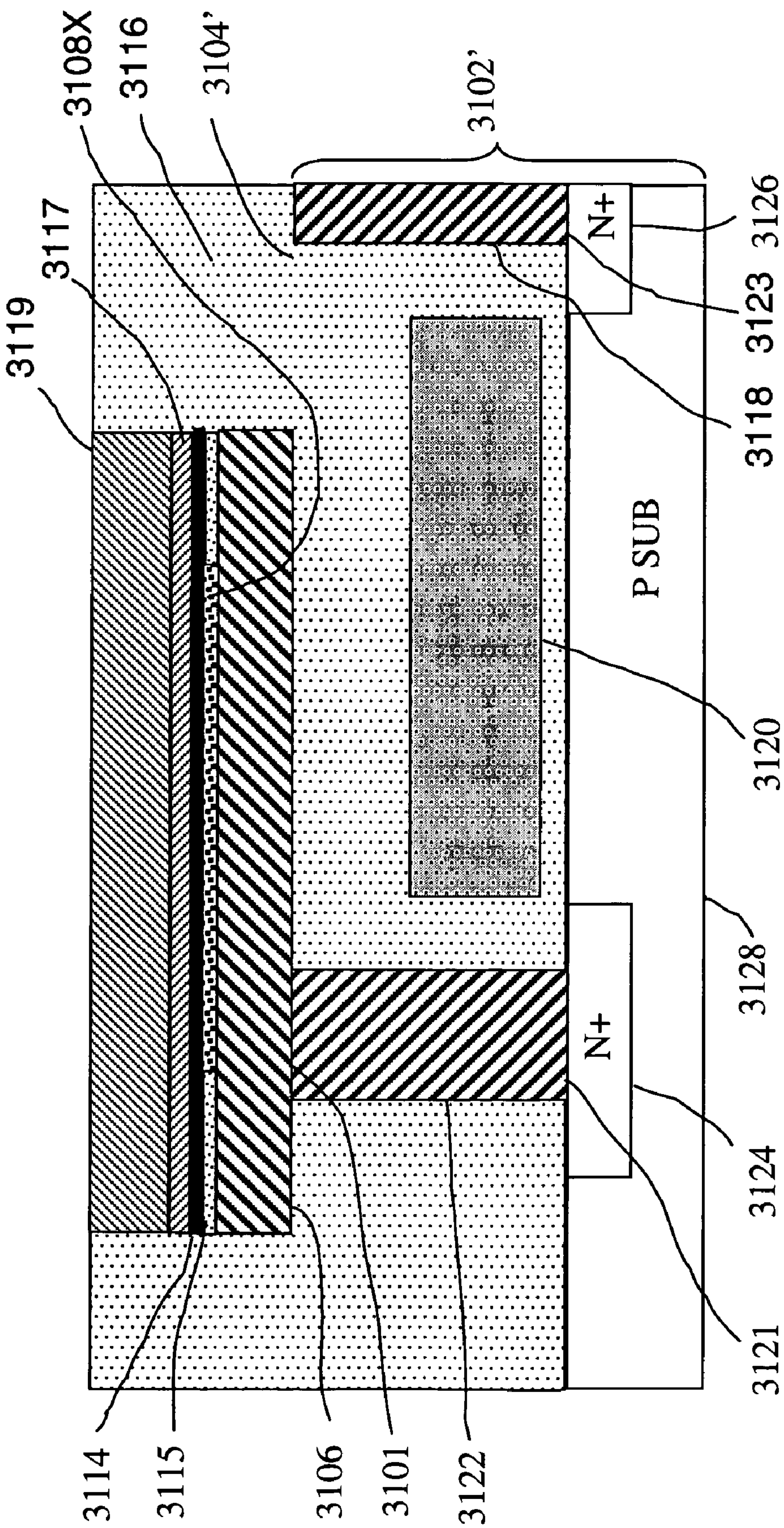
Figure 30B:
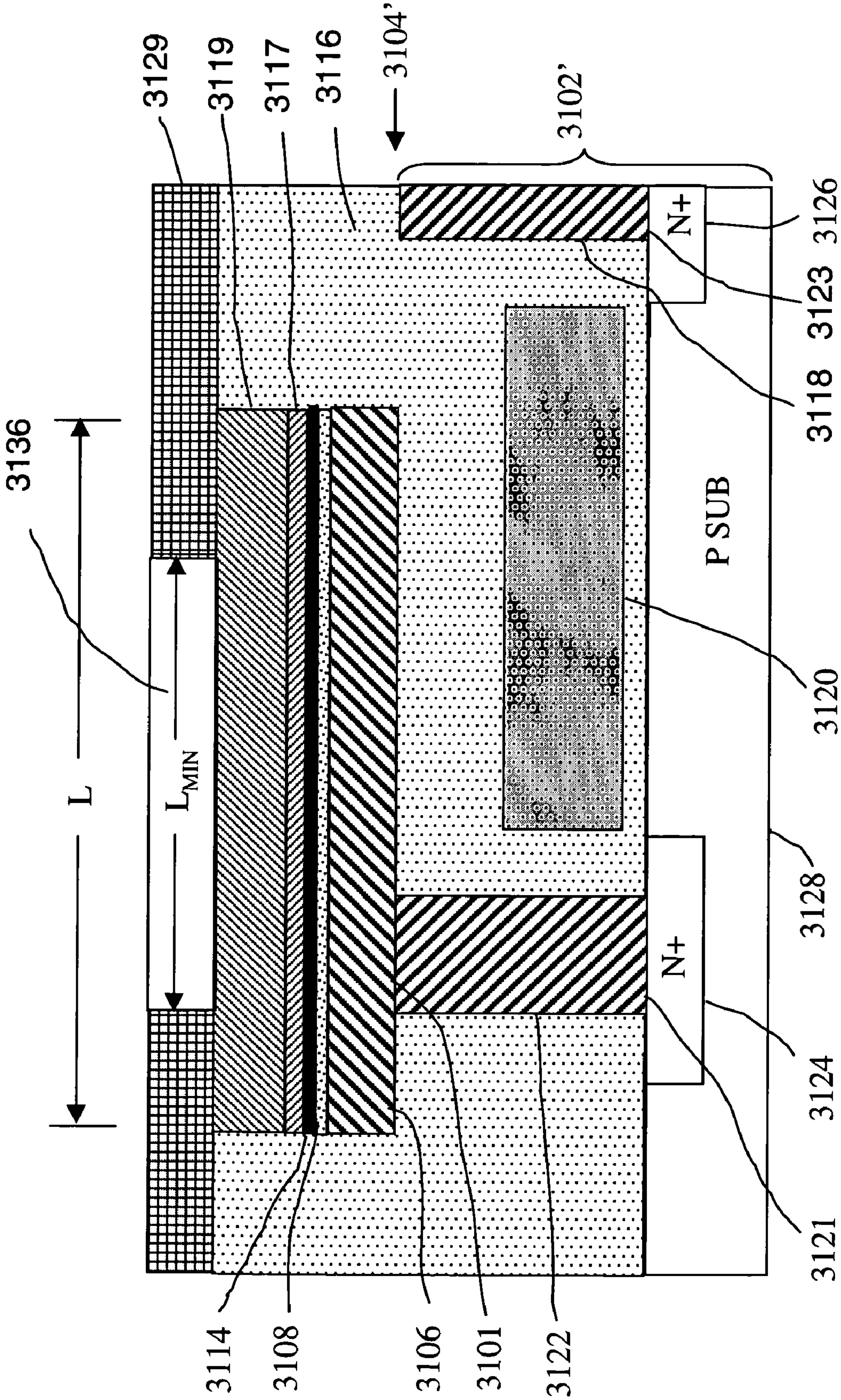
Figure 30C:
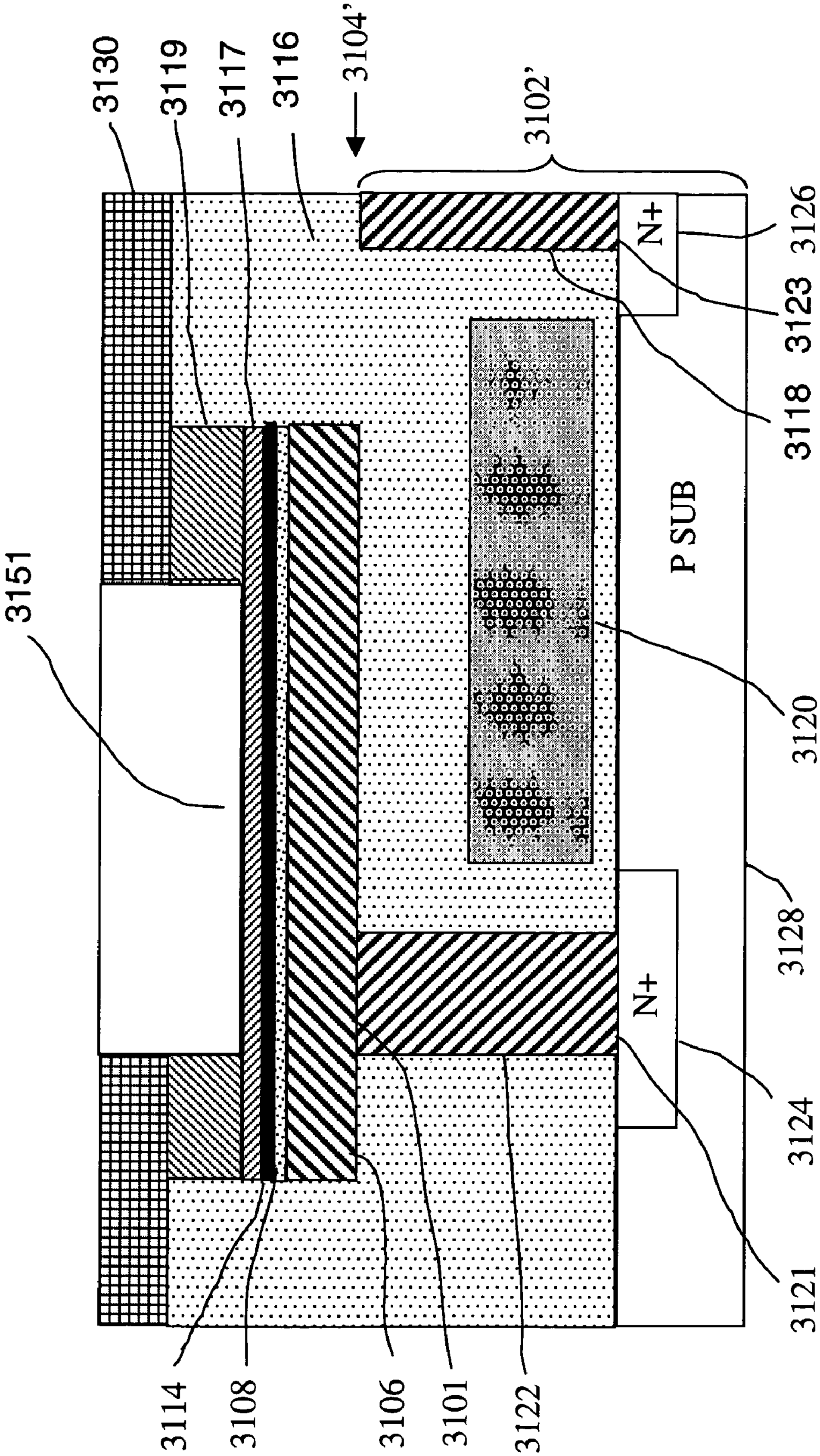
Figure 30D:
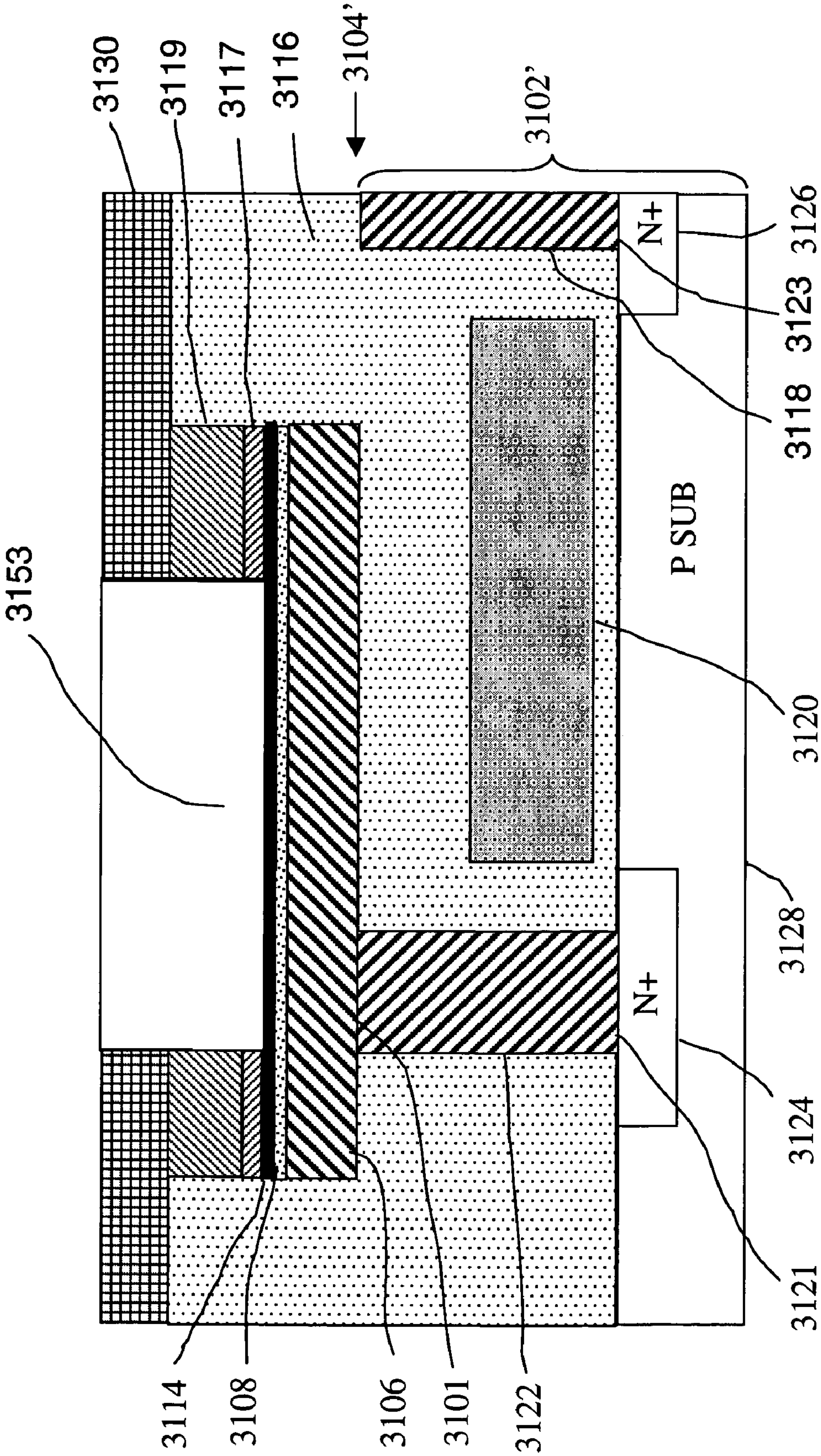
Figure 30E:
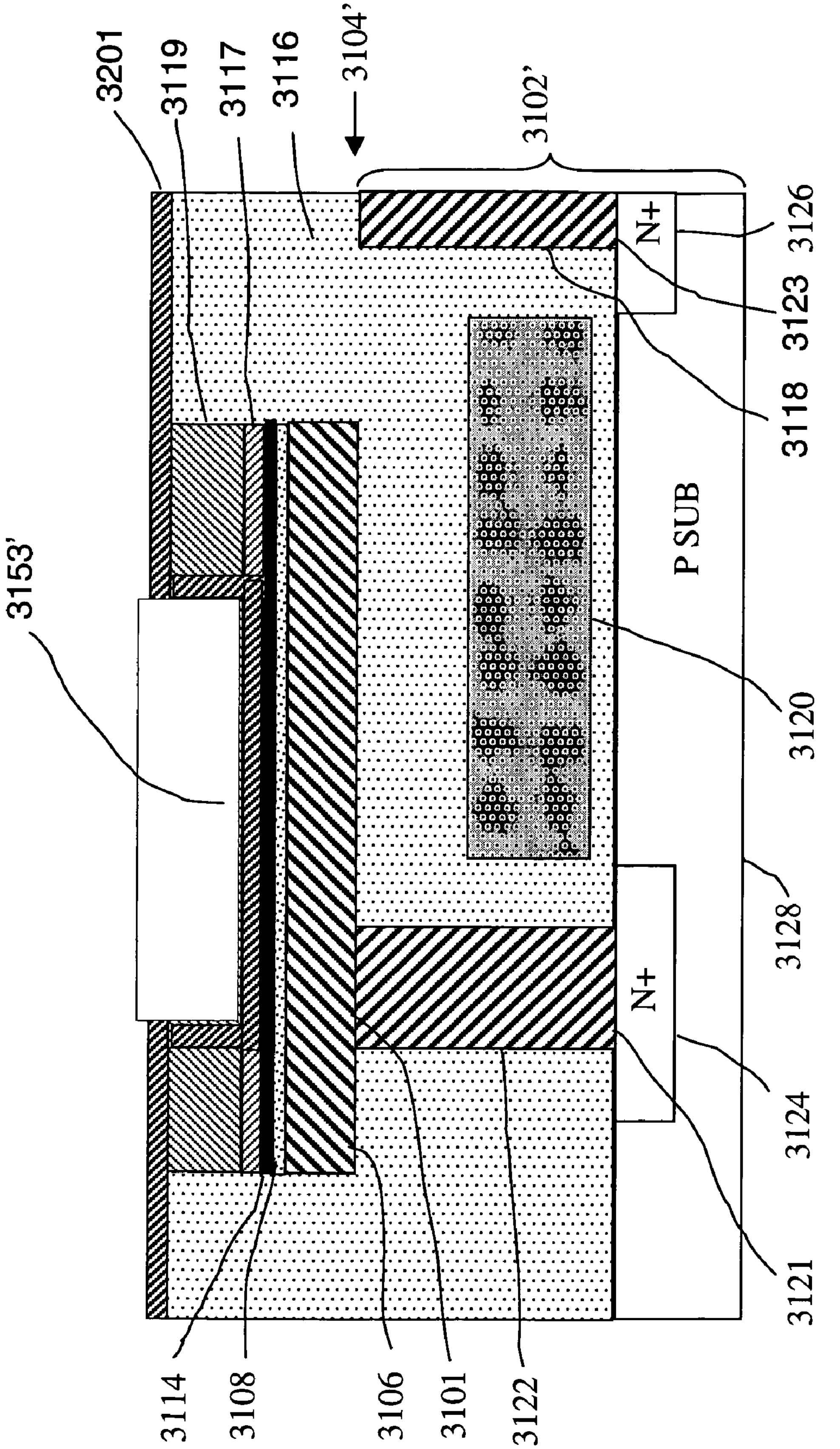
Figure 30E:
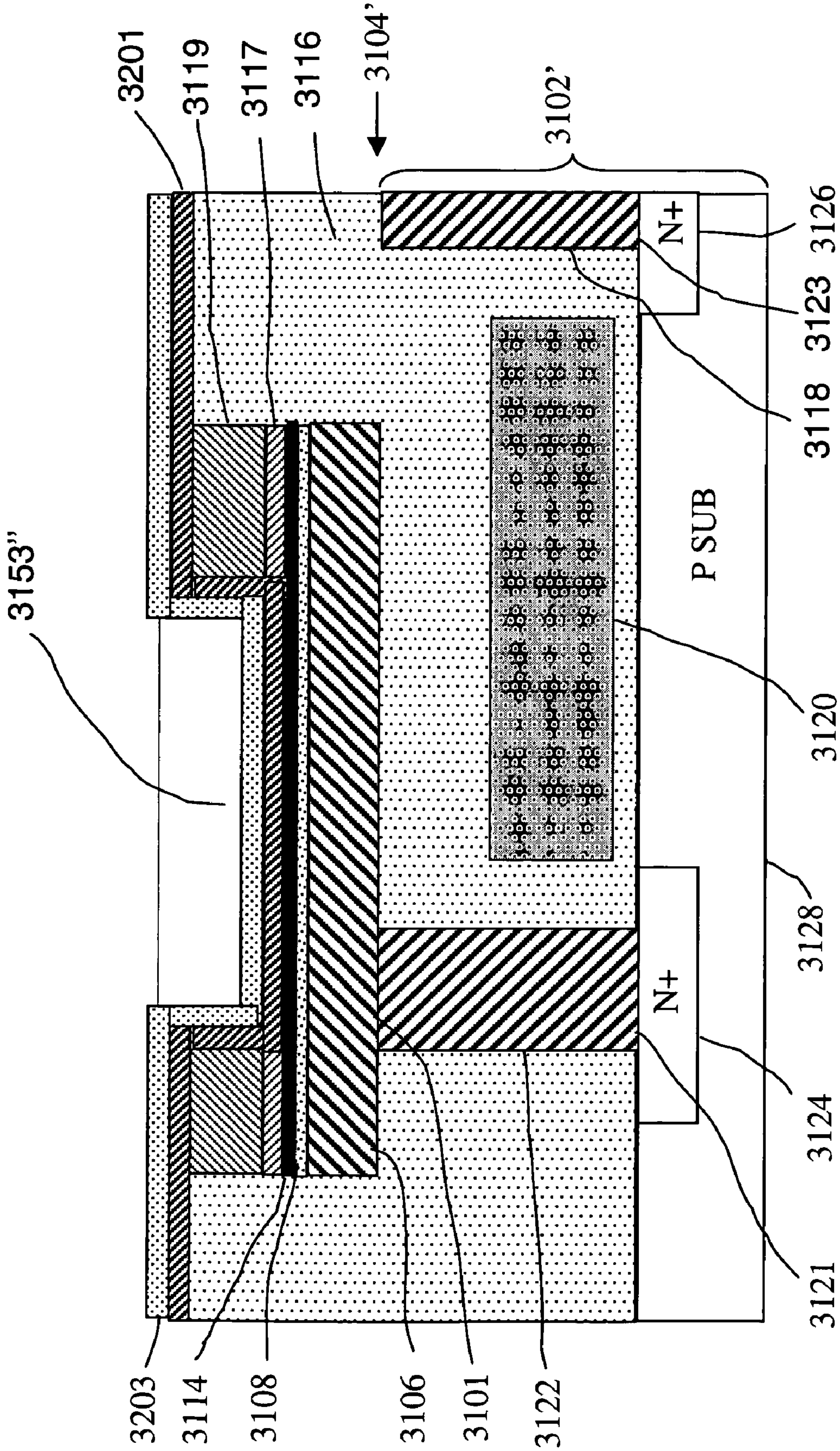
Figure 30F:
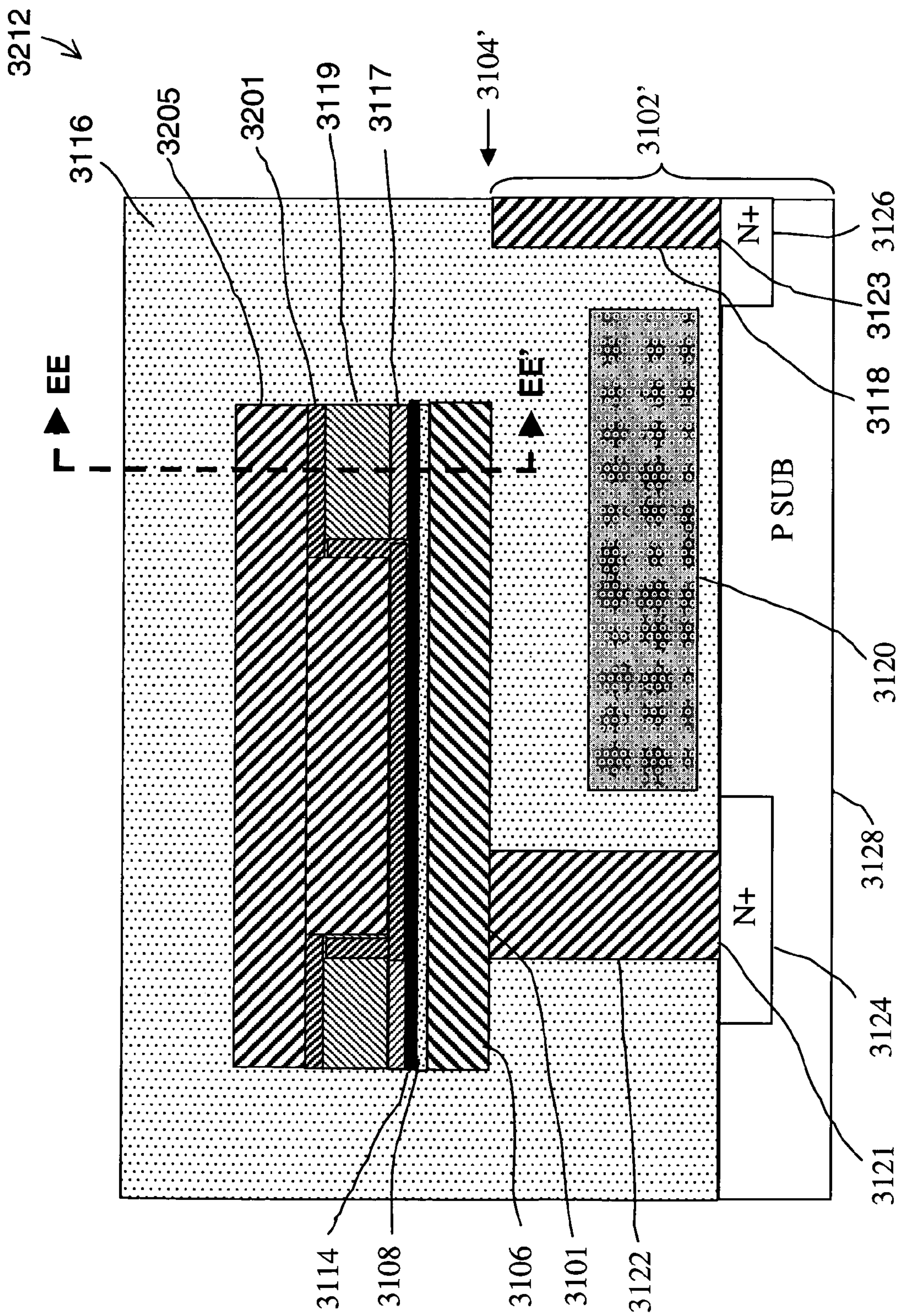
Figure 30F:
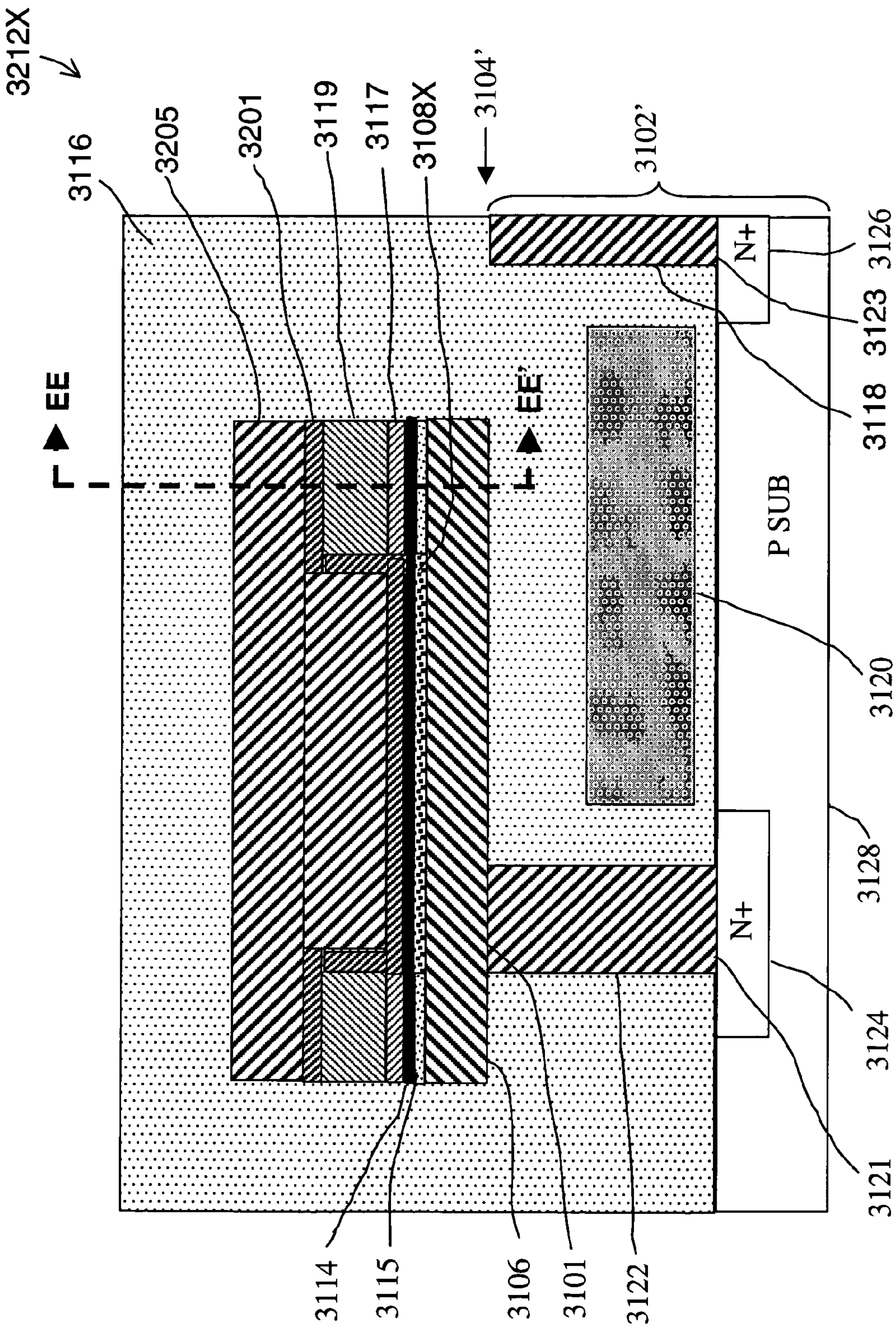
Figure 30F:
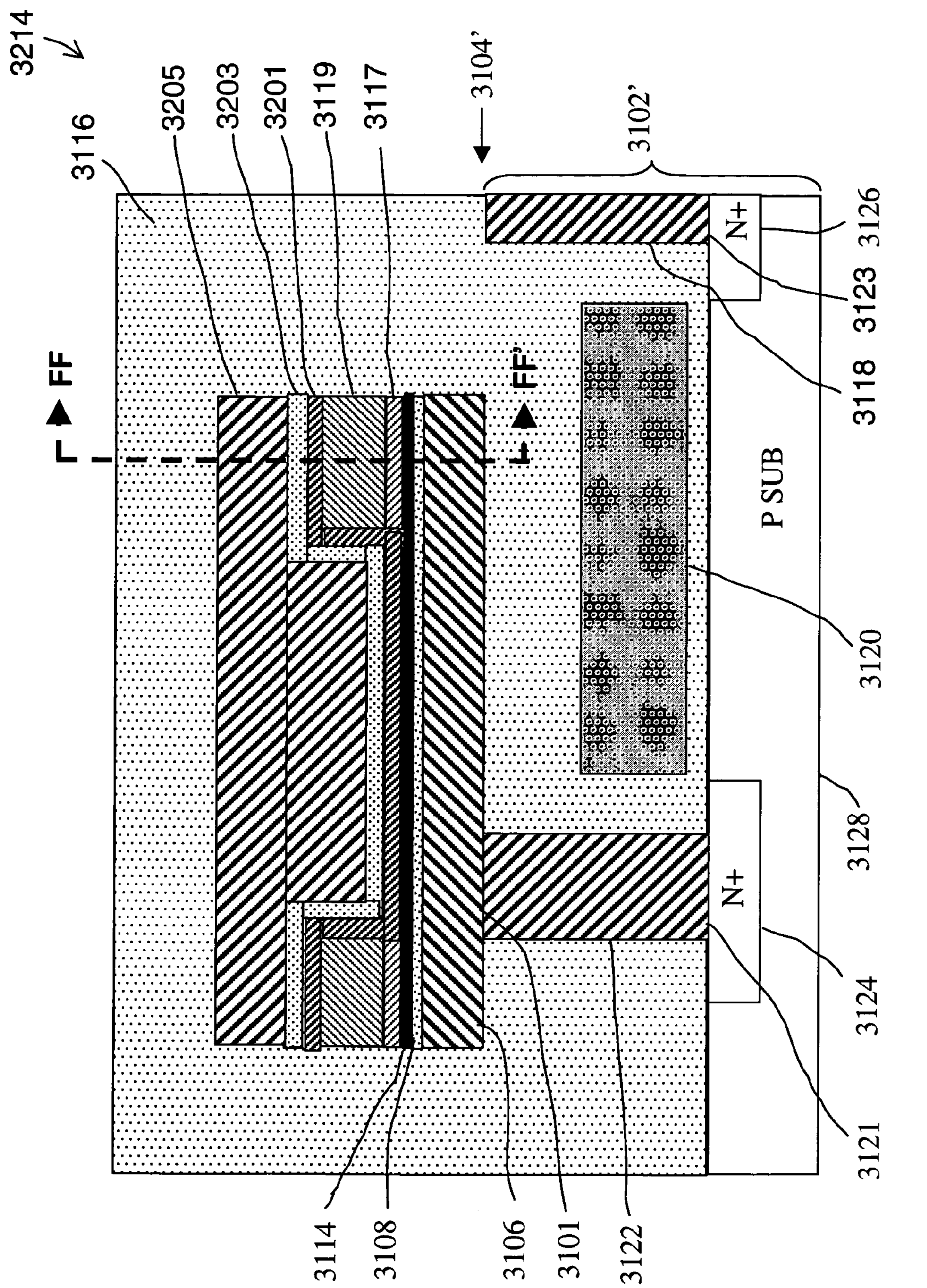
Figure 30F:
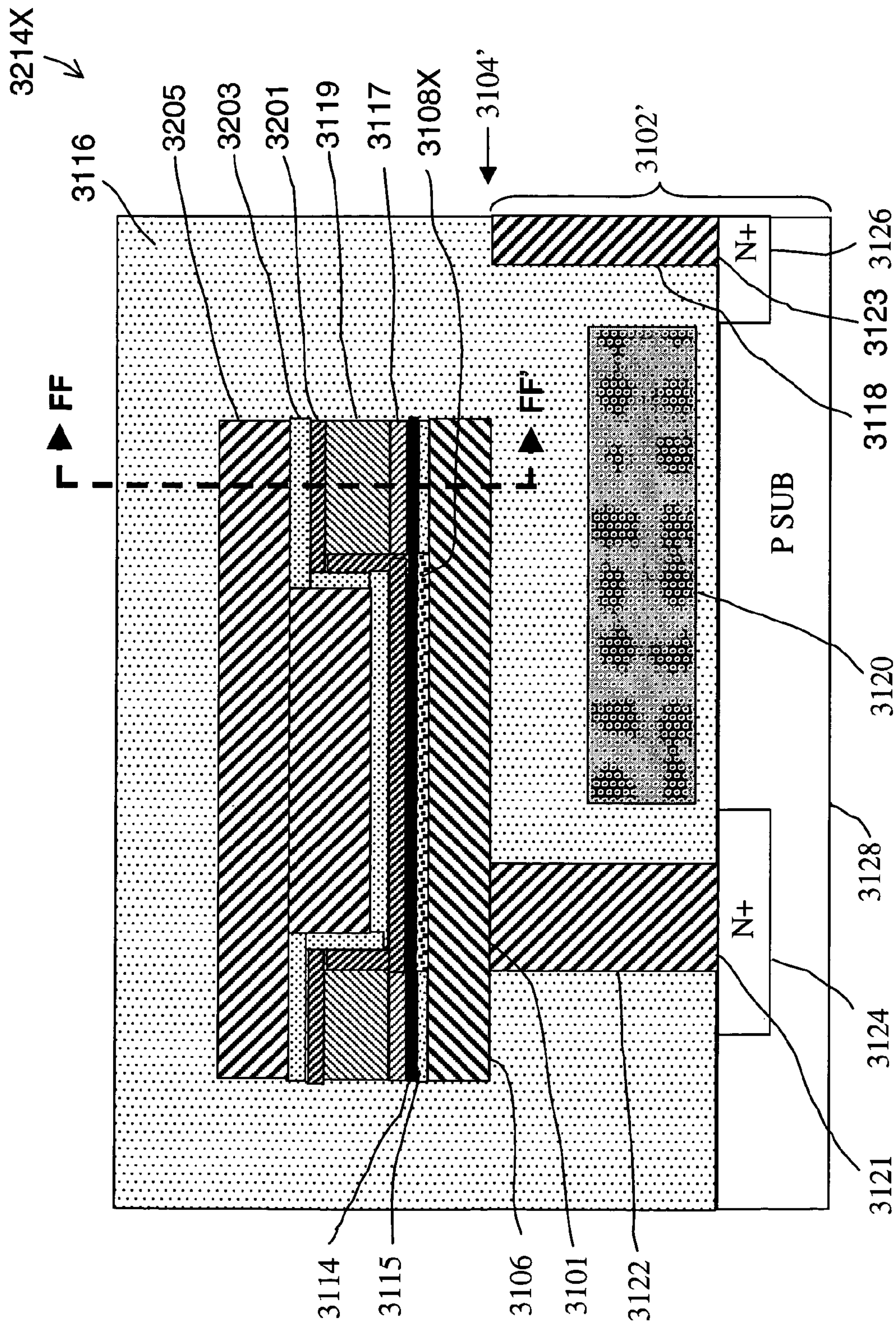

FIG. 30F illustrates the intermediate structure 3212, through completion of method act 3006. FIG. 30F shows structure 3212 much like structure 3103 in FIG. 24A which has been processed to include encapsulation over the nanotube structures in an insulator. Likewise, a structure 3103' of FIG. 24B could be analogously encapsulated. FIG. 30F' illustrates the intermediate structure 3214, through completion of Step 3006. FIG. 30F' shows structure 3214 much like structure 3107 in FIG. 24C which has been processed to include encapsulation over the nanotube structures in an insulator. Likewise, a structure 3107' of FIG. 24D could be analogously encapsulated. FIG. 30FX illustrates the intermediate structure 3212X, through completion of method act 3006. FIG. 30FX shows structure 3212X much like structure 3212 of FIG. 30F, except that first sacrificial layer 3108 has been replaced with first sacrificial layer 3108X and co-planar border region 3115. FIG. 30FX' illustrates the intermediate structure 3214X, through completion of method act 3006. FIG. 30FX' shows structure 3214X much like structure 3214 of FIG. 30F', except that first sacrificial layer 3108 has been replaced with first sacrificial layer 3108X and co-planar border region 3115. At this point, upper carbon nanotube intermediate control structure 3212 and 3214 are formed. When encapsulated, FIG. 25E (not shown) is similar to structure 3214 of FIG. 30F', except that insulator layer 3203 between second sacrificial layer 3201 and electrode 3205, but is instead between first sacrificial layer 3108 and electrode 3106.

After the structure is completed through the pre-nanotube release (pre-suspend) level, preferred methods then create a gap region above and below the (carbon) nanotube element by etching to gap sacrificial layers and removing the sacrificial gap layer between electrode 3205 and conductor 3119, and sacrificial gap layers in the NT switch region. The process of creating such a gap region is described below in connection with FIGS. 27 and 27'. Briefly, fluid communication paths are formed to the sacrificial gap material, see, e.g., opening 3207' of FIG. 30H and opening 3208' of FIG. 30H'. These paths are used to remove second sacrificial gap material 3201 and a segment of first sacrificial gap material 3108 of segment length defined by combined conductor 3119 and 3117 opening e.g., gap region 3209A and 3108A in FIGS. 30K and 30K' to suspend segment 3114A of nanotube elements 3114. Alternatively, these paths are used to remove second sacrificial gap material 3201 and first sacrificial gap material layer 3108X, leaving border region 3115. Afterwards the paths may be closed, see, e.g., FIG. 30J and FIG. 30J'. A suspended portion 3114A of nanotube elements 3114 may be seen in pre-wiring level structure 3213 illustrated in FIG. 30K and pre-wiring level structure 3215 illustrated in FIG. 30K'.

After sacrificial material has been removed, preferred embodiment complete fabrication 3009 of the combined nanotube and semiconductor structure to the external contact and passivation layers (not shown). For example, after the fluid communication openings (paths) are closed (encapsulated), connections to drain node 3126 are made, see structure 3223 of FIG. 30M and structure 3225 of FIG. 30M', prior to final wiring to terminal pads, passivation, and packaging.

Figure 23:
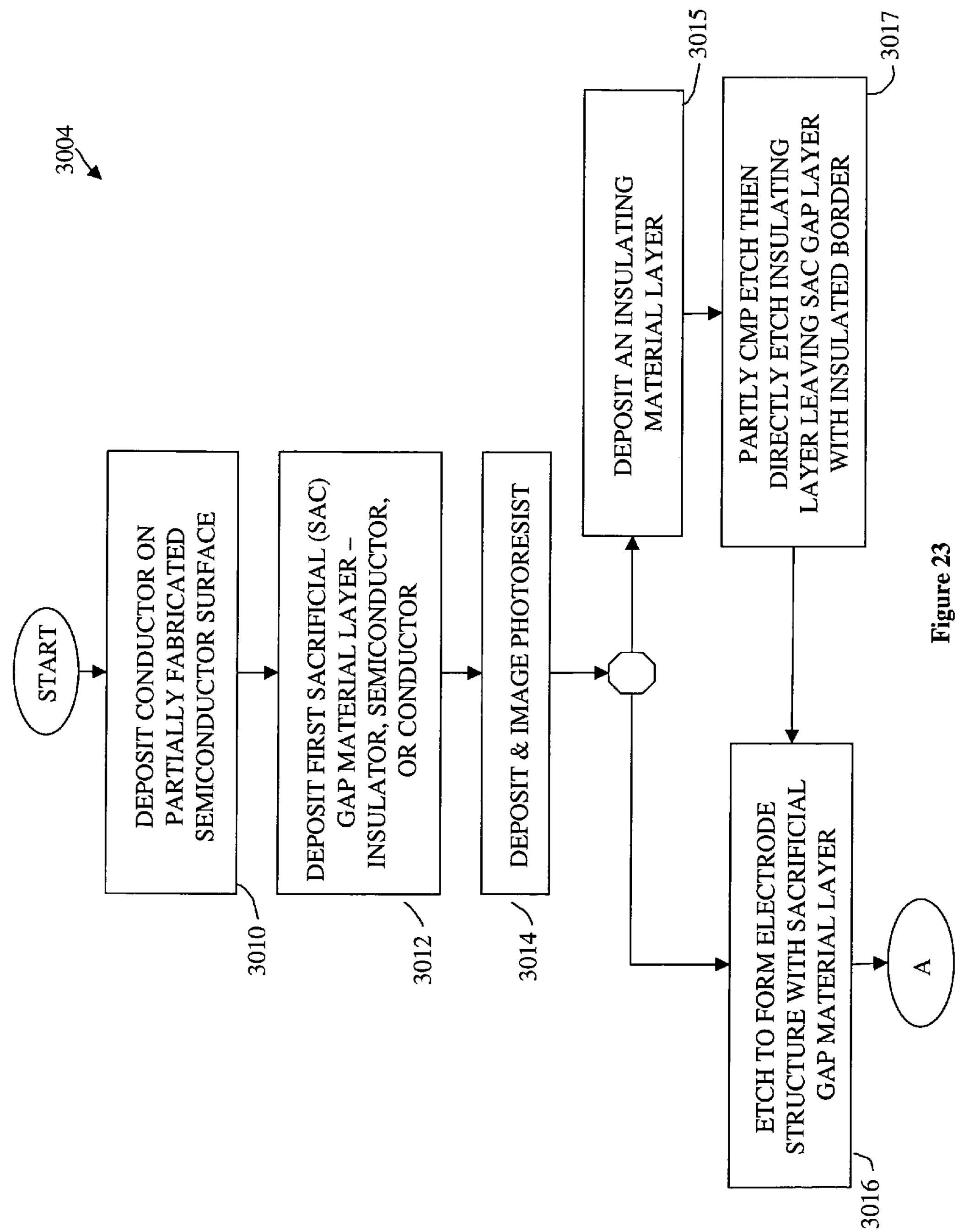
FIGS. 23, 23' and 23" are flow charts illustrating acts performed in preferred methods of the invention.
Figure 23:
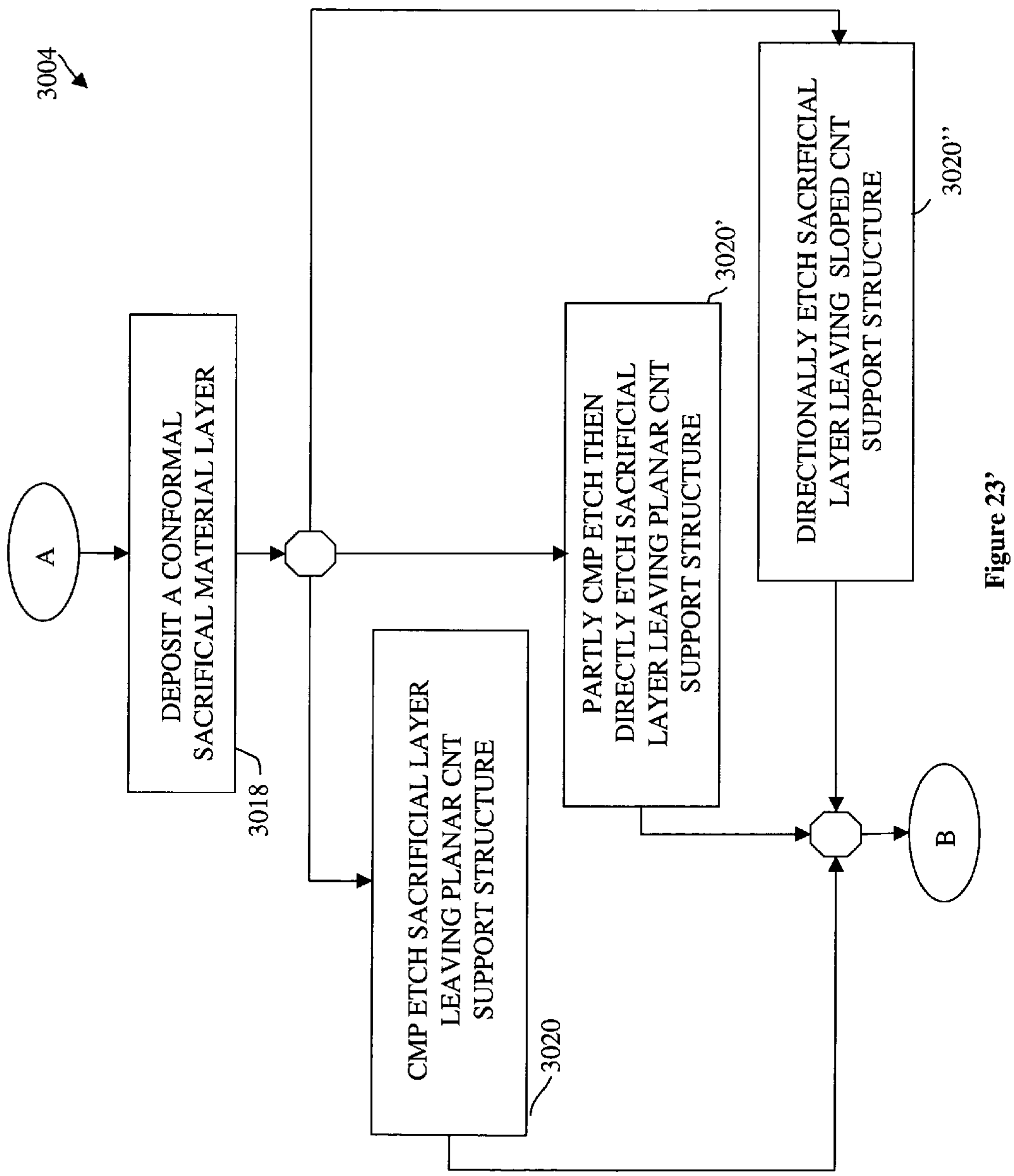
Figure 23:
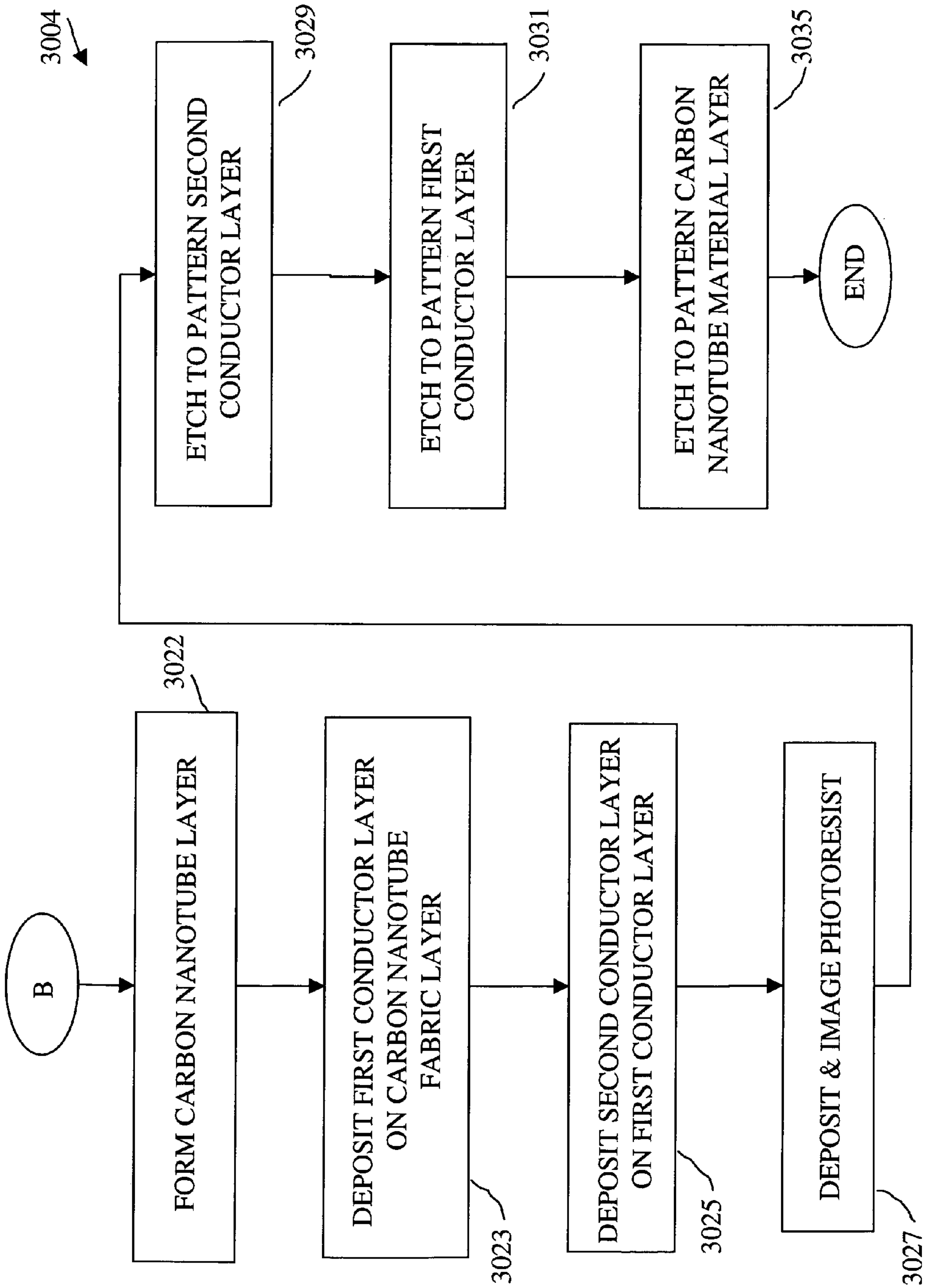

FIGS. 23, 23', 23'' each describe methods (processes) of forming the nanotube switching structures 3103, 3103' of FIGS. 24A and 24B, respectively, and nanotube switching structures 3107, 3107' of FIGS. 24C and 24D, respectively. FIGS. 23, 23', and 23" each describe methods (processes) of forming the nanotube switching structures 3107X and 3107" of FIGS. 24E and 24F, respectively.

Referring to FIGS. 23, 23' and 23", preferred methods in Flow Chart 3004 start with act 3010. Step 3010 presumes that an intermediate structure has already been created, on top of which the nanotube control structure is to be formed. For example, FIGS. 24A, 24B, 24C, 24D, 24E, and 24F each illustrate an intermediate structure 3102' on which the control structure is to be formed. Structure 3102' already has many components of a field effect device, including drain, source, and gate nodes. The first step is to deposit a conductor layer on surface 3104 intermediate structure 3102. By way of example, conductor layer may be tungsten, aluminum, copper, gold, nickel, chrome, platinum, palladium, polysilicon, or combinations of conductors such as chrome-copper-gold. Alternatively, conductor layer may be formed of single-layers or multi-layers of single or multi-walled nanotube fabric with conductivities in the range of 0.1 to 100 Ohms per square as describe in incorporated patent references explained further below. Nanotube fabric may be used in vias and wiring in any array structure. Conductor thickness may be in the range of 50 to 200 nm.

Figures 25A, 25B, 25C:
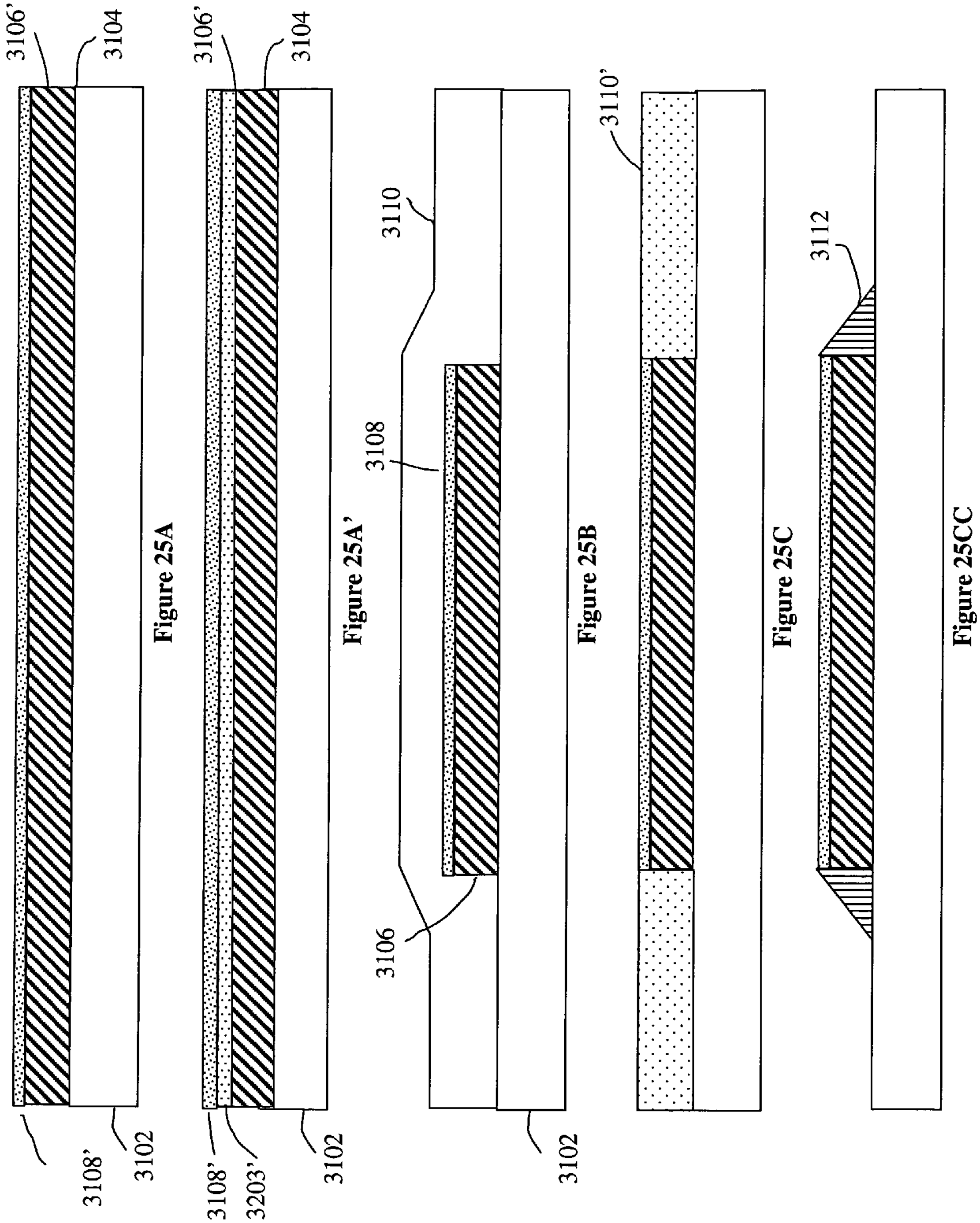
FIGS. 25A–GG illustrate exemplary intermediate structures according to certain aspects of the invention.
Figure 25A:
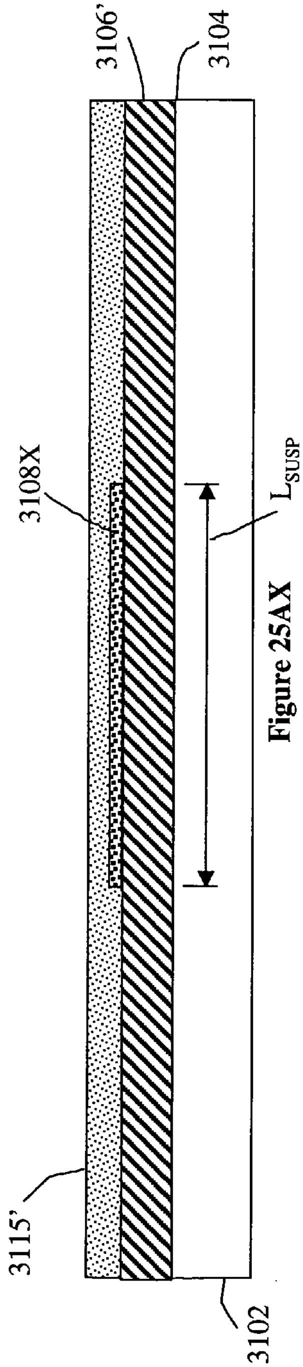
Figure 25A:
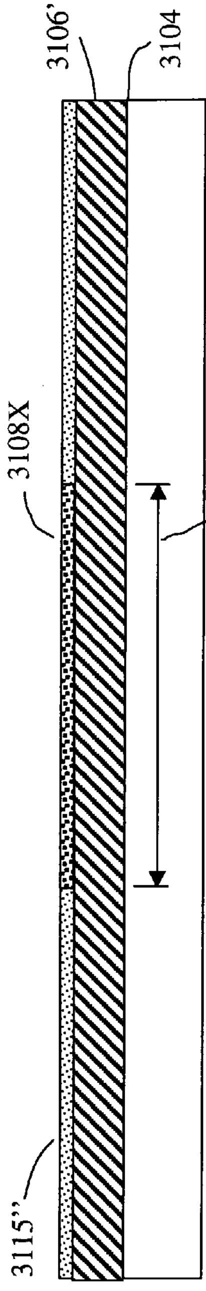
Figure 25B:
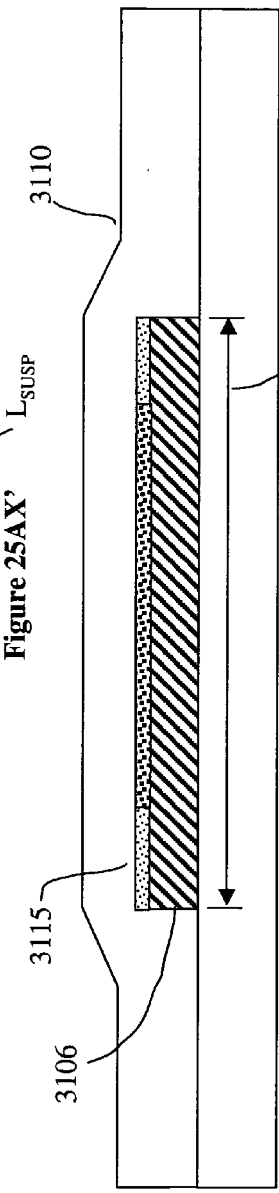
Figure 25C:
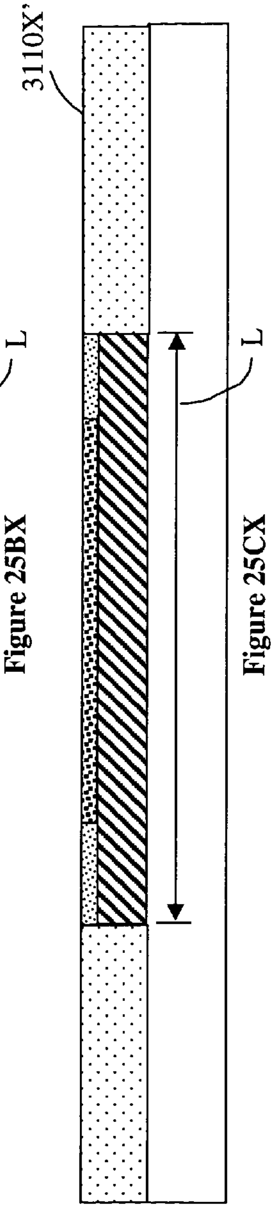

Then, preferred embodiments deposit 3012 first sacrificial gap material layer on top of the conductor layer. A sacrificial layer 3108' of gap material such as insulator silicon nitride ($Si_3N_4$) or semiconductor silicon (Si) for example, is deposited on conductor layer 3106', as illustrated in FIG. 25A. Sacrificial layer 3108' may also be a conductor, such as TiW, for example. As will be explained below, the first sacrificial gap layer thickness controls the separation (or gap) between the nanotube fabric element (yet to be formed) and conductor layer 3106' in the nanotube switch region. In a preferred embodiment, this separation or gap dimension is approximately 1/10 of the suspended length of the nanotube element. For a nanotube switch design with suspended length of 130 nm, the gap is therefore chosen as about 13 nm. Sacrificial layer 3108' is deposited to a thickness of about 13 nm, for example. Alternatively, after method act 3010, but before method act 3012, insulating film layer 3203' may be deposited as illustrated in FIG. 25A'. Insulating film layer 3203' may be $SiO_2$, for example, of thickness 5 to 20 nm, for example. Method 3004 continues with step 3012. Adding insulating layer 3203' results in structure 3107" after completion of methods 3004, 3036, and 3006 as described further below.

Then, preferred embodiments deposit and image 3014 photoresist. Such patterning may be done using known techniques. This is done to define (in photoresist) the pattern for the electrode and sacrificial material, see, e.g., electrode 3106 and first sacrificial gap layer 3108 of FIGS. 24A, 24B, 24C, 24D and 24F.

Alternatively, preferred embodiments step 3014 patterns layer 3108' resulting in first sacrificial layer 3108X as illustrated in FIG. 25AX, where first sacrificial layer 3108X is a conductor or semiconductor (silicon, for example), with dimensions corresponding to nanotube switching region suspended length $L_{SUSP}$, see e.g., electrode 3106 and first sacrificial gap layer 3108X of FIG. 24E. The inventors envision that for certain applications, the ability to precisely control sacrificial layer removal may be advantageous for manufacturability. Specifically, to etch layers anisotropically has advantages over isotropic etching in defining the underlying gap, e.g. gap region 3108A.

Next, preferred embodiments deposit 3015 insulating material layer 3115' such material may be $SiO_2$, $Si_3N_4$, $Al_2O_3$, or other insulating materials, for example, as illustrated in FIG. 25AX.

Next, preferred embodiments CMP etch then directly etch 3017 insulating layer 3115' exposing first sacrificial layer 3108X, silicon, for example, and forming coplanar insulating layer 3115", $SiO_2$ or $Si_3N_4$, for example, as shown in FIG. 25AX'.

Then, preferred methods etch 3016 conductor layer 3106' and sacrificial material layer 3108' to form electrode structure 3106 and sacrificial gap material layer 3108 as follows. Sacrificial layer 3108' is etched. The photoresist layer (not shown) is removed. Etched sacrificial layer 3108 is used as the mask layer for etching conductor layer 3106'. Alternatively, the photoresist layer is used to etch both sacrificial gap layer 3108' and conductor layer 3106', and then the photoresist is removed (not shown). Alternatively, preferred methods etch 3016 conductor layer 3106' and insulating material 3115" of coplanar layer 3115" and first sacrificial layer 3108X using a photoresist layer, and then the photoresist is removed (not shown).

After the electrode and sacrificial material region are formed, preferred methods deposit 3018 a conformal sacrificial material layer. As shown in FIG. 25B, conformal sacrificial layer 3110 is deposited over the combined control electrode 3106 and first sacrificial gap layer 3108 structure. Alternatively, as shown in FIG. 25BX, conformal sacrificial layer 3110 is deposited over the combined control electrode 3106 and coplanar first sacrificial layer 3108X and border layer 3115. Conformal layer 3110 may be formed using a variety of insulating materials such as $SiO_2$, $Si_3N_4$, $Al_2O_3$, and polyimide, or conducting materials such as aluminum, copper, nickel, chromium, tungsten, and silicon, for example. In a preferred implementation, $SiO_2$ is selected. The $SiO_2$ may be conformably deposited as spin-on-glass, or using Low Pressure Chemical Vapor Deposition (LPCVD), or by other conformal deposition techniques. The thickness of the deposited $SiO_2$ layer depends on the thickness of the combined control electrode 3106 and sacrificial layer 3108 (or combined control electrode 3106 and coplanar first sacrificial layer 3108X and border layer 3115) and method of etching conformal layer 3110, and may range from 70 nm to 300 nm, for example.

After the conformal sacrificial material is deposited, a first methods chemical-mechanical-polish etch 3020 partially removes sacrificial layer material 3110 to top surface of first sacrificial gap layer 3108, leaving planar support structure 3110' as illustrated in FIG. 25C. Alternatively, first methods CMP etch 3020 partially removes sacrificial layer material 3110 to top surface of combined control electrode 3106 and coplanar first sacrificial layer 3108X and border layer 3115, leaving support structure 3110X' as illustrated in FIG. 25CX. CMP etch applied to surface of sacrificial layer 3108 may result in surface damage to first sacrificial gap layer 3108. CMP etch applied to combined control electrode 3106 and coplanar first sacrificial layer 3108X and border layer 3115 may result in damage to first sacrificial layer 3108X. Alternatively, a second methods 3020' CMP etch partially removes sacrificial layer 3110, then directional etch removes additional sacrificial layer 3110 exposing top surface of first sacrificial gap layer 3108, leaving planar support structure 3110', or alternatively exposing top surface of first sacrificial layer 3108X, leaving support structure 3110X'. Two-step etch 3020' method may be simplified to a single-step method without exposing the surface of first sacrificial gap layer 3108, or first sacrificial gap layer 3108X, to a CMP etch process. Alternatively, third etch 3020" directly etches sacrificial layer 3110 material exposing top surface of first sacrificial layer 3108, leaving sloped support structure 3112 as illustrated in FIG. 25CC. Conformal sacrificial layer 3110 may be etched using sputter etching, reactive ion beam (RIE) etching, or other techniques.

Next, preferred methods form 3022 a porous layer of matted carbon nanotubes. This may be done with spin-on technique or other appropriate technique as described in U.S. Pat. Nos. 6,643,165 and 6,574,130 and U.S. patent application Ser. Nos. 09/915,093, 10/033,323, 10/033,032, 10/128,118, 10/128,117, 10/341,005, 10/341,055, 10/341,054, 10/341,130, 60/446,783 and 60/446,786, the contents of which are hereby incorporated by reference in their entireties (hereinafter and hereinbefore, the "incorporated patent references"). Under preferred embodiments, the carbon nanotube layer has a thickness of approximately 0.5–5 nm for devices using single-walled nanotubes and 5–20 nm and greater for devices using multi-walled nanotubes.

Figures 25D, 25E, 25F:
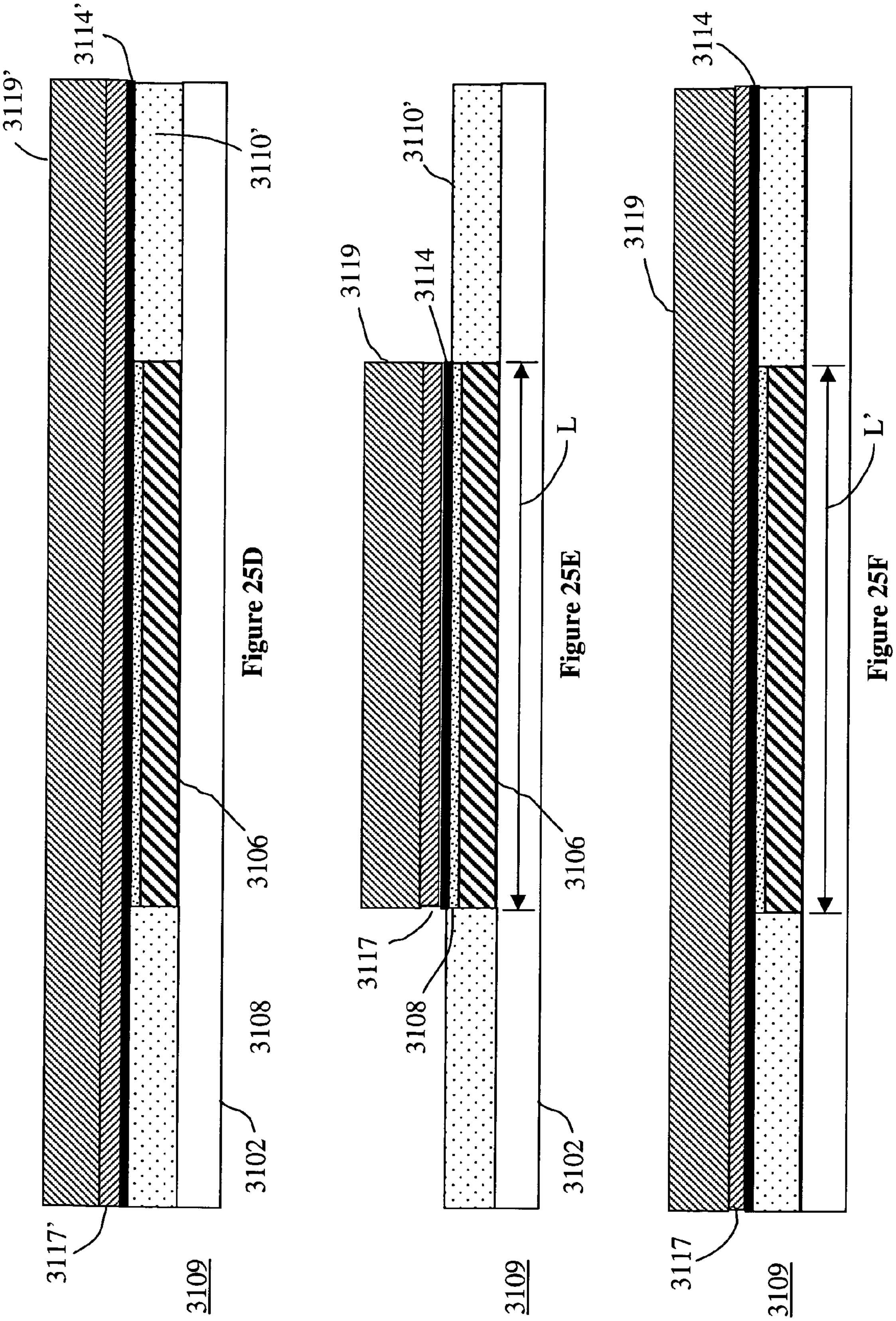
Figure 25D:
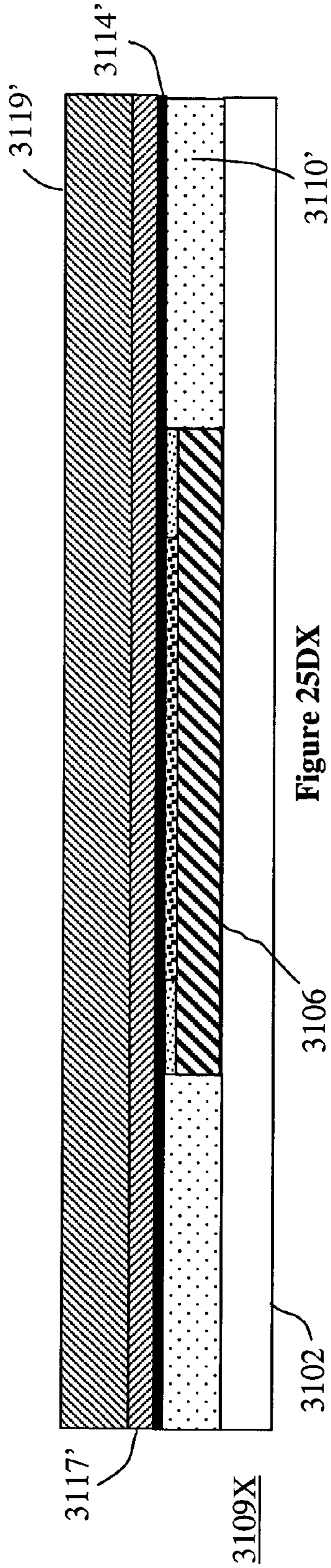
Figure 25E:
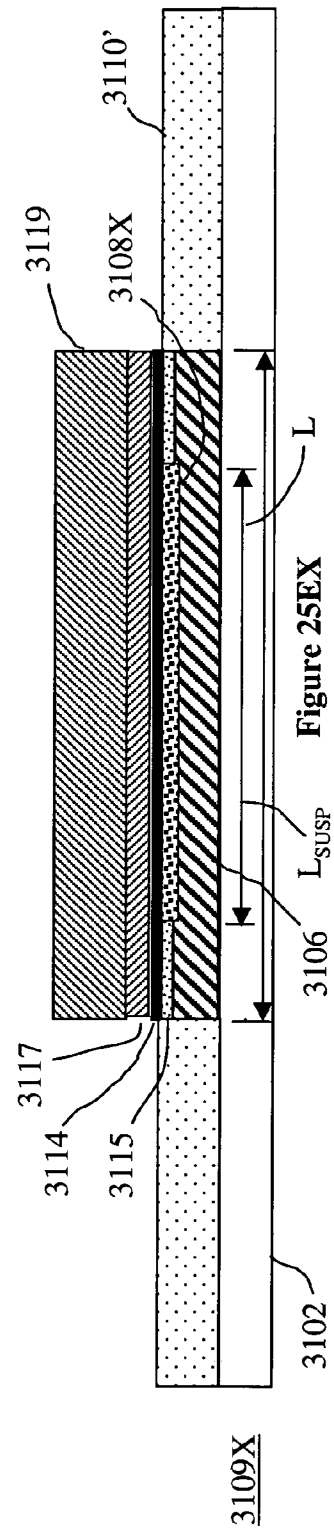
Figure 25F:
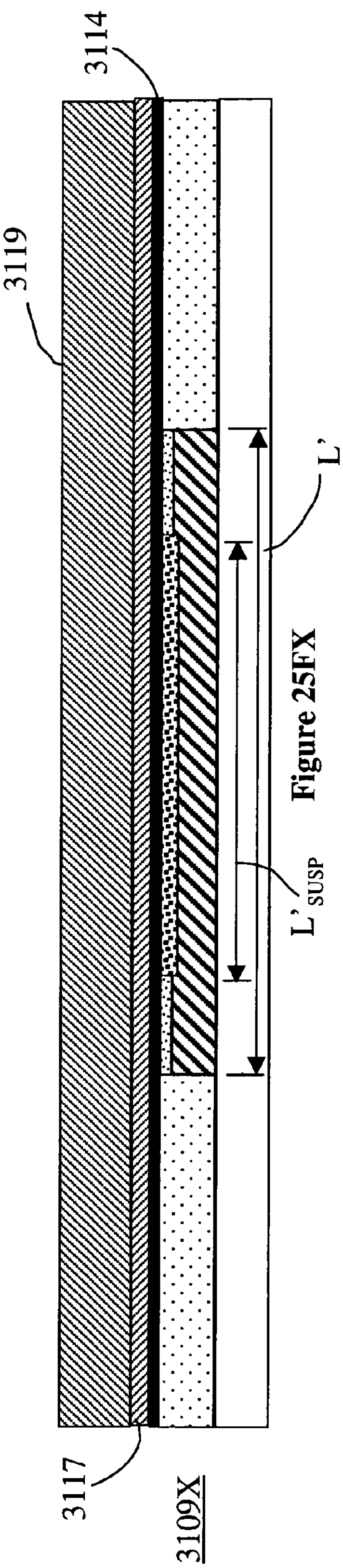

Then, preferred methods deposit 3023 a first conductor material layer 3117' as shown in FIG. 25D and FIG. 25DX. The material of conductor layer 3117' may be tungsten, aluminum, copper, gold, nickel, chrome, platinum, palladium, or combinations of conductors such as chrome-copper-gold. Conductor layer 3117' thickness is in the range of 25 to 100 nm. The material of conductor layer 3117' is selected for reliable low contact resistance $R_C$ between conductor layer 3117' and nanotube fabric layer 3114'.

Next, preferred methods deposit 3025 a second conductor material layer 3119' as shown in FIG. 25D and FIG. 25DX. The material of conductor layer 3119' may be tungsten, aluminum, copper, gold, nickel, chrome, platinum, palladium, or combinations of conductors such as chrome-copper-gold. Conductor layer 3119' thickness is in the range of 50 to 200 nm. The material of conductor layer 3119' is selected for good conductivity.

Photoresist is then deposited and imaged in act 3027 on second conductor material layer 3119'.

Next, preferred methods 3029 etches second conductor layer 3119' using appropriate known etch techniques to form electrical conductor 3119 as shown in FIGS. 25E, 25F, 25EX, and 25FX.

Next, preferred methods 3031 etches first electrical conductor 3117 using second conductor 3119 as a masking layer using known etch techniques to form electrical conductor 3117. Combined electrical conductors 3117 and 3119 are shown in FIGS. 25E, 25F, 25EX, and 25FX.

Next, preferred methods 3035 etches the carbon nanotube fabric layer 3114' by using appropriate techniques as described in the incorporated patent applications, with combined electrical conductors 3117 and 3119 acting as a masking layer. Combined electrical conductors 3117 and 3119, and patterned nanotube fabric layer 3114 are shown in FIGS. 25E, 25F, 25EX, 25FX, and 25G.

Under certain embodiments, photoresist is deposited 3027 and used to define an image of electrical conductor 3119, electrical conductor 3117, and nanotube fabric layer 3114.

Figure 25G:
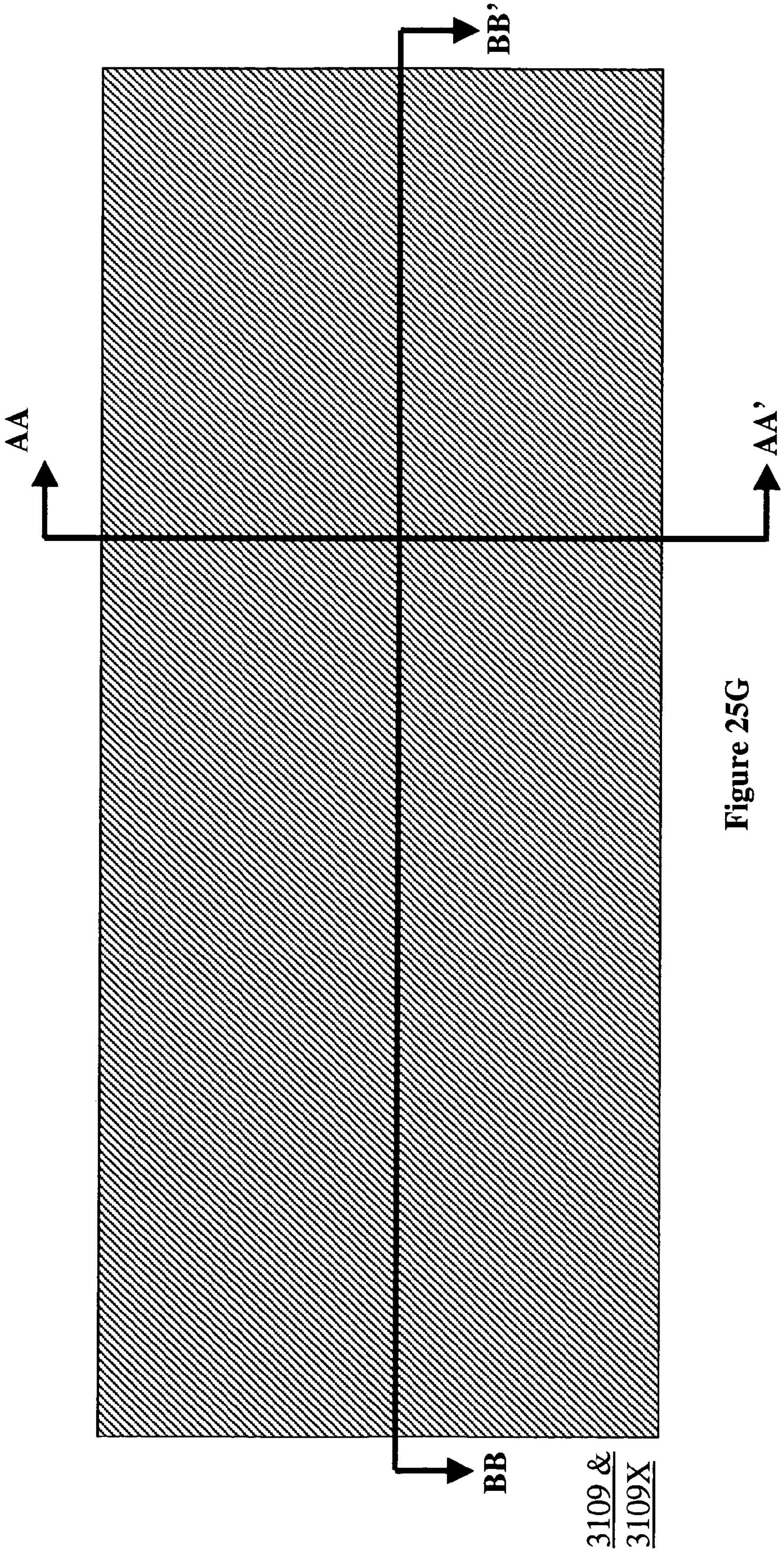
Figure 25D:
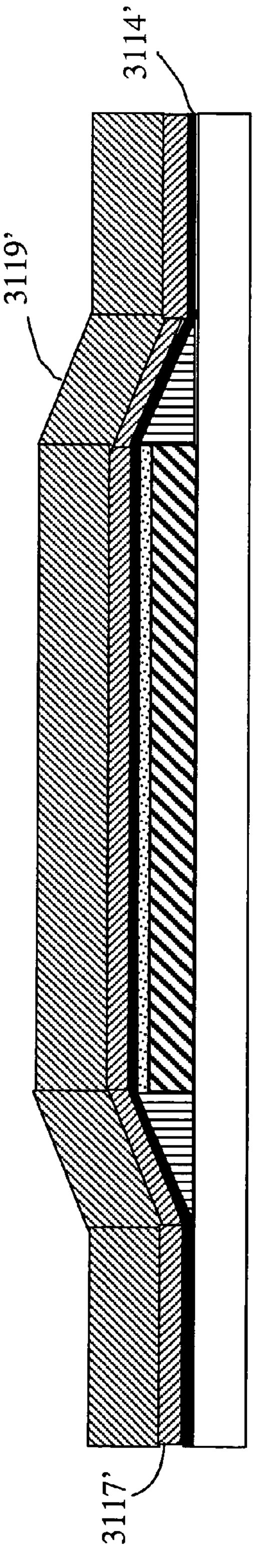
Figure 25E:
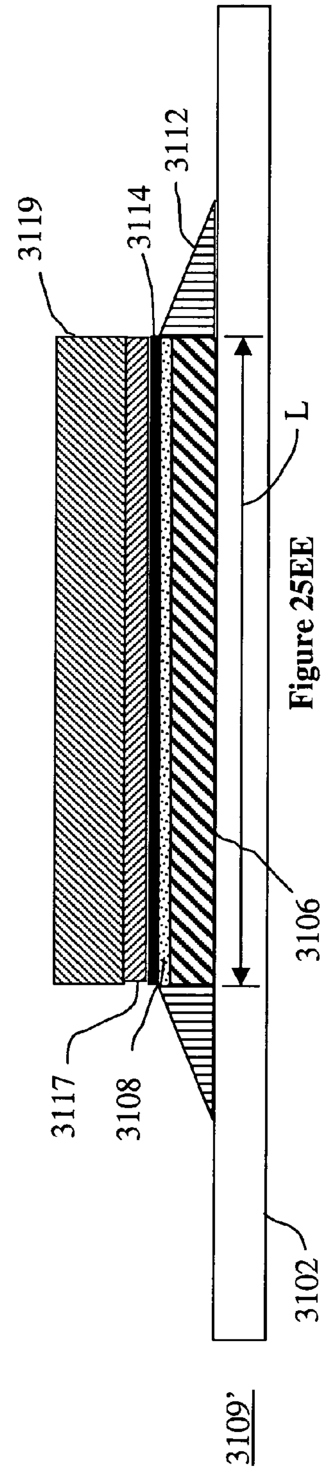
Figure 25F:
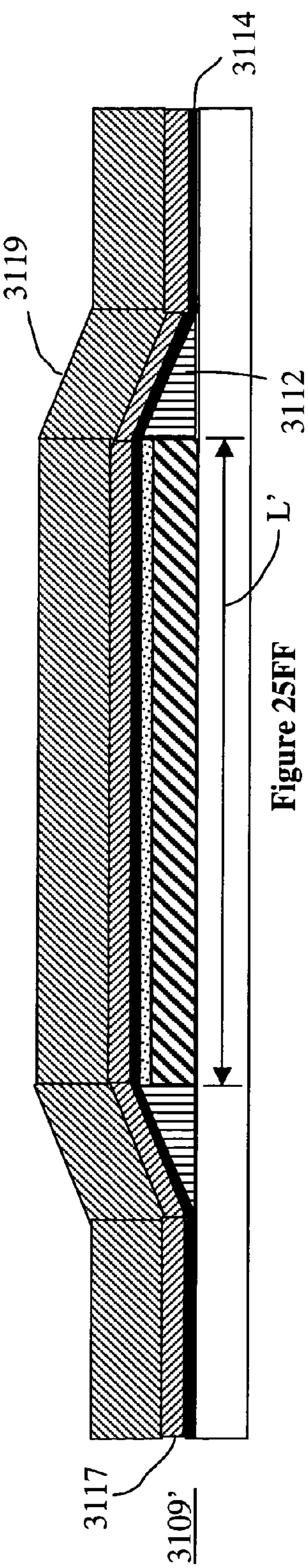
Figure 25G:
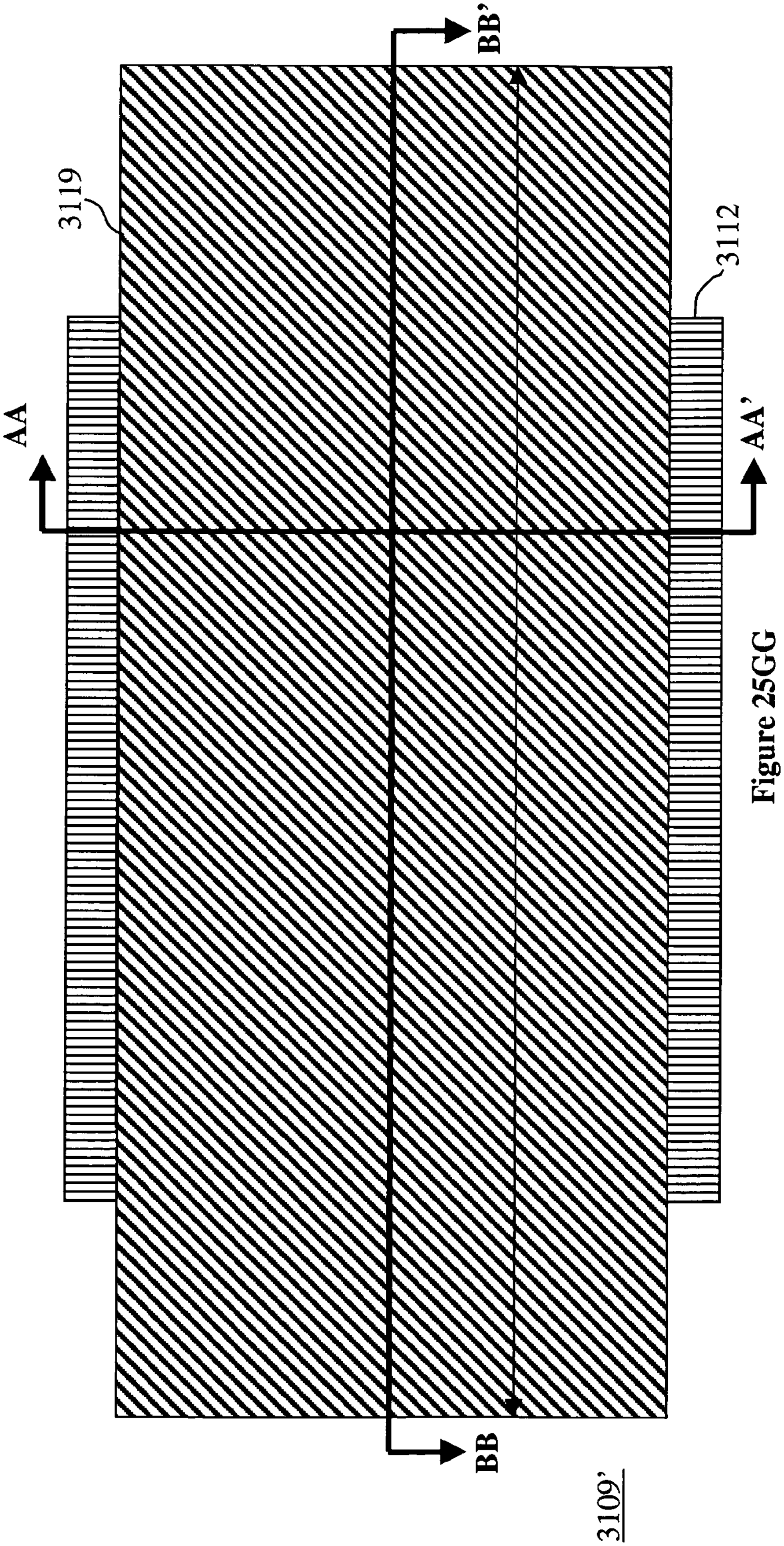

FIG. 25G shows a plan view of intermediate structure 3109 and intermediate structure 3109X. FIGS. 25E and 25EX show cross sectional views of intermediate structure 3109 and 3109X, respectively, taken at AA–AA' of FIG. 25G, and FIGS. 25F and 25FX show cross sectional views of intermediate structures 3109 and 3109X, respectively, taken at BB–BB' of FIG. 25G. Dimensions $L_{SUSP}$ and $L'_{SUSP}$ indicate orthogonal dimensions of first sacrificial layer 3108X and are typically at sub-minimum or minimum lithographic dimensions. Dimensions L and L' indicate orthogonal dimensions of electrode 3106. L and L' and are typically at or greater than the minimum lithographic dimensions allowed for a technology. Intermediate structure 3109 corresponds to a portion of FIGS. 24A and 24C in which electrode 3106, first sacrificial gap layer 3108 and combined electrical conductors 3117 and 3119 were formed using a planar support structure 3110', but prior to the formation of opening 3136. Intermediate structures 3109 and 3109X were formed using methods as indicated in flow chart 3004 shown in FIGS. 23, 23', and 23", the steps used were acts 3010 through 3018, next, acts 3020 or 3020' to define the planar support structure 3110' and 3110X', next, acts 3022 through 3035 to complete substructures 3109 and 3109X.

Referring to method 3004 shown in FIGS. 23, 23', and 23", a preferred method of forming another intermediate structure 3109' executes first, methods 3010 through 3018, next, method 3020" to define the sloped support structure 3112, next, methods 3022 through 3035 to complete substructure 3109.

FIG. 25GG shows a plan view of intermediate structure 3109'. FIG. 25EE shows a cross sectional view of intermediate structure 3109' taken at AA–AA' of FIG. 25GG, and FIG. 25FF shows a cross sectional view of intermediate structure 3109' taken at BB–BB' of FIG. 25GG. Dimensions L and L' indicate orthogonal dimensions of electrode 3106. L and L' are typically at or greater than the minimum lithographic dimensions allowed for a technology. Intermediate structure 3109' corresponds to a portion of FIGS. 24B and 24D in which electrode 3106, first sacrificial gap layer 3114, and combined electrical conductors 3117 and 3119 were formed using a sloped support structure 3112, but prior to the formation of opening 3136.

When the suspended portion (structure not yet illustrated) of carbon nanotube fabric layer 3114 shown schematically in FIG. 14 (position 250') and FIG. 17B (position 1140') storing logic state "1" (the same comments apply for a stored logic "0" state), carbon nanotube fibers in the nanotube fabric layer 3114 are elongated and under strain (tension). The ends of carbon nanotube fibers in the nanotube fabric layer 3114 that are supported (clamped, pinned) at the perimeter of the suspended region, apply a restoring force. The electrical and mechanical contact, support (clamping, pinning) region is illustrated by contact 3127 in FIGS. 24A–24F, with additional support in oxide layers beyond contact region 3127. Contacts 3127 in structures 3103 and 3107 and on adjacent surfaces of planar support structure 3110' shown in FIGS. 24A, 24C, 24E, and 24F illustrated in corresponding FIGS. 25F and 25FX, are sufficient to provide the necessary restoring force without carbon nanotube fiber slippage. Layer 3314 is thus pinned between 3117 and 3110' in region 3127. Contacts 3127 in structures 3103' and 3107' and on adjacent sloped support surfaces 3112 illustrated in FIGS. 24B and 24D, with sloped support surface 3112 overlap illustrated in corresponding FIG. 25FF, may tolerate still greater restoring forces without carbon nanotube fiber slippage.

All preferred structures may be fabricated using lithographic minimum dimensions and greater than minimum lithographic dimensions for a selected generation of technology. Selective introduction of sub-minimum lithographic dimensions may be used to realize smaller cell size, lower carbon nanotube switching (threshold) voltages with tighter distributions through scaling (reducing) the carbon nanotube structure dimensions (combination of shorter suspended length and gap spacings), faster nanotube switching, and lower power operation. Carbon nanotubes fibers of 130 nm suspended length and 13 nm gaps typically switch in less than 350 ps. Selective introduction of sub-minimum lithographic dimensions may be used to form smaller fluid communication pipes used to remove sacrificial material, facilitating covering (sealing) the openings prior to deposition of the conductive wiring layers.

Sub-minimum lithographic dimensions may be introduced on any planar surface at any step in the process. Flow chart 3036 illustrated in FIG. 26 may be used to generate shapes with sub-minimum dimensions. Shapes having two opposite sides of sub-minimum dimension, and two orthogonal sides having minimum or greater than minimum dimension may be formed using well known sidewall spacer technology. Sidewall periodicity is at minimum or greater than minimum dimensions. Shapes having two opposite sides of sub-minimum dimensions, and two orthogonal sides also having sub-minimum dimensions may be formed using the intersection of two sub-minimum dimension sidewall spacers as described in U.S. Pat. No. 5,920,101 and 5,834,818. Sidewall periodicity is at minimum or greater than minimum dimensions in both orthogonal directions.

Figure 26:
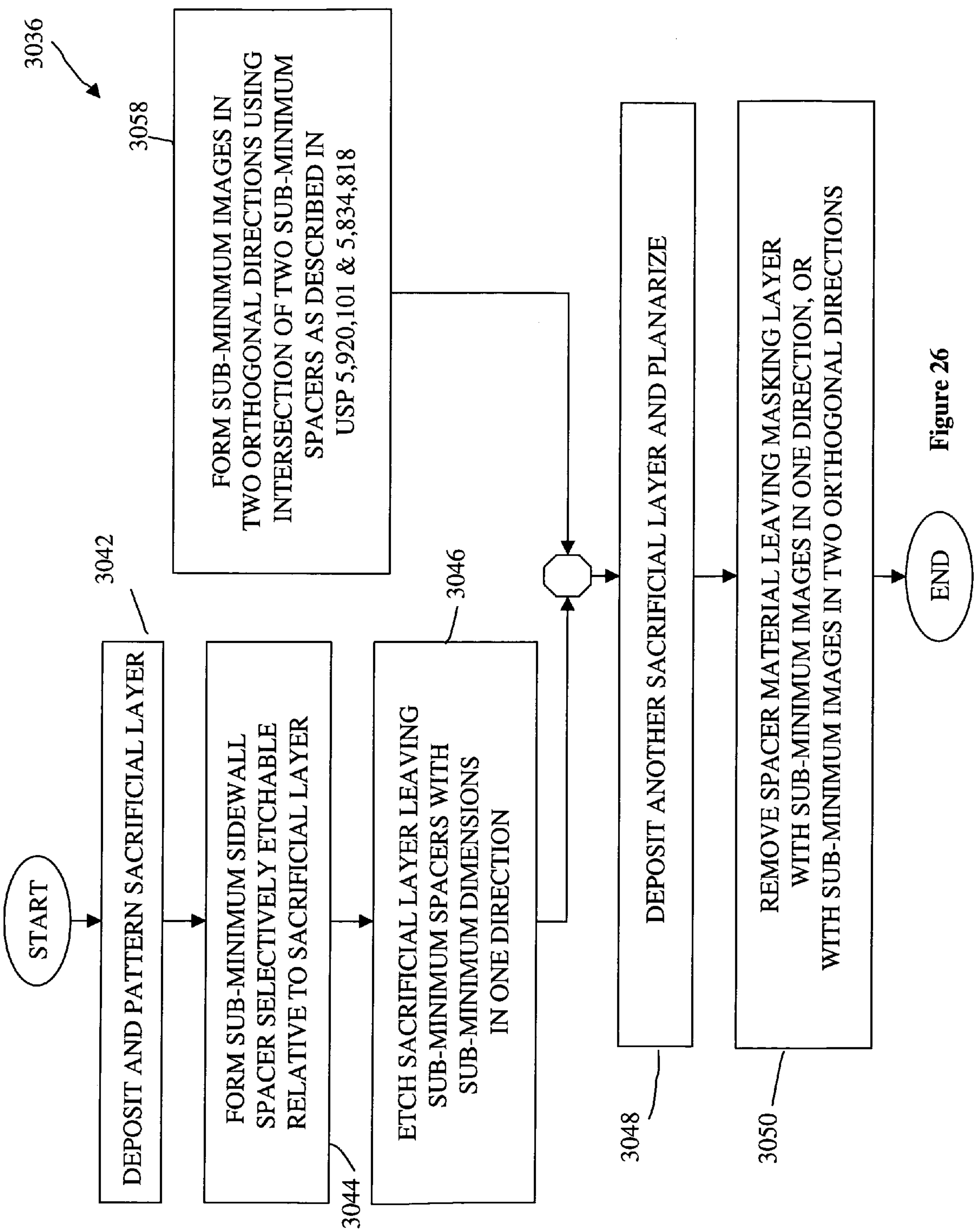
FIG. 26 is a flow chart of a method of manufacturing preferred embodiments of the invention.
Figures 29A, 29B, 29C:
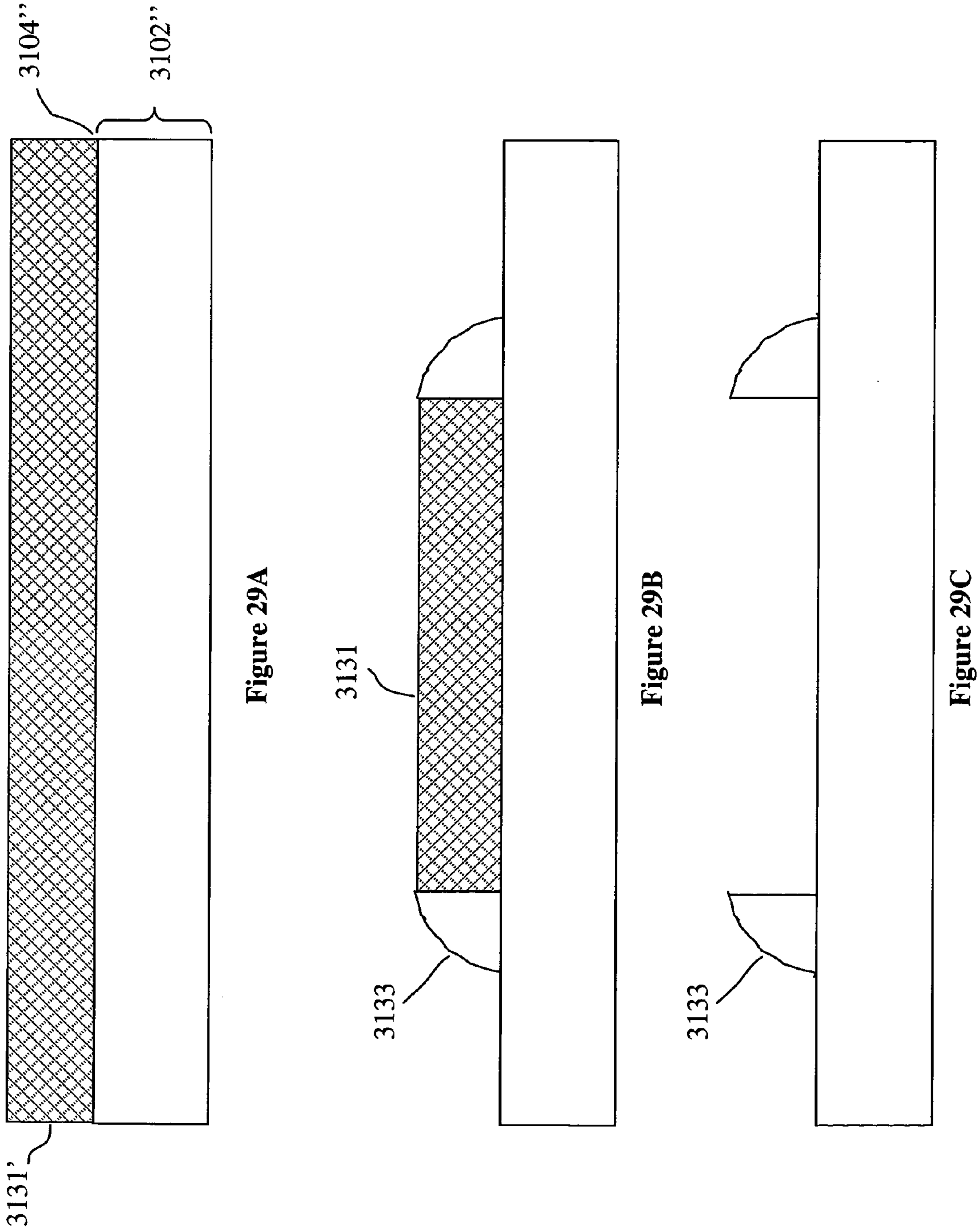
FIGS. 29A–F illustrate intermediate structures according to certain aspects of the invention.

Referring to FIG. 26, preferred methods flow chart 3036 start with methods step 3042. Methods step 3042 presumes that an intermediate base structure has already been created with a planar surface. An intermediate base structure 3102" may include semiconductor and carbon nanotube structure elements, and may be at any step in a process that has a planar surface. The preferred methods first step deposits 3042 sacrificial layer 3131' on intermediate structure 3102", having surface 3104", as illustrated in FIG. 29A. Sacrificial layer 3131' may be photo resist, an insulator such as $Si_3N_4$, a semiconductor, a conductor, and may be in the thickness range of 50 to 300 nm. Sacrificial layer 3131' is patterned to minimum or greater-than-minimum dimensions using photoresist (not shown).

Then, preferred embodiments form 3044 sub-lithographic sidewall spacer selectively etchable over sacrificial layer. Deposit a conformal layer of an insulator, or a conductor such as tungsten, for example, on patterned sacrificial layer of insulator $Si_3N_4$, for example. Tungsten thickness is selected to achieve a desired sidewall spacing dimension. For a technology of 130 nm minimum dimension, for example, a tungsten thickness is chosen that results in a sidewall lateral dimension in the range of 50 to 100 nm, for example. After deposition, the combined tungsten and $Si_3N_4$ layer is planarized, forming the sidewall spacer structure 3133 on the sidewalls of sacrificial layer 3131 illustrated in FIG. 29B Next, preferred methods 3046 selectively etch sacrificial layer, leaving sub-minimum tungsten spacers on planarized surface. Sub-minimum tungsten spacer structure 3133 of width in the range of 50 to 100 nm, for example, are shown in FIG. 29C. Alternatively, a second methods 3058 forms a second sidewall spacer structure above and orthogonal to sidewall spacer structure 3133 as described in U.S. Pat. No. 5,920,101 and 5,834,818. For a technology of 130 nm minimum dimension, for example, a tungsten thickness is chosen that results in a shape of lateral dimension in the range of 50 to 100 nm in one dimension, and. a shape of lateral dimension in the range of 50 to 100 nm in an orthogonal dimension (not shown).

Then, preferred methods deposit 3048 a sacrificial layer 3130 and planarize. The sacrificial layer 3130 may be an insulator layer, or a photoresist layer, for example. Planarization exposes the spacer material.

Figure 29D:
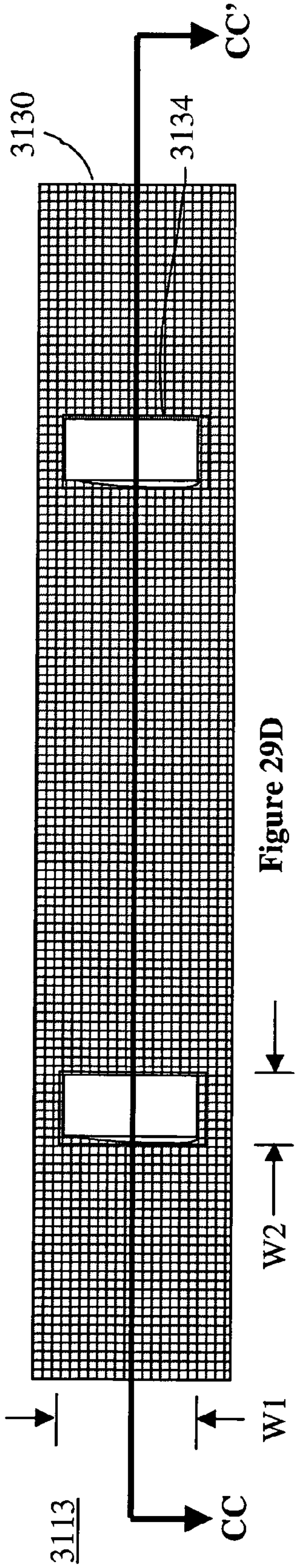
Figure 29E:
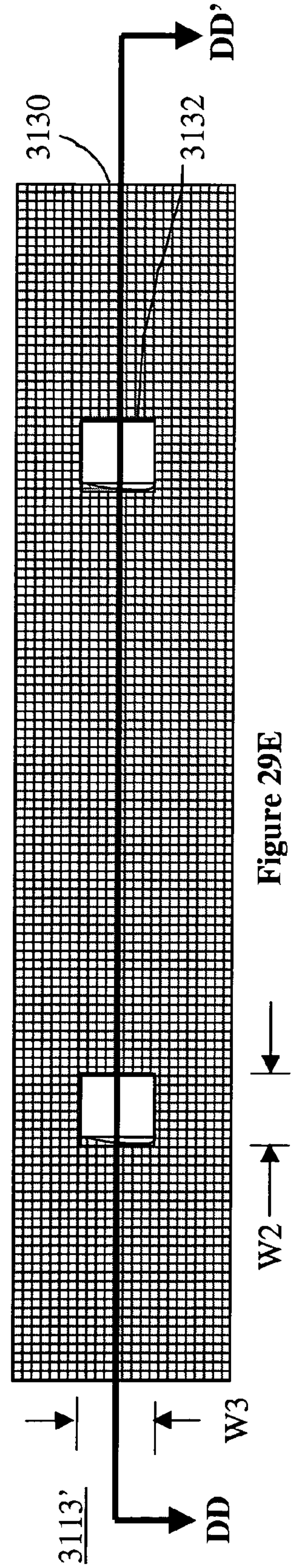
Figure 29F:
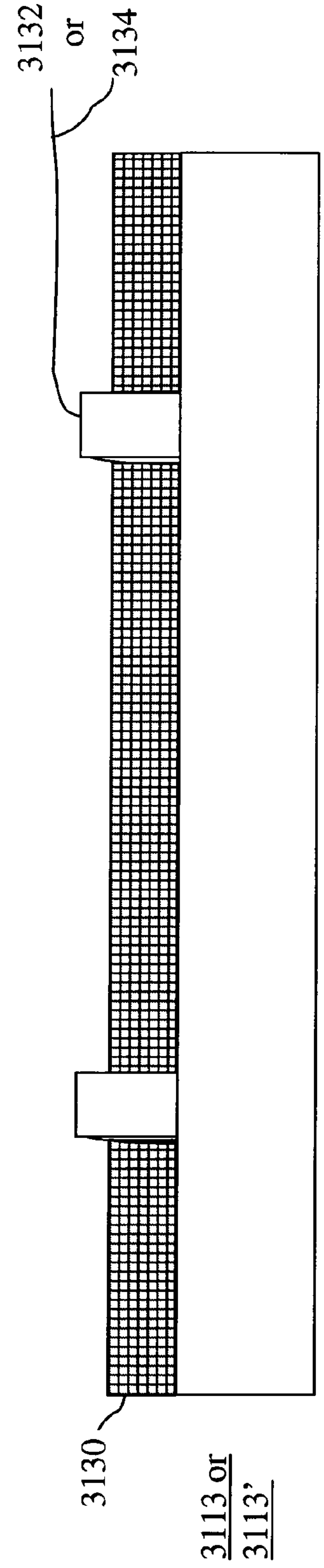

Next, preferred method 3050 spacer material is etched leaving photoresist openings to the underlying planar surface having the dimensions of the spacer structures. Photoresist layer openings 3134 may be shapes with one pair of minimum (or greater than minimum) shape W1, and sub-minimum pair of opposite dimensions of W2 as illustrated in plan view FIG. 29D. Photoresist layer openings 3132 may be shapes with one pair of sub-minimum opposite dimensions W2, and a second pair of orthogonal sub-minimum dimensions W3 as illustrated in plan view FIG. 29E. FIG. 29F shows a cross sectional view of intermediate sacrificial structure 3113 plan view FIG. 29D intermediate sacrificial structure 3113 taken at CC–CC' of FIG. 29D. FIG. 29F shows a cross sectional view of intermediate sacrificial structure 3113' plan view FIG. 29E intermediate sacrificial structure 3113' taken at DD–DD' of FIG. 29E.

Figure 27:
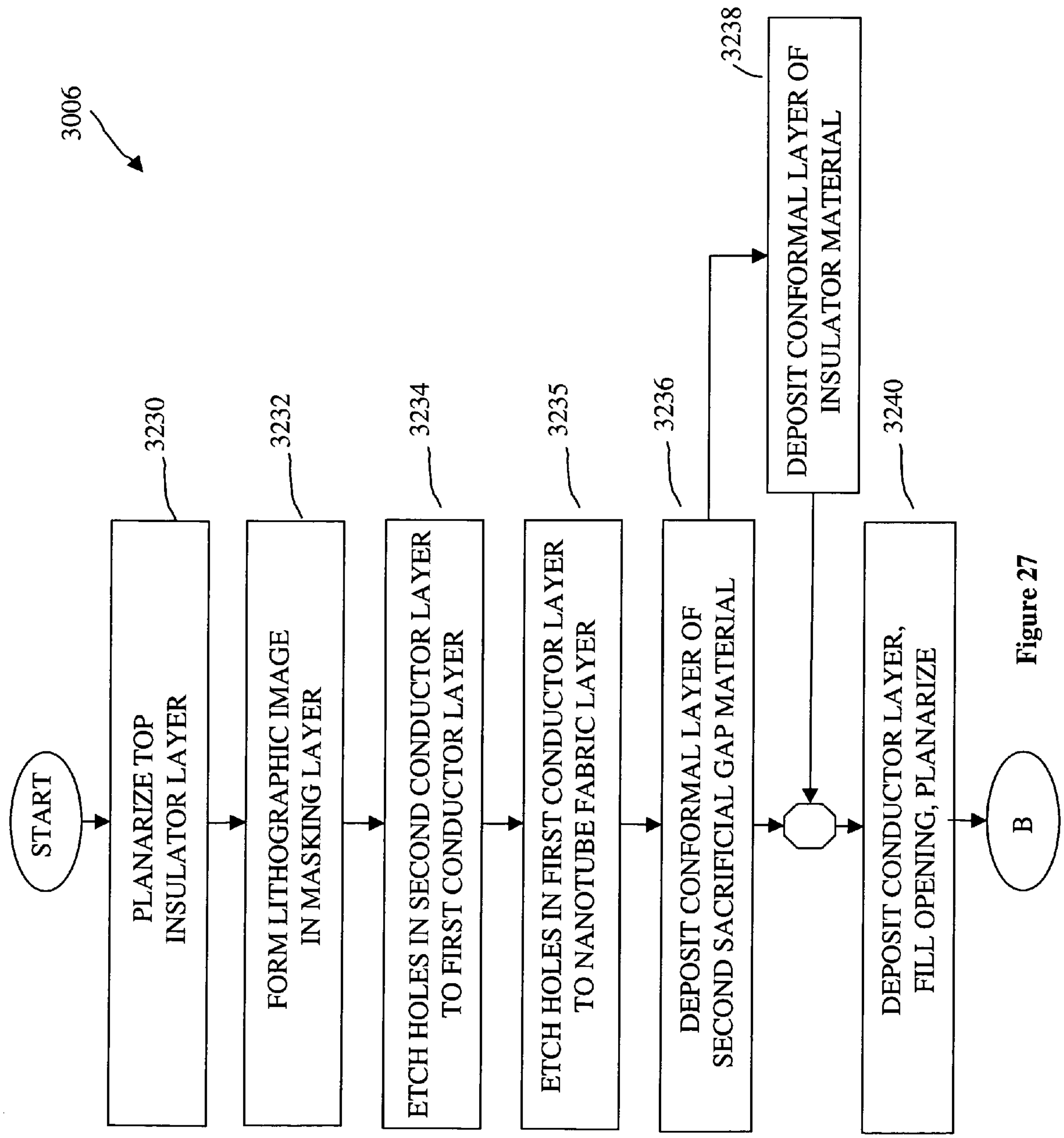
FIGS. 27, 27', 28 and 28' are flow charts of method of manufacturing preferred embodiments of the invention.
Figure 27:
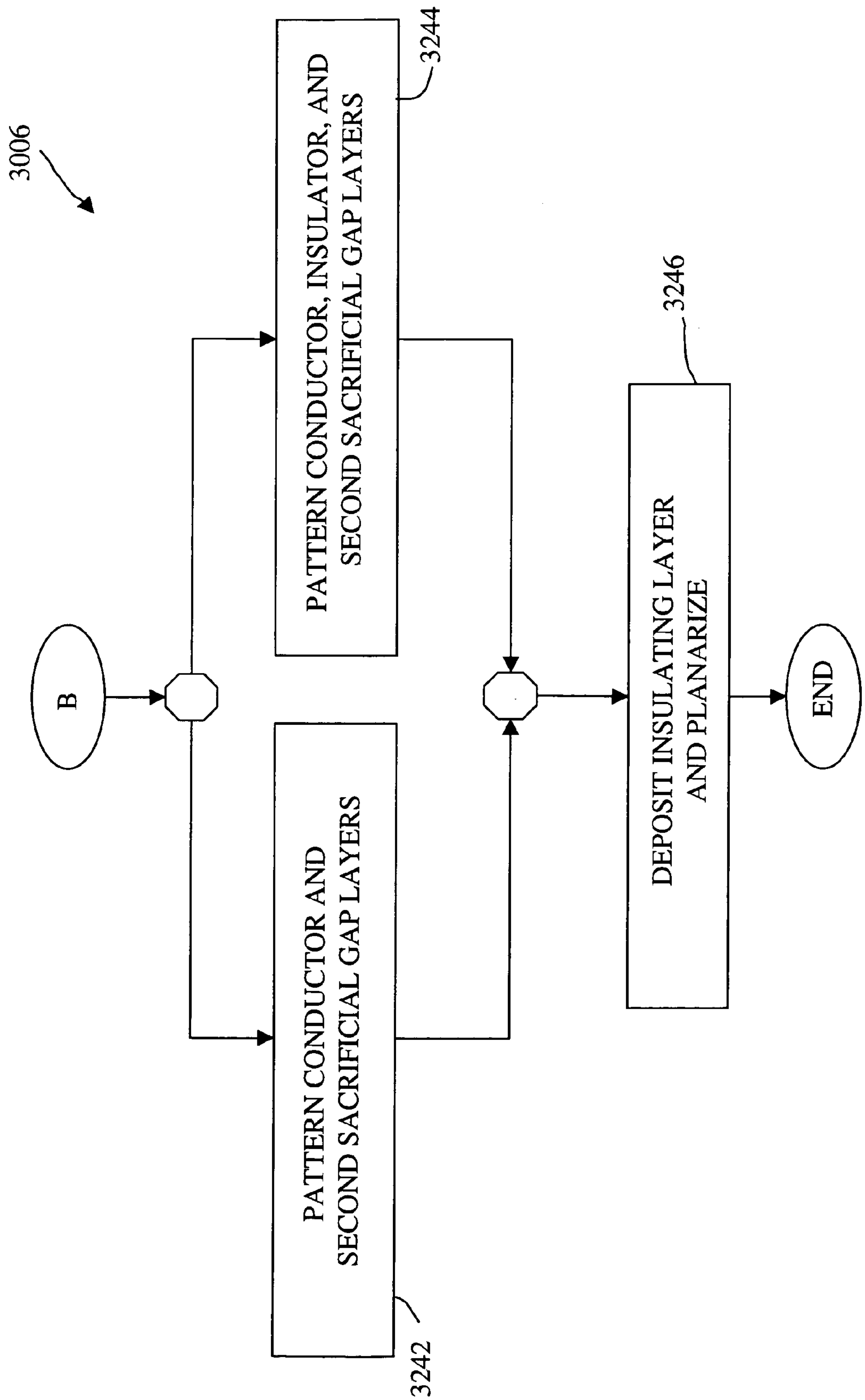

FIGS. 27 and 27' each describe methods (processes) 3006 for completing the nanotube switch (control) structures 3103 and 3107 illustrated in FIGS. 24A and 24C, respectively.

Referring to FIG. 27, preferred method preferred method acts in flow chart 3006 start with step 3230. Step 3230 presumes that a lower portion carbon nanotube intermediate structure 3109 (FIGS. 25E, 25F, and 25G) or nanotube intermediate structure 3109X (FIGS. 25DX, 25EX, and 25FX) of dimension L have already been created on an intermediate substrate structure 3102'. Structure 3102' already has many components of a field effect device, including drain, source, and gate nodes, and electrode 3106 of structure 3109 or 3109X is electrically connected to an FET source. The first step is to deposit and planarize an insulating layer that may be formed using a variety of insulating materials such as $SiO_2$, $Si_3N_4$, $Al_2O_3$. In a preferred implementation, $SiO_2$ is selected. The $SiO_2$ may be deposited as spin-on-glass, or using Low Pressure Chemical Vapor Deposition (LPCVD), or by other deposition techniques. The thickness of the deposited $SiO_2$ layer depends on the thickness of the lower portion carbon nanotube intermediate structure 3109, and may range from 150 nm to 300 nm, for example, as illustrated in FIG. 25D or FIG. 25E. Method steps described fully below with respect to FIG. 30A also apply to FIG. 30AX Then, preferred methods deposit and image 3232 photoresist. Such patterning may be done using known techniques to produce images in the photoresist of minimum size $L_{MIN}$ or greater in photoresist layer 3129 shown in FIG. 30B. Alternatively, intermediate sacrificial structure 3113 may be formed in lieu of photoresist layer 3129, such that opening $L_{MIN}$ is reduced to sub-minimum dimension W2 ($L_{SUB-MIN}$=W2) as illustrated in FIGS. 29D and 29F. Lower portion carbon nanotube intermediate structure 3109 may be reduced in size, such that L is replaced by $L_{MIN}$, and $L_{MIN}$ is replaced by W2 (also referred to as $L_{SUB-MIN}$). For a 130 nm minimum feature technology, L may be reduced from 250 nm to 190 nm, with the opening reduced from $L_{MIN}$ of 130 nm to W2 ($L_{SUB-MIN}$) of 65 nm, for example. Alternatively, intermediate artificial structure 3113' may be formed in lieu of photoresist layer 3129, such that opening $L_{MIN}$ is reduced to sub-minimum dimension W2, and orthogonal opening dimension (not shown) is reduced to sub-minimum dimension W3, as illustrated in FIGS. 29E and 29F. If W2=W3=65 nm, and, lower portion carbon nanotube intermediate structure 3109 dimensions L and L' are equal (FIGS. 25E and 25F), then the dimension of structure 3109 may reduced from 250×250 nm to 190×190 nm, with an opening reduced from 130×130 nm, to 65×65 nm, for example.

Then, preferred methods etch 3234 holes in second conductor layer 3119 to the top of conductor 3117. This etch can be done directly through conductor 3119 using RIE directional etch, for example, transferring the minimum or sub-minimum dimension of opening 3136 into conductor 3119 as minimum or sub-minimum opening 3151 as illustrated in FIG. 30C. Conductor 3117 is used an etch stop for the RIE because RIE may destroy carbon nanotube fibers in carbon nanotube layer 3114.

Next, preferred methods etch 3235 holes in first conductor layer 3117 to the carbon nanotube layer 3114. This etch can be done directly through conductor 3117, transferring the minimum or sub-minimum dimension of opening 3151 into opening 3153 in conductor 3117 as illustrated in FIG. 30D. A wet etch is used to create opening 3153 in conductor 3117. Wet etch is selected to prevent damage to nanotube layer 3114 as described in the incorporated patent applications. Wet etch is selected not to etch first sacrificial gap layer 3108. First sacrificial gap layer 3108 may consist of $Si_3N_4$ or Si, for example.

Then, preferred methods deposit 3236 conformal layer of second sacrificial gap material over conductor 3119, into opening 3153' contacting sidewalls of conductors 3119 and 3117, and over the carbon nanotube element 3114 as illustrate in FIG. 30E. One example is thin conductor layer of TiW, of approximate thickness 5–50 nm. The actual thickness may vary depending upon the performance specifications required for the nanotube device.

Next, preferred methods deposit 3240 conductor layer, fill the opening 3153' illustrated in FIG. 30E, and planarized. Conductor layer may be composed of tungsten, aluminum, copper, gold, nickel, chrome, platinum, palladium, or combinations of conductors such as chrome-copper-gold, of thickness 150 to 300 nm. Alternatively, preferred methods deposit 3238 of a conformal insulator layer 3203 , layer 3202 may be selected from materials such as $SiO_2$, $Al_2O_3$, or other suitable material with etch properties selective to $Si_3N_4$ or Si, for example. $SiO_2$ is preferred with approximate thickness 5–50 nm as illustrated in FIG. 30E'. Then, preferred methods deposit 3240 conductor layer for electrode 3205 on insulator layer, fill opening 3153. The actual thickness may vary depending upon the performance specifications required for the nanotube device.

Then, preferred methods 3242 pattern conductor layer using photoresist. Next, pattern second sacrificial gap layer is patterned using the photoresist layer as a mask, or conductor layer as a mask. Alternatively, preferred methods 3244 pattern conductor layer using photoresist. Next, pattern insulator layer using the photoresist layer as a mask, or conductor layer as a mask. Then, pattern second sacrificial gap layer is patterned using the photoresist layer as a mask, or combined metal and insulator as a mask.

Then, preferred methods 3246 deposit insulating layer and planarize to form intermediate structure 3212 as illustrated in FIG. 30F. Insulator 3116 overcoats electrode 3205. Second sacrificial gap layer 3201 separates electrode 3205 from conductors 3119 and 3117, and carbon nanotube fabric layer 3114. Alternatively, preferred methods 3246 deposit insulating layer and planarize to form intermediate structure 3214 as illustrated in FIG. 30F'. Insulator 3116 overcoats electrode 3205. Conformal insulator layer 3203 separates electrode 3205 and second sacrificial gap layer 3201, and remains on the lower surface of electrode 3205 after the removal of second sacrificial gap layer 3201 (a later step). Second sacrificial gap layer 3201 separates electrode 3205 from conductors 3119 and 3117, and carbon nanotube fabric layer 3114 forming intermediate structure 3212. Alternatively, preferred methods 3232 through preferred methods 3246 applied to FIG. 30AX result in the structure 3212X shown in FIG. 30FX and structure 3214X shown in FIG. 30FX'.

Figure 28:
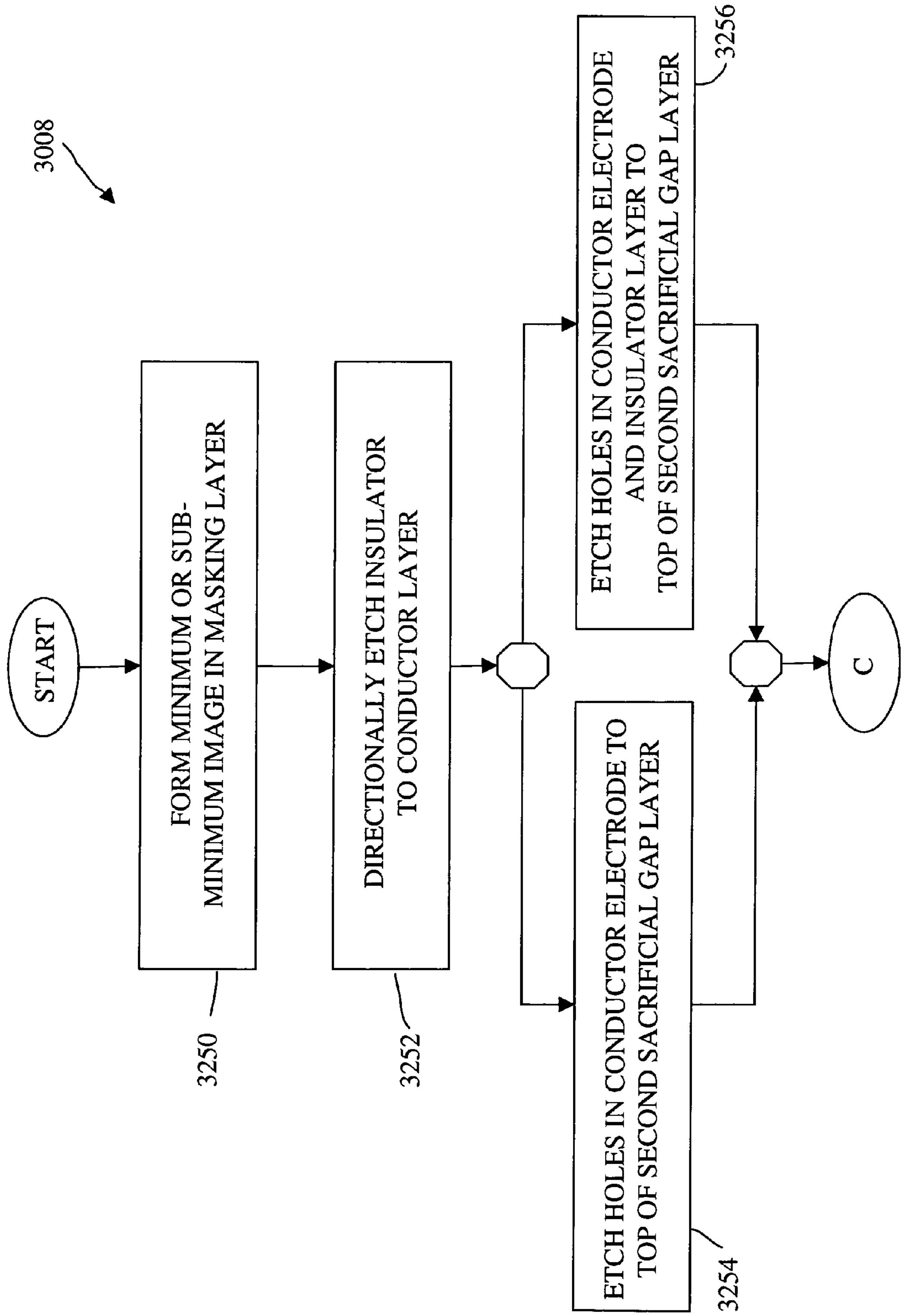
Figure 28:
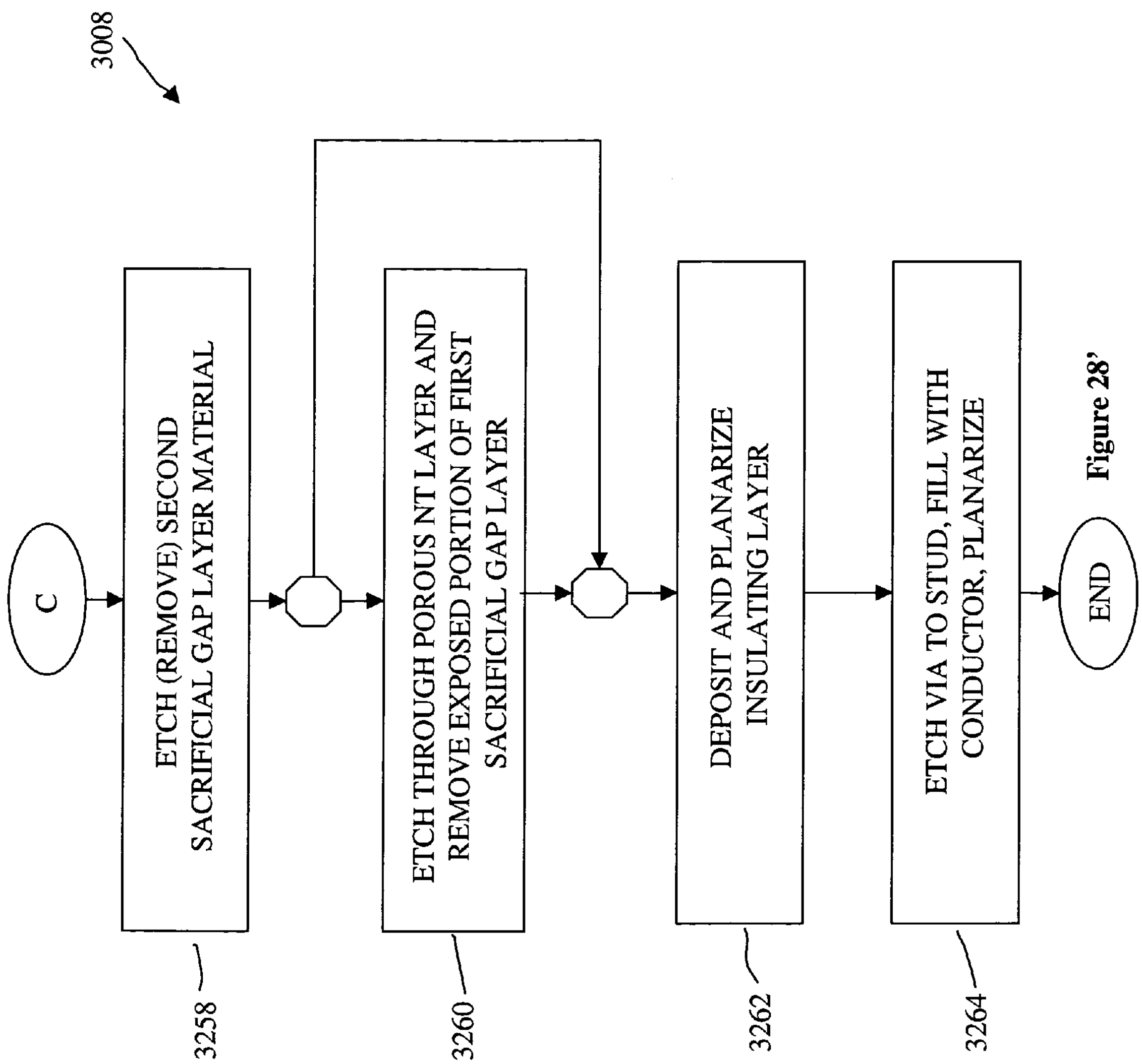

FIGS. 28 and 28' describe processes for removing sacrificial layers around the switching portion (region) of carbon nanotube fabric layer 3114 so that gaps are formed around the nanotube element so that the element may be suspended and switched in response to electrostatic forces. Each method presumes an intermediate structure such as 3212 or 3214 (FIGS. 30F and 30F', respectively) has already been formed.

FIGS. 28 and 28' describe processes for removing sacrificial layers around the switching portion (region) of carbon nanotube fabric layer 3114 so that gaps are formed around the nanotube element so that the element may be suspended and switched in response to electrostatic forces. Each method presumes an intermediate structure such as 3212X or 3214X (FIGS. 30FX and 30FX', respectively) has already been formed. While preferred methods are described further below with respect to structures 3212 and 3214 (FIGS. 30F and 30F', respectively), it is understood that these preferred methods may also be applied to structure 3212X shown in FIG. 30FX and structure 3214X shown in FIG. 30FX'.

With reference to flow chart 3008 of FIGS. 28 and 28' and to intermediate structures 3212 and 3214 of FIGS. 30F and 30F', respectively, preferred methods form 3250 minimum images in photoresist masking sacrificial layer 3130. Alternatively, intermediate sacrificial structure 3113 may be formed in lieu of a photoresist layer, providing an opening of sub-minimum dimension W2 as illustrated in FIGS. 29D and 29F.

Figure 30G:
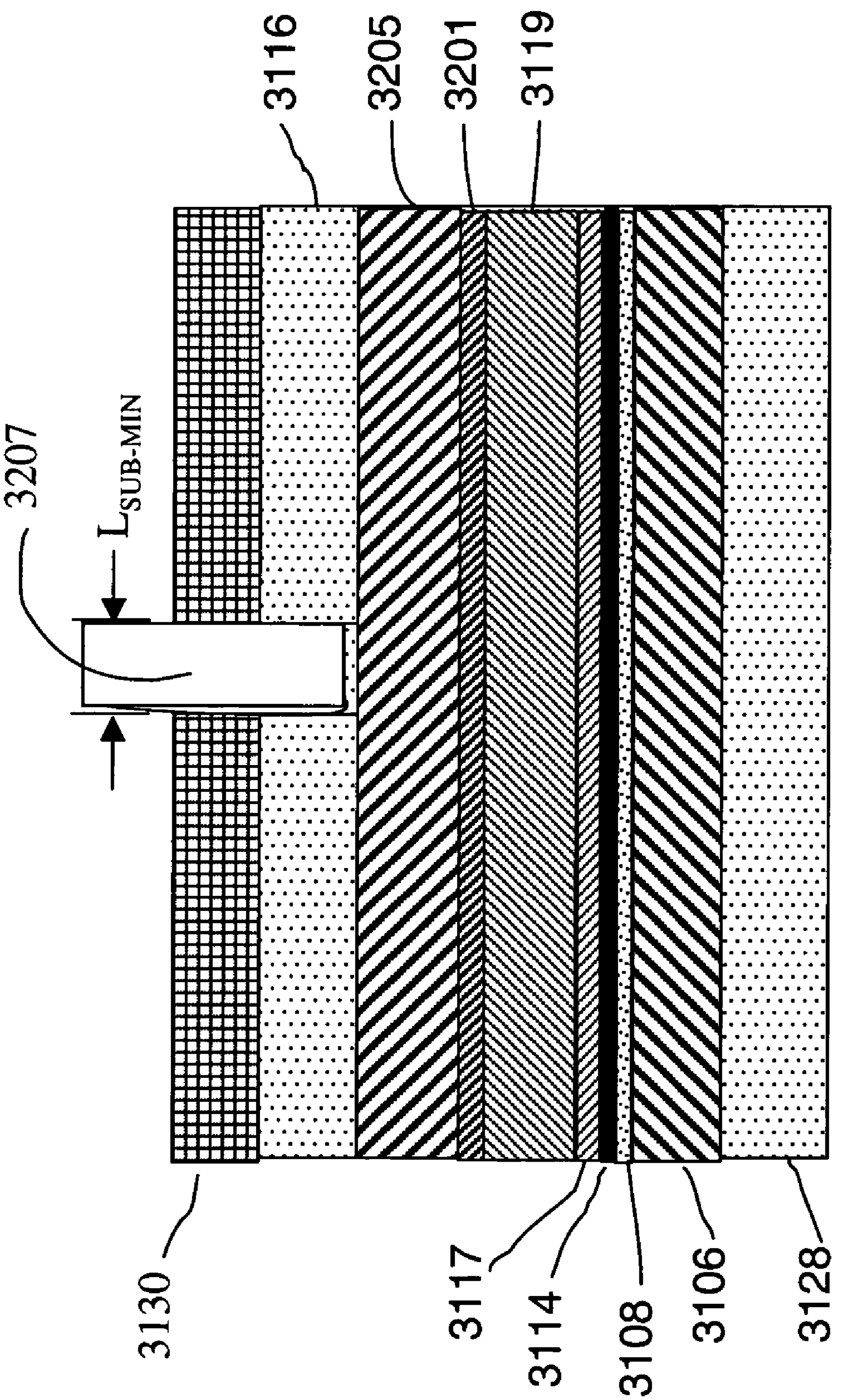
Figure 30G:
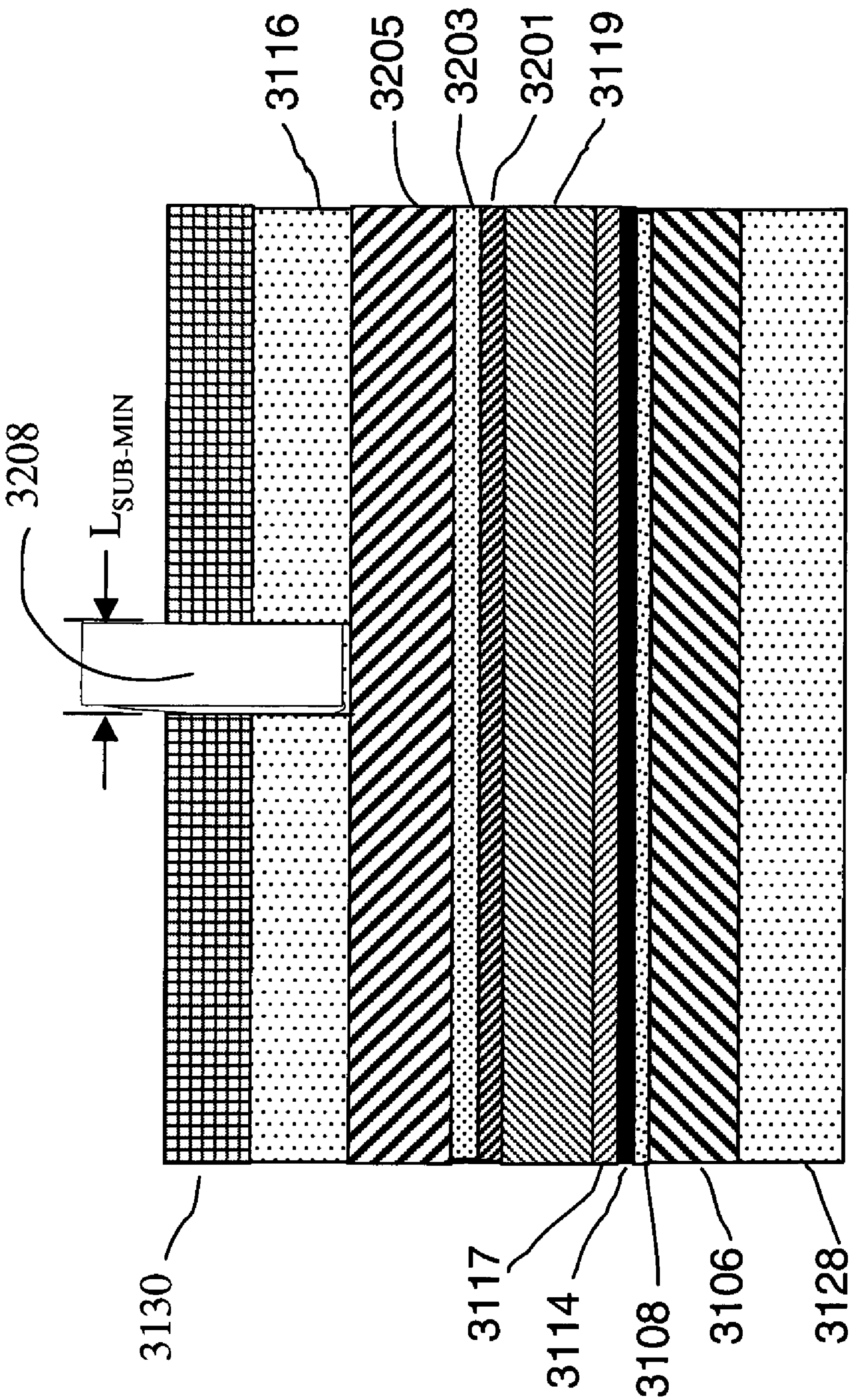

Then, preferred methods directionally etch 3252 insulator form, via holes and expose a top surface of a top electrode. Via holes are located outside nanotube switching regions. Via hole 3207 through insulator 3116 to top electrode 3205 illustrated in FIG. 30G is taken at EE–EE' as shown in FIG. 30F. No insulating layer is present between electrode 3205 and second sacrificial gap layer 3201. Alternatively, via hole 3208 through insulator 3116 to top electrode 3205 illustrated in FIG. 30G' is taken at FF–FF' as shown in FIG. 30F'. Insulating layer 3203 is present between electrode 3205 and second sacrificial gap layer 3201.

Figure 30H:
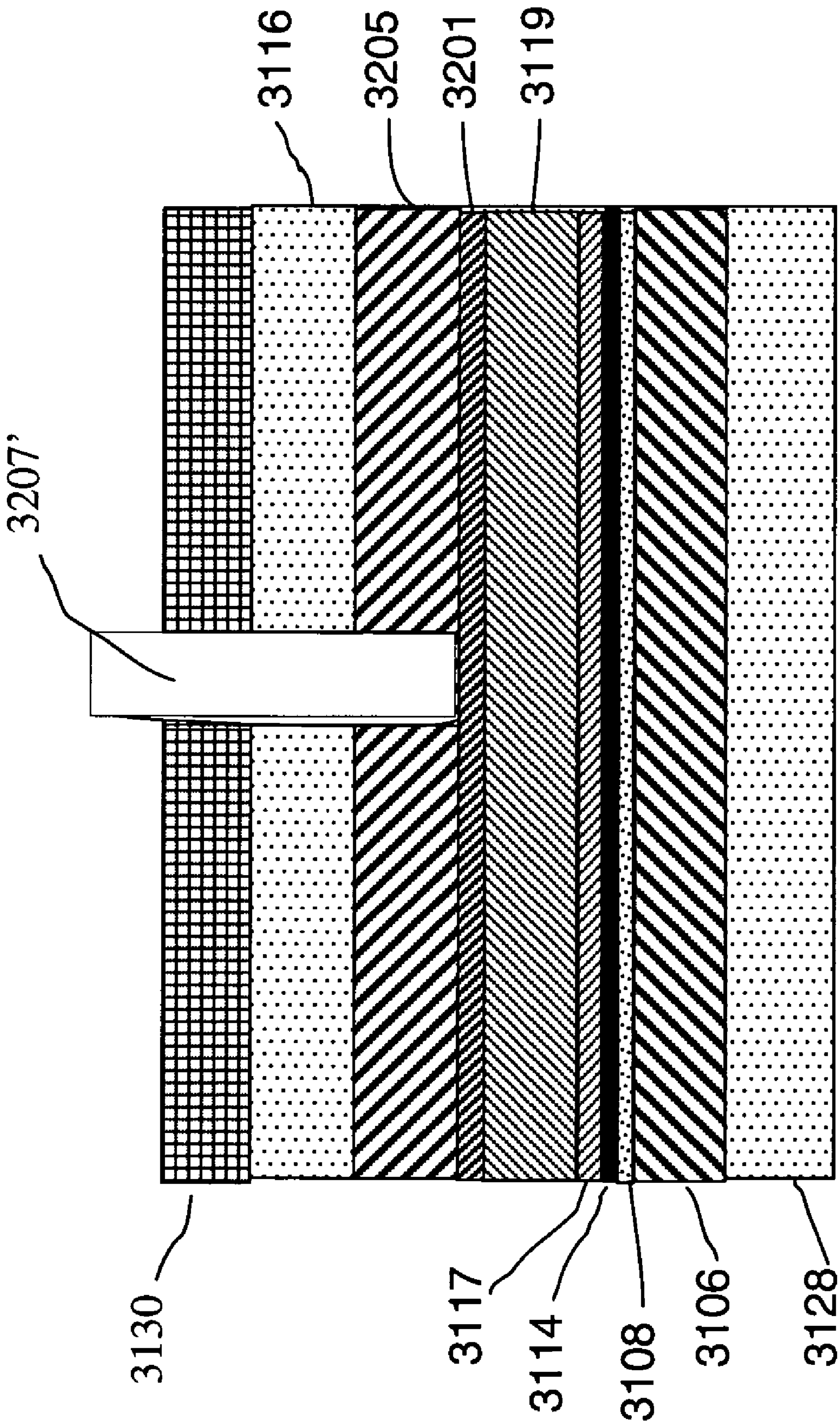
Figure 30H:
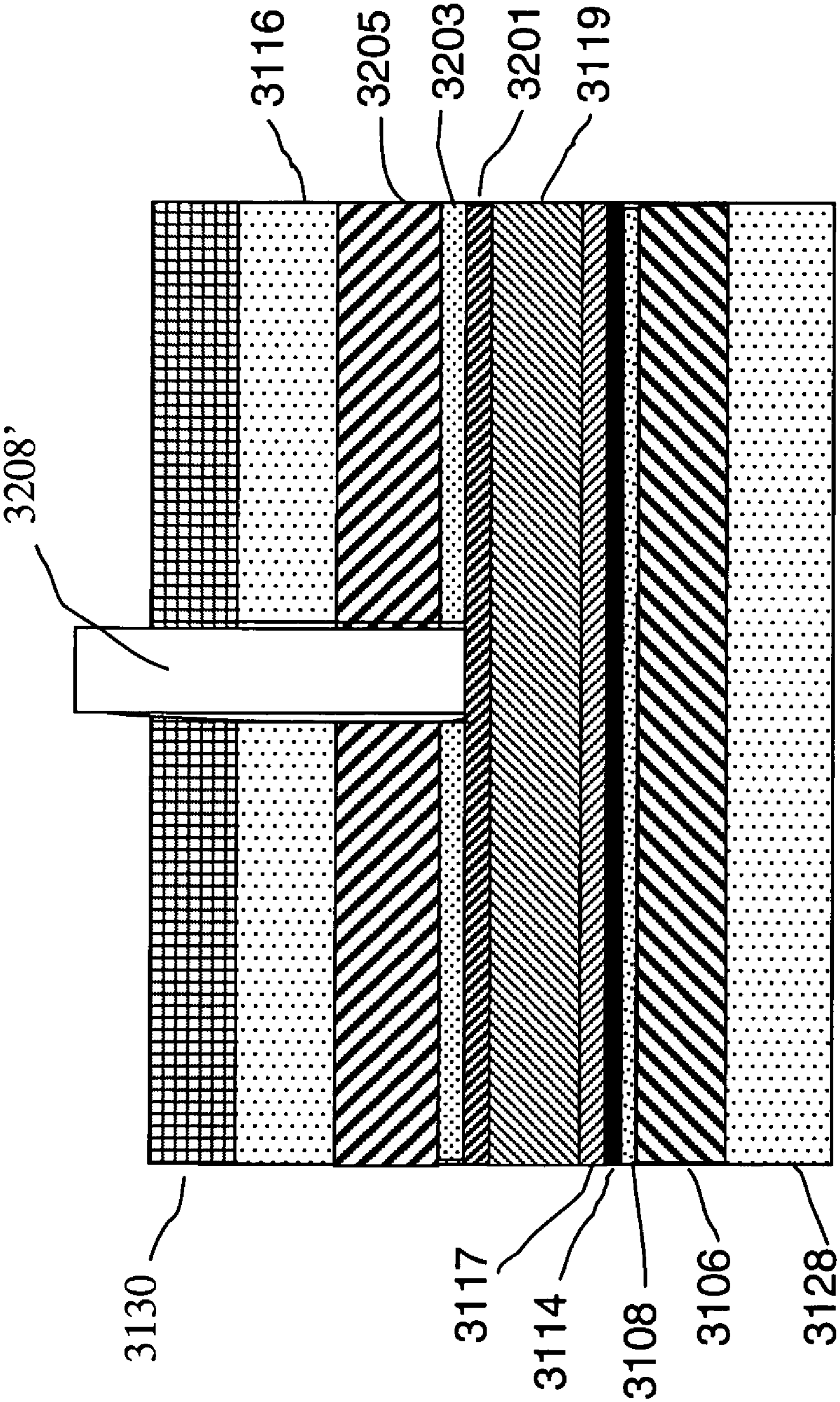

Next, preferred methods directionally etch 3254 conductor electrode to top of second sacrificial gap layer. Openings 3207' provide fluid communication paths to second sacrificial layers 3201 as illustrated in FIG. 30H. Alternatively, preferred methods directionally etch 3256 conductor electrode to top of insulating layer between conductor electrode and second sacrificial gap layer. Next, methods directionally etch 3254 insulator layer to top of second sacrificial layer. Openings 3208' provide fluid communication paths to second sacrificial gap layers 3201 as illustrated in FIG. 30H'

Then, preferred methods etch (remove) 3258 second sacrificial gap layer material creating a gap and extending fluid communication paths to the exposed top portion (region) of first sacrificial gap layers inside openings in conductors in contact with carbon nanotube fabric layers. At this point in the process a gap exists above a portion of the carbon nanotube film, which may also be referred to as a single-gap nanotube switch structure, and switched as described further down.

Figure 30I:
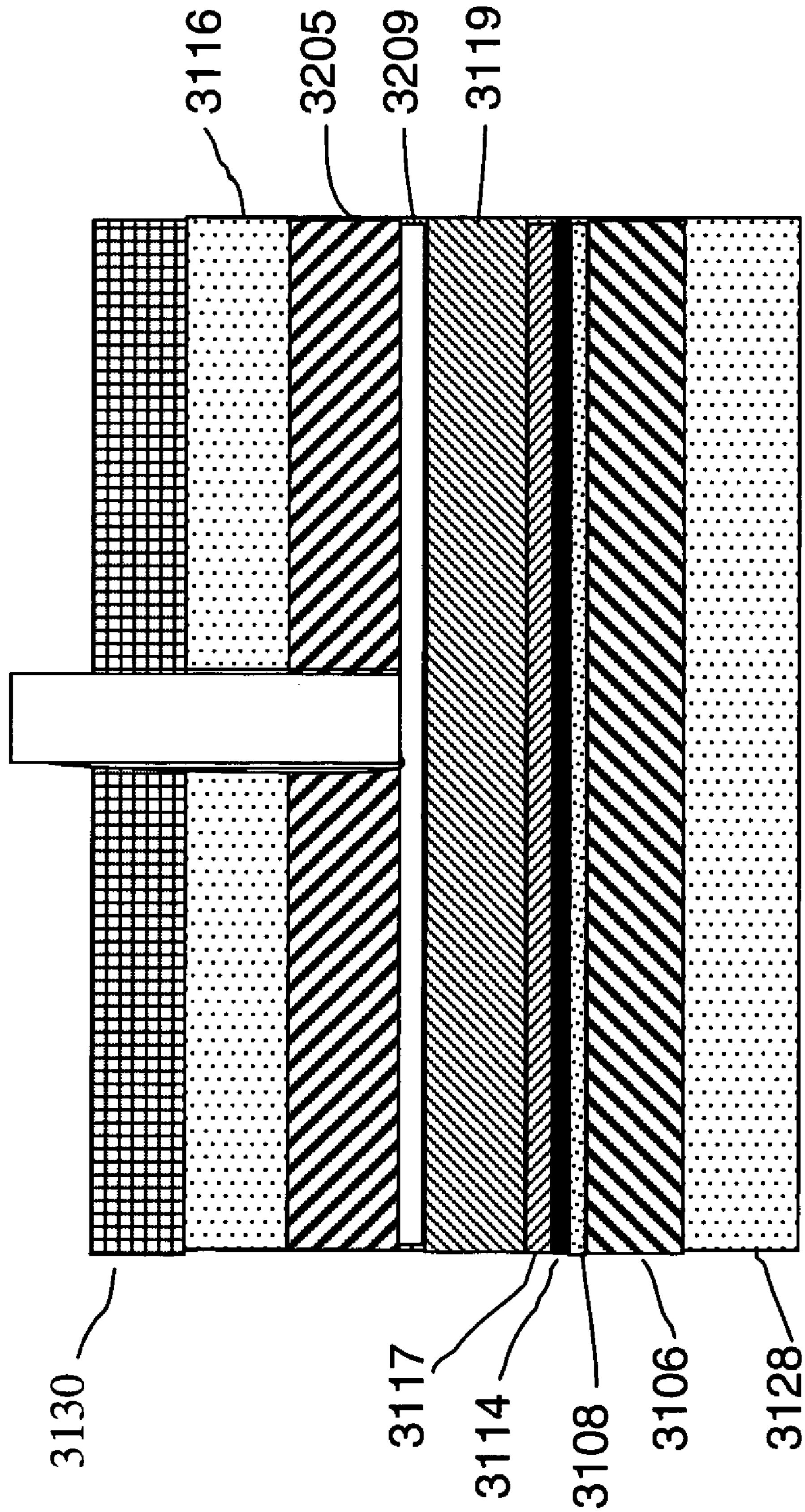
Figure 30I:
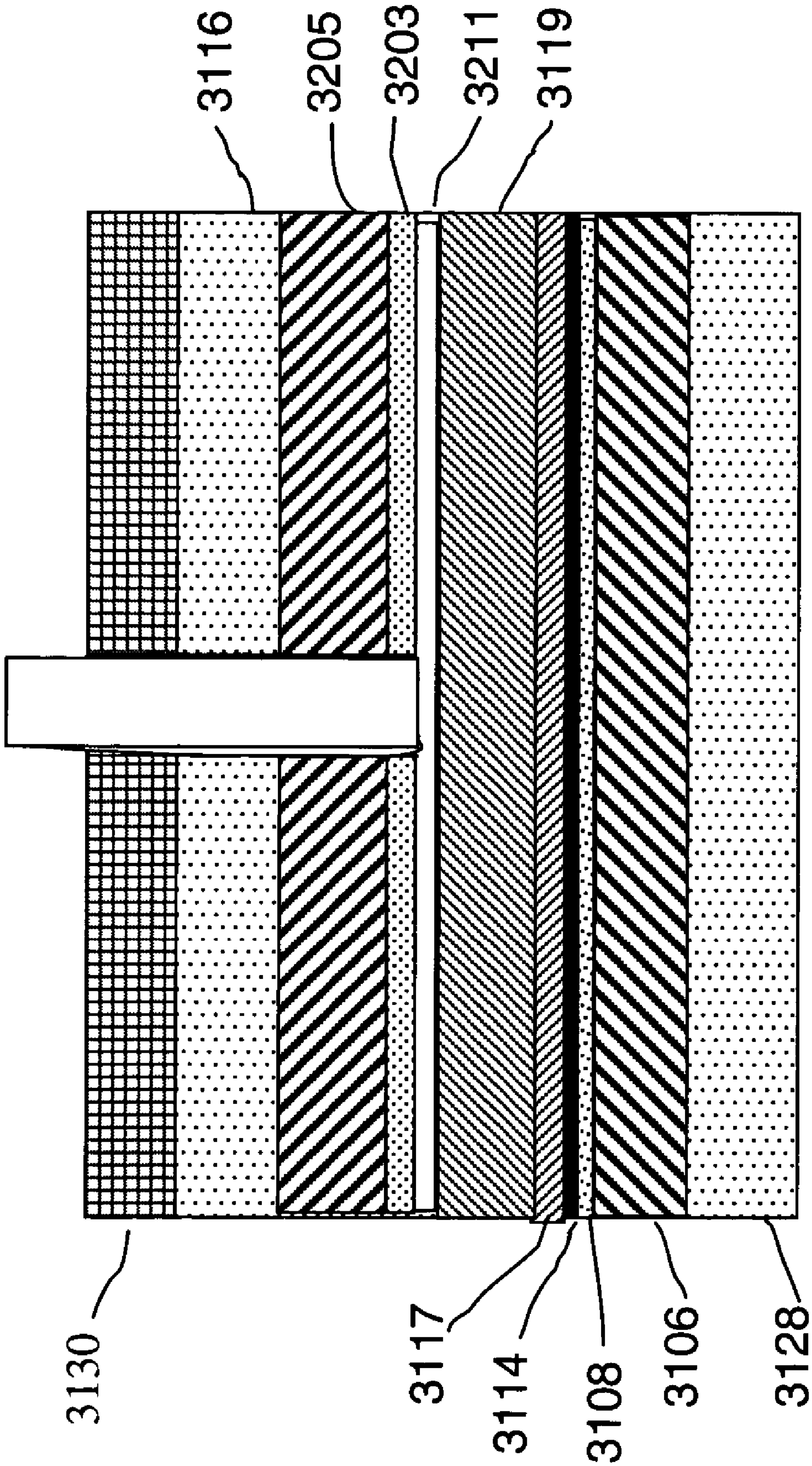

Next, preferred methods etch (remove) 3260 through porous carbon nanotube fabric layer without damaging carbon nanotube fibers by using appropriate techniques as descried in the incorporated patent applications, to exposed portion (region) of first sacrificial gap layers inside openings in conductors in contact with carbon nanotube fabric layer. Portions (regions) of first sacrificial gap layers exposed to the etch are removed and carbon nanotube fibers are suspended (released) in the switching region. First sacrificial layer 3108 is partially removed using industry standard wet etches for $Si_3N_4$, for example. Alternatively, first sacrificial layer 3108X is removed using industry standard wet etches for a silicon layer, for example. At this point a gap exists above and below a portion of the carbon nanotube, which may be referred to as a dual-gap switch structure, and switched as described further down. Carbon nanotube fibers in the peripheral region outside a switching region remain mechanically pinned and electrically connected, sandwiched between a conductor layer and the remaining (unetched) portion of the first sacrificial layer. A switching region is defined by openings in conductors in contact with carbon nanotube fabric layers. Gap regions 3209, 3209A, and 3108A for intermediate structure 3213 with no insulating layer above gap 3108A are illustrated in FIGS. 30I and 30K. Gap regions 3211, 3209A, and 3108A for intermediate structure 3215 with insulating layer above gap 3108A are illustrated in FIG. 30K'. Gap regions 3209, 3209A, and 3108A for intermediate structure 3215' with insulating layer 3203' below gap 3108A are illustrated in FIG. 30K". Insulator 3203' was deposited as illustrated in FIG. 25A'.

Next, preferred methods deposit 3262 insulating layer to fill (seal) openings (via holes) that provide a fluid communication path (or fluid conduit) used to release (suspend) carbon nanotube fibers. Insulator surface is planarized. Openings (via holes) that provide fluid communication paths are sealed as illustrated by sealed opening 3207" in FIG. 30J and by sealed opening 3208" in FIG. 30J'.

Next, preferred methods etch 3264 via holes to reach buried studs in contact with FET drain regions. Via holes are filled with a conductor and planarized. FIG. 30K illustrates structure 3213 with electrode 3205, combined metal conductors 3119 and 3117, and carbon nanotube region 3114A separated by gap regions 3209A and 3108A. Stud 3118A contacts stud 3118 that connects to drain 3126 through contact 3123. Structure 3213 is ready for first wiring layer. FIG. 30K' illustrates structure 3215 with combined electrode 3205 and bottom insulator layer 3203, combined metal conductors 3119 and 3117, and carbon nanotube region 3114A separated by gap regions 3209A and 3108A. Stud 3118A contacts stud 3118 that connects to drain 3126 through contact 3123. Structure 3215 is ready for a first wiring layer.

FIG. 30KK illustrates the nanotube switch portion 3217 of integrated dual-gap structure 3215 of FIG. 30K', where the suspended portion 3114A of nanotube 3114 has been switched to the open position "OFF" state, with the elongated suspended portion 3114A' in contact with insulator 3203 on release-plate 3216, and held in the open position by van der Waals forces between insulator 3203 and carbon nanotube portion 3114A'. Switch portion 3217 corresponds to switch 90 illustrated in the schematic of FIG. 3A switched to position 90", as illustrated in the schematic of FIG. 3C. Nanotube elongated suspended portion 3114A' of FIG. 30KK corresponds to nanotube elongated portion 1140" of the memory cell schematic illustrated in FIG. 17C. FIG. 30KK' illustrates the nanotube switch portion 3217' of integrated dual-gap structure 3215 of FIG. 30K', where the suspended portion 3114A of nanotube 3114 has been switched to the closed position "ON" state, with the elongated suspended portion 3114A" in contact with switch-plate 3206, and held in the closed position by van der Waals forces between switch-plate 3206 and carbon nanotube portion 3114A". Switch portion 3217' corresponds to switch 90 illustrated in the schematic of FIG. 3A switched to position 90', as illustrated in the schematic of FIG. 3B. Nanotube elongated suspended portion 3114A" of FIG. 30KK' also corresponds to nanotube elongated portion 1140' of the memory cell schematic illustrated in FIG. 17B.

Figure 30J:
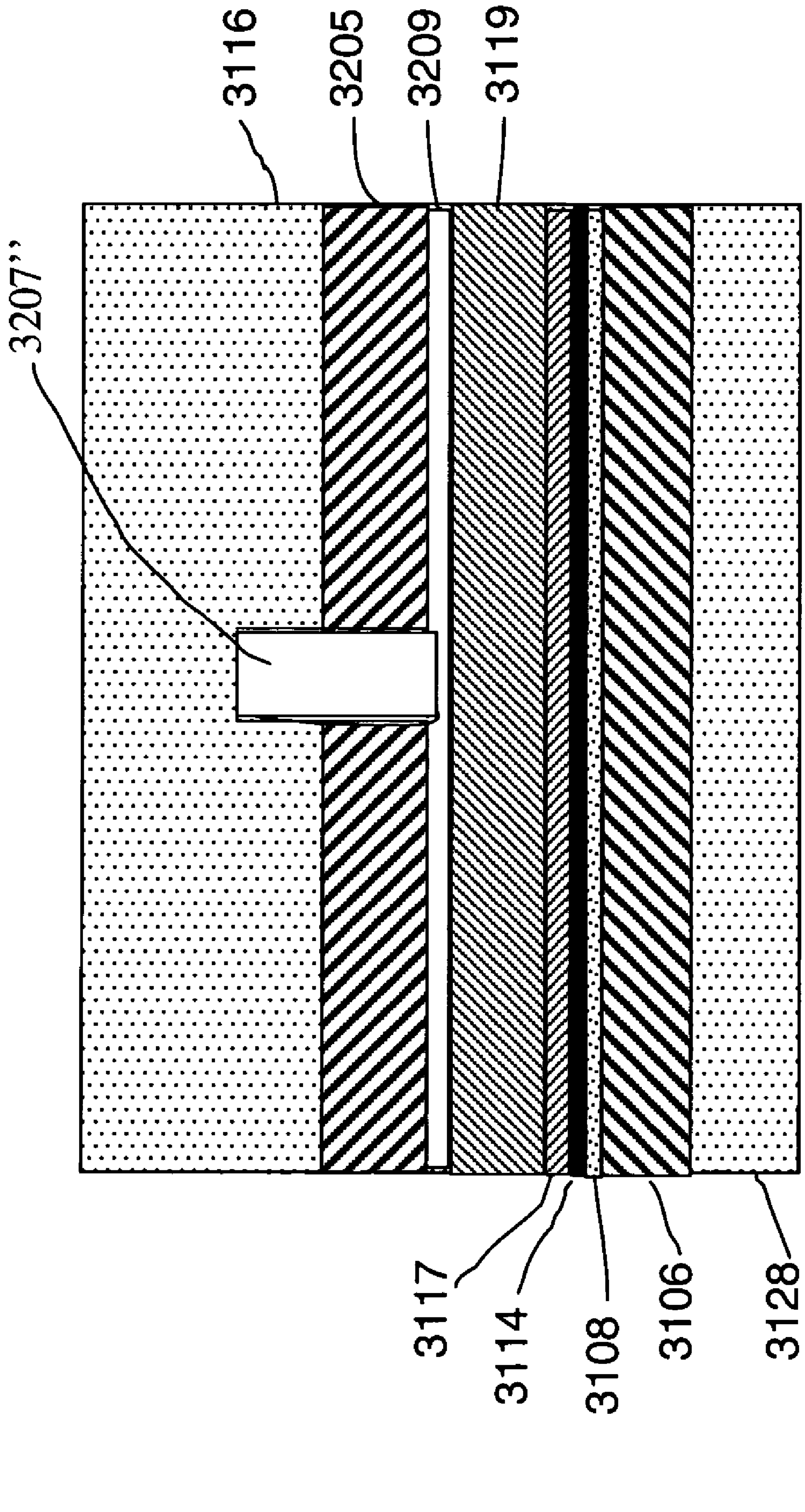
Figure 30J:
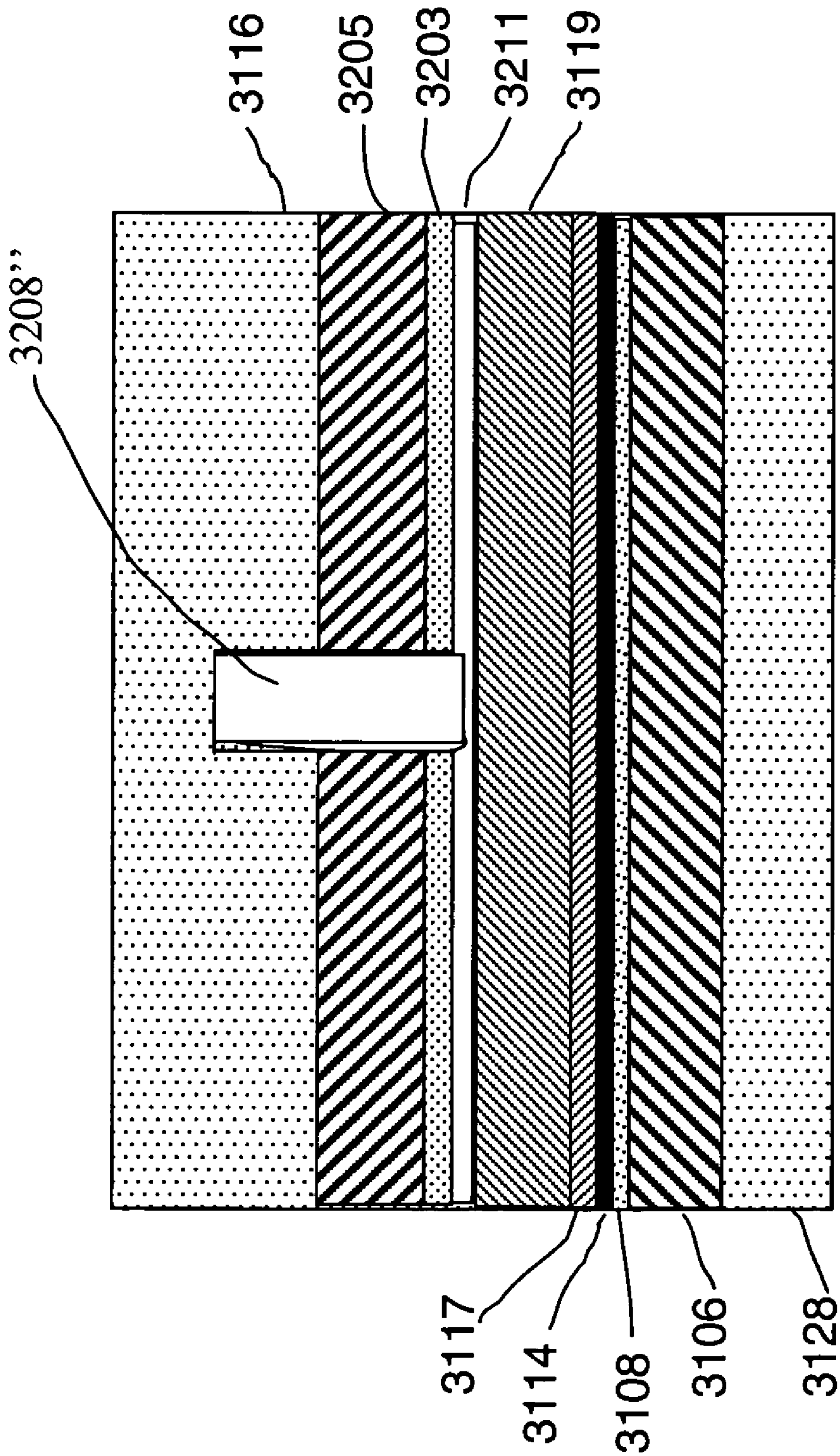
Figure 30K:
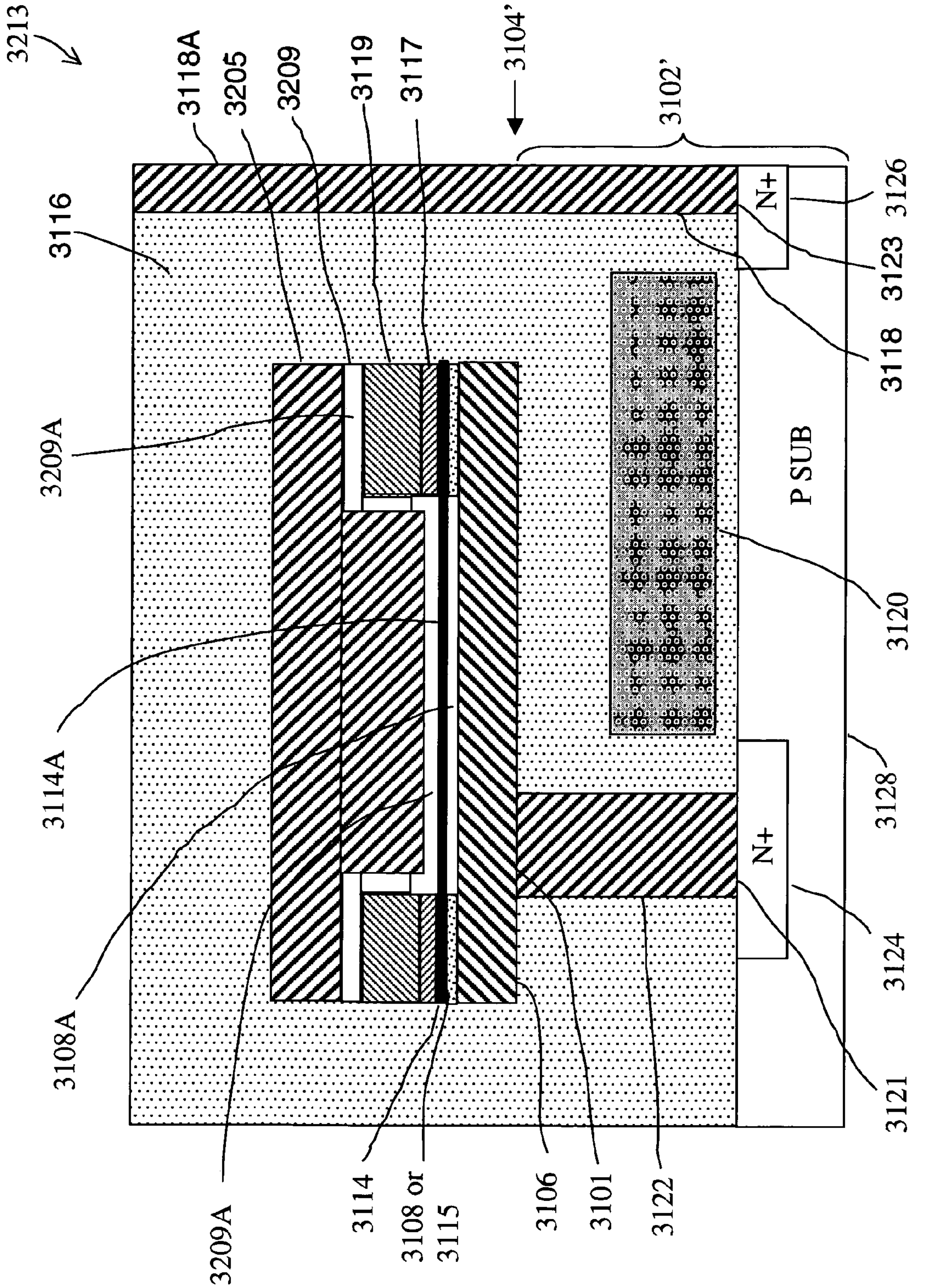
Figure 30K:
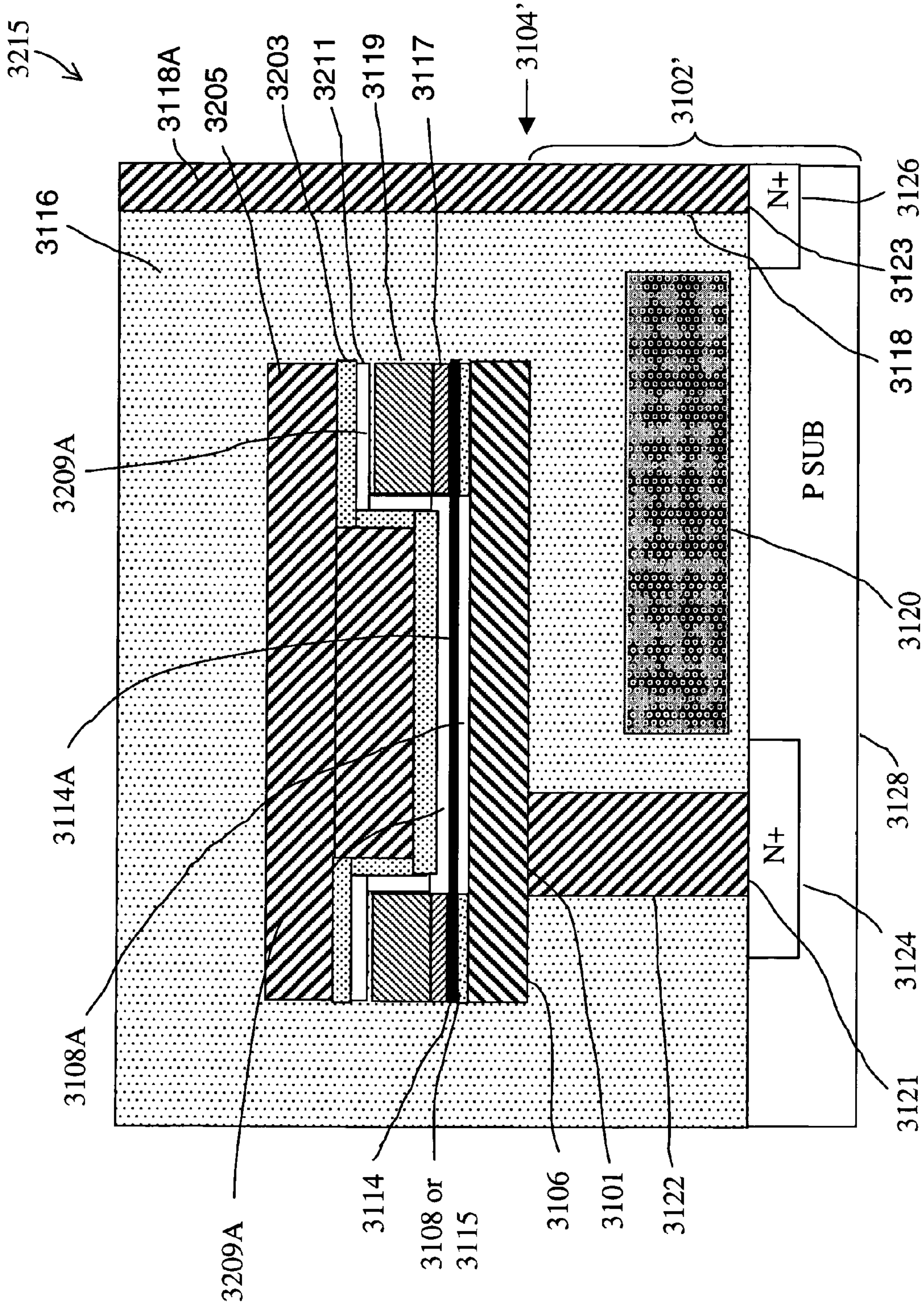
Figure 30K:
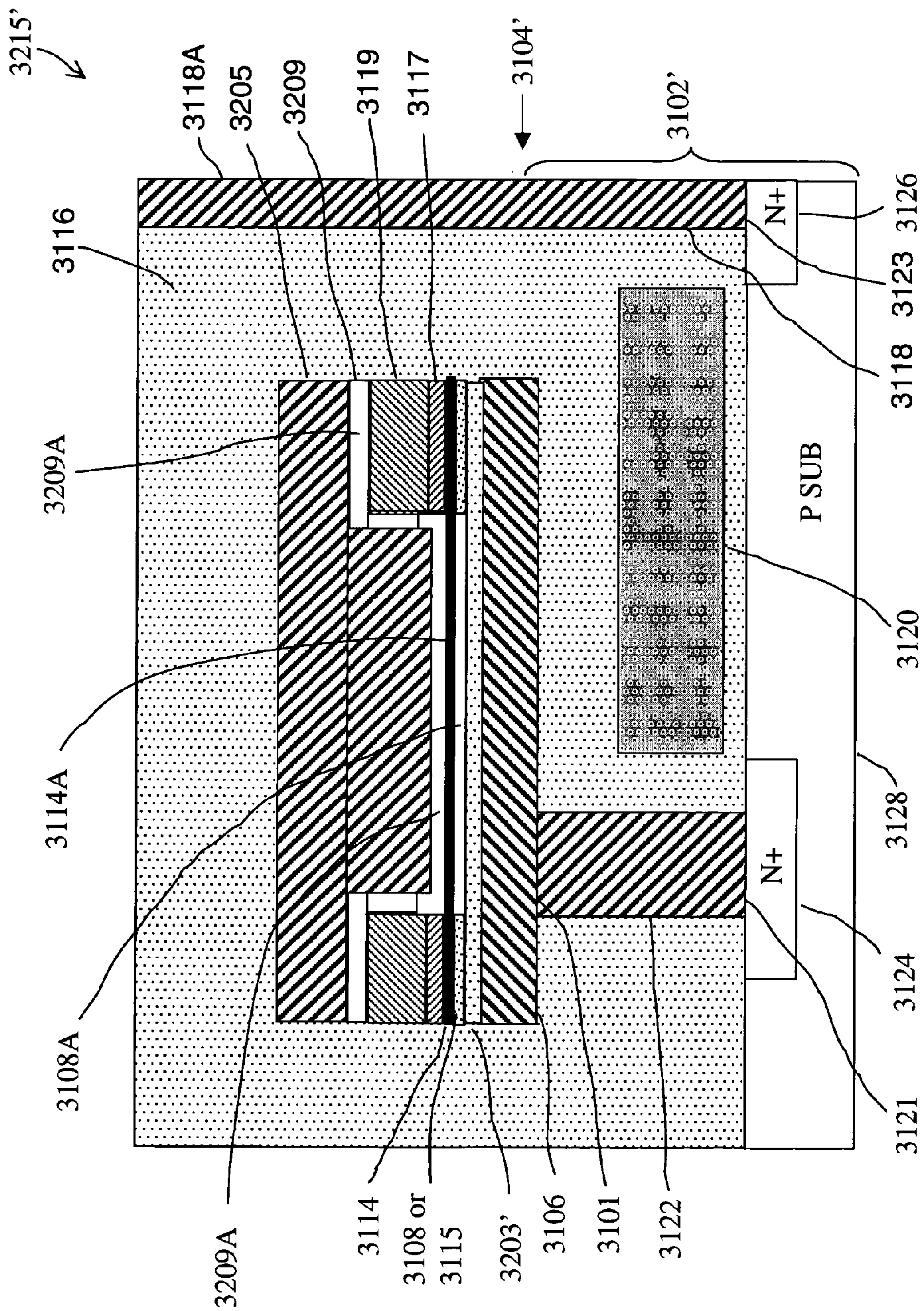
Figure 30K:
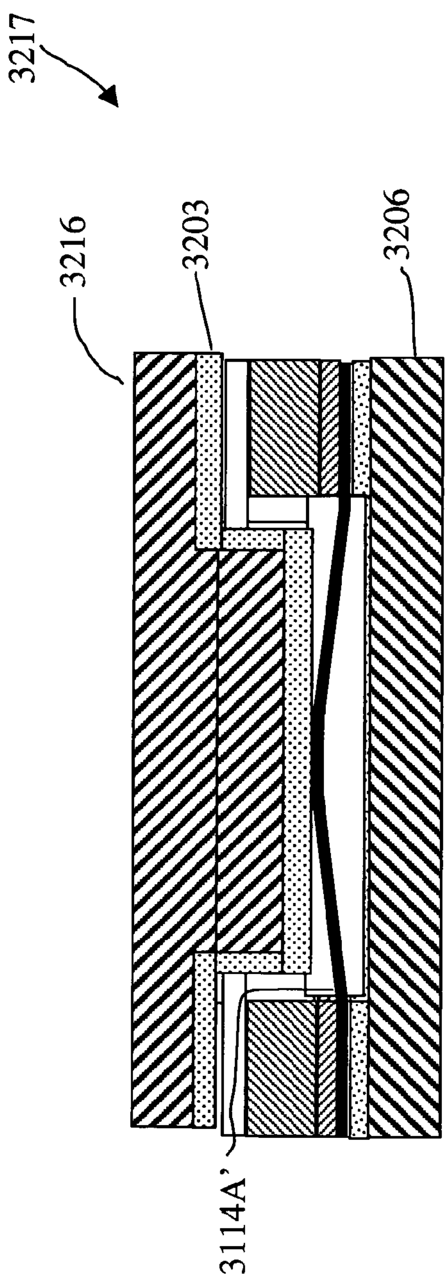
Figure 30K:
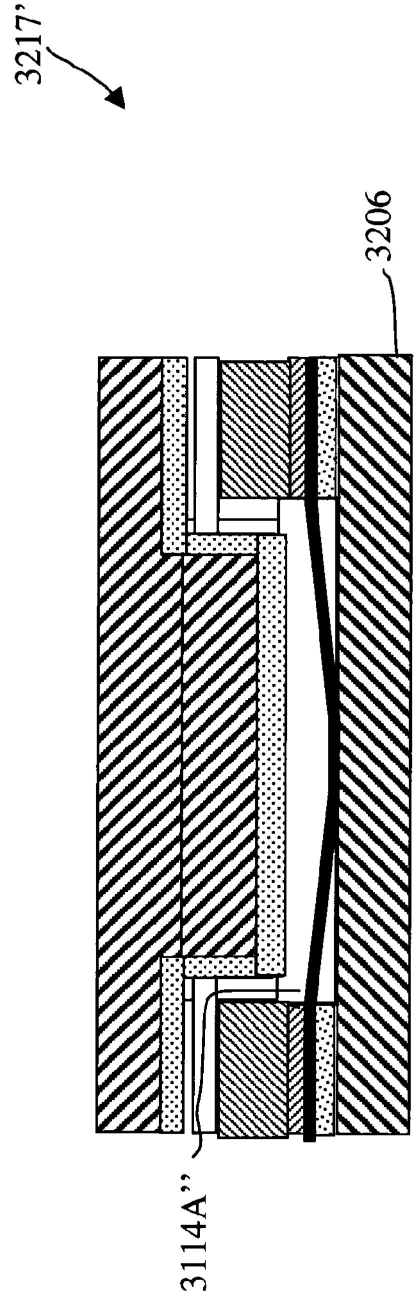
Figure 30L:
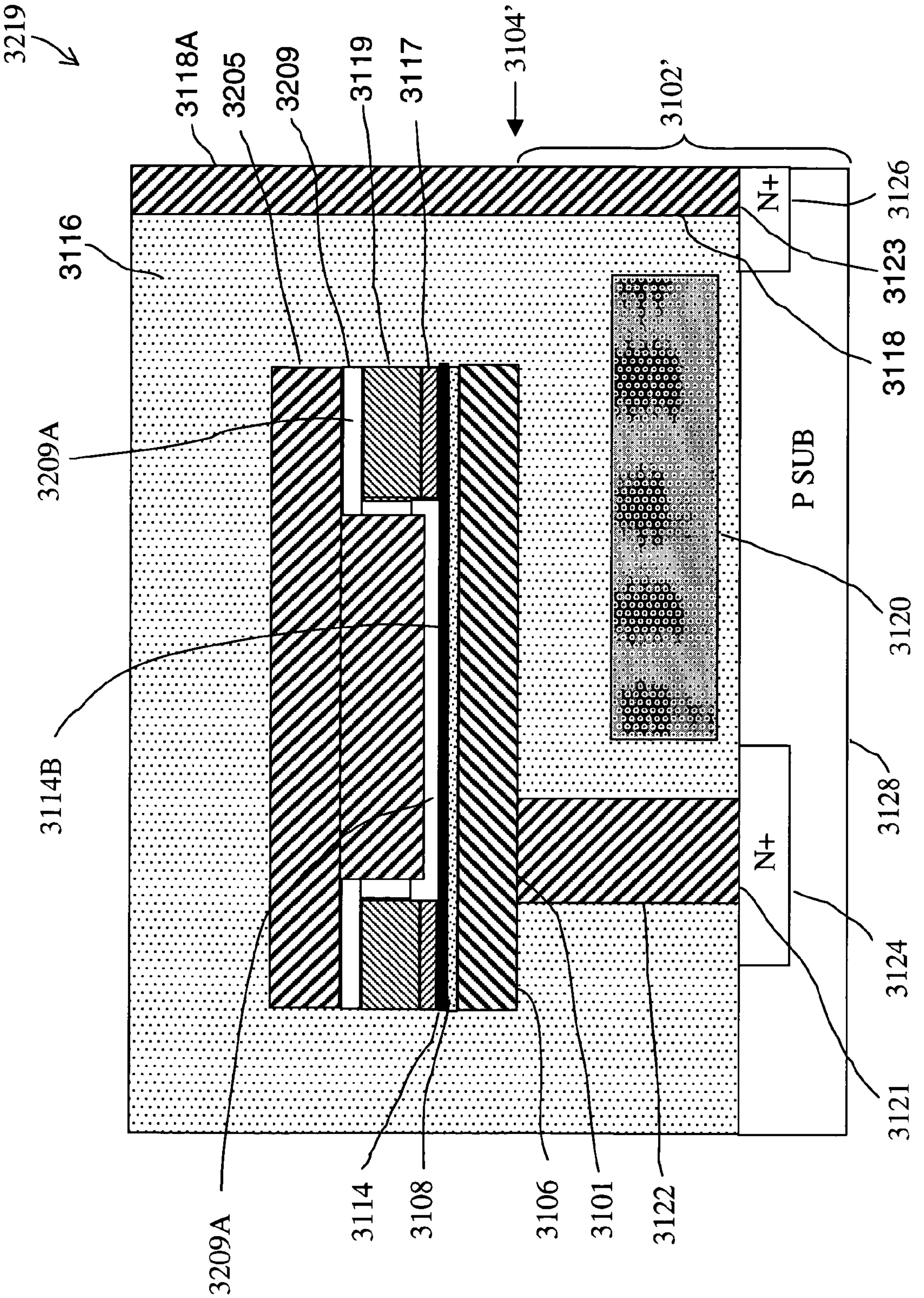
Figure 30L:
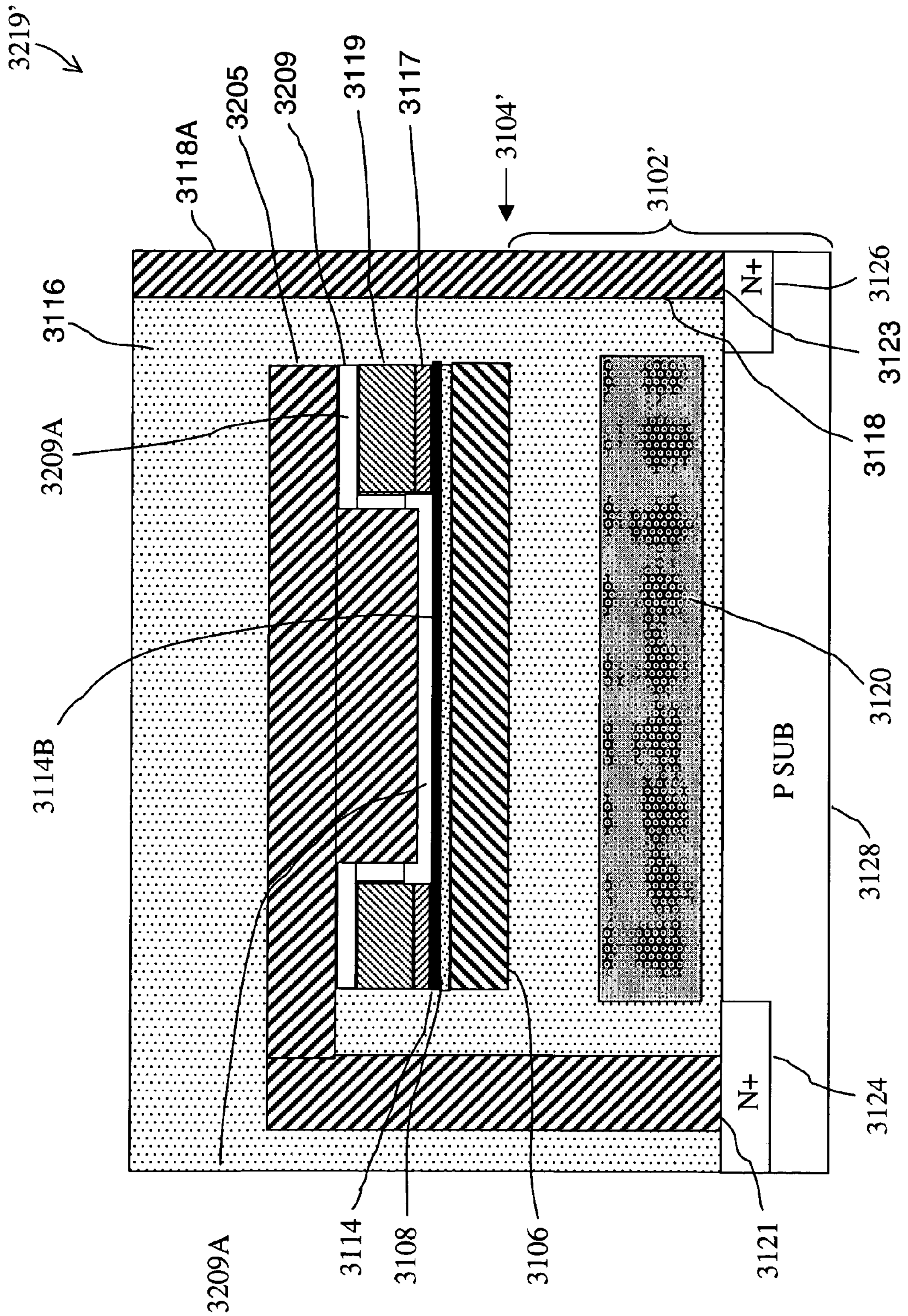

FIG. 30L illustrates a cross section of an alternate integrated nanotube structure that uses a single gap region above the nanotube switching region to form integrated single-gap nanotube switching structure 3219, instead of a dual-gap nanotube structure that uses a gap region above and below the switching region of the nanotube. Structure 3219 is referred to as a single-gap structure because segment 3114B of nanotube 3114 only has a single gap 3209A. Dielectric layer 3108 below nanotube segment 3114B is not removed by etching. Structure 3219 is fabricated using the steps as illustrated by flow chart 3008 in FIG. 28', and corresponds to the method of fabrication described above for fabricating cross section of structure 3213 of FIG. 30K, except that method steps 3260 are omitted, such that the first sacrificial gap layer is not removed. Electrode 3106 shown below nanotube 3114 in dual-gap integrated structure 3215 of FIG. 30K' performs a switch-plate function, as does electrode 3205 shown above nanotube 3114 in single-gap integrated structure 3219 of FIG. 30L. In other words, the bottom electrode 3106 of FIG. 30K' and the top electrode 3205 of FIG. 30L each performs a switch-plate function. Electrode 3205 with insulating layer 3203 shown above nanotube 3114 in dual-gap integrated structure 3215 of FIG. 30K' performs a release-plate function, as does electrode 3106 with insulating layer 3108 shown below nanotube 3114 in single-gap integrated structure 3219 of FIG. 30L. In other words, the insulated top electrode 3205 of FIG. 30K' and the insulated bottom electrode 3106 of FIG. 30L each performs a release-plate function. Source 3124 is connected to electrode 3106 as illustrated in FIG. 30K', such that source 3124 controls the voltage applied to electrode 3106, which is used a switch-plate in structure 3215 shown in FIG. 30K'. Source 3124 controls the voltage of insulated electrode 3106, which is used as a release-plate in structure 3219 shown in FIG. 30L.

FIG. 30L' illustrates the structure 3219' in which structure 3219 of FIG. 30L has been modified so that source 3124 controls the voltage of switch-plate electrode 3205. In operation, structure 3215 of FIG. 30K' and structure 3219' of FIG. 30L' operate in the same way, except that the position of corresponding switch plates have been interchanged, such that the switch-plate is below the nanotube layer in structure 3215, and above the nanotube layer in structure 3219'.

FIG. 30L" illustrates the nanotube switch portion 3221 of integrated single-gap structure 3219 of FIG. 30L, and single-gap structure 3219' of FIG. 30L', where the suspended portion 3114B of nanotube 3114 is in the open position "OFF" state. In the open position, nanotube 3114 remains in contact with insulator layer 3108, in an approximately non-elongated state, with van der Waals force between nanotube 3114 and insulator layer 3108. FIG. 30L'" illustrates the nanotube switch portion 3221' of integrated single-gap structure 3219 of FIG. 30L, and single-gap structure 3219' of FIG. 30L', where the suspended portion 3114B of nanotube 3114 has been switched to the closed position "ON" state 3114B'. In the closed position, nanotube 3114 has been switched in contact with switch-plate 3205, and remains in contact electrode 3205, in an elongated state, with van der Waals force between nanotube 3114B segment and electrode 3205. A single-gap structure may be used in lieu of a dual-gap structure to fabricate field effect devices with controllable sources and memories using NT-on-Source arrays.

Figure 30M:
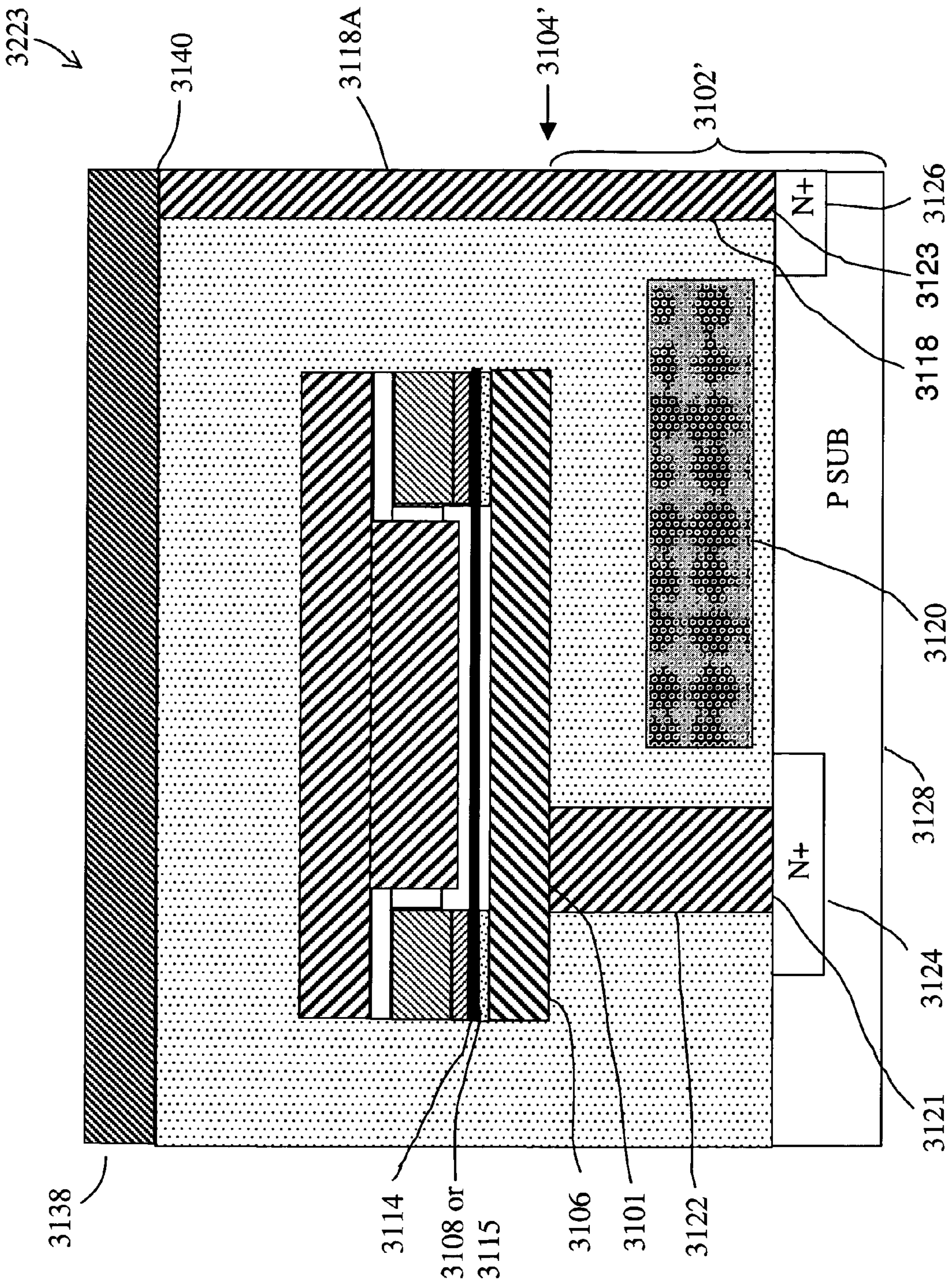
Figure 30M:
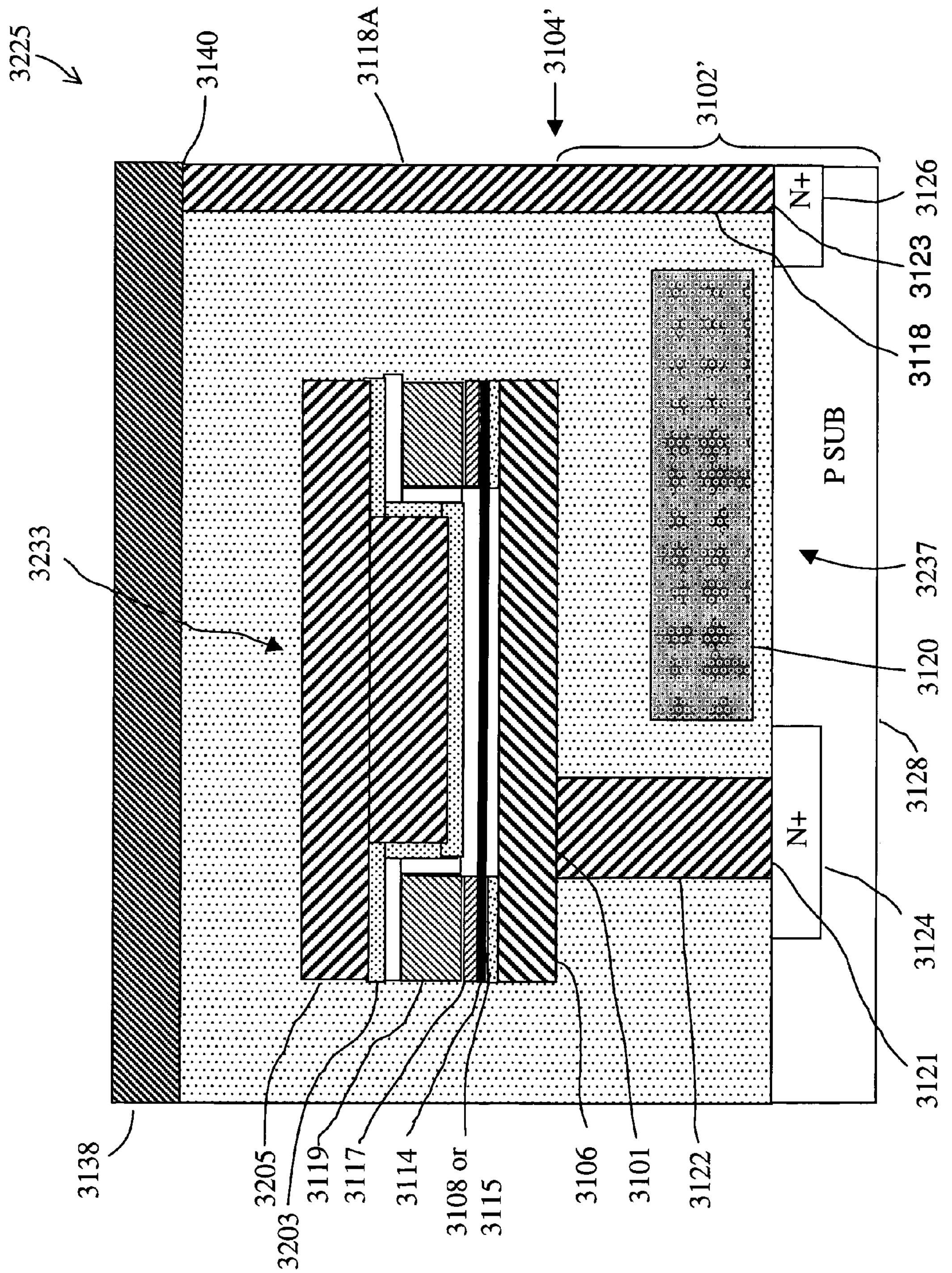

Continuing the fabrication process using a dual-gap nanotube structure such as illustrated in FIG. 30K, bit line 3138 is then deposited and patterned; the resulting cross section 3223 is illustrated in FIG. 30M. Wiring layer 3138 contacts stud 3118A at contact region 3140 of intermediate structure 3223. Final processing to the passivation layer is not shown. Alternatively, continuing the fabrication process using a dual-gap nanotube structure such as illustrated in FIG. 30K', bit line 3138 is then deposited and patterned; the resulting cross section 3225 is illustrated in FIG. 30M'. Wiring layer 3138 contacts stud 3118A at contact region 3140 of intermediate structure 3225. Final processing to the passivation layer is not shown.

Figure 30N:
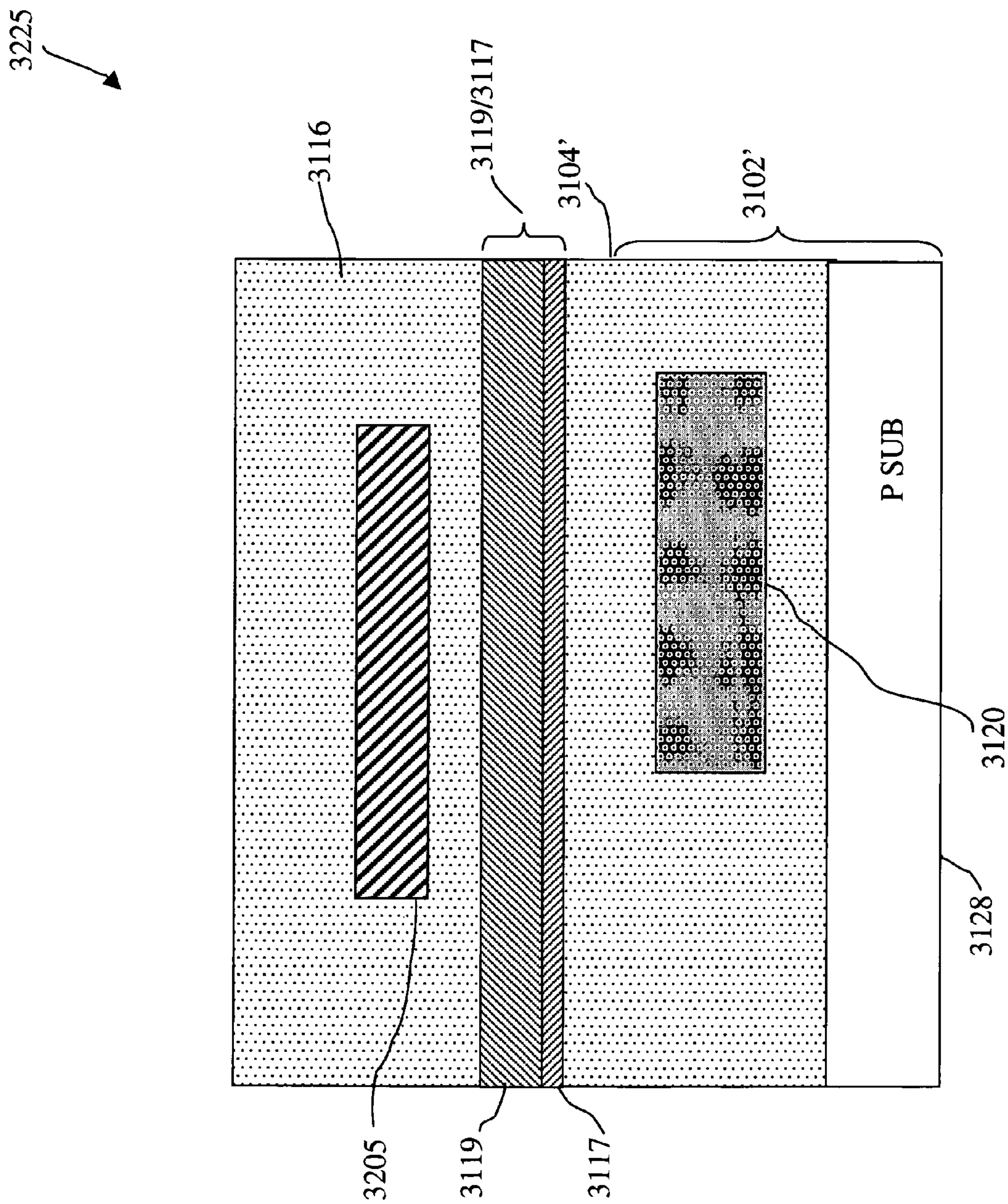
Figure 30P:
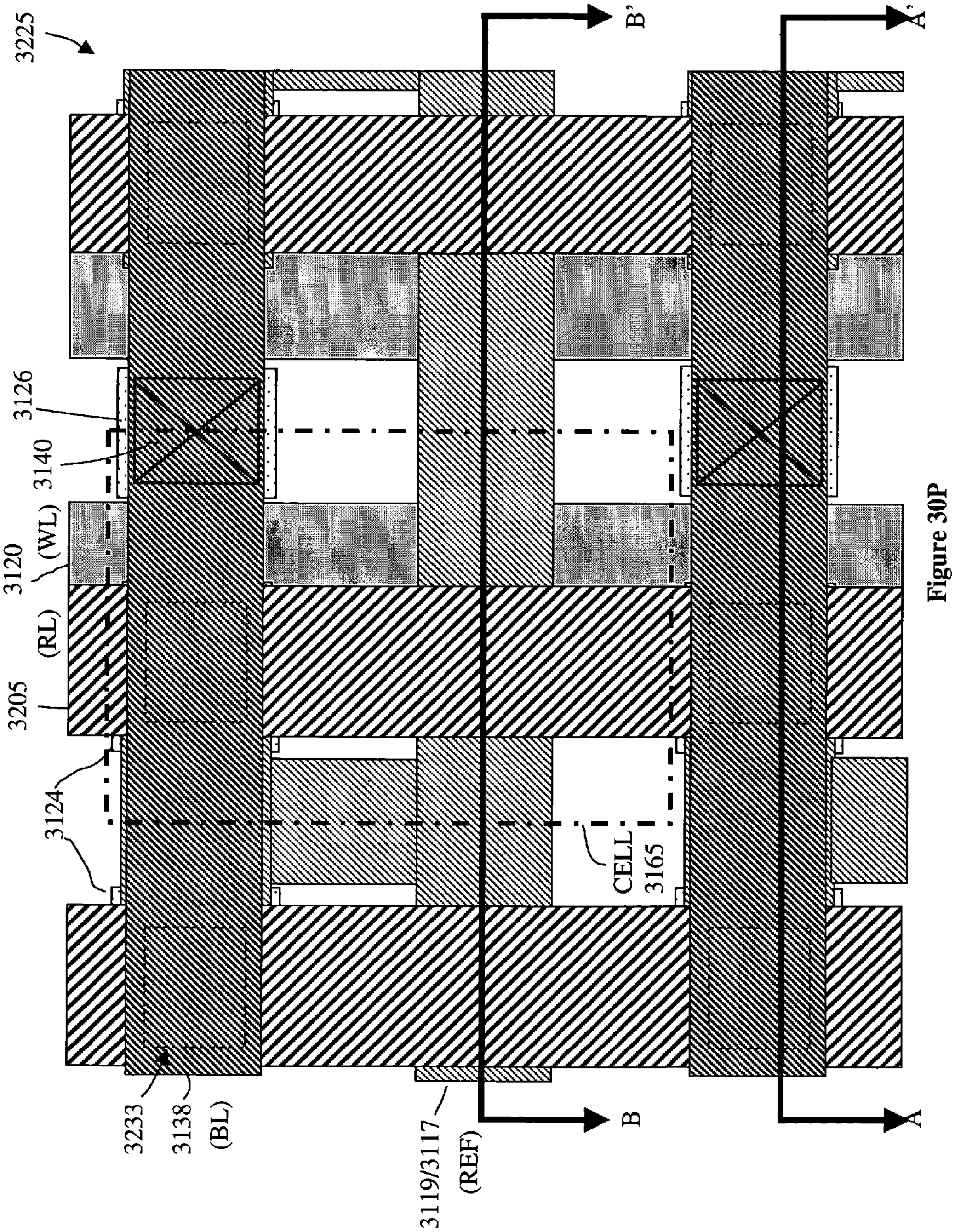

FIG. 30M' illustrates cross section A–A' of array 3225 taken at A–A' of the plan view of array 3225 illustrated in FIG. 30P, and shows FET device region 3237 in the FET length direction, nanotube switch structure 3233, interconnections and insulators. FIG. 30N illustrates cross section B–B' of array 3225 taken at B–B' of plan view of array 3225 illustrated in FIG. 30P, and shows a release array line 3205, a reference array line 3119/3117 composed of combined conductors 3119 and 3117, and a word array line 3120. FIG. 30P illustrates a plan view of array 3225 including exemplary cell 3165 region, bit array line 3138 contacting drain 3126 through contact 3140 to stud 3118A, to stud 3118, to contact 3123, and to drain 3126, (studs 3118, 3118A, and contact 3123 not shown in plan view 3225). Reference array line 3119/3117 is parallel to bit line 3138, is illustrated in cross section in FIG. 30N, and contacts a corresponding reference line segment in the picture frame region formed by combined conductors 3117 and 3119, in contact with nanotube 3114, as shown in FIG. 30M'. Release array line 3205 is parallel to word array line 3120. Release line 3205 contacts and forms a portion of release electrode 3205 as illustrated in the nanotube switching region of FIG. 30M'. This nanotube switching region is illustrated as nanotube switch structure 3233 in array 3225 of FIG. 30P. In terms of minimum technology feature size, NT-on-source cell 3165 is approximately 12 to 13 $F^2$. Nanotube-on-source array 3225 structures illustrated in FIGS. 30M', 30N, and 30P correspond to nanotube-on-source array 1700 schematic representations illustrated in FIG. 18. Bit line 3138 structures correspond to any of bit lines BL0 to BLm-1 schematic representations; reference line 3119/3117 structures correspond to any of reference lines REF0 to REFm-1 schematic representations; word line 3120 structures correspond to any of word lines WL0 to WLn-1 schematic representations; release line 3205 structures correspond to any of release lines RL0 to RLn-1 schematic representations; source contact 3140 structures correspond to any of source contacts 1720 schematic representations; nanotube switch structures 3233 correspond to any of NT0,0 to NTm-1,n-1 schematic representations; FET 3237 structures correspond to any of FETs T0,0 to Tm-1, n-1 schematic representations; and exemplary cell 3165 corresponds to any of cells C0,0 to cell Cm-1,n-1 schematic representations.

It is desirable to enhance array 3225 illustrated in plan view FIG. 30P by enhancing wireability, for example, or cell density, for example. In order to minimize the risk of shorts caused by misaligned via (vertical) connections between conductive layers, it is desirable to coat the top and sides of some selected conductors with an additional insulating layer that is not etched when etching the common insulator (common insulator $SiO_2$, for example) between conductive layers as illustrated by structure 3227 in FIG. 31D. A method 3144 of coating a conductive layer with an additional insulating layer to form insulated conductor structure 3227 is described with respect to structures illustrated in FIGS. 31A–31D.

Figures 31A, 31B, 31C, 31D:
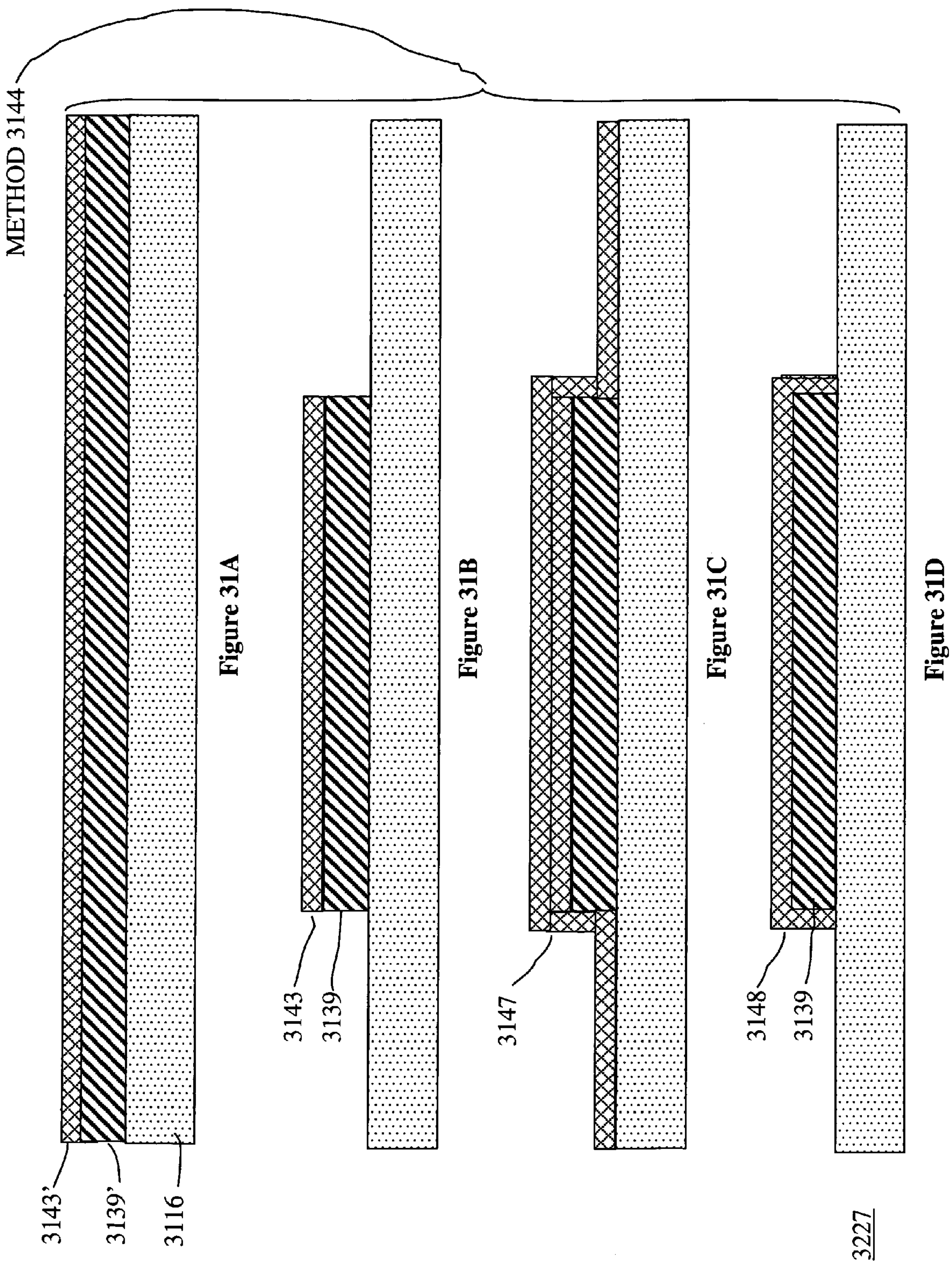
FIGS. 31A–D illustrate intermediate structures according to certain aspects of the invention.

FIG. 31A presumes that an intermediate structure has already been created and insulated with insulator layer 3116, $SiO_2$ for example. Then, preferred methods deposit conductor layer 3139' on insulator 3116. By way of example, conductor layer 3139' may be tungsten, aluminum, copper, gold, nickel, chrome, platinum, palladium, polysilicon, or combinations of conductors such as chrome-copper-gold deposited by evaporation, sputtering, CVD, and other methods. Conductor thickness may be in the range of 50 to 200 nm.

Then, preferred methods deposit insulating layer 3143' on top of conductor layer 3139' as illustrated in FIG. 31A. Insulator material may be silicon nitride, alumina, or polyimide, for example. Insulator thickness may be 20 to 100 nm, for example.

Then, preferred methods deposit and image photoresist using known techniques. This is done to define a pattern in the photoresist that corresponds to the electrode and insulating layer.

Then, preferred methods etch define conductor 3139 and insulating layer 3143 as illustrated in FIG. 31B. The photoresist layer (not shown) is removed.

After the conductor 3139 and insulating layer 3143 are defined, preferred methods deposit conformal insulating layer 3147 as illustrated in FIG. 31C. Insulating layer 3147 may be of the same material as insulating layer 3143. Insulating thickness may be 20 to 100 nm, for example.

Next, preferred methods directionally etch (reactive ion etch, for example) insulating layer 3147, resulting in conductor 3139 having insulating layer 3148 on top and on the sides and forming insulated conductor structure 3227 as illustrated in FIG. 31D. Method 3144 (or comparable methods) of insulating a conductor as illustrated in FIGS. 31A–31D may be applied to various conductive layers, such as those in memory array 3225.

It is desirable to enhance the wireability of array 3225 illustrated in FIG. 30P by forming reference array line 3138' on the same wiring level and at the same time as bit line 3138. Reference array line 3138' contacts reference line segments 3119/3117 composed of combined conductors 3119 and 3117 as illustrated further below. Line segments 3119/3117 are not required to span relatively long sub-array regions and may be optimized for contact to nanotube layer 3114.

Figure 32A:
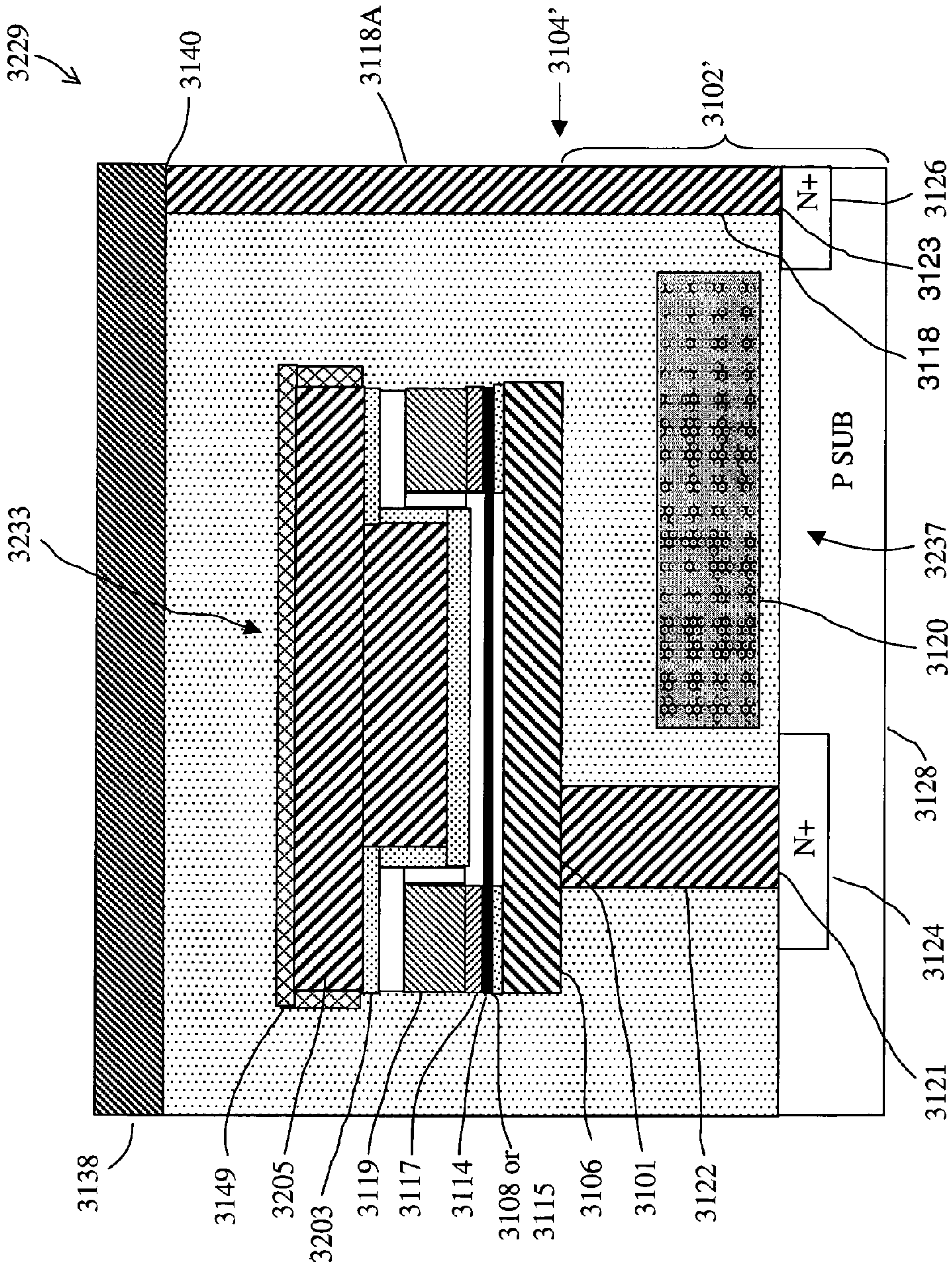
FIGS. 32A–B illustrate cross sections of an embodiment of the invention.
Figure 32B:
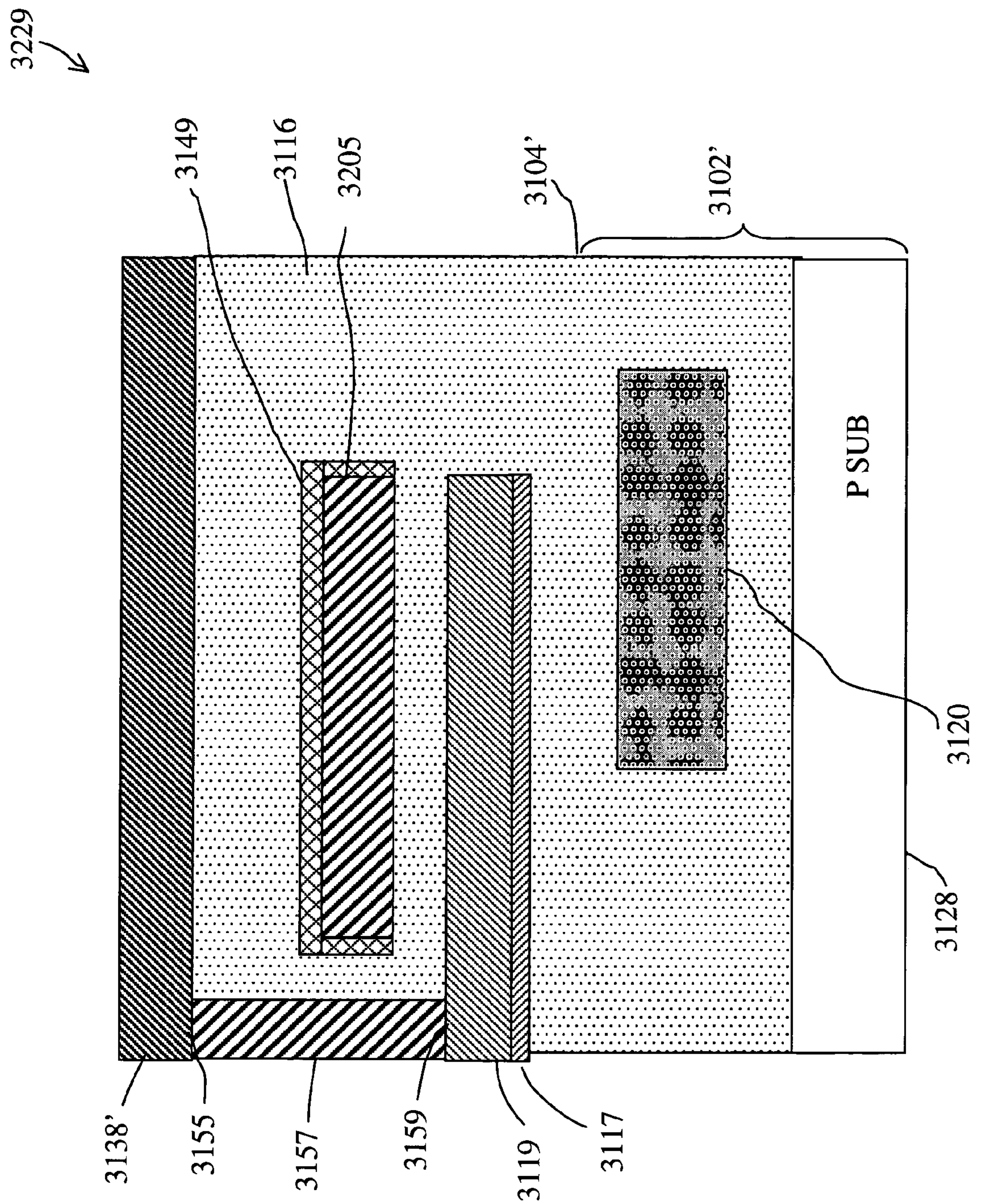
Figure 32C:
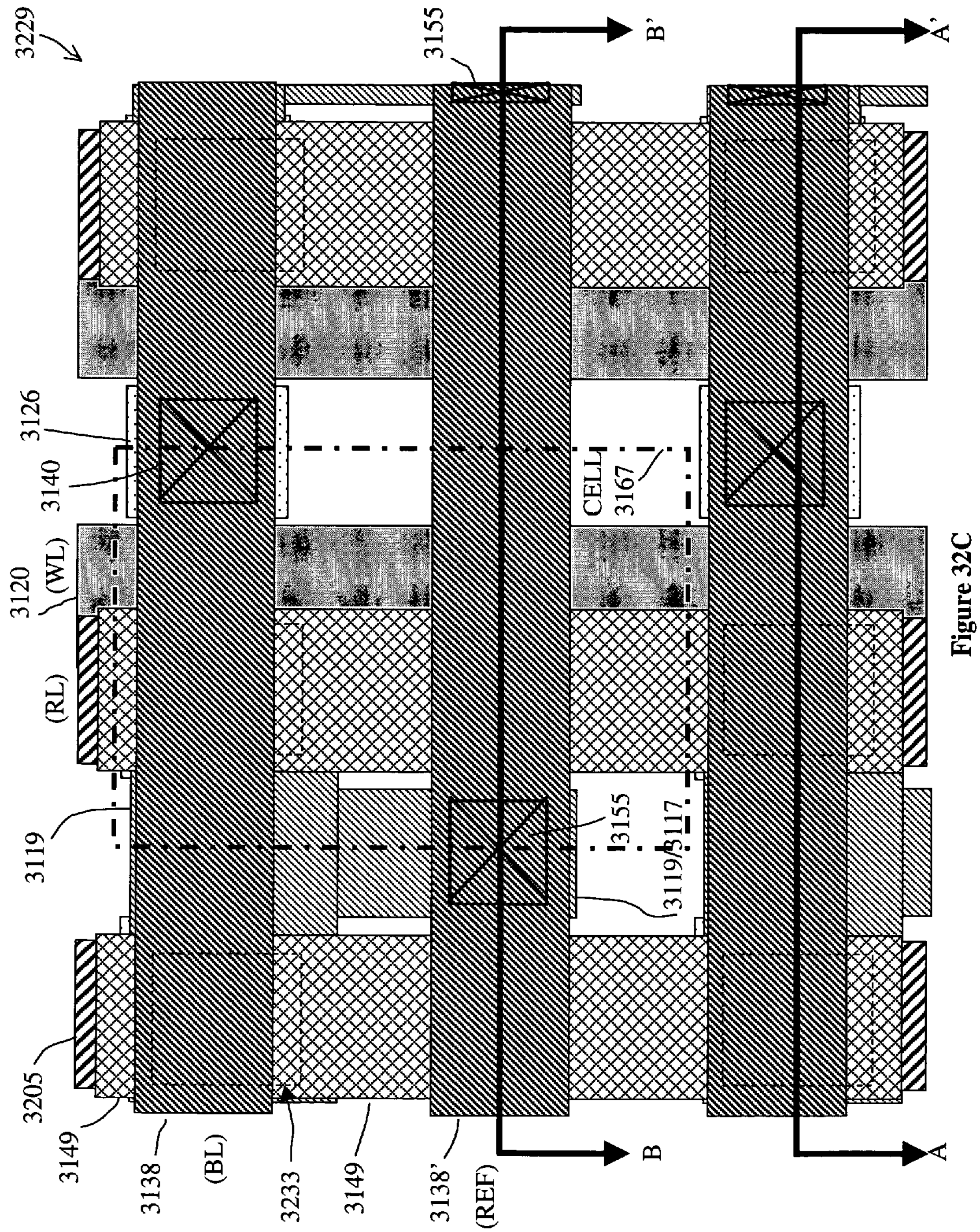
FIG. 32C illustrates a plan view of an embodiment of the invention.

FIG. 32A illustrates cross section A–A' of array 3229 taken at A–A' of the plan view of array 3229 illustrated in FIG. 32C, and shows FET device region 3237 in the FET length direction, nanotube switch structure 3233, interconnections and insulators. FIG. 32B illustrates cross section B–B' of array 3229 taken at B–B' of plan view of array 3229 illustrated in FIG. 32C, and shows a release array line 3205 with insulating layer 3149 corresponding to insulating layer 3148 in structure 3227 (FIG. 31D), a reference array line 3138' in contact with conductor 3119 of combined conductors 3119 and 3117, and a word array line 3120. Reference array line 3138' contacts conductor 3119 through contact 3155, to stud 3157, through contact 3159, to conductor 3119. Insulator 3149 is used to prevent contact between release line electrode 3205 and stud 3157 in case of stud 3157 misalignment. FIG. 32C illustrates a plan view of array 3229 including exemplary cell 3167 region, with bit array line 3138 contacting drain 3126 through contact 3140 to stud 3118A, to stud 3118, to contact 3123, and to drain 3126, (stud 3118A, stud 3118 and contact 3123 not shown in plan view 3229). Reference array line 3138' is on the same array wiring layer and parallel to bit line 3138, as is illustrated in plan view of array 3229 in FIG. 32C, and reference line 3138' contacts a corresponding reference line segment 3119, as shown in FIG. 32B. Release array line 3205 is parallel to word array line 3120. Release line 3205 contacts and forms a portion of release electrode 3205 as illustrated in the nanotube switching region of FIG. 32A. This nanotube switching region is illustrated as nanotube switch structure 3233 in array 3229 of FIG. 32C. In terms of minimum technology feature size, NT-on-source cell 3167 is approximately 12 to 13 $F^2$. Nanotube-on-source array 3229 structures illustrated in FIGS. 32A, 32B, and 32C correspond to nanotube-on-source array 1700 schematic representation illustrated in FIG. 18. Bit line 3138 structures correspond to any of bit lines BL0 to BLm-1 schematic representations; reference line 3138' structures correspond to any of reference lines REF0 to REFm-1 schematic representations; word line 3120 structures correspond to any of word lines WL0 to WLn-1 schematic representations; release line 3205 structures correspond to any of release lines RL0 to RLn-1 schematic representations; source contact 3140 structures correspond to any of source contacts 1720 schematic representations; nanotube switch structure 3233 correspond to any of NT0,0 to NTm-1,n-1 schematic representations; and FET 3237 structures correspond to any of FET T0,0 to Tm-1, n-1 schematic representations; and exemplary cell 3167 corresponds to any of cells C0,0 to cell Cm-1,n-1 schematic representations.

It is desirable to enhance the density of array 3225, illustrated in FIG. 30P, to reduce the area of each bit in the array, resulting in higher performance, lower power, and lower cost due to smaller array size. Smaller array size results in the same number of bits occupying a reduced silicon chip area, resulting in increased productivity and therefore lower cost, because there are more chips per wafer. Cell area is decreased by reducing the size (area) of nanotube switch region 3233, thereby reducing the periodicity between nanotube switch regions 3233 and correspondingly reducing the spacing between bit lines 3138 and reference lines 3119/3117.

Figure 33A:
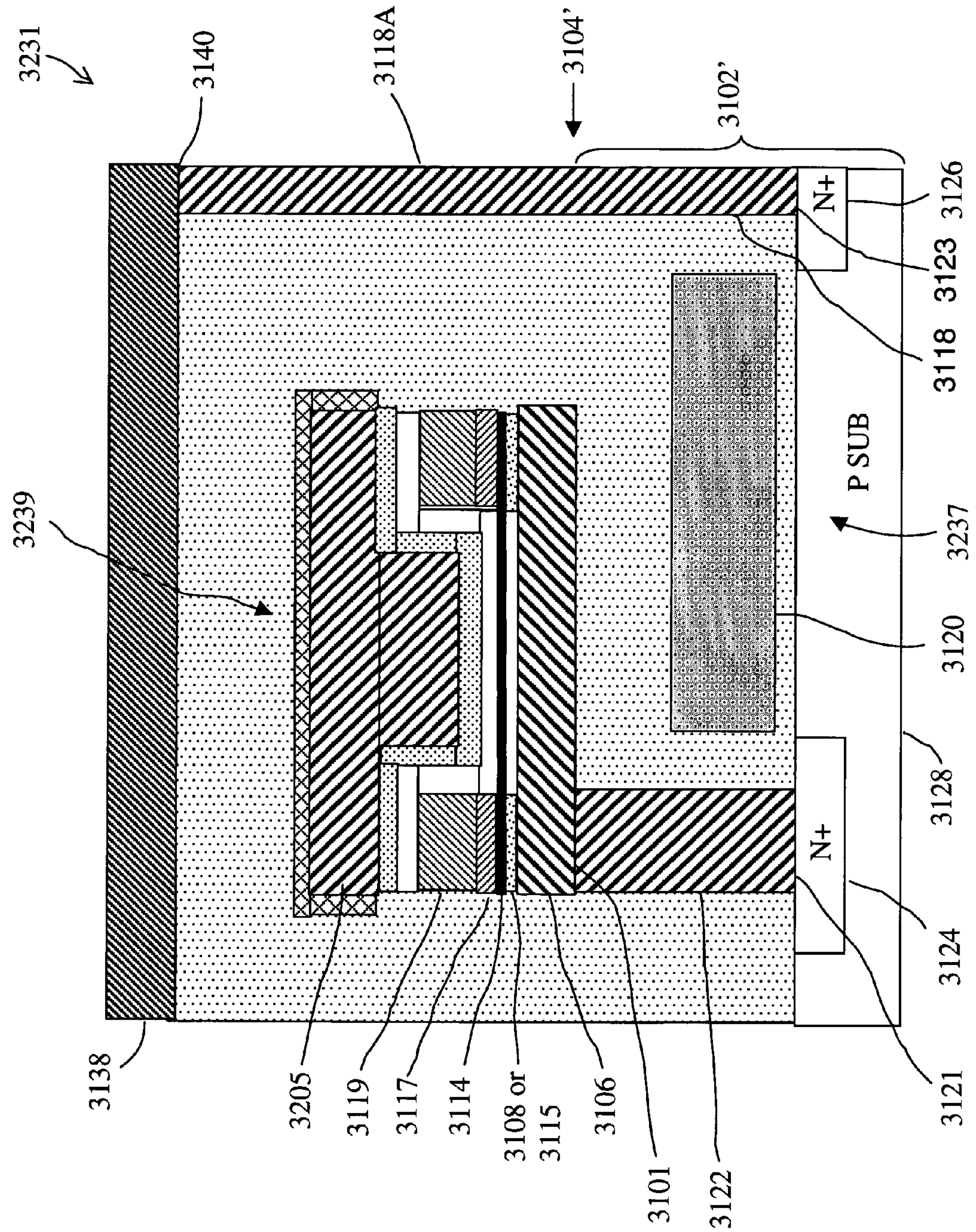
FIGS. 33A–C illustrate cross sections of an embodiment of the invention.
Figure 33B:
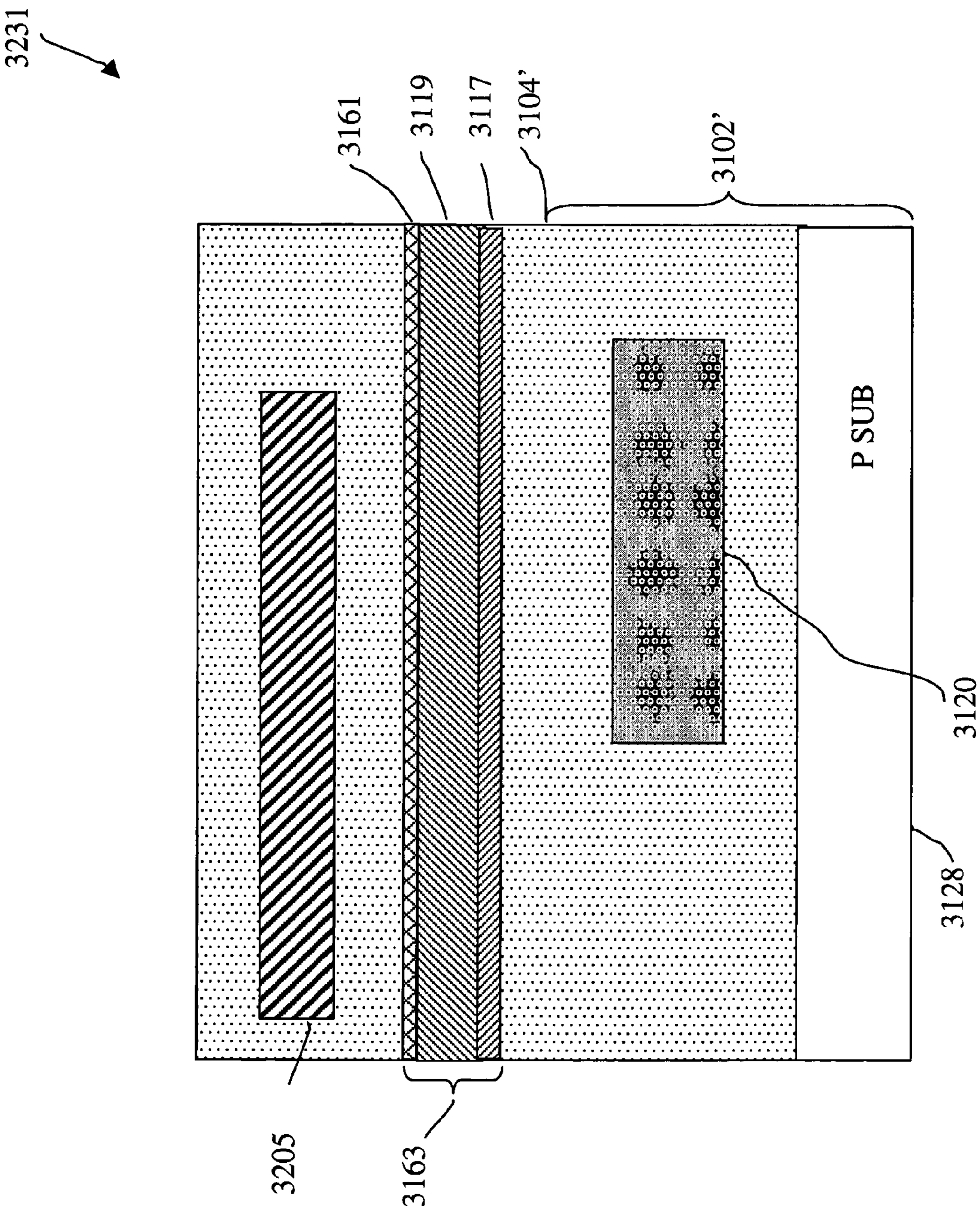
Figure 33C:
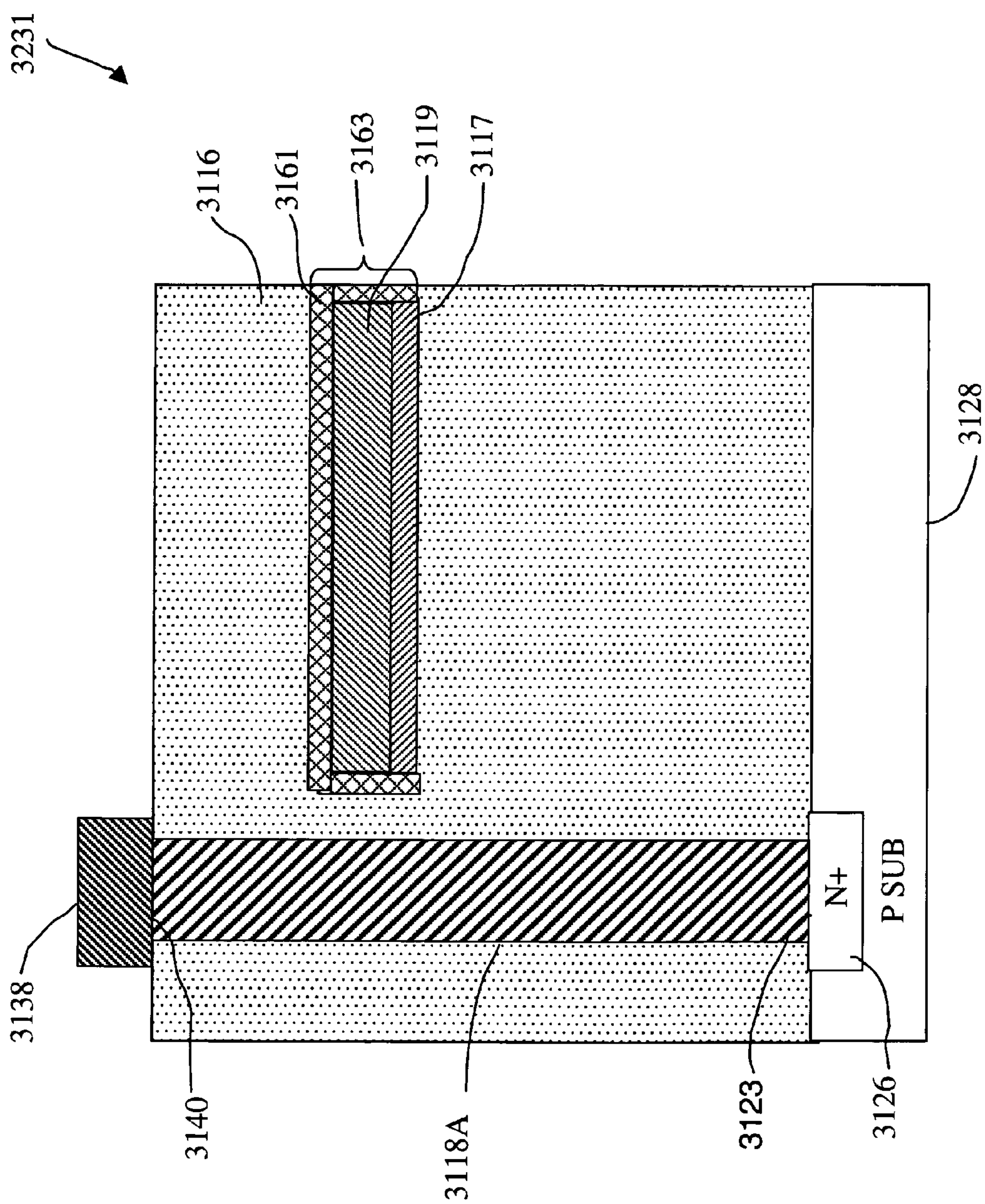
Figure 33D:
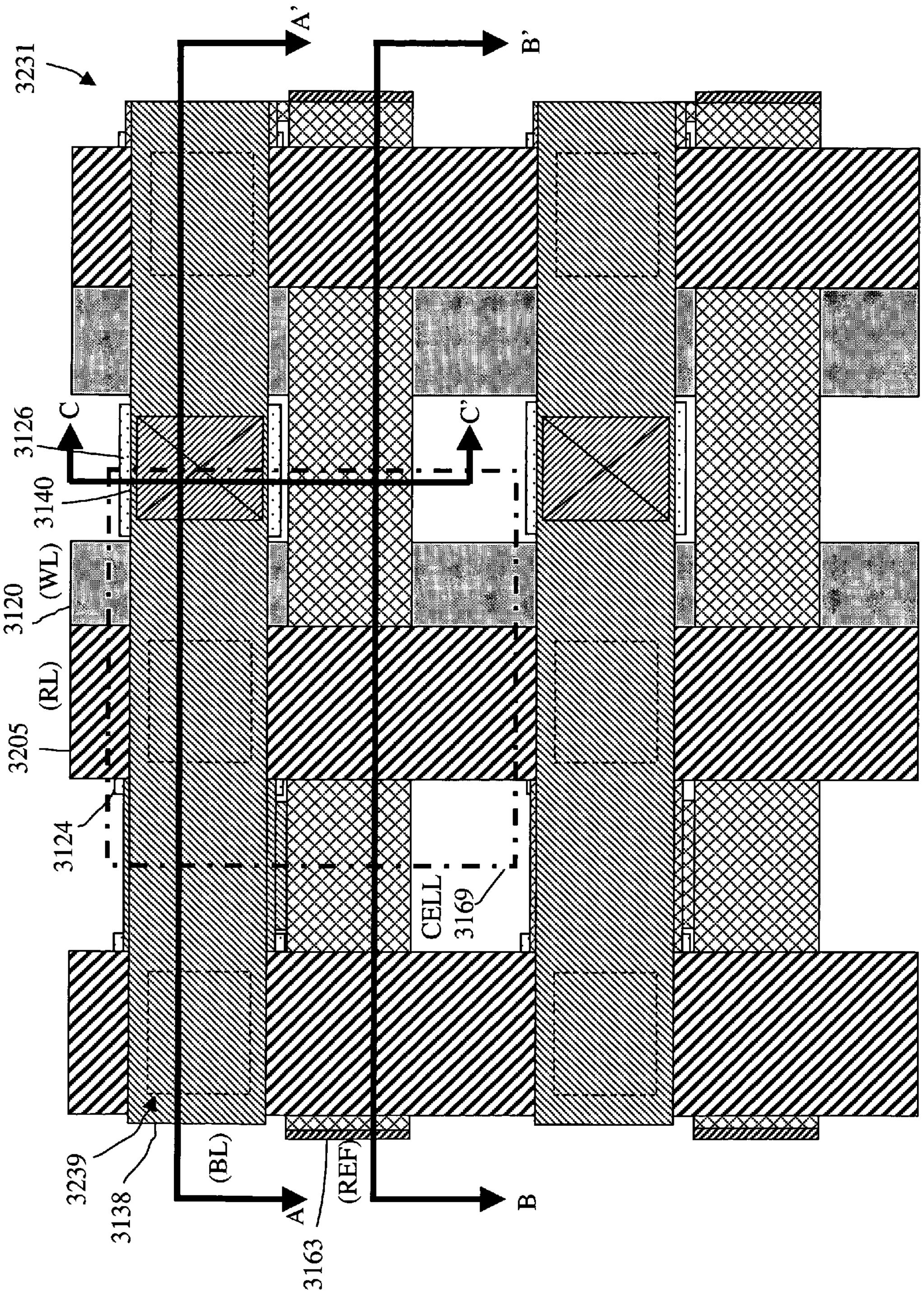
FIG. 33D illustrates a plan view of an embodiment of the invention.

FIG. 33A illustrates cross section A–A' of array 3231 taken at A–A' of the plan view of array 3231 illustrated in FIG. 33D, and shows FET device region 3237 in the FET length direction, reduced area (smaller) nanotube switch structure 3239, interconnections and insulators. A smaller picture frame opening is formed in combined conductors 3119 and 3117 by applying sub-lithographic method 3036 shown in FIG. 26 and corresponding sub-lithographic structures shown in FIGS. 29D, 29E, and 29F during the fabrication of nanotube switch structure 3239. FIG. 33B illustrates cross section B–B' of array 3231 taken at B–B' of plan view of array 3231 illustrated in FIG. 33D, and shows reference line 3163 comprising conductive layers 3117 and 3119, and conformal insulating layer 3161. Conductive layers 3117 and 3119 of reference line 3163 are extended to form the picture frame region of nanotube device structure 3239; however, insulating layer 3161 is not used as part of the nanotube switch structure 3239. FIG. 33B also illustrates release line 3205, and word array line 3120. FIG. 33C illustrates cross section C–C' of array 3231 taken at C–C' of the plan view of array 3231 illustrated in FIG. 33D. Bit line 3138 is connected to drain diffusion 3126 through contact 3140, to stud 3118A, and through contact 3123. In order to achieve greater array density, there is a small spacing between stud 3118A and reference line 3163. Insulator 3161 is used to prevent electrical shorting between stud 3118A and reference line 3163 conductors 3119 and 3117 if stud 3118A is misaligned. FIG. 33D illustrates a plan view of array 3231 including exemplary cell 3169 region, with bit array line 3138 contacting drain 3126 as illustrated in FIG. 33C, reference array lines 3163 parallel to bit line 3138 but on a different array wiring level (wiring plane). Release array line 3205 is parallel to word array line 3120. Release line 3205 contacts and forms a portion of release electrode 3205 as illustrated in the nanotube switching region of FIG. 33A. Exemplary cell 3169 area (region) is smaller (denser) than exemplary cell 3167 area shown in FIG. 32C and exemplary cell 3165 area shown in FIG. 30P, and therefore corresponding array 3231 is denser (occupies less area) than corresponding array areas of array 3229 and 3225. The greater density of array 3231 results in higher performance, less power, less use of silicon area, and therefore lower cost as well. In terms of minimum technology feature size, NT-on-source cell 3169 is approximately 10 to 11 $F^2$. Nanotube-on-source array 3231 structures illustrated in FIGS. 33A–33D correspond to nanotube-on-source array 1700 schematic representation illustrated in FIG. 18. Bit line 3138 structures correspond to any of bit lines BL0 to BLm-1 schematic representations; reference line 3163 structures correspond to any of reference lines REF0 to REFm-1 schematic representations; word line 3120 structures correspond to any of word lines WL0 to WLn-1 schematic representations; release line 3205 structures correspond to any of release lines RL0 to RLn-1 schematic representations; source contact 3140 structures correspond to any of source contacts 1720 schematic representations; nanotube switch structure 3239 correspond to any of NT0,0 to NTm-1,n-1 schematic representations; and FET 3237 structures correspond to any of FET T0,0 to Tm-1, n-1 schematic representations; and exemplary cell 3169 corresponds to any of cells C0,0 to cell Cm-1,n-1 schematic representations.

NT-on-Source NRAM Memory Systems and Circuits with Parallel Bit and Release Lines, and Parallel Word and Reference Lines NRAM 1T/1NT memory arrays are wired using four lines. Word line WL is used to gate select device T, bit line BL is attached to a shared drain between two adjacent select devices. Reference line REF is used to control the NT switch voltage of storage element NT, and release line RL is used to control the release-plate of storage element NT. In this NRAM array configuration, RL is parallel to BL and acts as second bit line, and REF is parallel to WL and acts as a second word line.

Figures 34A, 34B, 34C, 34D:
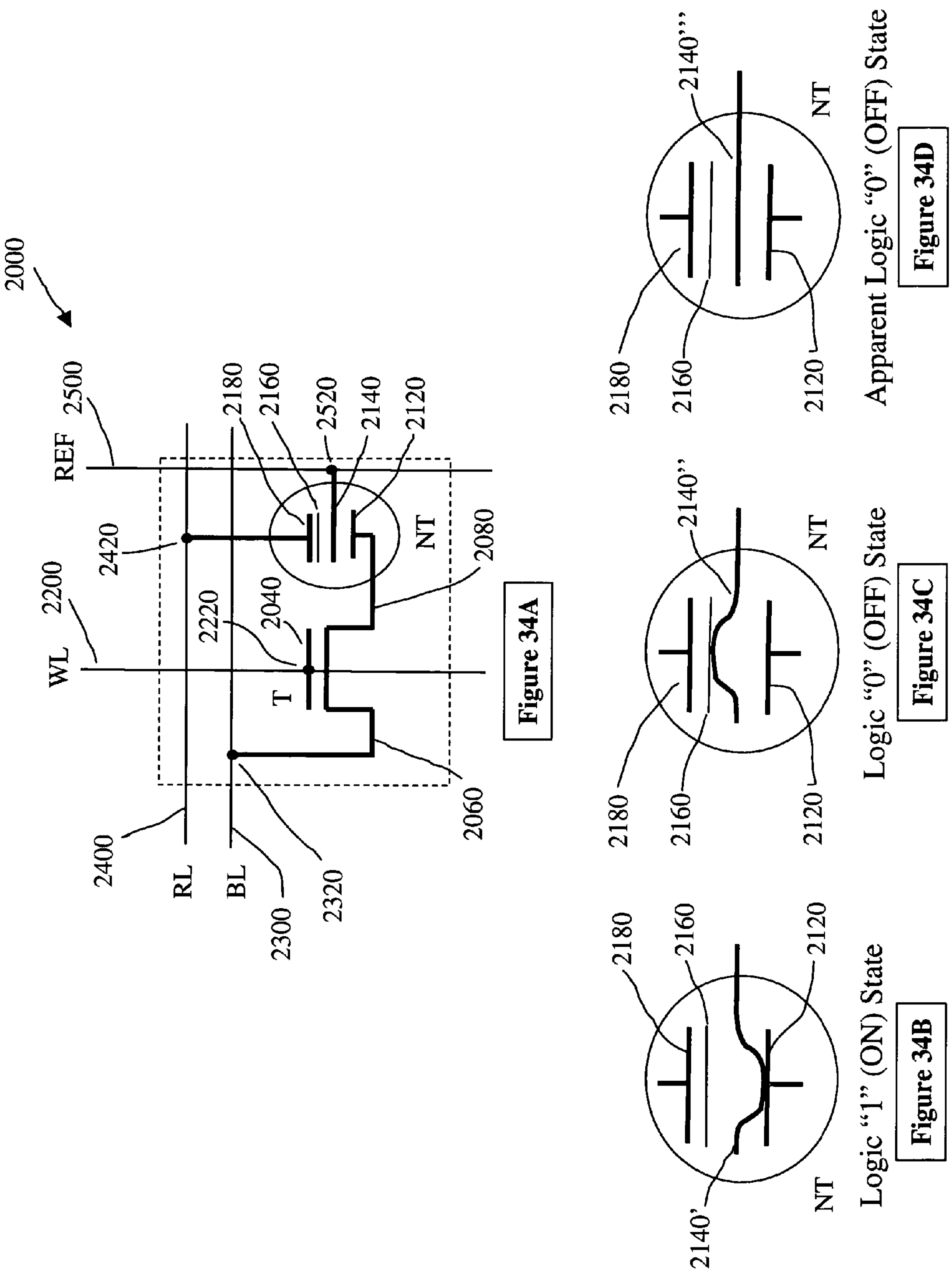
FIGS. 34A–D illustrate schematics of circuitry according to certain aspects of the invention.

FIG. 34A depicts a structure comprising non-volatile field effect device. FED4 80 with memory cell wiring to form NT-on-Source memory cell 2000 schematic. Memory cell 2000 operates in a source-follower mode. Word line (WL) 2200 connects to terminal T1 of FED4 80; bit line (BL) 2300 connects to terminal T2 of FED4 80; reference line (REF) 2400 connects to terminal T3 of FED4 80; and release line (RL) 2500 connects to terminal T4 of FED4 80 (T1–T4 shown in FIG. 2D). Memory cell 2000 performs write and read operations, and stores the information in a non-volatile state. The FED4 80 layout dimensions and operating voltages are selected to optimize memory cell 2000. Memory cell 2000 FET select transistor (T) gate 2040 corresponds to gate 82; drain 2060 corresponds to drain 84; and controllable source 2080 corresponds to controllable source 86. Memory cell 2000 nanotube (NT) switch-plate 2120 corresponds to switch-plate 88; NT switch 2140 corresponds to NT switch 90; release-plate insulator layer surface 2160 corresponds to release-plate insulator layer surface 96; and release-plate 2180 corresponds to release-plate 94. The interconnections between the elements of memory cell 2000 schematic correspond to the interconnection of the corresponding interconnections of the elements of FED4 80. BL 2300 connects to drain 2060 through contact 2320; REF 2400 connects to NT switch 2140 through contact 2420; RL 2500 connects to release-plate 2180 by contact 2520; WL 2200 interconnects to gate 2040 by contact 2220. The non-volatile NT switching element 2140 may be caused to deflect toward switch-plate 2120 via electrostatic forces to closed ("ON") position 2140' to store a logic "1" state as illustrated in FIG. 34B. The van der Waals force holds NT switch 2140 in position 2140'. Alternatively, the non-volatile NT switching element 2140 may be caused to deflect to insulator surface 2160 on release-plate 2180 via electrostatic forces to open ("OFF") position 2140'' to store a logic "0" state as illustrated in FIG. 34C. The van der Waals force holds NT switch 2140 in position 2140''. Non-volatile NT switching element 2140 may instead be caused to deflect to an open ("OFF") near-mid point position 2140''' between switch-plate 2120 and release-plate 2180, storing an apparent logic "0" state as illustrate in FIG. 34D. However, the absence of a van der Waals retaining force in this open ("OFF") position is likely to result in a memory cell disturb that causes NT switch 2140 to unintentionally transition to the closed ("ON") position, and is not desirable. Sufficient switching voltage is needed to ensure that the NT switch 2140 open ("OFF") position is position 2140''. The non-volatile element switching via electrostatic forces is as depicted by element 90 in FIG. 2D. Voltage waveforms 311 used to generate the required electrostatic forces are illustrated in FIG. 4.

NT-on-Source schematic 2000 forms the basis of a non-volatile storage (memory) cell. The device may be switched between closed storage state "1" (switched to position 2140') and open storage state "0" (switched to position 2140''), which means the controllable source may be written to an unlimited number of times to as desired. In this way, the device may be used as a basis for a non-volatile nanotube random access memory, which is referred to here as a NRAM array, with the 'N' representing the inclusion of nanotubes.

Figure 35:
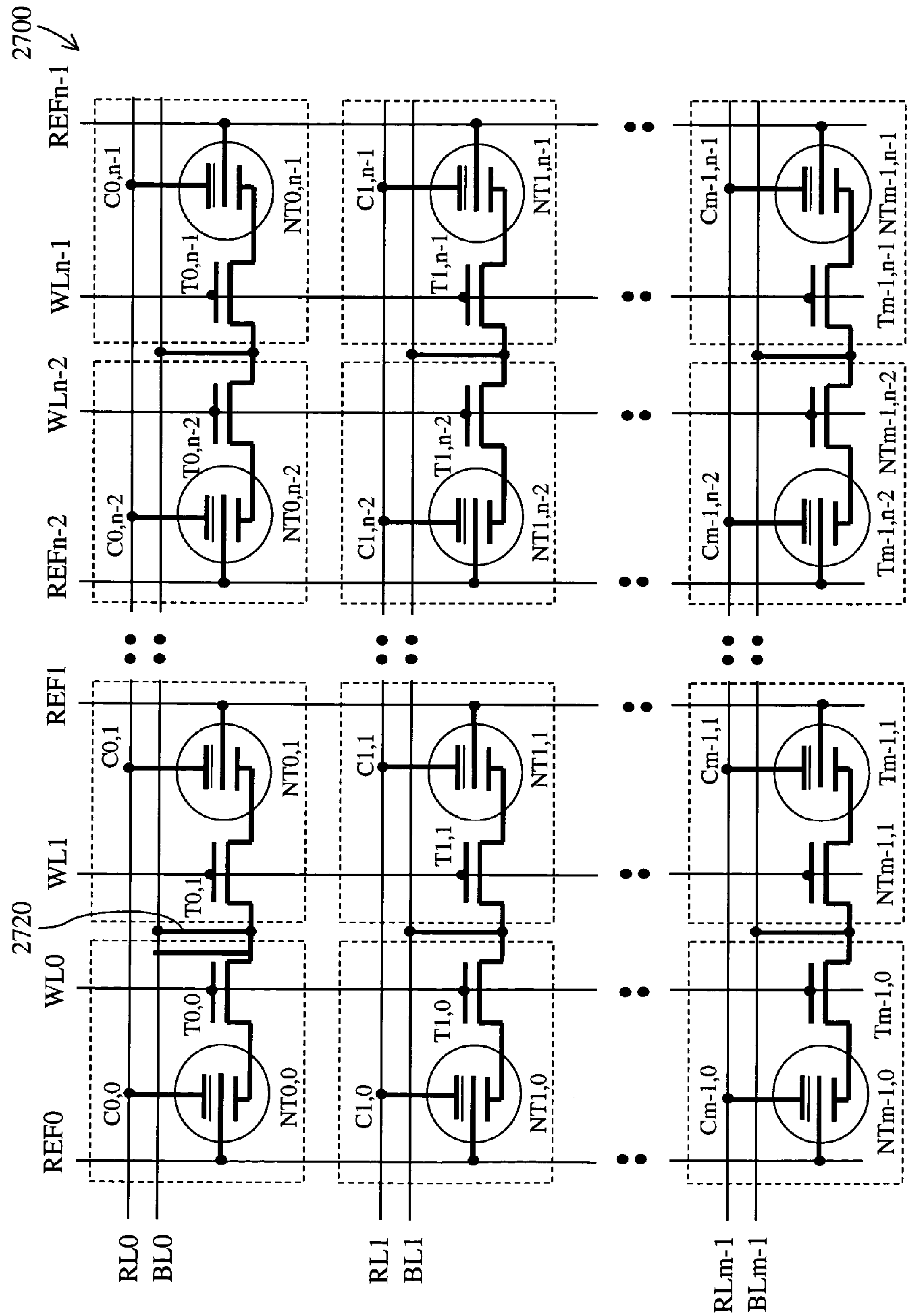
FIG. 35 illustrates schematics of memory arrays according to certain aspects of the invention.

FIG. 35 represents an NRAM system 2700, according to preferred embodiments of the invention. Under this arrangement, an array is formed with m×n (only exemplary portion being shown) of non-volatile cells ranging from cell C0,0 to cell Cm-1,n-1. NRAM system 2700 may be designed using one large m×n array, or several smaller sub-arrays, where each sub-array is formed of m×n cells. To access selected cells, the array uses read and write word lines (WL0, WL1, . . . WLn-1), read and write bit lines (BL0, BL1, . . . BLm-1), read and write reference lines (REF0, REF1, . . . REFm-1), and read and write release lines (RL0, RL1, . . . RLn-1). Non-volatile cell C0,0 includes a select device T0,0 and non-volatile storage element NT0,0. The gate of T0,0 is coupled to WL0, and the drain of T0,0 is coupled to BL0. NT0 is the non-volatilely switchable storage element where the NT0,0 switch-plate is coupled to the source of T0,0, the switching NT element is coupled to REF0, and the release-plate is coupled to RL0. Connection 2720 connects BL0 to shared drain of select devices T0,0 and T0,1. Word, bit, reference, and release decoders/drivers are explained further below.

Under preferred embodiments, nanotubes in array 2700 may be in the "ON" "1" state or the "OFF" "0" state. The NRAM memory allows for unlimited read and write operations per bit location. A write operation includes both a write function to write a "1" and a release function to write a "0". By way of example, a write "1" to cell C0,0 and a write "0" to cell C1,0 is described. For a write "1" operation to cell C0,0, select device T0,0 is activated when WL0 transitions from 0 to $V_{SW}$, BL0 transitions from $V_{DD}$ to 0 volts, RL0 transitions from $V_{DD}$ to switching voltage $V_{SW}$, and REF0 transitions from $V_{DD}$ to switching voltage $V_{SW}$. The release-plate and NT switch of the non-volatile storage element NT0,0 are each at $V_{SW}$ resulting in zero electrostatic force (because the voltage difference is zero). The zero BL0 voltage is applied to the switch-plate of non-volatile storage element NT0,0 by the controlled source of select device T0,0. The difference in voltage between the NT0,0 switch-plate and NT switch is $V_{SW}$ and generates an attracting electrostatic force. If $V_{SW}$ exceeds the nanotube threshold voltage $V_{NT-TH}$, the nanotube structure switches to "ON" state or logic "1" state, that is, the nanotube NT switch and switch-plate are electrically connected as illustrated in FIG. 34B. The near-Ohmic connection between switch-plate 2120 and NT switch 2140 in position 2140' represents the "ON" state or "1" state. If the power source is removed, cell C0,0 remains in the "ON" state.

For a write "0" (release) operation to cell C1,0, select device T1,0 is activated when WL0 transitions from 0 to $V_{SW}$, BL1 transitions from $V_{DD}$ to $V_{SW}$ volts, RL 1 transitions from $V_{DD}$ to zero volts, and REF0 transitions from $V_{DD}$ to switching voltage $V_{SW}$. The $V_{SW}$ BL1 voltage is applied to the switch-plate of non-volatile storage element NT1,0 by the controlled source of select device T1,0, and switching voltage $V_{SW}$ is applied to the NT switch by REF0, resulting in zero electrostatic force between switch-plate and NT switch. The non-volatile storage element NT1,0 release-plate is at switching voltage zero and the NT switch is at switching voltage $V_{SW}$ generating an attracting electrostatic force. If $V_{SW}$ exceeds the nanotube threshold voltage $V_{NT-TH}$, the nanotube structure switches to the "OFF" state or logic "0" state, that is, the nanotube NT switch and the surface of the release-plate insulator are in contact as illustrated in FIG. 34C. The non-conducting contact between insulator surface 2160 on release-plate 2180 and NT switch 2140 in position 2140'' represents the "OFF" state or "0" state. If the power source is removed, cell C1,0 remains in the "OFF" state.

An NRAM read operation does not change (destroy) the information in the activated cells, as it does in a DRAM, for example. Therefore the read operation in the NRAM is characterized as a non-destructive readout (or NDRO) and does not require a write-back after the read operation has been completed. For a read operation of cell C0,0, BL0 is driven high to $V_{DD}$ and allowed to float. WL0 is driven high to $V_{DD}$ and select device T0,0 turns on. REF0 is at zero volts, and RL0 is at $V_{DD}$. If cell C0,0 stores an "ON" state ("1" state) as illustrated in FIG. 34B, BL0 discharges to ground through a conductive path that includes select device T0,0 and non-volatile storage element NT0,0 in the "ON" state, the BL0 voltage drops, and the "ON" state or "1" state is detected by a sense amplifier/latch circuit (not shown) that records the voltage drop by switching the latch to a logic "1" state. BL0 is connected by the select device T0,0 conductive channel of resistance $R_{FET}$ to the switch-plate of NT0,0. The switch-plate of NT0,0 in the "ON" state contacts the NT switch with contact resistance $R_{SW}$ and the NT switch contacts reference line REF0 with contact resistance $R_C$. The total resistance in the discharge path is $R_{FET}+R_{SW}+R_C$. Other resistance values in the discharge path, including the resistance of the NT switch, are much small and may be neglected For a read operation of cell C1,0, BL1 is driven high to $V_{DD}$ and allowed to float. WL0 is driven high to $V_{DD}$ and select device T1,0 turns on. REF0=0, and RL1 is at $V_{DD}$. If cell C1,0 stores an "OFF" state ("0" state) as illustrated in FIG. 34C, BL1 does not discharge to ground through a conductive path that includes select device T1,0 and non-volatile storage element NT1,0 in the "OFF" state, because the switch-plate is not in contact with the NT switch when NT1,0 is in the "OFF" state, and the resistance $R_C$ is large. During read, BL2 to BLm-1 is at zero volts. Sense amplifier/latch circuit (not shown) does not detect a voltage drop and the latch is set to a logic "0" state.

Figure 36:
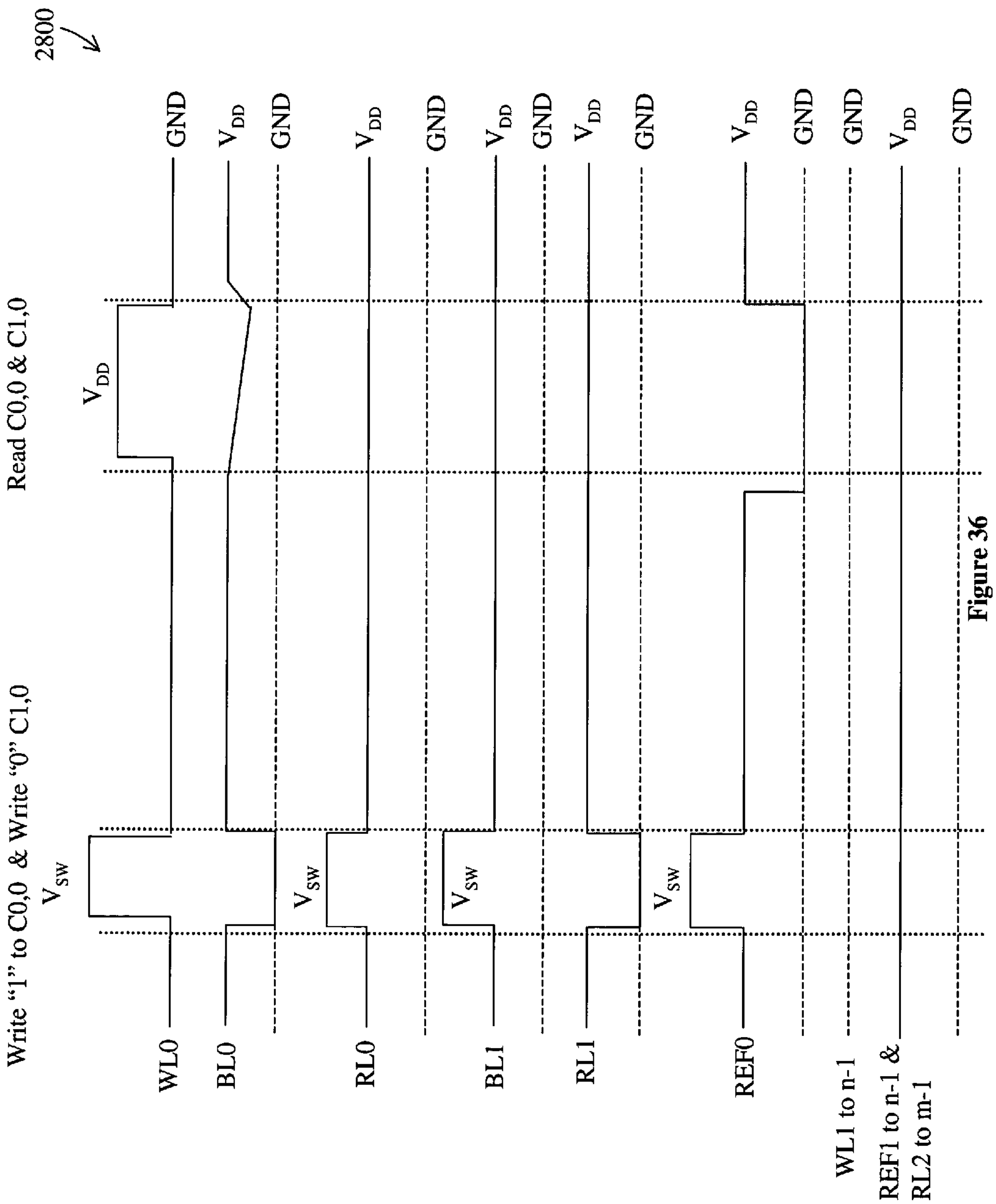
FIG. 36 illustrates operational waveforms of a memory array according to one aspect of the invention.

FIG. 36 illustrates the operational waveforms 2800 of memory array 2700 of FIG. 35 during read, write "1", and write "0" operations for selected cells, while not disturbing unselected cells (no change to unselected cell stored logic states). Waveforms 2800 illustrate voltages and timings to write logic state "1" in cell C0,0, write a logic state "0" in cell C1,0, read cell C0,0, and read cell C1,0. Waveforms 2800 also illustrate voltages and timings to prevent disturbing the stored logic states (logic "1" state and logic "0" state) in partially selected (also referred to as half-selected) cells. Partially selected cells are cells in memory array 2700 that receive applied voltages because they are connected to (share) word, bit, reference, and release lines that are activated as part of the read or write operation to the selected cells. Cells in memory array 2700 tolerate unlimited read and write operations at each memory cell location.

At the start of the write cycle, WL0 transitions from zero to $V_{SW}$, activating select devices T0,0, T1,0, . . . Tm-1,0. Word lines WL1, WL2, . . . WLn-1 are not selected and remain at zero volts. BL0 transitions from $V_{DD}$ to zero volts, connecting the switch-plate of non-volatile storage element NT0,0 to zero volts. BL1 transitions from $V_{DD}$ to $V_{SW}$ connecting the switch-plate of non-volatile storage element NT1,0 to $V_{SW}$ volts. BL2, BL3, . . . BLm-1 transition to $V_{SW}$ connecting the switch-plate of non-volatile storage elements NT2,0, NT3,0 . . . NTm-1,0 to $V_{WS}$. RL0 transitions from $V_{DD}$ to switching voltage $V_{SW}$, connecting the release-plates of non-volatile storage elements NT0,0, NT0,1, . . . NT0,n-2, NT0,n-1 to $V_{SW}$. RL1 transitions from $V_{DD}$ to zero volts, connecting the release-plates of non-volatile storage elements NT1,0, NT 1,1 . . . NT1,n-2,NT1,n-1 to zero volts. RL2, RL3, . . . RLm-1 remain at $V_{DD}$, connecting the release-plates of non-volatile storage elements NT3,0 to NTm-1,n-1 to VDD. REF0 transitions from $V_{DD}$ to switching voltage $V_{SW}$, connecting NT switches of non-volatile storage elements NT0,0, NT1,0, . . . NTm-1,0 to $V_{SW}$. REF1, REF2 . . . REFn-1 remain at $V_{DD}$, connecting NT switches of non-volatile storage elements NT0,1 to NTn-1,n-1 to $V_{DD}$.

NT0,0 may be in "ON" ("1" state) or "OFF" ("0" state) state at the start of the write cycle. It will be in "ON" state at the end of the write cycle. If NT0,0 in cell C0,0 is "OFF" ("0" state) it will switch to "ON" ("1" state) since the voltage difference between NT switch and release-plate is zero, and the voltage difference between NT switch and switch-plate is $V_{SW}$. If NT0,0 in cell C0,0 is in the "ON" ("1" state), it will remain in the "ON" ("1") state. NT1,0 may be in "ON" ("1" state) or "OFF" ("0" state) state at the start of the write cycle. It will be in "OFF" state at the end of the write cycle. If NT1,0 in cell C1,0 is "ON" ("1" state) it will switch to "OFF" ("0" state) since the voltage difference between NT switch and switch-plate is zero, and the voltage difference between NT switch and release-plate is $V_{SW}$. If NT1,0 in cell C1,0 is "OFF" ("0" state), it will remain "OFF" ("0" state). If for example, $V_{SW}$=3.0 volts, $V_{DD}$=1.5 volts, and NT switch threshold voltage range is $V_{NT\text{-}TH}$=1.7 to 2.8 volts, then for NT0,0 and NT1,0 a difference voltage $V_{SW}>V_{NT\text{-}TH}$ ensuring write states of "ON" ("1" state) for NT0,0 and "OFF" ("0" state) for NT1,0.

Cells C0,0 and C1,0 have been selected for the write operation. All other cells have not been selected, and information in these other cells must remain unchanged (undisturbed). Since in an array structure some cells other than selected cells C0,0 and C1,0 in array 2700 will experience partial selection voltages, often referred to as half-select voltages, it is necessary that half-select voltages applied to non-volatile storage element terminals be sufficiently low (below nanotube activation threshold $V_{NT\text{-}TH}$) to avoid disturbing stored information. For storage cells in the "ON" state, it is also necessary to avoid parasitic current flow (there cannot be parasitic currents for cells in the "OFF" state because the NT switch is not in electrical contact with switch-plate or release-plate). Potential half-select disturb along activated array lines WL0 and REF0 includes cells C3,0 to Cm-1,0 because WL0 and REF0 have been activated. Storage elements NT3,0 to NTm-1,0 will have BL2 to BLm-1 electrically connected to the corresponding storage element switch-plate by select devices T3,0 to Tm-1,0. All NT switches in these storage elements are at write voltage $V_{SW}$. To prevent undesired switching of NT switches, RL2 to RLm-1 reference lines are set at voltage $V_{DD}$. BL2 to BLm-1 voltages are set to $V_{SW}$ to prevent parasitic currents. The information in storage elements NT2,0 to NTm-1,0 in cells C2,0 to Cm-1,0 is not disturbed and there is no parasitic current. For those cells in the "OFF" state, there can be no parasitic currents (no current path), and no disturb because the voltage differences favor the "OFF" state. For those cells in the "ON" state, there is no parasitic current because the voltage difference between switch-plates (at $V_{DD}$) and NT switches (at $V_{DD}$) is zero. Also, for those cells in the "ON" state, there is no disturb because the voltage difference between corresponding NT switches and release-plate is $V_{SW}$–$V_{DD}$=1.5 volts, when $V_{SW}$=3.0 volts and $V_{DD}$=1.5 volts. Since this voltage difference of 1.5 volts is less than the minimum nanotube threshold voltage $V_{NT\text{-}TH}$ of 1.7 volts, no switching takes place.

Potential half-select disturb along activated array lines RL0 and BL0 includes cells C0,1 to C0, n-1 because RL0 and BL0 have been activated. Storage elements NT0,1 to NT0, n-1 all have corresponding switch-plates connected to switching voltage $V_{SW}$. To prevent undesired switching of NT switches, REF1 to REFn-1 are set at voltage $V_{DD}$. WL1 to WL n-1 are set at zero volts, therefore select devices T0,1 to T0,n-1 are open, and switch-plates (all are connected to select device source diffusions) are not connected to bit line BL0. All switch-plates are in contact with a corresponding NT switch for storage cells in the "ON" state, and all switch plates are only connected to corresponding "floating" source diffusions for storage cells in the "OFF" state. Floating diffusions are at approximately zero volts because of diffusion leakage currents to semiconductor substrates. However, some floating source diffusions may experience disturb voltage conditions that may cause the source voltage, and therefore the switch-plate voltage, to increase up to 0.6 volts as explained further below. The information in storage elements NT0,1 to NT0,n-1 in cells C0,1 to C0,n-1 is not disturbed and there is no parasitic current. For cells in both "ON" and "OFF" states there can be no parasitic current because there is no current path. For cells in the "ON" state, the corresponding NT switch and switch-plate are in contact and both are at voltage $V_{SW}$. There is a voltage difference of $V_{SW}$–$V_{DD}$ between corresponding NT switch and release-plate. For $V_{SW}$=3.0 volts and $V_{DD}$=1.5 volts, the voltage difference of 1.5 volts is below the minimum $V_{NT\text{-}TH}$=1.7 volts for switching. For cells in the "OFF" state, the voltage difference between corresponding NT switch and switch-plate ranges from $V_{DD}$ to $V_{DD}$–0.6 volts. The voltage difference between corresponding NT switch and switch-plate may be up to 1.5 volts, which is less than $V_{NT-TH}$ minimum voltage of 1.7 volts, and does not disturb the "OFF" cells by switching them to the "ON" state. There is also a voltage difference between corresponding NT switch and release-plate of $V_{SW}$–$V_{DD}$ of 1.5 volts with an electrostatic force that supports the "OFF" state.

Potential half-select disturb along activated array lines RL1 and BL1 includes cells C1,1 to C1, n-1 because RL1 and BL1 have been activated. Storage elements NT1,1 to NT1, n-1 all have corresponding NT release-plates connected to zero volts. To prevent undesired switching of NT switches, REF1 to REFn-1 are set at voltage $V_{DD}$. WL1 to WL n-1 are set at zero volts, therefore select devices T1,1 to T1,n-1 are open, and switch-plates (all are connected to select device source diffusions) are not connected to bit line BL1. All switch-plates are in contact with a corresponding NT switch for storage cells in the "ON" state, and all switch plates are only connected to corresponding "floating" source diffusions for storage cells in the "OFF" state. Floating diffusions are at approximately zero volts because of diffusion leakage currents to semiconductor substrates. However, some floating source diffusions may experience disturb voltage conditions that may cause the source voltage, and therefore the switch-plate voltage, to increase up to 0.6 volts as explained further below. The information in storage elements NT1,1 to NT1,n-1 in cells C1,1 to C1,n-1 is not disturbed and there is no parasitic current. For cells in both "ON" and "OFF" states there can be no parasitic current because there is no current path. For cells in the "ON" state, the corresponding NT switch and switch-plate are in contact and both are at voltage $V_{DD}$. There is a voltage difference of $V_{DD}$ between corresponding NT switches and release-plates. For $V_{DD}$=1.5 volts, the voltage difference of 1.5 volts is below the minimum $V_{NT-TH}$=1.7 volts for switching. For cells in the "OFF" state, the voltage of the switch-plate ranges zero to 0.6 volts. The voltage difference between corresponding NT switch and switch-plate may be up to $V_{DD}$. There is also a voltage difference between corresponding NT switch and release-plate of $V_{DD}$=1.5 volts. $V_{DD}$ is less than the minimum $V_{NT-TH}$ of 1.7 volts the "OFF" state remains unchanged.

For all remaining memory cells 2700, C2,1 to Cm-1,n-1, there is no electrical connection between NT2,1 to NTm-1, n-1 switch-plates connected to corresponding select device source and corresponding bit lines BL2 to BLm-1 because WL1 to WLn-1 are at zero volts, and select devices T2,1 to Tm-1,n-1 are open. Release line voltages for RL2 to RLm-1 are set at $V_{DD}$ and reference line voltages for REF1 to REFn-1 are set at $V_{DD}$. Therefore, all NT switches are at $V_{DD}$ and all corresponding release-plates are at $V_{DD}$, and the voltage difference between corresponding NT switches and release-plates is zero. For storage cells in the "ON" state, NT switches are in contact with corresponding switch-plates and the voltage difference is zero. For storage cells in the "OFF" state, switch-plate voltages are zero to a maximum of 0.6 volts. The maximum voltage difference between NT switches and corresponding switch-plates is $V_{DD}$=1.5 volts, which is below the $V_{NT-TH}$ voltage minimum voltage of 1.7 volts. The "ON" and "OFF" states remain undisturbed.

Figure 37A:
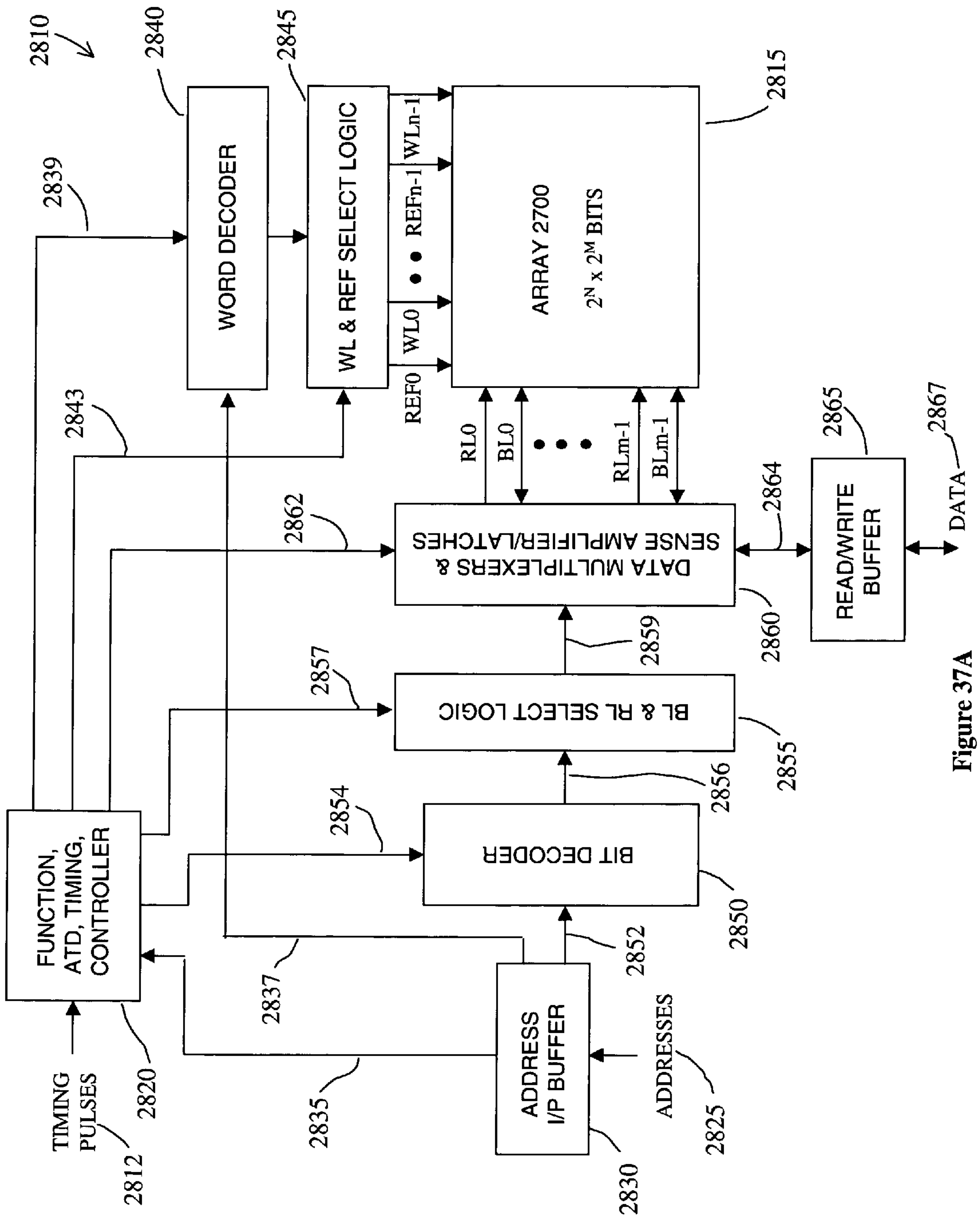
FIG. 37A illustrates a diagram outlining a memory array system according to one aspect of the invention.

Non-volatile NT-on-source NRAM memory array 2700 with bit lines parallel to release lines is shown in FIG. 35 contains $2^N \times 2^M$ bits, is a subset of non-volatile NRAM memory system 2810 illustrated as memory array 2815 in FIG. 37A. NRAM memory system 2810 may be configured to operate like an industry standard asynchronous SRAM or synchronous SRAM because nanotube non-volatile storage cells 2000 shown in FIG. 34A, in memory array 2700, may be read in a non-destructive readout (NDRO) mode and therefore do not require a write-back operation after reading, and also may be written (programmed) at CMOS voltage levels (5, 3.3, and 2.5 volts, for example) and at nanosecond and sub-nanosecond switching speeds. NRAM read and write times, and cycle times, are determined by array line capacitance, and are not limited by nanotube switching speed. Accordingly, NRAM memory system 2810 may be designed with industry standard SRAM timings such as chip-enable, write-enable, output-enable, etc., or may introduce new timings, for example. Non-volatile NRAM memory system 2810 may be designed to introduce advantageous enhanced modes such as a sleep mode with zero current (zero power—power supply set to zero volts), information preservation when power is shut off or lost, enabling rapid system recovery and system startup, for example. NRAM memory system 2810 circuits are designed to provide the memory array 2700 waveforms 2800 shown in FIG. 36.

Figure 38:
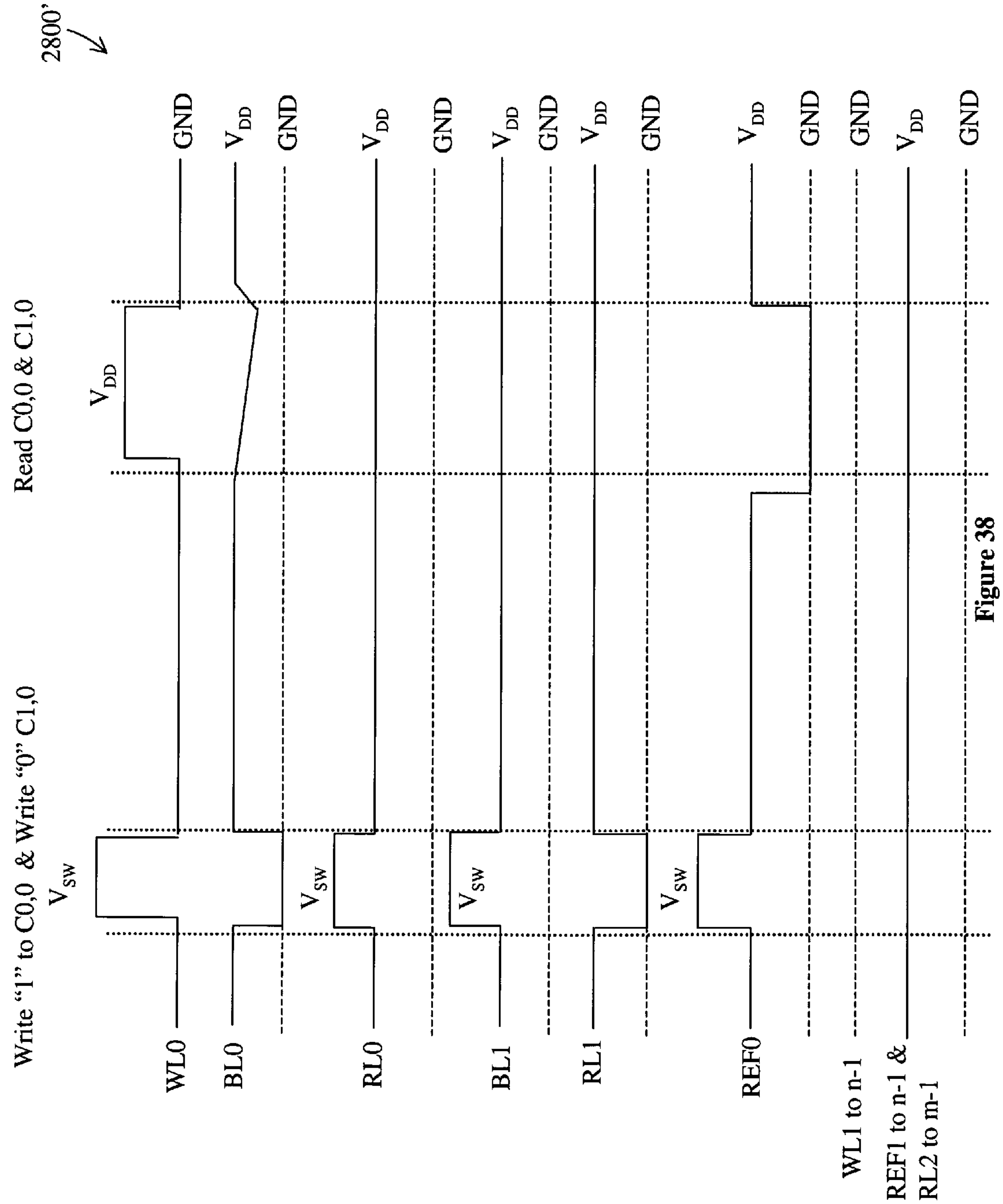
FIG. 38 illustrates operational waveforms of a memory array according to one aspect of the invention.

NRAM memory system 2810 accepts timing inputs 2812, accepts address inputs 2825, and accepts data 1867 from a computer, or provides data 2867 to a computer using a bidirectional bus sharing input/output (I/O) terminals. Alternatively, inputs and outputs may use separate (unshared) terminals (not shown). Address input (I/P) buffer 2830 receives address locations (bits) from a computer system, for example, and latches the addresses. Address I/P buffer 2830 provides word address bits to word decoder 2840 via address bus 2837; address I/P buffer 2830 provides bit addresses to bit decoder 2850 via address bus 2852; and address bus transitions provided by bus 2835 are detected by function generating, address transition detecting (ATD) timing waveform generator, controller (controller) 2820. Controller 2820 provides timing waveforms on bus 2839 to word decoder 2840. Word decoder 2840 selects the word address location within array 2815. Word address decoder 2840 is used to decode both word lines WL and corresponding reference lines REF (there is no need for a separate REF decoder) and drives word line (WL) and reference line (REF) select logic 2845. Controller 2820 provides function and timing inputs on bus 2843 to WL & REF select logic 2845, resulting in NRAM memory system 2810 on-chip WL and REF waveforms for both write-one, write-zero, read-one, and read-zero operations as illustrated by waveforms 2800' shown in FIG. 38. FIG. 38 NRAM memory system 2810 waveforms 2800' correspond to memory array 2700 waveforms 2800 shown in FIG. 36.

Bit address decoder 2850 is used to decode both bit lines BL and corresponding release lines RL (there is no need for a separate RL decoder) and drive bit line (BL) and release (RL) select logic 2855 via bus 2856. Controller 2820 provides timing waveforms on bus 2854 to bit decoder 2850. Controller 2820 also provides function and timing inputs on bus 2857 to BL & RL select logic 2855. BL & RL select logic 2855 uses inputs from bus 2856 and bus 2857 to generate data multiplexer select bits on bus 2859. The output of BL and RL select logic 2855 on bus 2859 is used to select control data multiplexers using combined data multiplexers & sense amplifiers/latches (MUXs & SAs) 2860. Controller 2820 provides function and timing inputs on bus 2862 to MUXs & SAs 2860, resulting in NRAM memory system 2810 on-chip BL and RL waveforms for both write-one, write-zero, read-one, and read-zero operations as illustrated by waveforms 2800' corresponding to memory array 2700 waveforms 2800 shown in FIG. 36. MUXs & SAs 2860 are used to write data provided by read/write buffer 2865 via bus 2864 in array 2815, and to read data from array 2815 and provide the data to read/write buffer 2865 via bus 2864 as illustrated in waveforms 2800'.

Figure 37B:
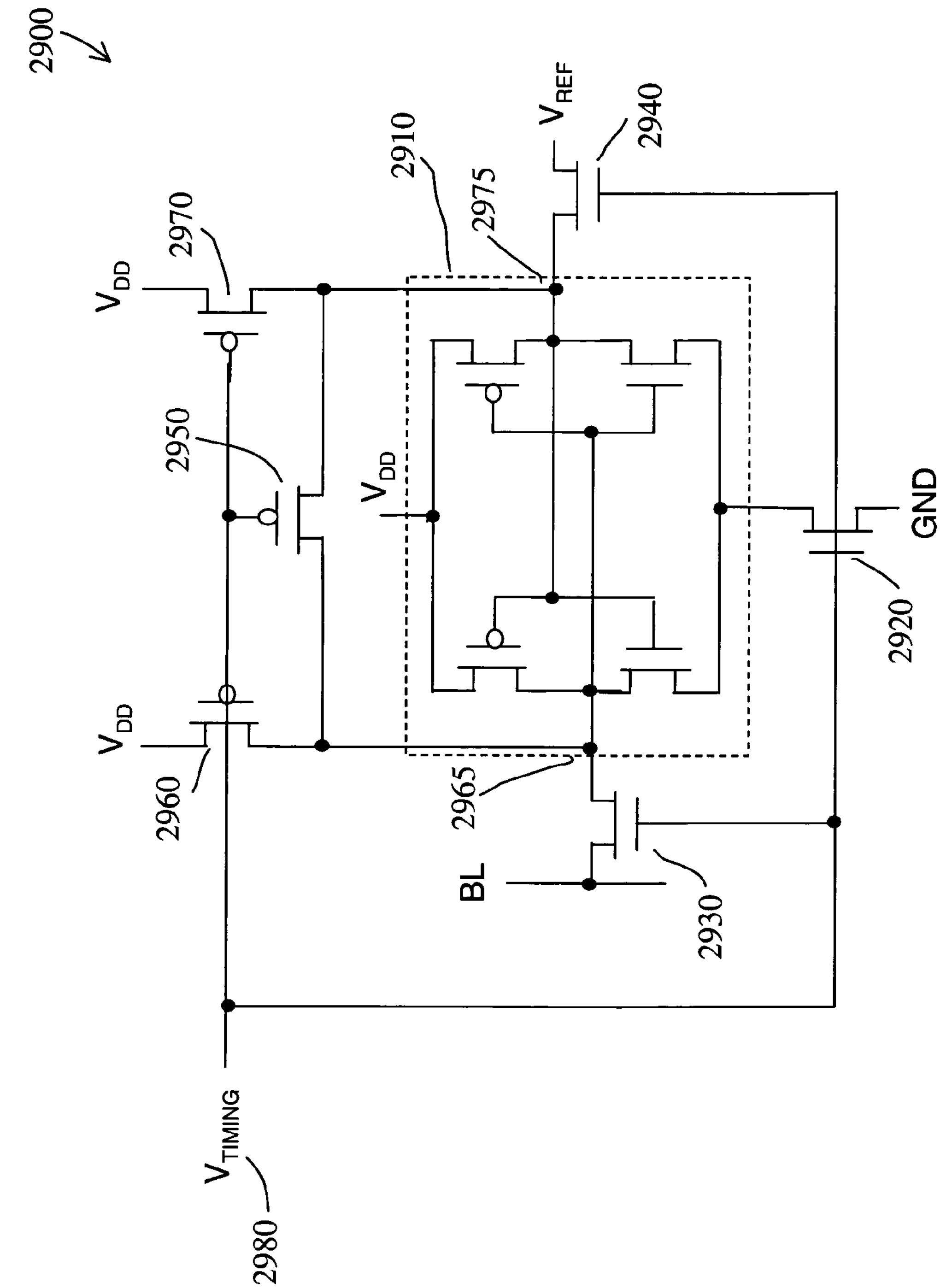
FIG. 37B is a schematic of a cell according to once aspect of the invention.

Sense amplifier/latch 2900 is illustrated in FIG. 37B. Flip flop 2910, comprising two back-to-back inverters is used to amplify and latch data inputs from array 2815 or from read/write buffer 2865. Transistor 2920 connects flip flop 2910 to ground when activated by a positive voltage supplied by control voltage $V_{TIMING}$ 2980, which is provided by controller 2820. Gating transistor 2930 connects a bit line BL to node 2965 of flip flop 2910 when activated by a positive voltage. Gating transistor 2940 connects reference voltage $V_{REF}$ to flip flop node 2975 when activated by a positive voltage. Transistor 2960 connects voltage $V_{DD}$ to flip flop 2910 node 2965, transistor 2970 connects voltage $V_{DD}$ to flip flop 2910 node 2975, and transistor 2950 ensures that small voltage differences are eliminated when transistors 2960 and 2970 are activated. Transistors 2950, 2960, and 2970 are activated (turned on) when gate voltage is low (zero, for example).

In operation, $V_{TIMING}$ voltage is at zero volts when sense amplifier 2900 is not selected. NFET transistors 2920, 2930, and 2940 are in the "OFF" (non-conducting) state, because gate voltages are at zero volts. PFET transistors 2950, 2960, and 2970 are in the "ON" (conducting) state because gate voltages are at zero volts. $V_{DD}$ may be 5, 3.3, or 2.5 volts, for example, relative to ground. Flip flop 2910 nodes 2965 and 2975 are at $V_{DD}$. If sense amplifier/latch 2900 is selected, $V_{TIMING}$ transitions to $V_{DD}$, NFET transistors 2920, 2930, and 2940 turn "ON", PFET transistors 2950, 2960, and 2970 are turned "OFF", and flip flop 2910 is connected to bit line BL and reference voltage $V_{REF}$. $V_{REF}$ is connected to $V_{DD}$ in this example. As illustrated by waveforms BL0 and BL1 of waveforms 2800', bit line BL is pre-charged prior to activating a corresponding word line (WL0 in this example). If cell 2000 of memory array 2700 (memory system array 2815) stores a "1", then bit line BL in FIG. 37B corresponds to BL0 in FIG. 38, BL is discharged by cell 2000, voltage droops below $V_{DD}$, and sense amplifier/latch 2900 detects a "1" state. If cell 2000 of memory array 2700 (memory system array 2815) stores a "0", then bit line BL in FIG. 37B corresponds to BL1 in FIG. 38, BL is not discharged by cell 2000, voltage does not droop below $V_{DD}$, and sense amplifier/latch 2900 detect a "0" state. The time from sense amplifier select to signal detection by sense amplifier/latch 2900 is referred to as signal development time. Sense amplifier/latch 2900 typically requires 100 to 200 mV relative to $V_{REF}$ in order to switch. It should be noted that cell 2000 requires a nanotube "OFF" resistance to "ON" resistance ratio of greater than 10 to 1 for successful operation. A typical bit line BL has a capacitance value of 250 fF, for example. A typical nanotube storage device (switch) or dimensions 0.2 by 0.2 um typically has 8 nanotube filaments across the suspended region, for example, as illustrated further below. For a combined contact and switch resistance of 50,000 Ohms per filament, as illustrated further below, the nanotube "ON" resistance of cell 2000 is 6,250 Ohms. For a bit line of 250 fF, the time constant RC=1.6 ns. The sense amplifier signal development time is less than RC, and for this example, is between 1 and 1.5 nanoseconds.

Non-volatile NRAM memory system 2810 operation may be designed for high speed cache operation at 5 ns or less access and cycle time, for example. Non-volatile NRAM memory system 2810 may be designed for low power operation at 60 or 70 ns access and cycle time operation, for non-limiting example. For low power operation, address I/P buffer 2830 operation typically requires 8 ns; controller 2820 operation requires 16 ns; bit decoder 2850 operation plus BL & RL select logic 2855 plus MUXs & SA 2860 operation requires 12 ns (word decoder 2840 operation plus WL & RL select logic 2845 ns require less than 12 ns); array 2815 delay is 8 ns; operation of sense latch 2900 requires 8 ns; and read/write buffer 2865 requires 12 ns, for non-limiting example. The access time and cycle time of non-volatile NRAM memory system 2810 is 64 ns. The access time and cycle time may be equal because the NDRO mode of operation of nanotube storage devices (switches) does not require a write-back operation after access (read).

NT-on-source arrays with bit lines BL parallel to release lines RL and reference lines REF parallel to word lines WL may be fabricated by applying methods illustrated previously illustrated above to fabricate preferred NT-on-source arrays with BLs parallel to REF lines and WLs parallel to RLs. Examples of preferred NT-on-source arrays with BLs parallel to REF lines and WLs parallel to RLs are illustrated by array 3225 in FIGS. 30M', 30N, and 30P; array 3229 shown in FIGS. 32A–32C, and array 3231 shown in FIGS. 33A–33D. The methods used to fabricate arrays 3225, 3229, and 3231 may be used to fabricate NT-on-source arrays with BLs parallel to RLs, and WLs parallel to REF lines. These methods include methods 3000 shown in FIG. 22 and corresponding figures and structures; methods 3004 shown in FIGS. 23 and 23' and corresponding figures and structures; methods 3036 shown in FIG. 26 and corresponding figures and structures; methods 3006 shown in FIGS. 27 and 27' and corresponding figures and structures; methods 3008 shown in FIGS. 28 and 28' and corresponding figures and structures; and other methods and structures illustrated in fabricating arrays 3225, 3229, and 3231 as described above.

Nanotube Random Access Memory Using FEDs with Controllable Drains

Nanotube Random Access Memory (NRAM) Systems and Circuits, with Same

Non-volatile field effect devices (FEDs) 100, 120, 140, and 160 with controllable drains may be used as cells and interconnected into arrays to form non-volatile nanotube random access memory (NRAM) systems. The memory cells contain one select device (transistor) T and one non-volatile nanotube storage element NT (1T/1NT cells). By way of example, FED8 160 (FIG. 2H) is used to form a non-volatile NRAM memory cell that is also referred to as a NT-on-Drain memory cell.

NT-on-Drain NRAM Memory Systems and Circuits with Parallel Bit and Reference Lines, and Parallel Word and Release Lines NRAM 1T/1NT memory arrays are wired using four lines. Word line WL is used to gate select device T, reference line REF is attached to a shared source between two adjacent select devices. Bit line BL is used to control NT switch voltage of storage element NT, and release line RL is used to control the release-plate of storage element NT. In this NRAM array configuration, REF is parallel to BL and acts as second bit line, and RL is parallel to WL and acts as a second word line.

Figures 39A, 39B, 39C, 39D:
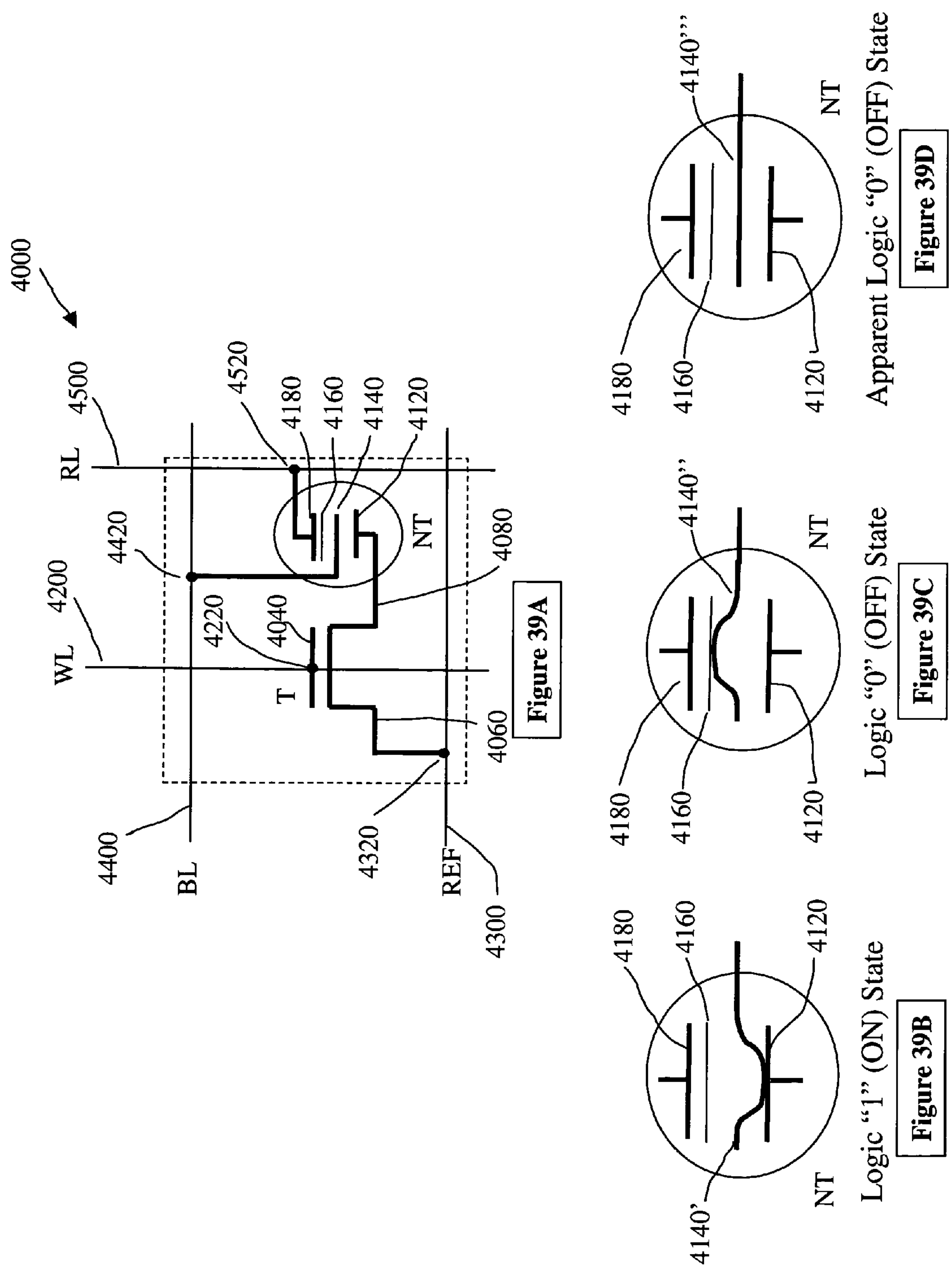
FIG. 39A–D illustrate schematics of circuitry according to certain aspects of the invention.

FIG. 39A depicts non-volatile field effect device 160 with memory cell wiring to form NT-on-Drain memory cell 4000 schematic. Word line (WL) 4200 connects to terminal T1 of FED8 160; bit line (BL) 4400 connects to terminal T2 or FED8 160; reference line (REF) 4300 connects to terminal T3 of FED8 160; and release line (RL) 4500 connects to terminal T4 of FED8 160. Memory cell 4000 performs write and read operations, and stores the information in a non-volatile state. The FED8 160 layout dimensions and operating voltages are selected to optimize memory cell 4000. Memory cell 4000 FET select device (T) gate 4040 corresponds to gate 162; controllable drain 4080 corresponds to controllable drain 164; and source 4060 corresponds to source 166. Memory cell 4000 nanotube (NT) switch-plate 4120 corresponds to switch-plate 168; NT switch 4140 corresponds to NT switch 170; release-plate insulator layer surface 4160 corresponds to release-plate insulator layer surface 176; and release-plate 4180 corresponds to release-plate 174. The interconnections between the elements of memory cell 4000 schematic correspond to the interconnection of the corresponding interconnections of the elements of FED8 160. REF 4300 connects to source 4060 through contact 4320; BL 4400 connects to NT switch 4140 through contact 4420; RL 4500 connects to release-plate 4180 by contact 4520; WL 4200 interconnects to gate 4040 by contact 4220. The non-volatile NT switching element 4140 may be caused to deflect toward switch-plate 4120 via electrostatic forces to closed ("ON") position 4140' to store a logic "1" state as illustrated in FIG. 39B. The van der Waals force holds NT switch 4140 in position 4140'. Alternatively, the non-volatile NT switching element 4140 may be caused to deflect to insulator surface 4160 on release-plate 4180 via electrostatic forces to open ("OFF") position 4140" to store a logic "0" state as illustrated in FIG. 39C. The van der Waals force holds NT switch 4140 in position 4140". Non-volatile NT switching element 4140 may instead be caused to deflect to an open ("OFF") near-mid point position 4140'" between switch-plate 4120 and release-plate 4180, storing an apparent logic "0" state as illustrate in FIG. 24D. However, the absence of a van der Waals retaining force in this open ("OFF") position is likely to result in a memory cell disturb that causes NT switch 4140 to unintentionally transition to the closed ("ON") position, and is not desirable. Sufficient switching voltage is needed to ensure that the NT switch 4140 open ("OFF") position is position 4140". The non-volatile element switching via electrostatic forces is as depicted by element 170 in FIG. 2H. Voltage waveforms 355 used to generate the required electrostatic forces are illustrated in FIG. 11.

NT-on-Drain memory cell schematic 4000 forms the basis of a non-volatile storage (memory) cell. The device may be switched between closed storage state "1" (switched to position 4140') and open storage state "0" (switched to position 4140"), which means the controllable drain may be written to an unlimited number of times to as desired. In this way, the device may be used as a basis for a non-volatile nanotube random access memory, which is referred to here as a NRAM array, with the 'N' representing the inclusion of nanotubes.

Figure 40:
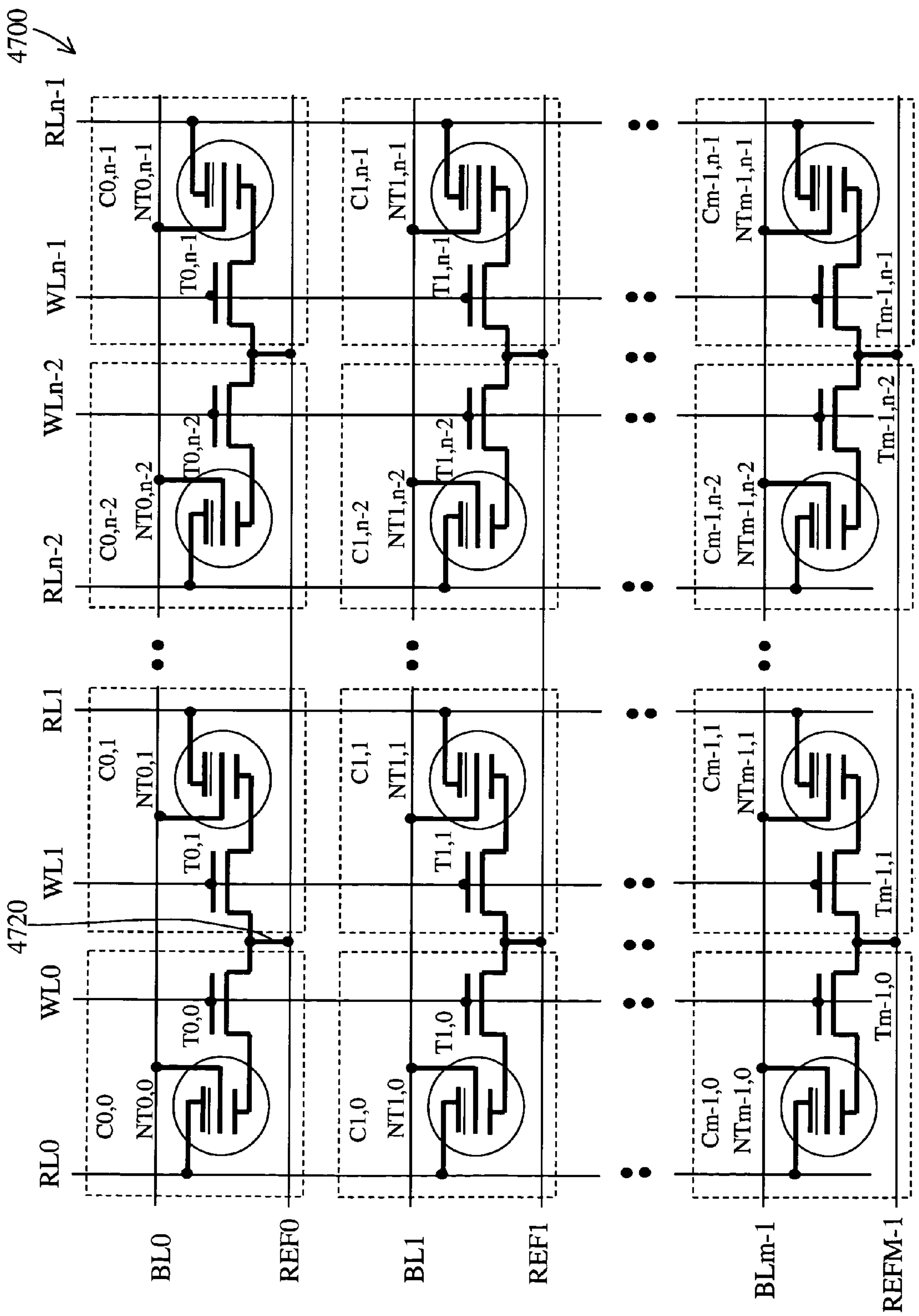
FIG. 40 illustrates a schematic of an NRAM system, according to one embodiment of the invention.

FIG. 40 represents an NRAM system 4700, according to preferred embodiments of the invention. Under this arrangement, an array is formed with m×n (only exemplary portion being shown) of non-volatile cells ranging from cell C0,0 to cell Cm-1,n-1. NRAM system 4700 may be designed using one large m×n array, or several smaller sub-arrays, where each sub-array if formed of m×n cells. To access selected cells, the array uses read and write word lines (WL0, WL1, . . . WLn-1), read and write bit lines (BL0, BL1, . . . BLm-1), read and write reference lines (REF0, REF1, . . . REFm-1), and read and write release lines (RL0, RL1, . . . RLn-1). Non-volatile cell C0,0 includes a select device T0,0 and non-volatile storage element NT0,0. The gate of T0,0 is coupled to WL0, and the source of T0,0 is coupled to REF0. NT0 is the non-volatilely switchable storage element where the NT0,0 switch-plate is coupled to the drain of T0,0, the switching NT element is coupled to BL0, and the release-plate is coupled to RL0. Connection 4720 connects REF0 to shared source of select devices T0,0 and T0,1. Word, bit, reference, and release decoders/drivers are explained further below.

Under preferred embodiments, nanotubes in array 4700 may be in the "ON" "1" state or the "OFF" "0" state. The NRAM memory allows for unlimited read and write operations per bit location. A write operation includes both a write function to write a "1" and a release function to write a "0". By way of example, a write "1" to cell C0,0 and a write "0" to cell C1,0 is described. For a write "1" operation to cell C0,0, select device T0,0 is activated when WL0 transitions from 0 to $V_{DD}$, REF0 transitions from $V_{DD}$ to 0 volts, BL0 transitions from $V_{DD}$ to switching voltage $V_{SW}$, and RL0 transitions from $V_{DD}$ to switching voltage $V_{SW}$. The release-plate and NT switch of the non-volatile storage element NT0,0 are each at $V_{SW}$ resulting in zero electrostatic force (because the voltage difference is zero). The zero REF0 voltage is applied to the switch-plate of non-volatile storage element NT0,0 by the controlled drain of select device T0,0. The difference in voltage between the NT0,0 switch-plate and NT switch is $V_{SW}$ and generates an attracting electrostatic force. If $V_{SW}$ exceeds the nanotube threshold voltage $V_{NT-TH}$, the nanotube structure switches to "ON" state or logic "1" state, that is, the nanotube NT switch and switch-plate are electrically connected as illustrated in FIG. 39B. The near-Ohmic connection between switch-plate 4120 and NT switch 4140 in position 4140' represents the "ON" state or "1" state. If the power source is removed, cell C0,0 remains in the "ON" state.

For a write "0" (release) operation to cell C1,0, select device T1,0 is activated when WL0 transitions from 0 to $V_{DD}$, REF1 transitions from $V_{DD}$ to 0 volts, BL1 transitions from $V_{DD}$ to zero volts, and RL0 transitions from $V_{DD}$ to switching voltage $V_{SW}$. The zero REF1 voltage is applied to the switch-plate of non-volatile storage element NT1,0 by the controlled drain of select device T1,0, and zero volts is applied the NT switch by BL1, resulting in zero electrostatic force between switch-plate and NT switch. The non-volatile storage element NT1,0 release-plate is at switching voltage $V_{SW}$ and the NT switch is at zero volts generating an attracting electrostatic force. If $V_{SW}$ exceeds the nanotube threshold voltage $V_{NT-TH}$, the nanotube structure switches to the "OFF" state or logic "0" state, that is, the nanotube NT switch and the surface of the release-plate insulator are in contact as illustrated in FIG. 39C. The non-conducting contact between insulator surface 4160 on release-plate 4180 and NT switch 4140 in position 4140" represents the "OFF" state or "0" state. If the power source is removed, cell C1,0 remains in the "OFF" state.

An NRAM read operation does not change (destroy) the information in the activated cells, as it does in a DRAM, for example. Therefore the read operation in the NRAM is characterized as a non-destructive readout (or NDRO) and does not require a write-back after the read operation has been completed. For a read operation of cell C0,0, BL0 is driven high to $V_{DD}$ and allowed to float. WL0 is driven high to $V_{DD}$ and select device T0,0 turns on. REF0 is at zero volts, and RL0 is at $V_{DD}$. If cell C0,0 stores an "ON" state ("1" state) as illustrated in FIG. 39B, BL0 discharges to ground through a conductive path that includes select device T0,0 and non-volatile storage element NT0,0 in the "ON" state, the BL0 voltage drops, and the "ON" state or "1" state is detected by a sense amplifier/latch circuit (not shown) that records the voltage drop by switching the latch to a logic "1" state. REF0 is connected by the select device T0,0 conductive channel of resistance $R_{FET}$ to the switch-plate of NT0,0. The switch-plate of NT0,0 in the "ON" state contacts the NT switch with contact resistance $R_{SW}$ and the NT switch contacts bit line BL0 with contact resistance $R_C$. The total resistance in the discharge path is $R_{FET}+R_{SW}+R_C$. Other resistance values in the discharge path, including the resistance of the NT switch, are much small and may be neglected For a read operation of cell C1,0, BL1 is driven high to $V_{DD}$ and allowed to float. WL0 is driven high to $V_{DD}$ and select device T1,0 turns on. REF1=0, and RL0 is at $V_{DD}$. If cell C1,0 stores an "OFF" state ("0" state) as illustrated in FIG. 39C, BL1 does not discharge to ground through a conductive path that includes select device T1,0 and non-volatile storage element NT1,0 in the "OFF" state, because the switch-plate is not in contact with the NT switch when NT1,0 is in the "OFF" state, and the resistance $R_C$ is large. Sense amplifier/latch circuit (not shown) does not detect a voltage drop and the latch is set to a logic "0" state.

Figure 41:
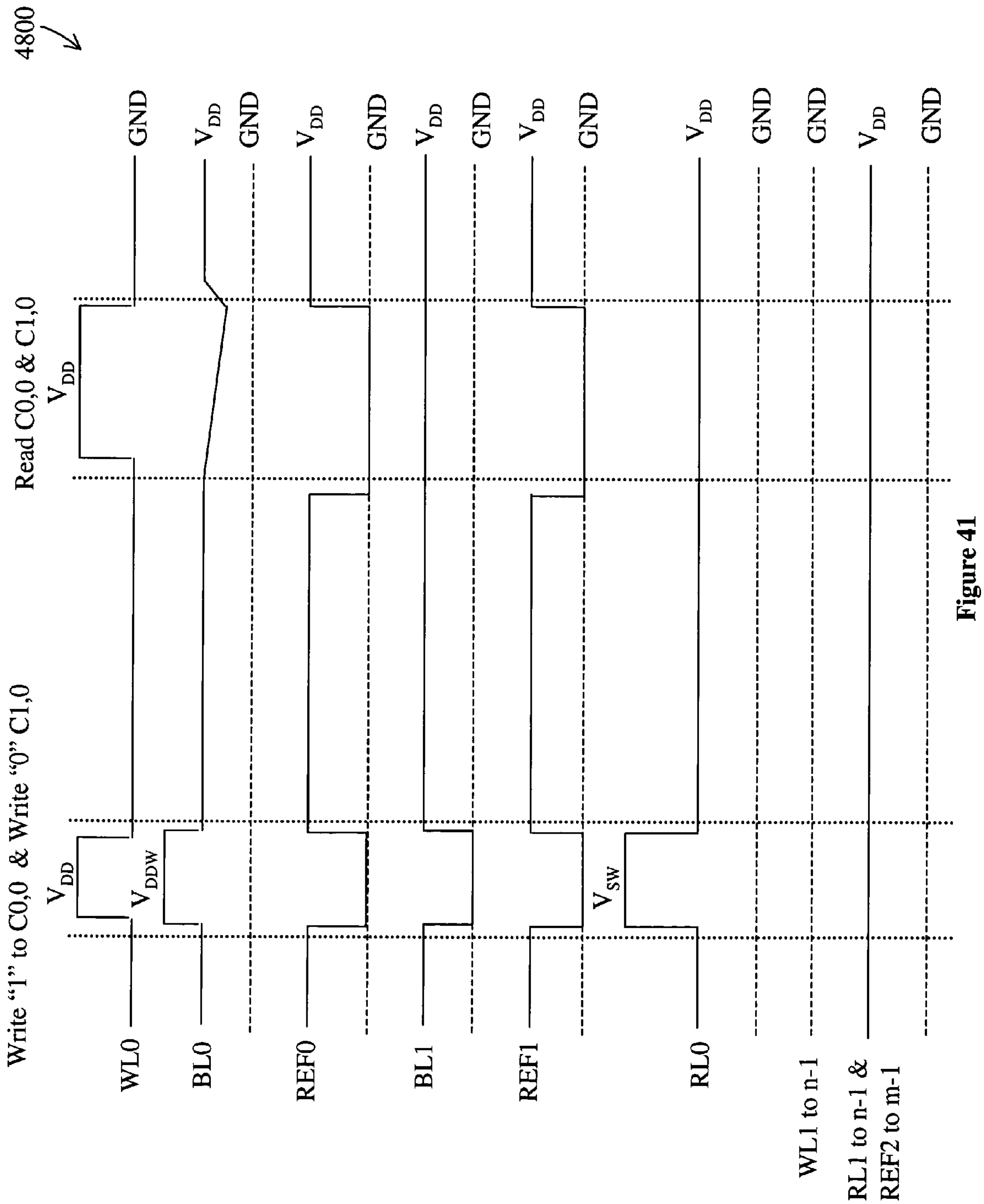
FIG. 41 illustrates the operational waveforms of a memory array according to one aspect of the invention.

FIG. 41 illustrates the operational waveforms 4800 of memory array 4700 of FIG. 40 during read, write "1", and write "0" operations for selected cells, while not disturbing unselected cells (no change to unselected cell stored logic states). Waveforms 4800 illustrate voltages and timings to write logic state "1" in cell C0,0, write a logic state "0" in cell C1,0, read cell C0,0, and read cell C1,0. Waveforms 4800 also illustrate voltages and timings to prevent disturbing the stored logic states (logic "1" state and logic "0" state) in partially selected (also referred to as half-selected) cells. Partially selected cells are cells in memory array 4700 that receive applied voltages because they are connected to (share) word, bit, reference, and release lines that are activated as part of the read or write operation to the selected cells. Cells in memory array 4700 tolerate unlimited read and write operations at each memory cell location.

At the start of the write cycle, WL0 transitions from zero to $V_{DD}$, activating select devices T0,0, T1,0, . . . Tm-1,0. Word lines WL1, WL2 . . . WLn-1 are not selected and remain at zero volts. REF0 transitions from $V_{DD}$ to zero volts, connecting the switch-plate of non-volatile storage element NT0,0 to zero volts. REF1 transitions from $V_{DD}$ to zero volts connecting the switch-plate of non-volatile storage element NT1,0 to zero volts. REF2, REF3 . . . REFm-1 remain at $V_{DD}$ connecting the switch-plate of non-volatile storage elements NT2,0, NT3,0 . . . NTm-1,0 to $V_{DD}$. BL0 transitions from $V_{DD}$ to switching voltage $V_{SW}$, connecting the NT switches of non-volatile storage elements NT0,0, NT0,1 . . . NT0,n-2, NT0,n-1 to $V_{SW}$. BL1 transitions from $V_{DD}$ to zero volts, connecting the NT switches of non-volatile storage elements NT1,0, NT1,1 . . . NT1,n-2,NT1, n-1 to zero volts. BL2, BL3 . . . BLm-1 remain at $V_{DD}$, connecting the NT switches of non-volatile storage elements NT3,0 to NTm-1,n-1 to $V_{DD}$. RL1, RL2 . . . RLn-1 remain at $V_{DD}$, connecting release-plates of non-volatile storage elements NT0,1 to NTn-1,n-1 to $V_{DD}$.

NT0,0 may be in "ON" ("1" state) or "OFF" ("0" state) state at the start of the write cycle. It will be in "ON" state at the end of the write cycle. If NT0,0 in cell C0,0 is "OFF" ("0" state) it will switch to "ON" ("1" state) since the voltage difference between NT switch and release-plate is zero, and the voltage difference between NT switch and switch-plate is $V_{SW}$. If NT0,0 in cell C0,0 is in the "ON" ("1" state), it will remain in the "ON" ("1") state. NT1,0 may be in "ON" ("1" state) or "OFF" ("0" state) state at the start of the write cycle. It will be in "OFF" state at the end of the write cycle. If NT1,0 in cell C1,0 is "ON" ("1" state) it will switch to "OFF" ("0" state) since the voltage difference between NT switch and switch-plate is zero, and the voltage difference between NT switch and release-plate is $V_{SW}$. If NT1,0 in cell C1,0 is "OFF" ("0" state), it will remain "OFF" ("0" state). If for example, $V_{SW}$=3.0 volts, $V_{DD}$=1.5 volts, and NT switch threshold voltage range is $V_{NT-TH}$=1.7 to 2.8 volts, then for NT0,0 and NT1,0 a difference voltage $V_{SW}>V_{NT-TH}$ ensuring write states of "ON" ("1" state) for NT0,0 and "OFF" ("0" state) for NT1,0.

Cells C0,0 and C1,0 have been selected for the write operation. All other cells have not been selected, and information in these other cells must remain unchanged (undisturbed). Since in an array structure some cells other than selected cells C0,0 and C1,0 in array 4700 will experience partial selection voltages, often referred to as half-select voltages, it is necessary that half-select voltages applied to non-volatile storage element terminals be sufficiently low (below nanotube activation threshold $V_{NT-TH}$) to avoid disturbing stored information. For storage cells in the "ON" state, it is also necessary to avoid parasitic current flow (there cannot be parasitic currents for cells in the "OFF" state because the NT switch is not in electrical contact with switch-plate or release-plate). Potential half-select disturb along activated array lines WL0 and RL0 includes cells C3,0 to Cm-1,0 because WL0 and RL0 have been activated. Storage elements NT3,0 to NTm-1,0 will have REF2 to REFm-1 electrically connected to the corresponding storage element switch-plate by select devices T3,0 to Tm-1,0. All release-plates in these storage elements are at write voltage $V_{SW}$. To prevent undesired switching of NT switches, BL2 to BLm-1 reference lines are set at voltage $V_{DD}$. REF2 to REFm-1 voltages are set to $V_{DD}$ to prevent parasitic currents. The information in storage elements NT2,0 to NTm-1,0 in cells C2,0 to Cm-1,0 is not disturbed and there is no parasitic current. For those cells in the "OFF" state, there can be no parasitic currents (no current path), and no disturb because the voltage differences favor the "OFF" state. For those cells in the "ON" state, there is no parasitic current because the voltage difference between switch-plates (at $V_{DD}$) and NT switches (at $V_{DD}$) is zero. Also, for those cells in the "ON" state, there is no disturb because the voltage difference between corresponding NT switches and release-plate is $V_{SW}-V_{DD}$=1.5 volts, when $V_{SW}$=3.0 volts and $V_{DD}$=1.5 volts. Since this voltage difference of 1.5 volts is less than the minimum nanotube threshold voltage $V_{NT-TH}$ of 1.7 volts, no switching takes place.

Potential half-select disturb along activated array lines REF0 and BL0 includes cells C0,1 to C0, n-1 because REF0 and BL0 have been activated. Storage elements NT0,1 to NT0, n-1 all have corresponding NT switches connected to switching voltage $V_{SW}$. To prevent undesired switching of NT switches, RL1 to RLn-1 are set at voltage $V_{DD}$. WL1 to WL n-1 are set at zero volts, therefore select devices T0,1 to T0,n-1 are open, and switch-plates (all are connected to select device drain diffusions) are not connected to bit line REF0. All switch-plates are in contact with a corresponding NT switch for storage cells in the "ON" state, and all switch plates are only connected to corresponding "floating" drain diffusions for storage cells in the "OFF" state. Floating diffusions are at approximately zero volts because of diffusion leakage currents to semiconductor substrates. However, some floating source diffusions may experience disturb voltage conditions that may cause the source voltage, and therefore the switch-plate voltage, to increase up to 0.6 volts as explained further below. The information in storage elements NT0,1 to NT0,n-1 in cells C0,1 to C0,n-1 is not disturbed and there is no parasitic current. For cells in both "ON" and "OFF" states there can be no parasitic current because there is no current path. For cells in the "ON" state, the corresponding NT switch and switch-plate are in contact and both are at voltage $V_{SW}$. There is a voltage difference of $V_{SW}$–$V_{DD}$ between corresponding NT switch and release-plate. For $V_{SW}$=3.0 volts and $V_{DD}$–1.5 volts, the voltage difference of 1.5 volts is below the minimum $V_{NT-TH}$=1.7 volts for switching. For cells in the "OFF" state, the voltage difference between corresponding NT switch and switch-plate ranges from $V_{SW}$ to $V_{SW}$–0.6 volts. The voltage difference between corresponding NT switch and switch-plate may be up to 3.0 volts, which exceeds the $V_{NT-TH}$ voltage, and would disturb "OFF" cells by switching them to the "ON" state. However, there is also a voltage difference between corresponding NT switch and release-plate of $V_{SW}$–$V_{DD}$ of 1.5 volts with an electrostatic force in the opposite direction that prevents the disturb of storage cells in the "OFF" state. Also very important is that NT switching element 4140 is in position 4140" in contact with the storage-plate dielectric, a short distance from the storage plate, thus maximizing the electric field that opposes cell disturb. Switch-plate 4140 is far from the NT switching element 4140 switch greatly reducing the electric field that promotes disturb. In addition, the van der Waals force also must be overcome to disturb the cell.

Potential half-select disturb along activated array lines REF1 and BL1 includes cells C1,1 to C1, n-1 because REF1 and BL1 have been activated. Storage elements NT1,1 to NT1, n-1 all have corresponding NT switches connected to zero volts. To prevent undesired switching of NT switches, RL1 to RLn-1 are set at voltage $V_{DD}$. WL1 to WL n-1 are set at zero volts, therefore select devices T1,1 to T1,n-1 are open, and switch-plates (all are connected to select device drain diffusions) are not connected to reference line REF1. All switch-plates are in contact with a corresponding NT switch for storage cells in the "ON" state, and all switch plates are only connected to corresponding "floating" drain diffusions for storage cells in the "OFF" state. Floating diffusions are at approximately zero volts because of diffusion leakage currents to semiconductor substrates. However, some floating source diffusions may experience disturb voltage conditions that may cause the source voltage, and therefore the switch-plate voltage, to increase up to 0.6 volts as explained further below. The information in storage elements NT1,1 to NT1,n-1 in cells C1,1 to C1,n-1 is not disturbed and there is no parasitic current. For cells in both "ON" and "OFF" states there can be no parasitic current because there is no current path. For cells in the "ON" state, the corresponding NT switch and switch-plate are in contact and both are at zero volts. There is a voltage difference of $V_{DD}$ between corresponding NT switch and release-plate. For $V_{DD}$=1.5 volts, the voltage difference of 1.5 volts is below the minimum $V_{NT-TH}$=1.7 volts for switching. For cells in the "OFF" state, the voltage of the switch-plate ranges zero to 0.6 volts. The voltage difference between corresponding NT switch and switch-plate may be up to 0.6 volts. There is also a voltage difference between corresponding NT switch and release-plate of $V_{DD}$=1.5 volts. $V_{DD}$ is less than the minimum $V_{NT-TH}$ of 1.7 volts the "OFF" state remains unchanged.

For all remaining cells of memory array 4700, cells C2,1 to Cm-1,n-1, there is no electrical connection between NT2,1 to NTm-1,n-1 switch-plates connected to corresponding select device drain and corresponding reference lines REF2 to REFm-1 because WL1 to WLn-1 are at zero volts, and select devices T2,1 to Tm-1,n-1 are open. Bit line voltages for BL2 to BLm-1 are set at $V_{DD}$ and release line voltages for RL1 to RLn-1 are set at $V_{DD}$. Therefore, all NT switches are at $V_{DD}$ and all corresponding release-plates are at $V_{DD}$, and the voltage difference between corresponding NT switches and release-plates is zero. For storage cells in the "ON" state, NT switches are in contact with corresponding switch-plates and the voltage difference is zero. For storage cells in the "OFF" state, switch plate voltages are zero to a maximum of 0.6 volts. The maximum voltage difference between NT switches and corresponding switch-plates is $V_{DD}$=1.5 volts, which is below the $V_{NT-TH}$ voltage minimum voltage of 1.7 volts. The "ON" and "OFF" states remain undisturbed.

Figure 42A:
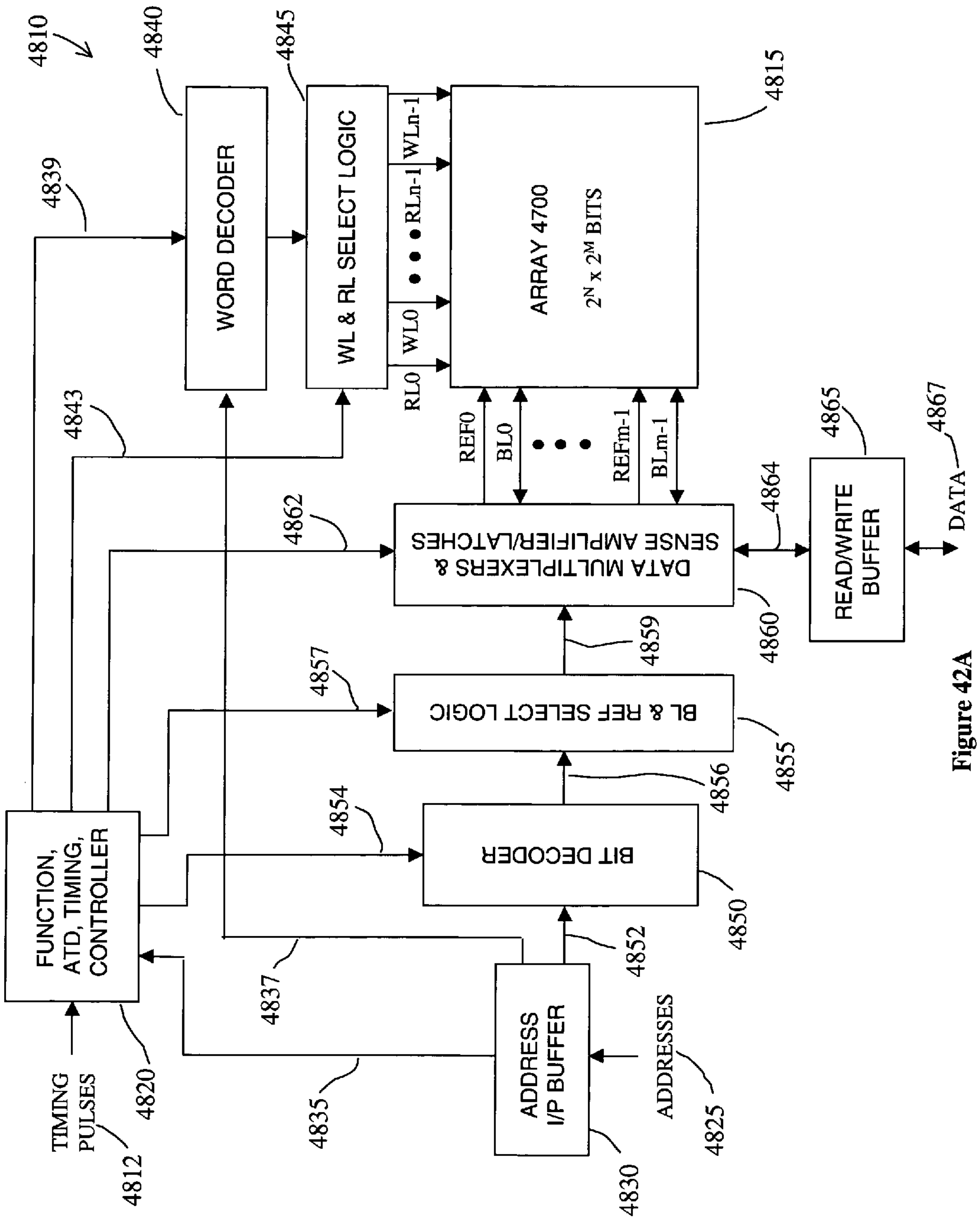
FIG. 42A illustrates a diagram outlining a memory array system according to one aspect of the invention.

Non-volatile NT-on-drain NRAM memory array 4700 with bit lines parallel to reference lines is shown in FIG. 40 contains $2^N \times 2^M$ bits, is a subset of non-volatile NRAM memory system 4810 illustrated as memory array 4815 in FIG. 42A. NRAM memory system 4810 may be configured to operate like an industry standard asynchronous SRAM or synchronous SRAM because nanotube non-volatile storage cells of memory cell schematic 4000 shown in FIG. 39A, in memory array 4700, may be read in a non-destructive readout (NDRO) mode and therefore do not require a write-back operation after reading, and also may be written (programmed) at CMOS voltage levels (5, 3.3, and 2.5 volts, for example) and at nanosecond and sub-nanosecond switching speeds. NRAM read and write times, and cycle times, are determined by array line capacitance, and are not limited by nanotube switching speed. Accordingly, NRAM memory system 4810 may be designed with industry standard SRAM timings such as chip-enable, write-enable, output-enable, etc., or may introduce new timings, for example. Non-volatile NRAM memory system 4810 may be designed to introduce advantageous enhanced modes such as a sleep mode with zero current (zero power—power supply set to zero volts), information preservation when power is shut off or lost, enabling rapid system recovery and system startup, for example. NRAM memory system 4810 circuits are designed to provide the memory array 4700 waveforms 4800 shown in FIG. 41.

Figure 43:
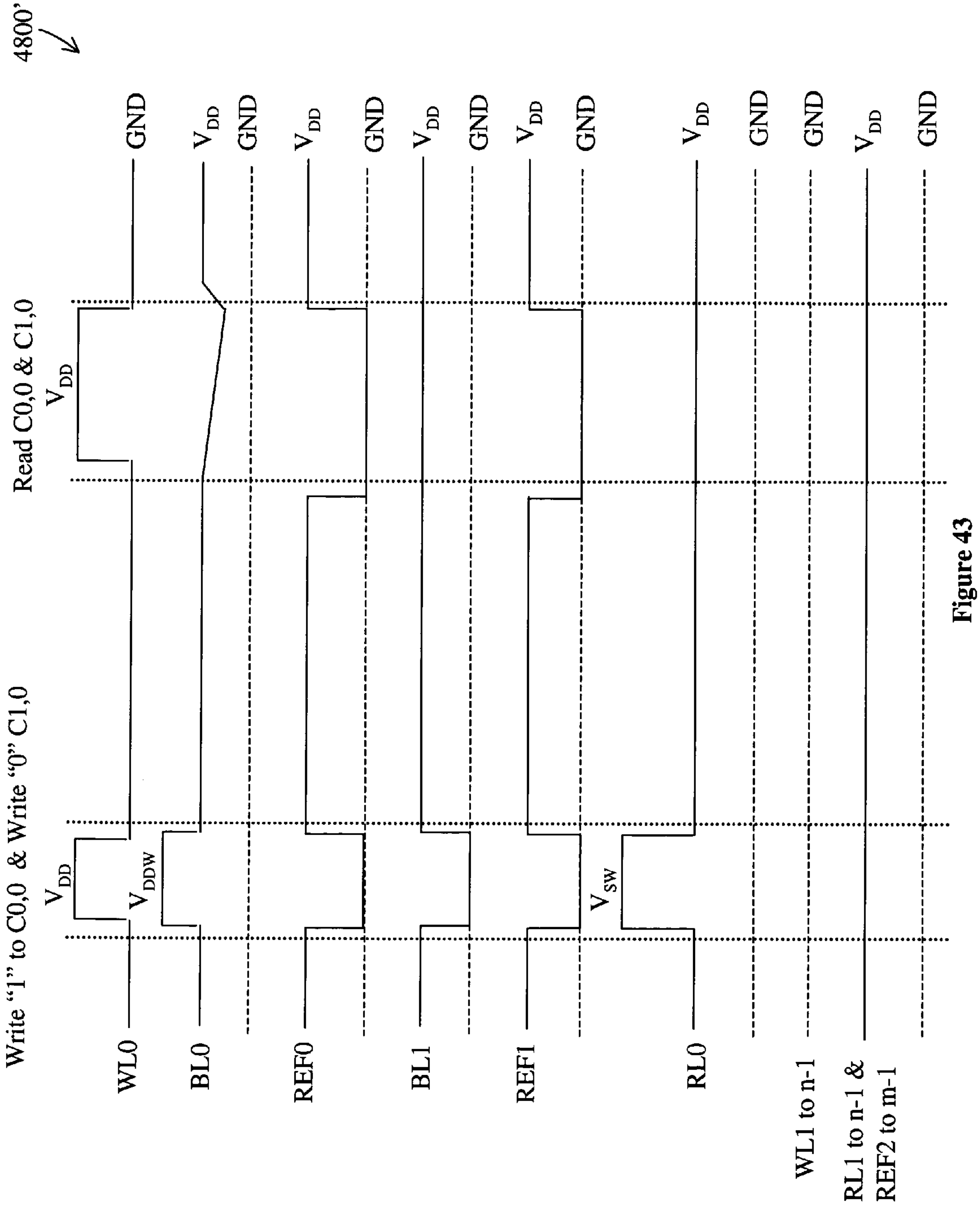
FIG. 43 illustrates the operational waveforms of a memory array according to one aspect of the invention.

Figure NRAM memory system 4810 accepts timing inputs 4812, accepts address inputs 4825, and accepts data 4867 from a computer, or provides data 4867 to a computer using a bidirectional bus sharing input/output (I/O) terminals. Alternatively, inputs and outputs may use separate (unshared) terminals (not shown). Address input (I/P) buffer 4830 receives address locations (bits) from a computer system, for example, and latches the addresses. Address I/P buffer 4830 provides word address bits to word decoder 4840 via address bus 4837; address I/P buffer 4830 provides bit addresses to bit decoder 4850 via address bus 4852; and address bus transitions provided by bus 4835 are detected by function generating, address transition detecting (ATD), timing waveform generator, controller (controller) 4820. Controller 4820 provides timing waveforms on bus 4839 to word decoder 4840. Word decoder 4840 selects the word address location within array 4815. Word address decoder 4840 is used to decode both word lines WL and corresponding release lines RL (there is no need for a separate RL decoder) and drives word line (WL) and release line (RL) select logic 4845. Controller 4820 provides function and timing inputs on bus 4843 to WL & RL select logic 4845, resulting in NRAM memory system 4810 on-chip WL and RL waveforms for both write-one, write-zero, read-one, and read-zero operations as illustrated by waveforms 4800' shown in FIG. 43. FIG. 43 NRAM memory system 4810 waveforms 4800' correspond to memory array 4700 waveforms 4800 shown in FIG. 41.

Bit address decoder 4850 is used to decode both bit lines BL and corresponding reference lines REF (there is no need for a separate REF decoder) and drive bit line (BL) and reference (REF) select logic 4855 via bus 4856. Controller 4820 provides timing waveforms on bus 4854 to bit decoder 4850. Controller 4820 also provides function and timing inputs on bus 4857 to BL & REF select logic 4855. BL & REF select logic 4855 uses inputs from bus 4856 and bus 4857 to generate data multiplexer select bits on bus 4859. The output of BL and REF select logic 4855 on bus 4859 is used to select control data multiplexers using combined data multiplexers & sense amplifiers/latches (MUXs & SAs) 4860. Controller 4820 provides function and timing inputs on bus 4862 to MUXs & SAs 4860, resulting in NRAM memory system 4810 on-chip BL and REF waveforms for both write-one, write-zero, read-one, and read-zero operations as illustrated by waveforms 4800' corresponding to memory array 4700 waveforms 4800 shown in FIG. 41. MUXs & SAs 4860 are used to write data provided by read/write buffer 4865 via bus 4864 in array 4815, and to read data from array 4815 and provide the data to read/write buffer 4865 via bus 4864 as illustrated in waveforms 4800' of FIG. 43A.

Figure 42B:
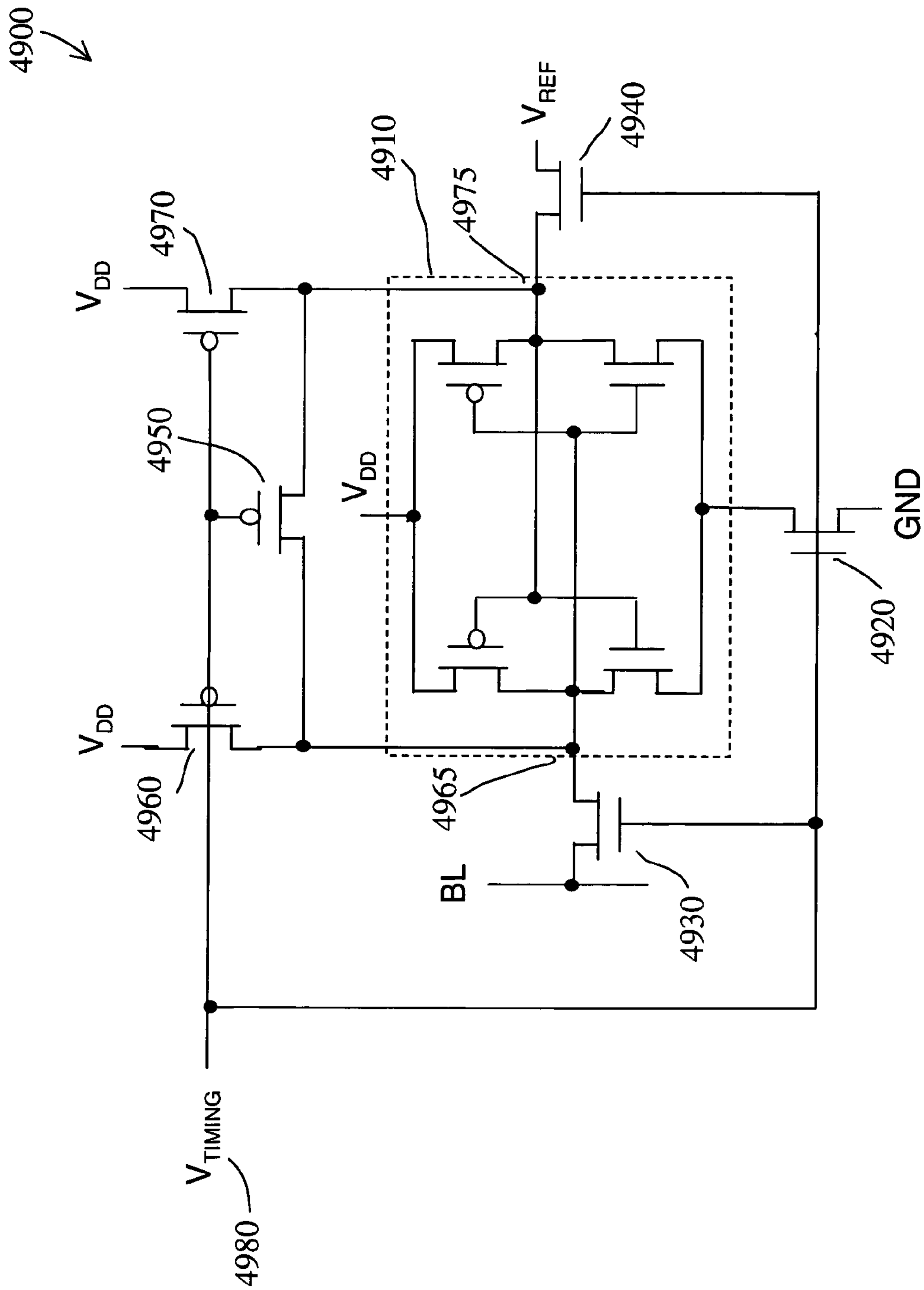
FIG. 42B is a schematic of a cell according to once aspect of the invention.

Sense amplifier/latch 4900 is illustrated in FIG. 42B. Flip flop 4910, comprising two back-to-back inverters is used to amplify and latch data inputs from array 4815 or from read/write buffer 4865. Transistor 4920 connects flip flop 4910 to ground when activated by a positive voltage supplied by control voltage $V_{TIMING}$ 4980, which is provided by controller 4820. Gating transistor 4930 connects a bit line BL to node 4965 of flip flop 4910 when activated by a positive voltage. Gating transistor 4940 connects reference voltage $V_{REF}$ to flip flop node 4975 when activated by a positive voltage. Transistor 4960 connects voltage $V_{DD}$ to flip flop 4910 node 4965, transistor 4970 connects voltage $V_{DD}$ to flip flop 4910 node 4975, and transistor 4950 ensures that small voltage differences are eliminated when transistors 4960 and 4970 are activated. Transistors 4950, 4960, and 4970 are activated (turned on) when gate voltage is low (zero, for example).

In operation, $V_{TIMING}$ voltage is at zero volts when sense amplifier 4900 is not selected. NFET transistors 4920, 4930, and 4940 are in the "OFF" (non-conducting) state, because gate voltages are at zero volts. PFET transistors 4950, 4960, and 4970 are in the "ON" (conducting) state because gate voltages are at zero volts. $V_{DD}$ may be 5, 3.3, or 2.5 volts, for example, relative to ground. Flip flop 4910 nodes 4965 and 4975 are at $V_{DD}$. If sense amplifier/latch 4900 is selected, $V_{TIMING}$ transitions to $V_{DD}$, NFET transistors 4920, 4930, and 4940 turn ON, PFET transistors 4950, 4960, and 4970 are turned "OFF", and flip flop 4910 is connected to bit line BL and reference voltage $V_{REF}$. $V_{REF}$ is connected to $V_{DD}$ in this example. As illustrated by waveforms BL0 and BL1 of waveforms 4800', bit line BL is pre-charged prior to activating a corresponding word line (WL0 in this example). If memory cell 4000 of memory array 4700 (memory system array 4815) stores a "1", then bit line BL in FIG. 42B corresponds to BL0 in FIG. 43, BL is discharged by cell 4000, voltage droops below $V_{DD}$, and sense amplifier/latch 4900 detects a "1" state. If cell 4000 of memory array 4700 (memory system array 4815) stores a "0", then bit line BL in FIG. 42B corresponds to BL1 in FIG. 43, BL is not discharged by cell 4000, voltage does not droop below $V_{DD}$, and sense amplifier/latch 4900 detect a "0" state. The time from sense amplifier select to signal detection by sense amplifier/latch 4900 is referred to as signal development time. Sense amplifier/latch 4900 typically requires 100 to 200 mV relative to $V_{REF}$ in order to switch. It should be noted that cell 4000 requires a nanotube "OFF" resistance to "ON" resistance ratio of greater than 10 to 1 for successful operation. A typical bit line BL has a capacitance value of 250 fF, for example. A typical nanotube storage device (switch) or dimensions 0.2 by 0.2 um typically has 8 nanotube filaments across the suspended region, for example, as illustrated further below. For a combined contact and switch resistance of 50,000 Ohms per filament, as illustrated further below, the nanotube "ON" resistance of cell 1000 is 6,250 Ohms. For a bit line of 250 fF, the time constant RC=1.6 ns. The sense amplifier signal development time is less than RC, and for this example, is between 1 and 1.5 nanoseconds.

Non-volatile NRAM memory system 4810 operation may be designed for high speed cache operation at 5 ns or less access and cycle time, for example. Non-volatile NRAM memory system 4810 may be designed for low power operation at 60 or 70 ns access and cycle time operation, for example. For low power operation, address I/P buffer 4830 operation requires 8 ns; controller 4820 operation requires 16 ns; bit decoder 4850 operation plus BL & select logic 4855 plus MUXs & SA 4860 operation requires 12 ns (word decoder 4840 operation plus WL & RL select logic 4845 ns require less than 12 ns); array 4815 delay is 8 ns; sensing operation of sense amplifier latch 4900 requires 8 ns; and read/write buffer 4865 requires 12 ns, for example. The access time and cycle time of non-volatile NRAM memory system 4810 is 64 ns. The access time and cycle time may be equal because the NDRO mode of operation of nanotube storage devices (switches) does not require a write-back operation after access (read).

Figure 44B:
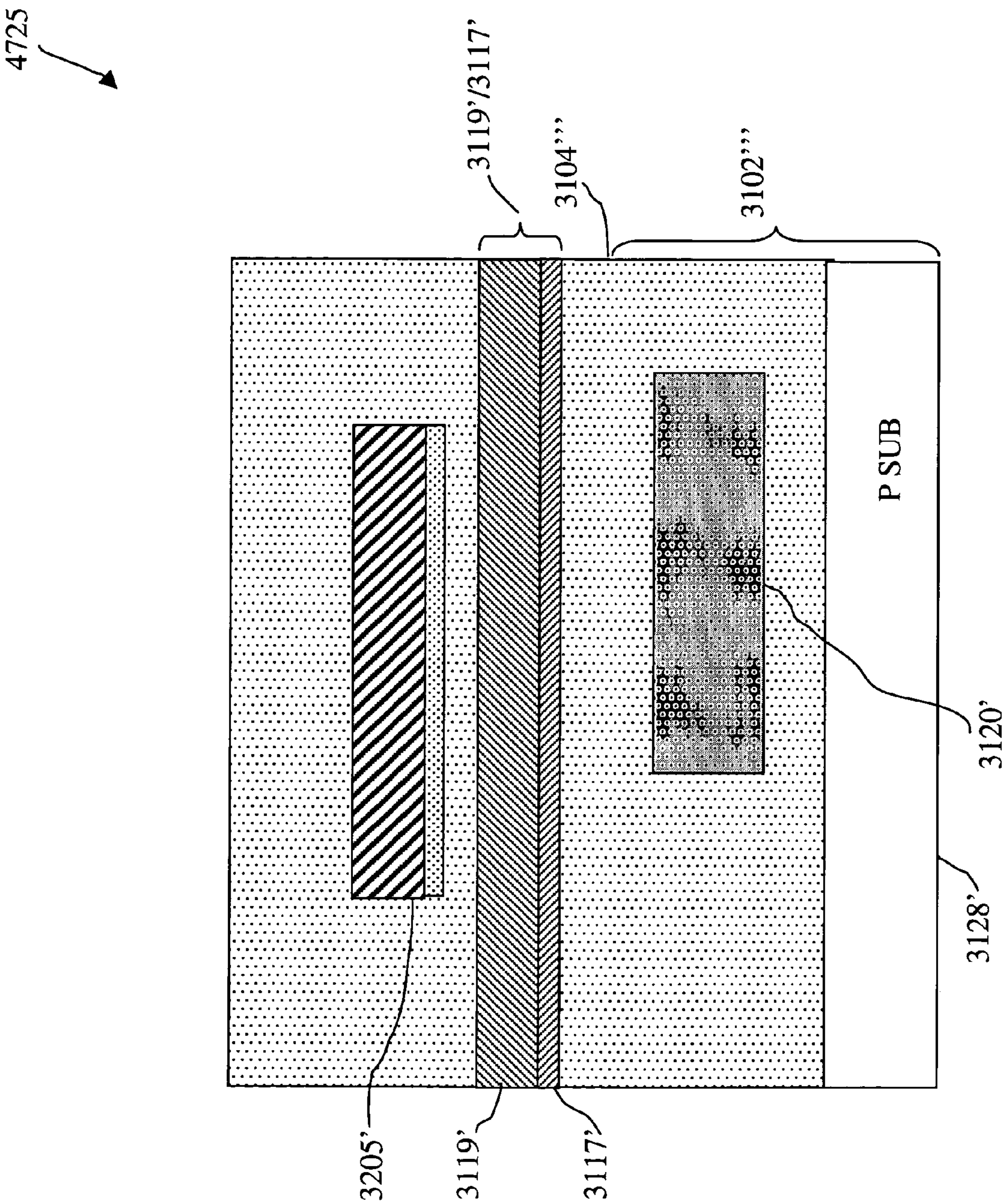
Figure 45A:
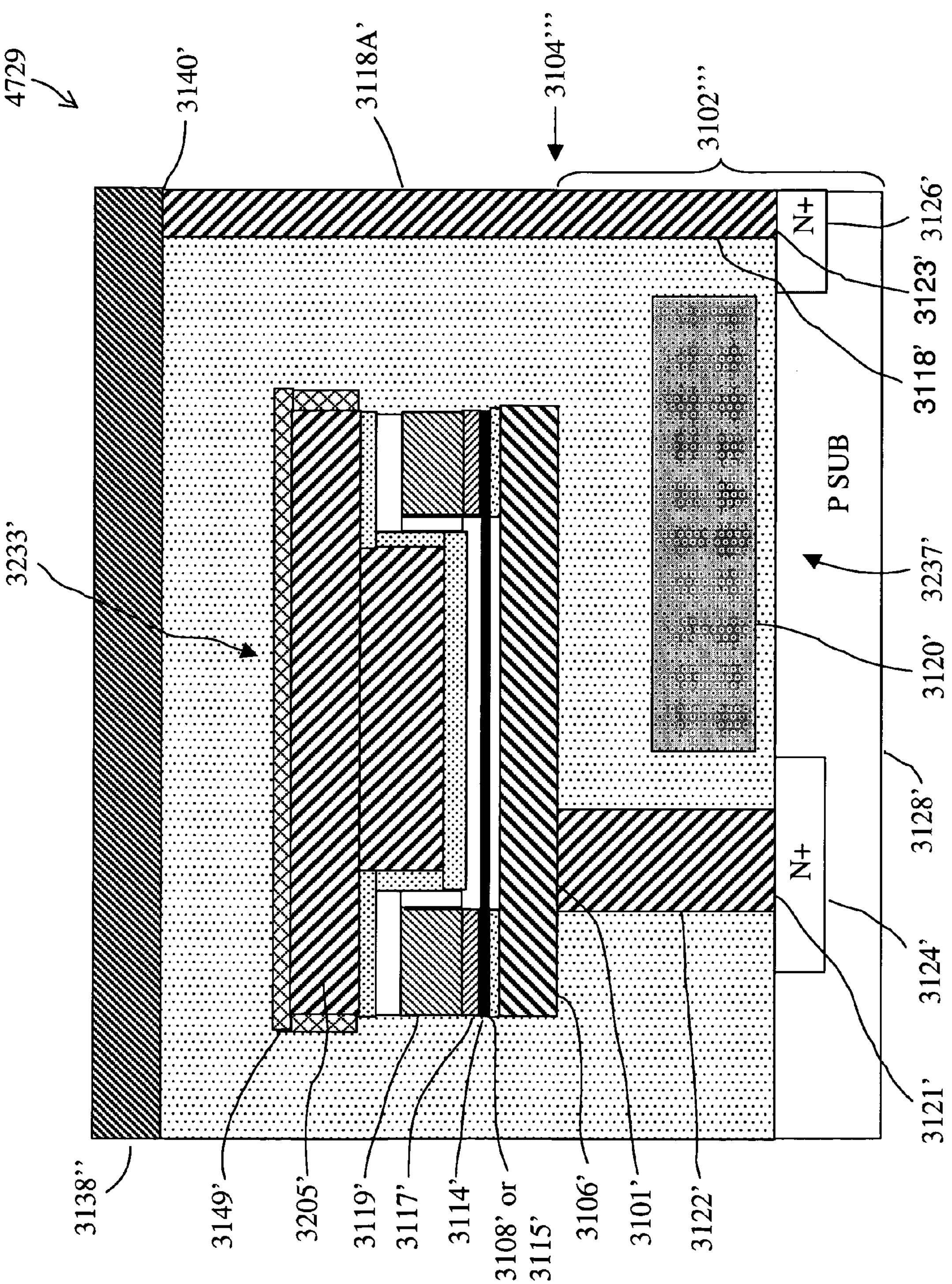
FIGS. 45A–B illustrate cross sections of memory arrays according to aspects of the invention.
Figure 45B:
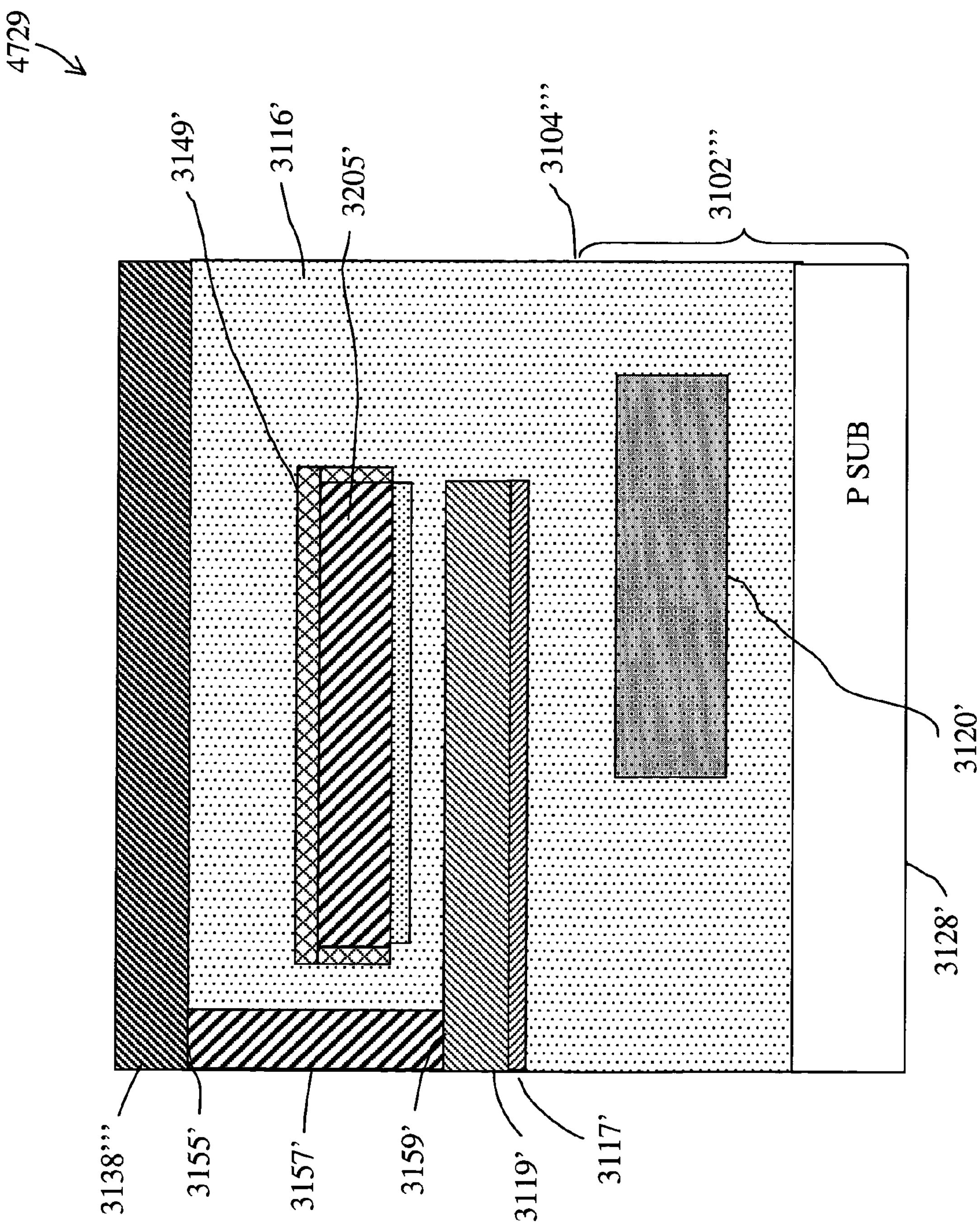
Figure 45C:
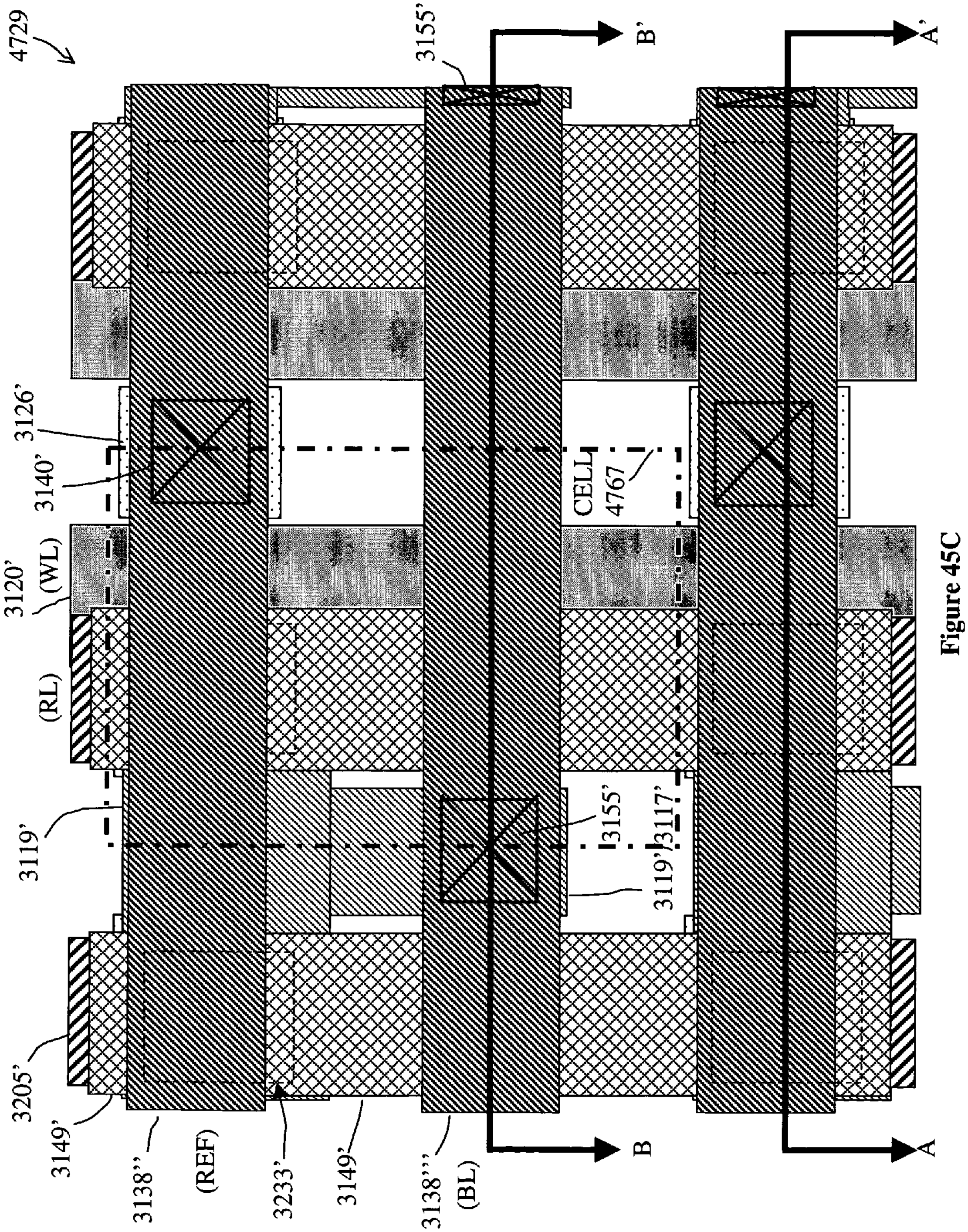
FIG. 45C illustrates a plan view of a memory array structure according to one aspect of the invention.
Figure 46A:
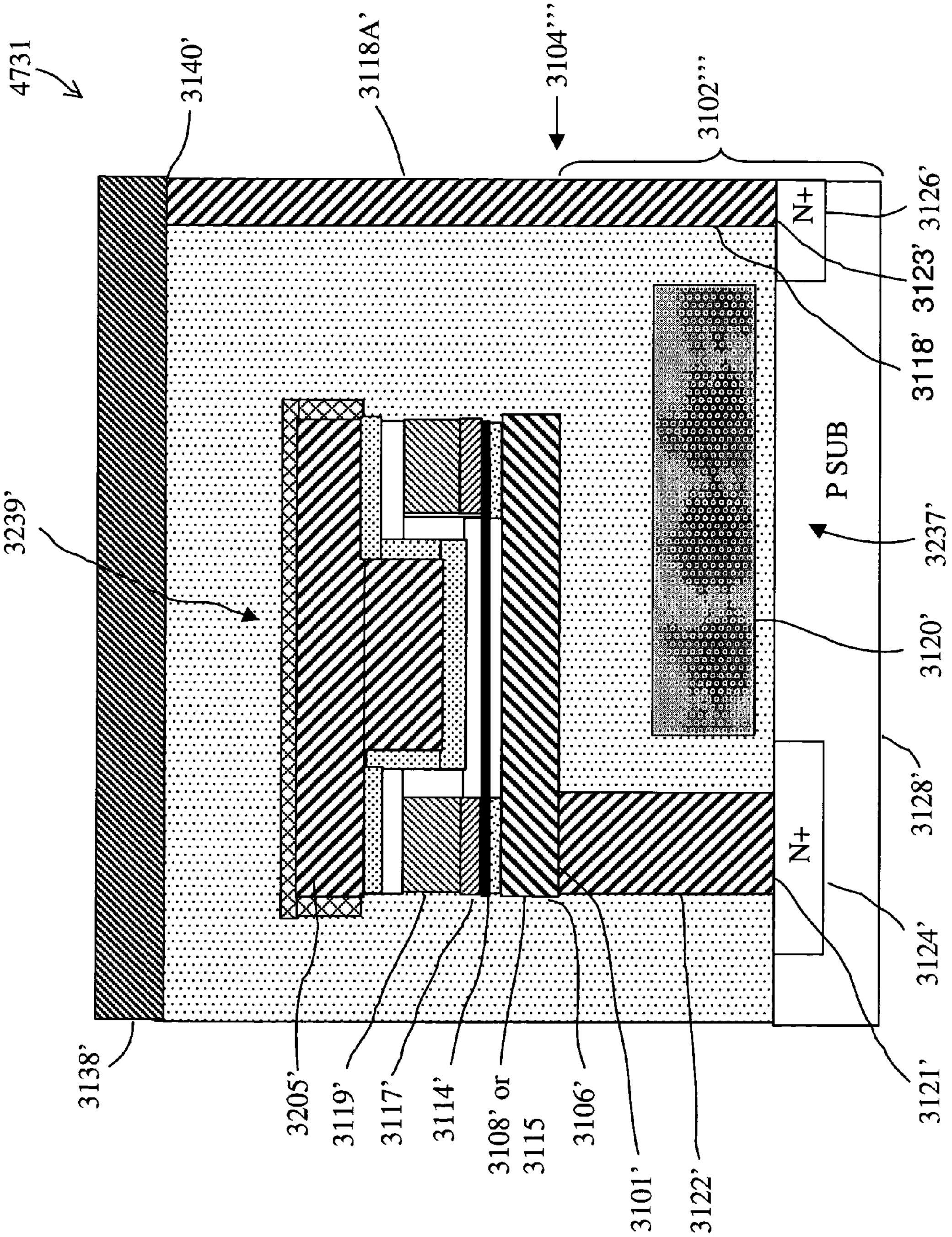
FIGS. 46A–C illustrate cross sections of structures according to certain aspects of the invention.
Figure 46B:
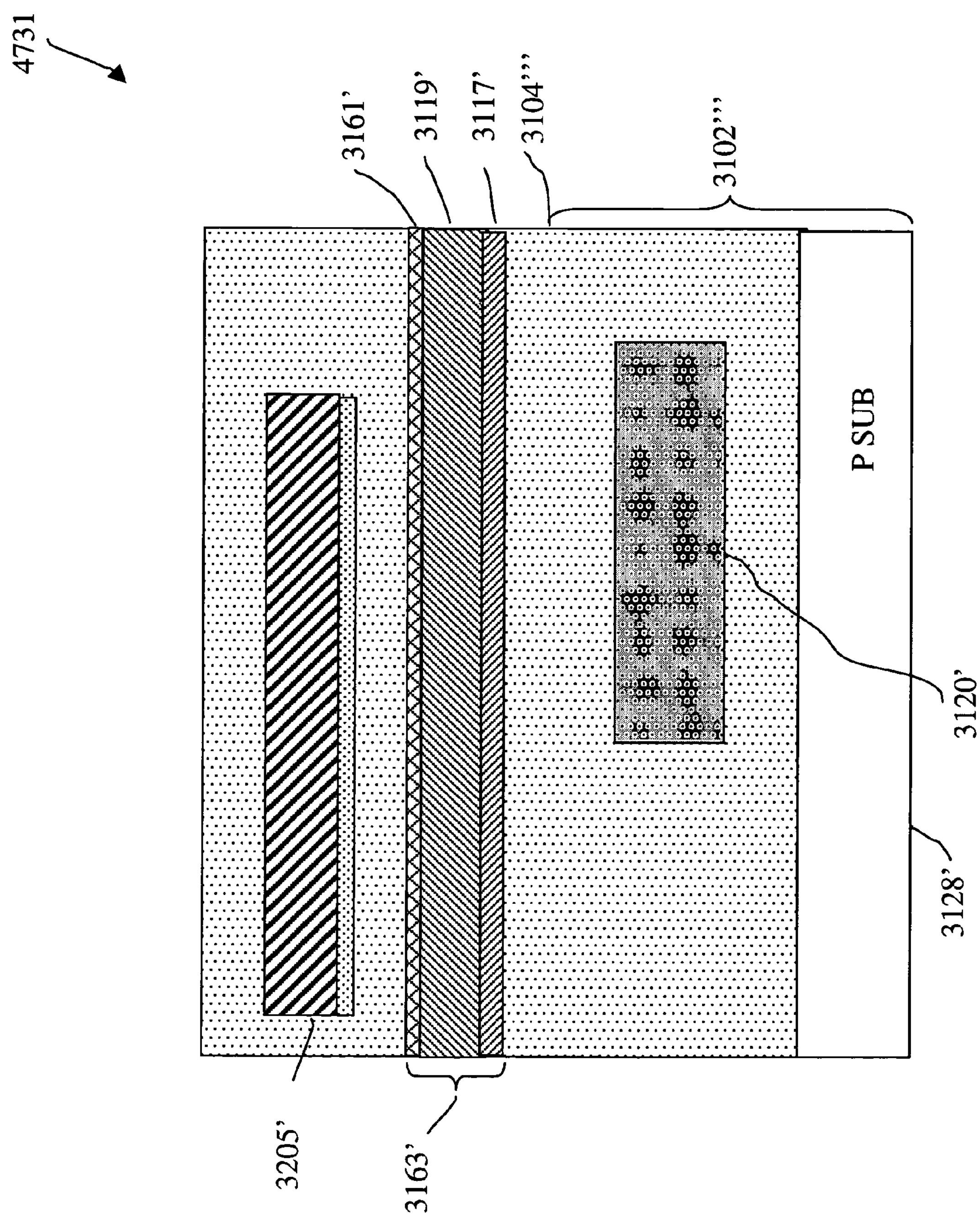
Figure 46C:
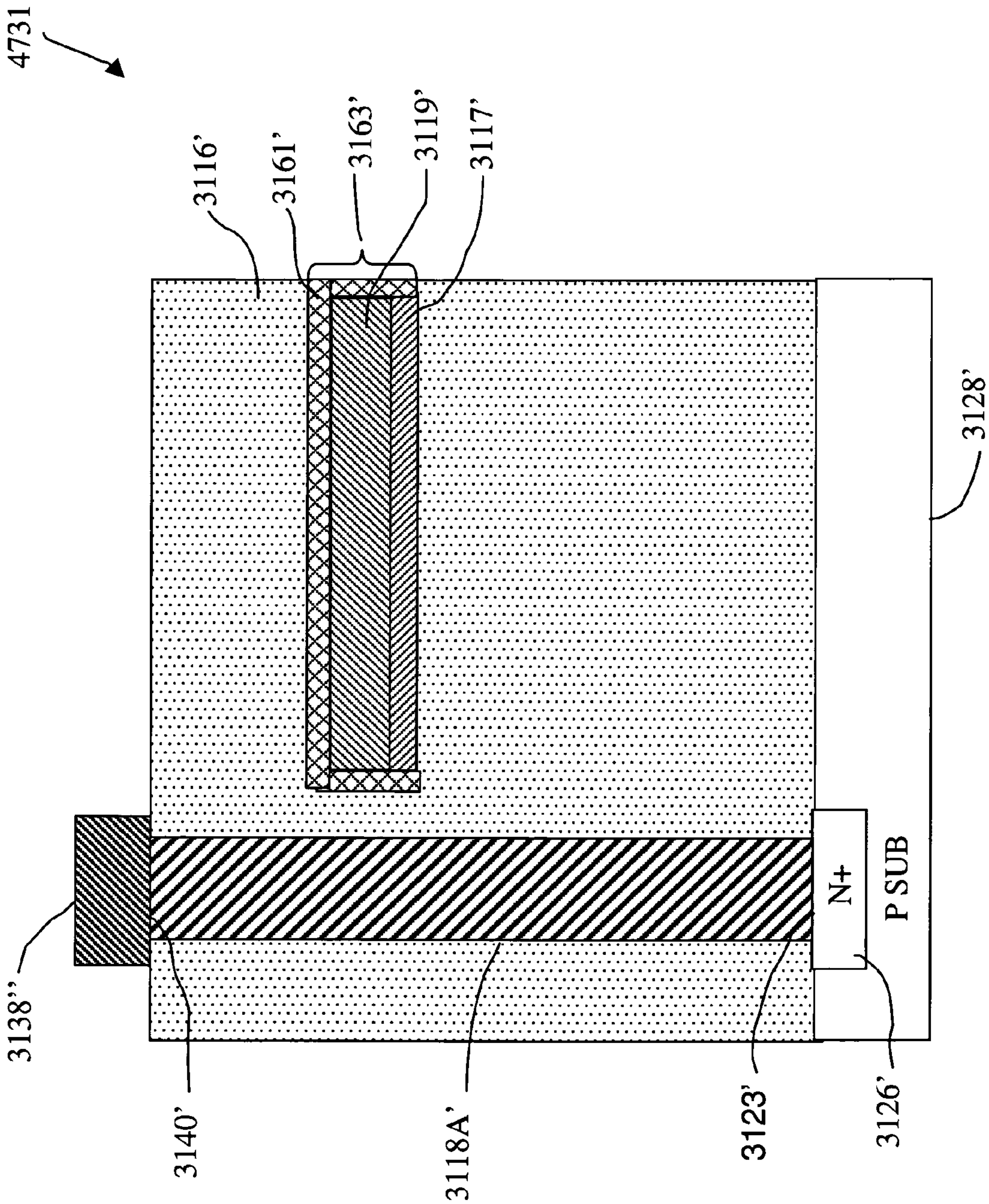

Method of Making Field Effect Device with Controllable Drain and NT-on-Drain Memory System and Circuits with Parallel Bit and Reference Array Lines, and Parallel Word and Release Array Lines Methods of fabricating NT-on-drain memory arrays are the same as those used to fabricate NT-on-source memory arrays. Methods 3000 shown in FIG. 22 and associated figures; methods 3004 shown in FIGS. 23 and 23' and associated figures; methods 3036 shown in FIG. 26 and associated figures; methods 3006 shown in FIGS. 27 and 27' and associated figures; methods 3008 shown in FIGS. 28 and 28' and associated figures; and methods 3144 as illustrated in FIGS. 31A–31D. Conductors, semiconductors, insulators, and nanotubes are formed in the same sequence and are in the same relative position in the structure. Length, widths, thickness dimensions may be different, reflecting differences in design choices. Also, conductor materials may be different, for example. The function of some electrodes may be different for NT-on-source and NT-on-drain memory arrays. For example, bit array lines and reference lines connect to different electrodes in the nanotube structure as may be seen further below. Also, connections to source and drain diffusions are different. For NT-on-source memory arrays, the switch-plate of the nanotube structure is connected to the source diffusion of the FET device. However, for NT-on-drain memory arrays, the switch-plate of the nanotube structure is connected to the drain diffusion of the FET device, as may be seen further below. Differences between NT-on-source and NT-on-drain memory arrays may be seen by comparing figures: 30M' and 44A; FIGS. 30N and 44B; FIGS. 30P and 44C; FIGS. 32A and 45A; FIGS. 32B and 45B; FIGS. 32C and 45C; FIGS. 33A and 46A; FIGS. 33B and 46B; FIGS. 33C and 46C; and FIGS. 33D and 46D.

Figure 44A:
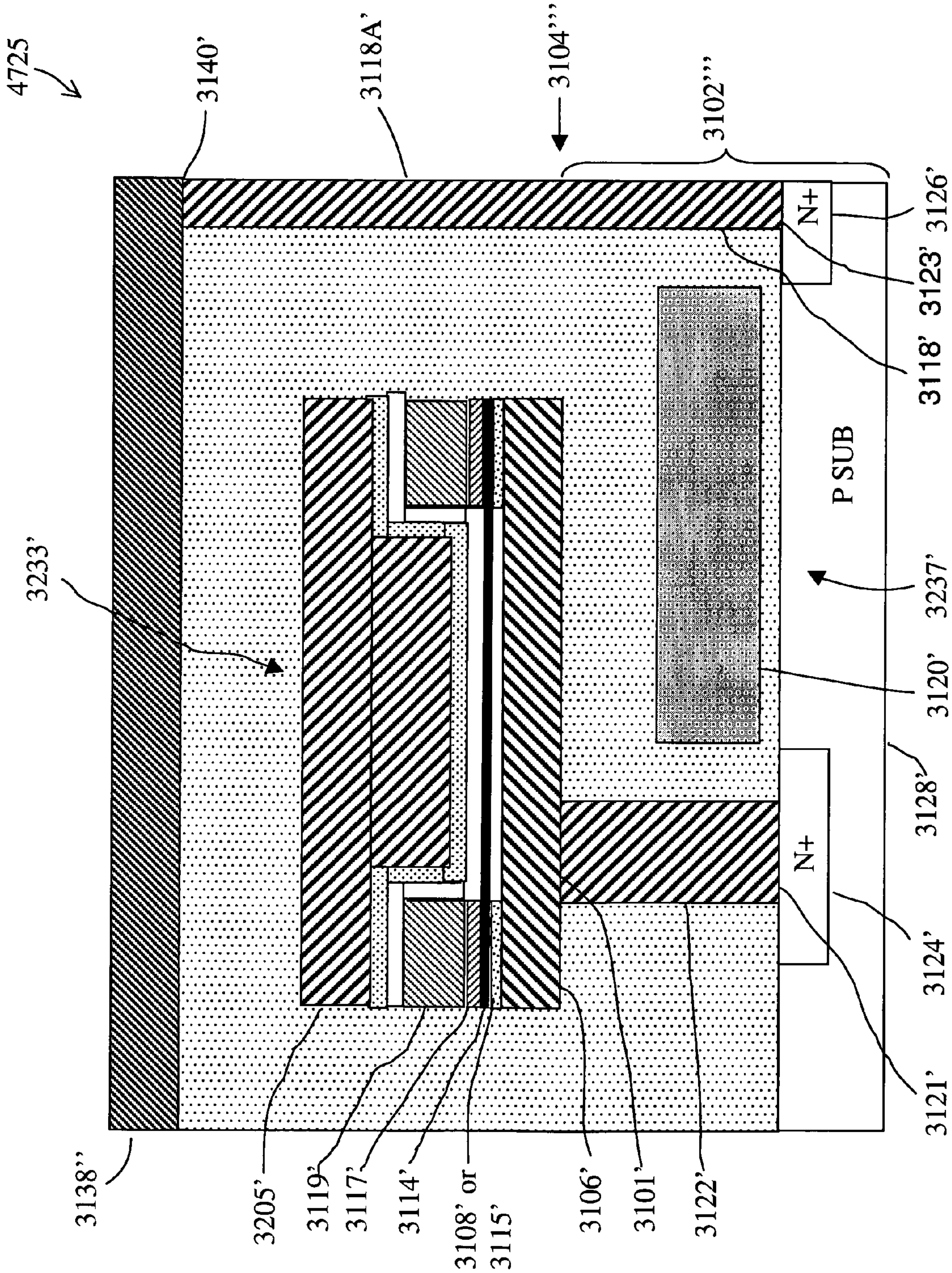
FIGS. 44A–B illustrate cross sections of memory arrays according to aspects of the invention.
Figure 44C:
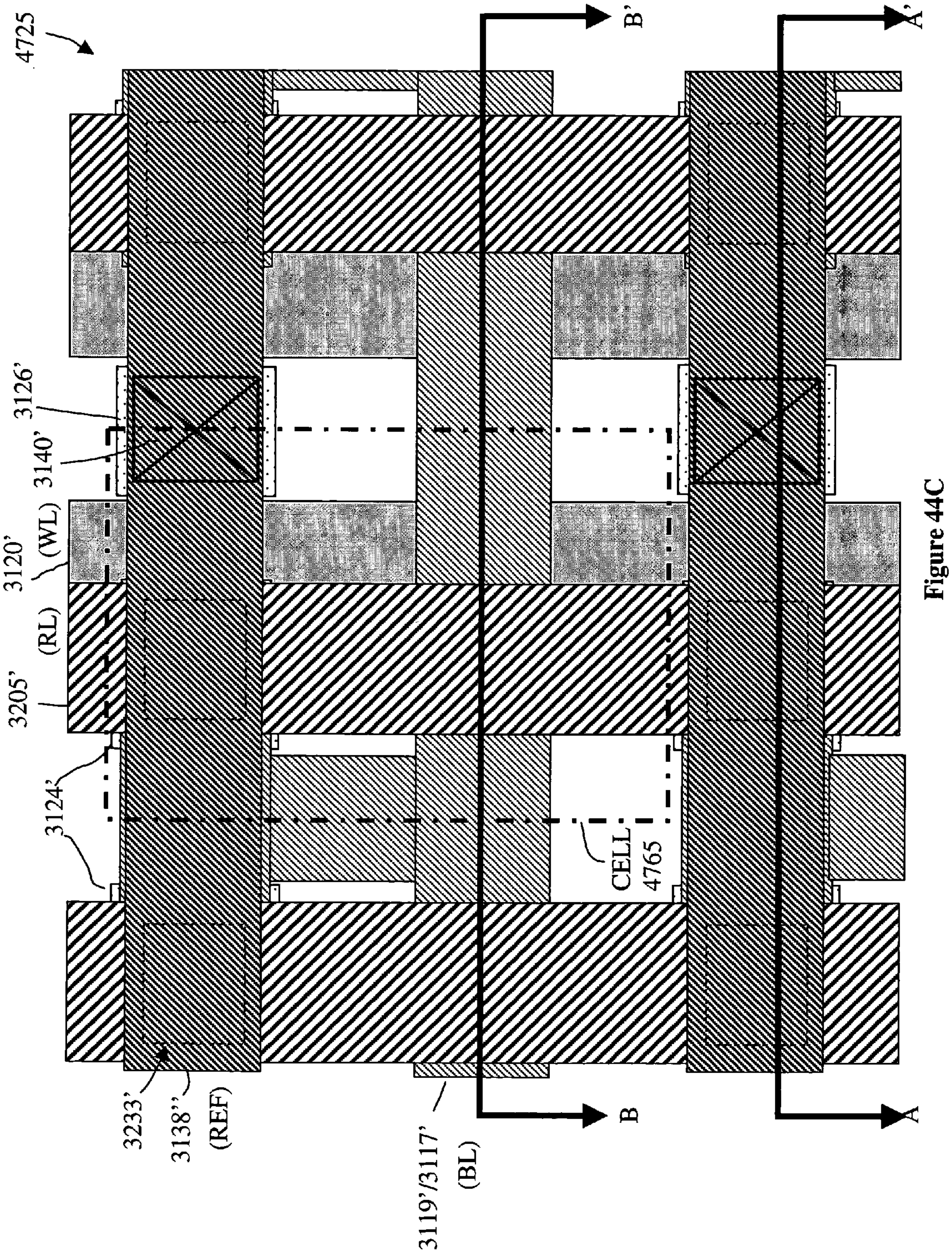
FIG. 44C illustrates a plan view of a memory array structure according to one aspect of the invention.

FIG. 44A illustrates cross section A–A' of array 4725 taken at A–A' of the plan view of array 4725 illustrated in FIG. 44C, and shows FET device region 3237' in the FET length direction, nanotube switch structure 3233', interconnections and insulators. FIG. 44B illustrates cross section B–B' of array 4725 taken at B–B' of plan view of array 4725 illustrated in FIG. 44C, and shows a release array line 3205', a bit array line 3119'/3117' composed of combined conductors 3119' and 3117', and a word array line 3120'. FIG. 44C illustrates a plan view of array 4725 including exemplary cell 4765 region, reference array line 3138" contacting source 3126' through contact 3140' to stud 3118A', to stud 3118', to contact 3123' (3118A', to stud 3118', to contact 3123' not shown in plan view 4725), and to source 3126'. Bit array line 3119'/3117' is parallel to reference line 3138", is illustrated in cross section in FIG. 44B, and contacts a corresponding bit line segment in the picture frame region formed by combined conductors 3117' and 3119', in contact with nanotube 3114', as shown in FIG. 44A. Release array line 3205' is parallel to word array line 3120'. Release line 3205' contacts and forms a portion of release electrode 3205' as illustrated in the nanotube switching region of FIG. 44A. This nanotube switching region is illustrated as nanotube switch structure 3233' in array 4725 of FIG. 44C. In terms of minimum technology feature size, NT-on-drain cell 4765 is approximately 12 to 13 $F^2$. Nanotube-on-drain array 4725 structures illustrated in FIGS. 44A, 44B, and 44C correspond to nanotube-on-drain array 4700 schematic representations illustrated in FIG. 40. Bit line 3119'/3117' structures correspond to any of bit lines BL0 to BLm-1 schematic representations; reference line 3138" structures correspond to any of reference lines REF0 to REFm-1 schematic representations; word line 3120' structures correspond to any of word lines WL0 to WLn-1 schematic representations; release line 3205' structures correspond to any of release lines RL0 to RLn-1 schematic representations; source contact 3140' structures correspond to any of source contacts 4720 schematic representations; nanotube switch structures 3233' correspond to any of NT0,0 to NTm-1,n-1 schematic representations; FET 3237' structures correspond to any of FETs T0,0 to Tm-1, n-1 schematic representations; and exemplary cell 4765 corresponds to any of cells C0,0 to cell Cm-1,n-1 schematic representations. Switch plate 3106' is connected to drain 3124' through contact 3101', conductive stud 3122', and contact 3121'. Drain 3124' is in substrate 3128'.

It is desirable to enhance array 4725 illustrated in plan view FIG. 44C by enhancing wireability, for example, or cell density, for example. In order to minimize the risk of shorts caused by misaligned via (vertical) connections between conductive layers, it is desirable to coat the top and sides of some selected conductors with an additional insulating layer that is not etched when etching the common insulator (common insulator $SiO_2$, for example) between conductive layers as illustrated by structure 3227 in FIG. 31D. A method such as Method 3144 of coating a conductive layer with an additional insulating layer to form insulated conductor structure 3227 as described with respect to structures illustrated in FIGS. 31A–31D may be applied to structures as illustrated further below.

It is desirable to enhance the wireability of array 4725 illustrated in FIG. 44C by forming bit array line 3138'" on the same wiring level and at the same time as reference line 3138". Bit array line 3138'" contacts bit line segments 3119'/3117' composed of combined conductors 3119' and 3117' as illustrated further below. Line segments 3119'/3117' are not required to span relatively long sub-array regions and may be optimized for contact to nanotube layer 3114'.

FIG. 45A illustrates cross section A–A' of array 4729 taken at A–A' of the plan view of array 4729 illustrated in FIG. 45C, and shows FET device region 3237' in the FET length direction, nanotube switch structure 3233', interconnections and insulators. FIG. 45B illustrates cross section B–B' of array 4729 taken at B–B' of plan view of array 4729 illustrated in FIG. 45C, and shows a release array line 3205' with insulating layer 3149' corresponding to insulating layer 3148 in structure 3227 (FIG. 31D), a bit array line 3138'" in contact with conductor 3119' of combined conductors 3119' and 3117', and a word array line 3120'. Bit array line 3138'" contacts conductor 3119' through contact 3155', to stud 3157', through contact 3159', to conductor 3119'. Insulator 3149' is used to prevent contact between release line conductor 3205' and stud 3157' in case of stud 3157' misalignment. FIG. 45C illustrates a plan view of array 4729 including exemplary cell 4767 region, with reference array line 3138" contacting source 3126' through contact 3140' to stud 3118A', to stud 3118', to contact 3123', (stud 3118A', stud 3118' and contact 3123' not shown in plan view 4725) and to source 3126'. Reference array line 3118" is on the same array wiring layer and parallel to bit line 3138'", as is illustrated in plan view of array 4729 in FIG. 45C, and bit line 3138'" contacts a corresponding bit line segment 3119', as shown in FIG. 45B. Release array line 3205' is parallel to word array line 3120'. Portions of release line 3205' act as release electrode 3205' as illustrated in the nanotube switching region of FIG. 45A. This nanotube switching region is illustrated as nanotube switch structure 3233' in array 4729 of FIG. 45C. In terms of minimum technology feature size, NT-on-drain cell 4767 is approximately 12 to 13 $F^2$. Nanotube-on-drain array 4729 structures illustrated in FIGS. 45A, 45B, and 45C correspond to nanotube-on-drain array 4700 schematic representation illustrated in FIG. 40. Bit line 3138'" structures correspond to any of bit lines BL0 to BLm-1 schematic representations; reference line 3138" structures correspond to any of reference lines REF0 to REFm-1 schematic representations; word line 3120' structures correspond to any of word lines WL0 to WLn-1 schematic representations; release line 3205' structures correspond to any of release lines RL0 to RLn-1 schematic representations; source contact 3140' structures correspond to any of source contacts 4720 schematic representations; nanotube switch structure 3233' correspond to any of NT0,0 to NTm-1,n-1 schematic representations; and FET 3237' structures correspond to any of FET T0,0 to Tm-1, n-1 schematic representations; and exemplary cell 4767 corresponds to any of cells C0,0 to cell Cm-1,n-1 schematic representations.

It is desirable to enhance the density of array 4725 illustrated in FIG. 44C to reduce the area of each bit in the array, resulting in higher performance, lower power, and lower cost due to smaller array size. Smaller array size results in the same number of bits occupying a reduced silicon chip area, resulting in increased productivity and therefore lower cost, because there are more chips per wafer. Cell area is decreased by reducing the size of nanotube switch region 3233', thereby reducing the periodicity between nanotube switch regions 3233', and correspondingly reducing the spacing between reference lines 3138" and bit lines 3119'/3117'.

Figure 46D:
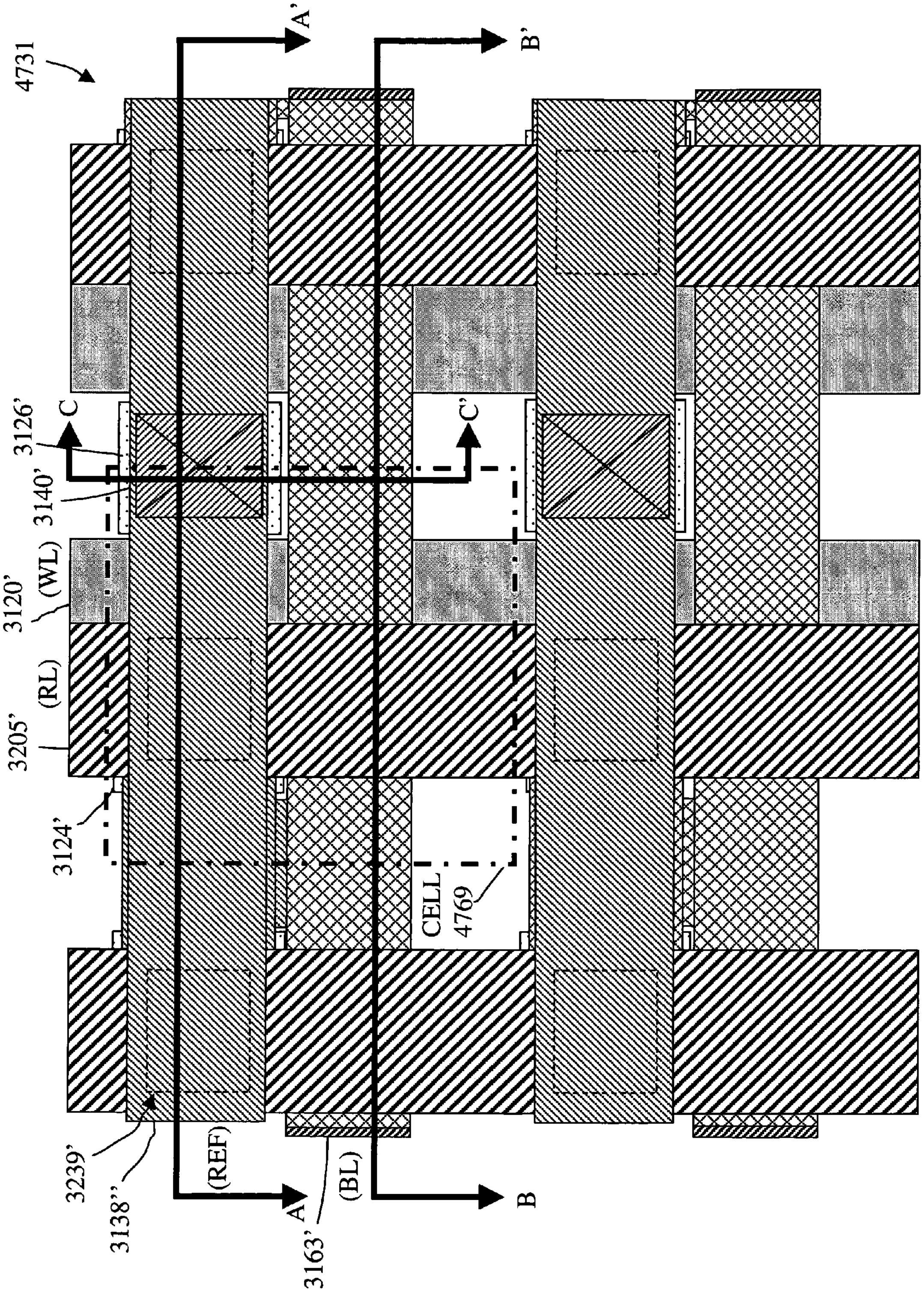
FIG. 46D illustrates a plan view of a memory array structure according to one aspect of the invention.

FIG. 46A illustrates cross section A–A' of array 4731 taken at A–A' of the plan view of array 4731 illustrated in FIG. 46D, and shows FET device region 3237' in the FET length direction, reduced area (smaller) nanotube switch structure 3239', interconnections and insulators. A smaller picture frame opening is formed in combined conductors 3119' and 3117' by applying sub-lithographic method 3036 shown in FIG. 26 and corresponding sub-lithographic structures shown in FIGS. 29D, 29E, and 29F during the fabrication of nanotube switch structure 3239'. FIG. 46B illustrates cross section B–B' of array 4731 taken at B–B' of plan view of array 4731 illustrated in FIG. 46D, and shows reference line 3163' comprising conductive layers 3117' and 3119', and conformal insulating layer 3161'. Conductive layers 3117' and 3119' of reference line 3163' are extended to form the picture frame region of nanotube device structure 3239', however, insulating layer 3161' is not used as part of the nanotube switch structure 3239'. FIG. 46B also illustrates release line 3205', and word array line 3120'. FIG. 46C illustrates cross section C–C' of array 4731 taken at C–C' of the plan view of array 4731 illustrated in FIG. 46D. Reference line 3138" is connected to source diffusion 3126' through contact 3140', to stud 3118A', and through contact 3123'. In order to achieve greater array density, there is a small spacing between stud 3118A' and reference line 3163'. Insulator 3161' is used to prevent electrical shorting between stud 3118A' and reference line 3163' conductors 3119' and 3117' if stud 3118A' is misaligned. FIG. 46D illustrates a plan view of array 4731 including exemplary cell 4769 region, with reference array line 3138" contacting source 3126' as illustrated in FIG. 46C, bit array lines 3163' parallel to reference line 3138" but on a different array wiring level (wiring plane). Release array line 3205' is parallel to word array line 3120'. Release line 3205' contacts and forms a portion of release electrode 3205' as illustrated in the nanotube switching region of FIG. 46A. Exemplary cell 4769 area (region) is smaller (denser) than exemplary cell 4767 area shown in FIG. 45C and exemplary cell 4765 area shown in FIG. 44C, and therefore corresponding array 4731 is denser (occupies less area) than corresponding array areas of array 4729 and 4725. The greater density (smaller size) of array 4731 results in higher performance, less power, less use of silicon area, and therefore lower cost as well. In terms of minimum technology feature size, NT-on-drain cell 4769 is approximately 10 to 11 $F^2$. Nanotube-on-drain array 4731 structures illustrated in FIGS. 46A–46D correspond to nanotube-on-drain array 4700 schematic representation illustrated in FIG. 40. Bit line 3163' structures correspond to any of bit lines BL0 to BLm-1 schematic representations; reference line 3138" structures correspond to any of reference lines REF0 to REFm-1 schematic representations; word line 3120' structures correspond to any of word lines WL0 to WLn-1 schematic representations; release line 3205' structures correspond to any of release lines RL0 to RLn-1 schematic representations; source contact 3140' structures correspond to any of source contacts 4720 schematic representations; nanotube switch structure 3239' correspond to any of NT0,0 to NTm-1,n-1 schematic representations; and FET 3237' structures correspond to any of FET T0,0 to Tm-1, n-1 schematic representations; and exemplary cell 4769 corresponds to any of cells C0,0 to cell Cm-1,n-1 schematic representations.

Nanotube Random Access Memory Using FEDs with Controllable Gates

Nanotube Random Access Memory (NRAM) Systems and Circuits, with Same

Non-volatile field effect devices (FEDs) 180, 200, 220, and 240 with controllable gates may be used as cells and interconnected into arrays to form non-volatile nanotube random access memory (NRAM) systems. The memory cells contain a single element that combines both select and storage functions, and is referred to as a nanotube transistor (NT-T). By way of example, FED12 240 (FIG. 2L) is used to form a non-volatile NRAM memory cell that is also referred to as a NT-on-Gate memory cell.

NT-on-Gate NRAM Memory Systems and Circuits with Parallel Bit and Release Lines, and Parallel Word and Reference Lines NRAM 1NT-T memory arrays are wired using four lines. Word line WL is used to gate combined nanotube/select device NT-T, bit line BL is attached to a shared drain between two adjacent combined nanotube/select devices. Reference line REF is attached to a shared source between two adjacent nanotube/select devices and is grounded. Release line RL is used to control a release-plate of a combined nanotube/select device. In this NRAM array configuration, RL is parallel to BL and acts as second bit line, and REF is parallel to WL, and REF is grounded.

Figure 47A:
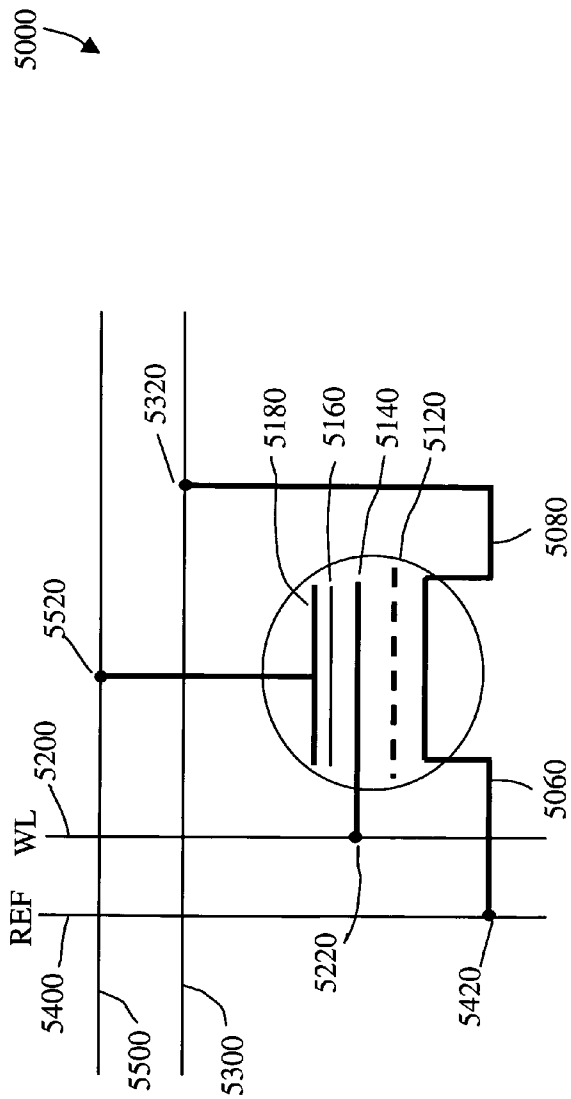
FIGS. 47A–C illustrate schematics of circuitry for a non-volatile field effect device according to aspects of the invention.
Figure 47B:
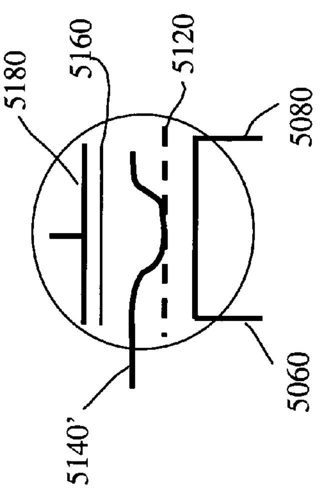
Figure 47C:
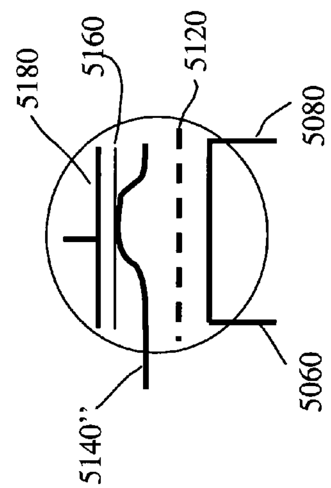

FIG. 47A depicts non-volatile field effect device 240 with memory cell wiring to form NT-on-Gate memory cell 5000 schematic. Word line (WL) 5200 connects to terminal T1 of FED12 240; bit line (BL) 5300 connects to terminal T2 of FED12 240; reference line (REF) 5400 connects to terminal T3 of FED12 240; and release line (RL) 5500 connects to terminal T4 of FED12 240. Memory cell 5000 performs write and read operations, and stores the information in a non-volatile state. The FED12 240 layout dimensions and operating voltages are selected to optimize memory cell 5000. Memory cell 5000 FET combined nanotube/select device controllable gate 5120 corresponds to a combination of gate 242 and switch plate 248; drain 5080 corresponds to drain 244; and source 5060 corresponds to source 246. Memory cell 5000 combined nanotube/select device control gate and NT switch 5140 corresponds to NT switch 250; release-plate insulator layer surface 5160 corresponds to release-plate insulator layer surface 256; and release-plate 5180 corresponds to release-plate 254. The interconnections between the elements of memory cell 5000 schematic correspond to the interconnection of the corresponding interconnections of the elements of FED12 240. BL 5300 connects to drain 5080 through contact 5320; REF 5400 connects to source 5060 through contact 5420; RL 5500 connects to release-plate 5180 by contact 5520; WL 5200 interconnects to combined nanotube/select device NT switch control gate 5140 by contact 5220. The non-volatile NT switching element 5140 may be caused to deflect toward combined switch-plate controllable gate 5120 via electrostatic forces to closed ("ON") position 5140' to store a logic "1" state as illustrated in FIG. 47B. The van der Waals force holds NT switch 5140 in position 5140'. In position 5140' combined switch plate controllable gate 5120 is at the same voltage as NT switch control gate 5140'. Alternatively, the non-volatile NT switching element 5140 may be caused to deflect to insulator surface 5160 on release-plate 5180 via electrostatic forces to open ("OFF") position 5140" to store a logic "0" state as illustrated in FIG. 47C. The van der Waals force holds NT switch 5140 in position 5140". In position 5140" combined switch-plate controllable gate 5120 is floating (not connected). When combined switch plate controllable gate 5120 is not connected to a terminal, its voltage is determined by the internal capacitance network as illustrated in FIG. 13A and FIG. 14. Combined switch plate controllable gate 5120 is a combination of elements 242, 243, and 248 as illustrated in more detail in cross section 400 in FIG. 14. $C_{CH-SUB}$ is not in the internal device capacitance network because bit lines BL and reference lines REF are held at zero volts during the write operation. When combined switch plate controllable gate 5120 is floating, its voltage $V_G$ may be calculated as $V_G=V_{CG}\times C_{1G}/(C_{1G}+C_{G-CH})$, where $V_{CG}$ is the voltage of NT switch control gate 5140. Capacitance $C_{1G}$ is designed for a desired capacitance ratio relative to device gate capacitance $C_{G-CH}$. For $C_{1G}=0.25\times C_{G-CH}$, $V_G=0.2\times V_{CG}$. The non-volatile element switching via electrostatic forces is as depicted by element 250 in FIG. 2L. Voltage waveforms 375 used to generate the required electrostatic forces are illustrated in FIG. 15.

NT-on-Gate schematic of memory cell 5000 forms the basis of a non-volatile storage (memory) cell. The device may be switched between closed storage state "1" (switched to position 5140') and open storage state "0" (switched to position 5140"), which means the controllable gate may be written to an unlimited number of times as desired. In this way, the device may be used as a basis for a non-volatile nanotube random access memory, which is referred to here as a NRAM array, with the 'N' representing the inclusion of nanotubes. In the NT-on-gate structure, no dc current flows through the switch-plate to NT fabric contact, maximizing cyclability (maximum number of ON/OFF cycles).

Figure 48:
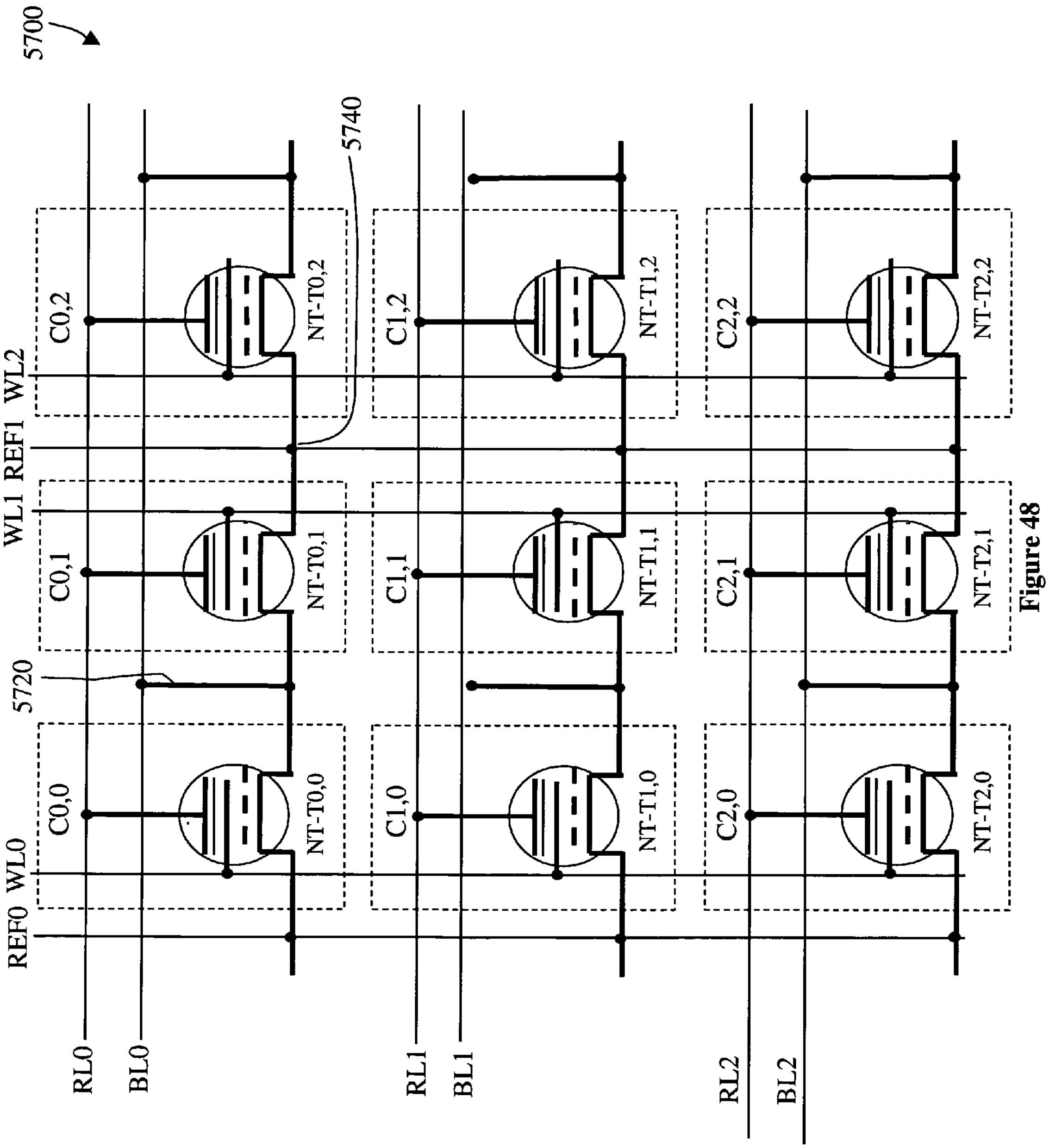
FIG. 48 illustrates a schematic of an NRAM system according to one aspect of the invention.

FIG. 48 represents an NRAM system 5700, according to preferred embodiments of the invention. Under this arrangement, an array is formed with m×n (only exemplary portion being shown) of non-volatile cells ranging from cell C0,0 to cell C2,2. NRAM system 5700 may be designed using one large m×n array, or several smaller sub-arrays, where each sub-array is formed of m×n cells. Non-volatile cell C0,0 contains a single combined nanotube/select device NT-T0,0. To access selected cells, the array uses read and write word lines (WL0, WL1, WL2), read bit lines (BL0, BL1, BL2), grounded reference lines (REF0, REF1), and write release lines (behave as write bit lines) (RL0, RL1, RL2). The NT switch control gate of NT-T0,0 is coupled to WL0, the drain of NT-T0,0 is coupled to BL0, the source of NT-T0,0 is coupled to REF0, and the release-plate of NT-T0,0 is coupled to RL0. Connection 5720 connects BL0 to shared drain of select devices NT-T0,0 and NT-T0,1. Connection 5740 connects REF1 to shared source of select devices NT-T0,1 and NT-T0,2. Word, bit, reference, and release decoders/drivers are explained further below.

Under preferred embodiments, nanotubes in array 5700 may be in the "ON" "1" state or the "OFF" "0" state. The NRAM memory allows for unlimited read and write operations per bit location. A write operation includes both a write function to write a "1" and a release function to write a "0". By way of example, a write "1" to cell C0,0 and a write "0" to cell C1,0 is described. For a write "1" operation to cell C0,0, combined nanotube/select device NT-T0,0 is activated when WL0 transitions from 0 to $V_{SW}$, BL0 has transitioned from $V_{DD}$ to 0 volts prior to WL0 activation, RL0 transitions from $V_{DD}$ to switching voltage $V_{SW}$, and REF0 remains at zero. The release-plate and combined NT-switch-control-gate of the non-volatile combined nanotube/select device NT0,0 are each at $V_{SW}$ resulting in zero electrostatic force (because the voltage difference is zero). The zero BL0 voltage is applied to the drain, and zero REF0 reference is applied to the source of combined nanotube/select device NT-T0,0. The difference in voltage between the NT0,0 combined NT-switch-control-gate and the combined switch-plate-gate is $V_{SW}-0.2V_{SW}$, and generates an attracting electrostatic force. If $V_{SW}-0.2V_{SW}$ exceeds the nanotube threshold voltage $V_{NT-TH}$($V_{SW}>1.25V_{NT-TH}$), then the nanotube structure switches to "ON" state or logic "1" state, that is, combined NT-switch-control-gate and combined switch-plate-gate are electrically connected as illustrated in FIG. 47B. If NT-T0,0 was in the "1" state at the onset of the write "1" cycle, it remains in the "1" state. The near-Ohmic connection between combined switch-plate-gate 5120 and combined NT-switch-control-gate 5140 in position 5140' represents the "ON" state or "1" state. If the power source is removed, cell C0,0 remains in the "ON" state.

For a write "0" (release) operation to cell C1,0, combined nanotube/select device NT-T1,0 is activated when WL0 transitions from 0 to $V_{SW}$ and drives combined NT-switch-control-gate to $V_{SW}$. BL1 transitioned from $V_{DD}$ to 0 volts prior to WL0 activation, RL1 transitions from $V_{DD}$ to zero volts, and REF0 remains at zero volts. If cell C1,0 is in the "1" state, then switching voltage $V_{SW}$ is applied to the combined switch-plate-gate of NT-T1,0. There is no electrostatic force between combined switch-plate-gate and combined NT-switch-control-gate. The non-volatile storage element NT1,0 release-plate is at switching voltage zero and the combined NT-switch-control-gate is at switching voltage $V_{SW}$ generating an attracting electrostatic force. If $V_{SW}$ exceeds the nanotube threshold voltage $V_{NT-TH}$, the nanotube structure switches to the "OFF" state or logic "0" state, that is, the nanotube NT switch and the surface of the release-plate insulator are in contact as illustrated in FIG. 47C. If NT-T1,0 was in the "0" state at the onset of the write "0" cycle, it remains in the "0" state. The non-conducting contact between insulator surface 5160 on release-plate 5180 and combined NT-switch-control-gate 5140 in position 5140" represents the "OFF" state or "0" state. If the power source is removed, cell C1,0 remains in the "OFF" state.

An NRAM read operation does not change (destroy) the information in the activated cells, as it does in a DRAM, for example. Therefore the read operation in the NRAM is characterized as a non-destructive readout (or NDRO) and does not require a write-back after the read operation has been completed. In this example, Cell C0,0 combined nanotube/select device NT-T0,0 stores a "1" state as illustrated in FIG. 47B. The electrical characteristics (source-drain current $I_{SD}$ vs combined switch-plate-gate) depend on the stored logic state ("1" state or "0" state). Combined nanotube/select device NT-T0,0 is field effect device (FED) 240 (FIG. 2L) with structure 400 (FIG. 14) used in cell 5000, and memory array 5700, and exhibits electrical characteristic 385, as illustrated in FIG. 16. FED12 240, NT switch 250 and position 250', correspond to NT-T0,0 combined NT-switch-control-gate 5140 position 5140'. NT-switch-control-gate 5140 is connected to WL0 (which corresponds to $V_{T1}$ in FIG. 16). During read, BL0 is precharged to $V_{DD}$ and allowed to float. WL0 transitions from zero to $V_{DD}$ (1.2 volts, for example). For a stored logic "1" state, the FET threshold voltage $V_{FET-TH}$=0.4 volts is exceeded by 0.8 volts and BL0 is discharged. The change in BL0 voltage is detected by a sense amplifier/latch, and a logic "1" state is stored in the latch. BL0, in contact with NT-T0,0 drain 5080, discharges through conductive channel of resistance $R_{FET}$ to the grounded source terminal 5060. The combined NT-switch-control-gate 5140 contacts combined switch-plategate 5120 of NT-T0,0 through conductor to NT contact resistances $R_C$ and NT switch to switch-plate resistance $R_{SW}$. $R_C$+$R_{SW}$ are not in the discharge path for a NT-on-gate cell.

In this example, cell C1,0 combined nanotube/select device NT-T1,0 stores a "0" state as illustrated in FIG. 47C. For a read operation of cell C1,0, BL1 is precharged high to $V_{DD}$ and allowed to float. WL0 is driven high to $V_{DD}$ (1.2 volts, for example). WL0 voltage $V_{DD}$ is capacitively coupled to combined switch-plate-gate 5120 by the internal capacitance network illustrated in FIG. 14, resulting in an FET-gate voltage of 0.24 volts (0.2×1.2 volts). Since the FET gate voltage is less than $V_{FET-TH}$=0.4 volts (electrical characteristic 385, FIG. 16), there is no conductive path between drain 5080 and source 5060, and BL1 is not discharged. Sense amplifier/latch circuit (not shown) does not detect a voltage drop and the latch is set to a logic "0" state.

Figure 49:
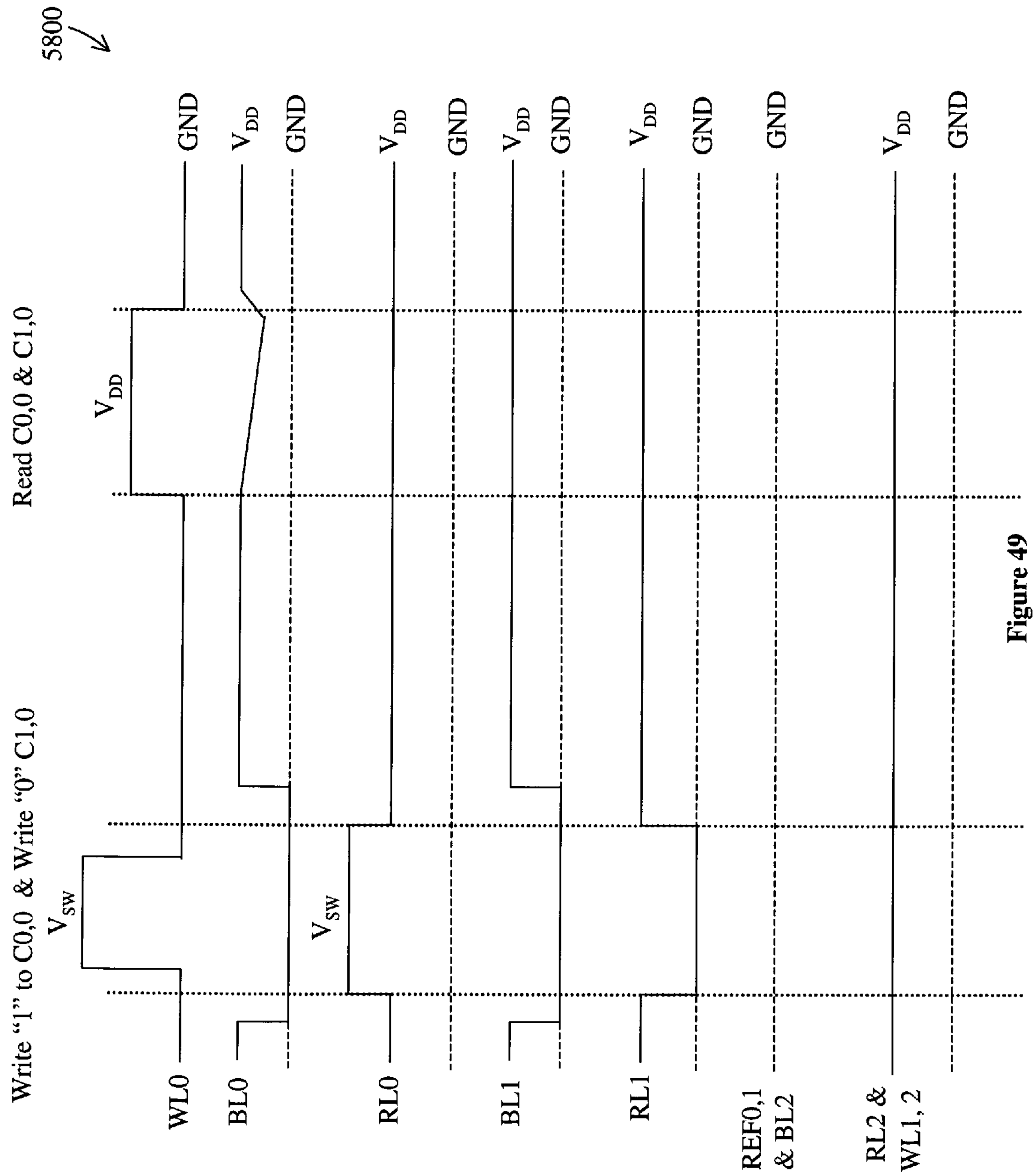
FIG. 49 illustrates operational waveforms of a memory array according to one aspect of the invention.

FIG. 49 illustrates the operational waveforms 5800 of memory array 5700 of FIG. 48 during read, write "1", and write "0" operations for selected cells, while not disturbing unselected cells (no change to unselected cell stored logic states). Waveforms 5800 illustrate voltages and timings to write logic state "1" in cell C0,0, write a logic state "0" in cell C1,0, read cell C0,0, and read cell C1,0. Waveforms 5800 also illustrate voltages and timings to prevent disturbing the stored logic states (logic "1" state and logic "0" state) in partially selected (also referred to as half-selected) cells. Partially selected cells are cells in memory array 5700 that receive applied voltages because they are connected to (share) word, bit, reference, and release lines that are activated as part of the read or write operation to the selected cells. Cells in memory array 5700 tolerate unlimited read and write operations at each memory cell location.

At the start of the write cycle, BL0 transitions from $V_{DD}$ to zero volts, connecting the drain to ground. REF0 is at zero volts connecting source to ground. BL1 and BL2 transition from $V_{DD}$ to zero volts connecting all drains to ground. REF1 and REF2 are also at zero volts connecting all sources to ground. WL0 transitions from zero to $V_{SW}$, activating select devices NT-T0,0, NT-T1,0, NT-T2,0. Word lines WL1, WL2 are not selected and remain at zero volts. RL0 transitions from $V_{DD}$ to switching voltage $V_{SW}$, connecting the release-plates combined nanotube/select device NT-T0, 0, NT-T0,1, and NT-T0,2 to $V_{SW}$. RL1 transitions from $V_{DD}$ to zero volts, connecting the release-plates of combined nanotube/select devices NT-T1,0, NT-T1,1, and NT-T1,2, to zero volts. RL2 remains at $V_{DD}$, connecting the release-plates of NT-T3,0 to $V_{DD}$. REF0 transitions from $V_{DD}$ to switching voltage $V_{SW}$, connecting NT switches of non-volatile storage elements NT0,0, NT1,0 . . . NTm-1,0 to $V_{SW}$. REF1, REF2 . . . REFn-1 remain at $V_{DD}$, connecting NT switches of non-volatile storage elements NT0,1 to NTn-1,n-1 to $V_{DD}$.

NT-T0,0 may be in "ON" ("1" state) or "OFF" ("0" state) state at the start of the write cycle. It will be in "ON" state at the end of the write cycle. If NT-T0,0 in cell C0,0 is "OFF" ("0" state) it will switch to "ON" ("1" state) since the voltage difference between combined NT-switch-control-gate and release-plate is zero, and the voltage difference between combined NT-switch-control-gate and combined switch-plate-gate is $V_{SW}$–0.2 $V_{SW}$ because of the internal device capacitance coupling network. Therefore, $V_{SW}$ must be sufficiently elevated to ensure nanotube switching occurs. For $V_{NT-TH}$ in the range of 1.7 to 2.2 volts, $V_{SW}$–0.2 $V_{SW}$ must exceed 2.2 volts, therefore $V_{SW}$>2.75 volts. $V_{SW}$=2.8 volts is used in this example to ensure an "OFF" to "ON" transition. If NT-T-T0,0 in cell C0,0 is in the "ON" ("1" state), it will remain in the "ON" ("1") state. NT-T1,0 may be in "ON" ("1" state) or "OFF" ("0" state) state at the start of the write cycle. It will be in "OFF" state at the end of the write cycle. If NT-T1,0 in cell C1,0 is "ON" ("1" state) it will switch to "OFF" ("0" state) since the voltage difference between combined NT-switch-control-plate and combined switch-plate-gate is zero, and the voltage difference between NT-switch-control-plate and release-plate is $V_{SW}$. If NT-T1,0 in cell C1,0 is "OFF" ("0" state), it will remain "OFF" ("0" state). If for example, $V_{SW}$=2.4 volts, $V_{DD}$=1.2 volts, and NT switch threshold voltage range is $V_{NT-TH}$=1.7 to 2.2 volts, then for NT-T0,0 and NT-T1,0 a difference voltage $V_{SW}$>$V_{NT-TH}$ ensuring write states of "ON" ("1" state) for NT0,0 and "OFF" ("0" state) for NT1,0. Although VSW=2.4 volts ensures an "ON" to "OFF" transition, VSW=2.8 volts is used in this example to ensure "OFF" to "ON" transition.

Cells C0,0 and C 1,0 have been selected for the write operation. All other cells have not been selected, and information in these other cells must remain unchanged (undisturbed). Since in an array structure some cells other than selected cells C0,0 and C1,0 in array 5700 will experience partial selection voltages, often referred to as half-select voltages, it is necessary that half-select voltages applied to non-volatile storage element terminals be sufficiently low (below nanotube activation threshold $V_{NT-TH}$) to avoid disturbing stored information. It is also necessary to avoid parasitic current flow. For NT-on-Gate memory cells during write operations, all bit lines (connected to drain) and reference lines (connected to sources) are at zero volts, so no disturb currents flow for write "1" or write "0" operations. Release lines are used as write bit lines in NT-on-Gate memory arrays. Potential half-select disturb along activated array lines WL0 (REF0 voltage is zero) includes cell C2,0 because WL0 has been activated. Storage element NT-T2,0 will have BL2 at zero volts. To prevent undesired switching of NT-T2,0, RL2 is set at voltage $V_{DD}$. The information in storage elements NT-T2,0 in cell C2,0 is not disturbed, and there is no parasitic current. Since corresponding source and drain voltages are zero, there can be no parasitic current. If cell C2,0 is in the "ON" state, there is no disturb because the voltage difference between corresponding combined NT-switch-control-gates and corresponding release-plate is $V_{SW}$–$V_{DD}$=1.2 volts, when $V_{SW}$=2.8 volts and $V_{DD}$=1.2 volts. Since this voltage difference of 1.6 volts is less than the minimum nanotube threshold voltage $V_{NT-TH}$ of 1.7 volts, no switching takes place. If C2,0 is in the "OFF" state, then the difference in voltage between combined NT-switch-control-gate and combined switch-pate-gate is $V_{SW}$–0.2 $V_{SW}$=2.2 volts. However, for NT-T0,1 and NT-T0,2 release-plate at $V_{SW}$=2.8 volts, corresponding combined NT-switch-control-gate at $V_{DD}$, and corresponding combined switch-plate-gate at $V_{DD}$ (for ON) and 0.2 $V_{DD}$ (equals 0.24 volts for OFF), and with minimum $V_{NT-TH}$=1.7 volts, no disturb occurs.

Potential half-select disturb along activated array lines RL0 and BL0 includes cells C0,1 and C0,2 because RL0 and BL0 have been activated. RL0 drives combined nanotube/select device NT-T0,1 and NT-T0,2 release-plates to switching voltage $V_{SW}$, and WL1 and WL2 drive corresponding combined NT-switch-control-gates to $V_{DD}$. Combined nanotube/select devices NT-T0,1 and NT-T0,2 have corresponding release-plates at $V_{SW}$ and combined NT-switch-control-gates at $V_{DD}$. For a stored "1" ("ON") state, combined switch-plate-gate is at $V_{DD}$. The voltage difference $V_{SW}$–$V_{DD}$=1.6 volts, less than minimum $V_{NT-TH}$=1.7 volts, and the stored "1" ("ON") state is not disturbed. For a stored "0" ("OFF") state, combined switch-plate-gate is at 0.2 $V_{DD}$ due to internal device capacitance network coupling. The electrostatic attractive force due to $V_{DD}$–0.2 $V_{DD}$=1 volt and cannot overcome a much stronger electrostatic force due to the $V_{SW}$–$V_{DD}$=1.6 volts and close proximity between release-plate and corresponding combined NT-switch-control-gate, and the "0" ("OFF") state is not disturbed.

Potential half-select disturb along activated array lines RL1 and BL1 includes cells C1,1 and C1,2 because RL1 and BL1 have been activated. RL1 drives combined nanotube/select device NT-T0,1 and NT-T0,2 release-plates to zero volts, and WL1 and WL2 drive corresponding combined NT-switch-control-gates to $V_{DD}$. Combined nanotube/select devices NT-T1,1 and NT-T1,2 have corresponding release-plates at zero volts and combined NT-switch-control-gates at $V_{DD}$. For a stored "1" ("ON") state, combined switch-plate-gate is at $V_{DD}$. The voltage difference $V_{DD}$–0=1.2 volts, less than minimum $V_{NT-TH}$=1.7 volts, and the stored "1" ("ON") state is not disturbed. For a stored "0" ("OFF") state, combined switch-plate-gate is at 0.2 $V_{DD}$ due to internal device capacitance network coupling. The electrostatic attractive force due to $V_{DD}$–0.2 $V_{DD}$=1 volt causes a counter-balancing electrostatic, and the "0" ("OFF") state is not disturbed.

For all remaining memory array 5700 cells C2,1 and C2,2 BL2 and REL 1 and REL2 voltages are zero, so no parasitic currents can flow between drains and sources of combined nanotube/select devices NT-T2,1 and NT-T2,2. RL2 drives combined nanotube/select device NT-T2,1 and NT-T2,2 release-plates to $V_{DD}$, and WL1 and WL2 drive corresponding combined NT-switch-control-gates to $V_{DD}$. Combined nanotube/select devices NT-T2,1 and NT-T2,2 have corresponding release-plates at $V_{DD}$ and corresponding combined NT-switch-control-gates at $V_{DD}$, for a voltage difference of zero. For a stored "1" ("ON") state, combined switch-plate-gate is at $V_{DD}$, all voltage differences are zero, and the stored "1" ("ON") state is not disturbed. For a stored "0" ("OFF") state, combined switch-plate-gate is at 0.2 $V_{DD}$ due to internal device capacitance network coupling. The electrostatic attractive force due to $V_{DD}$–0.2$V_{DD}$=1 volt is much less than $V_{NT-TH}$=1.7 volts, and the "0" ("OFF") state is not disturbed.

Figure 50A:
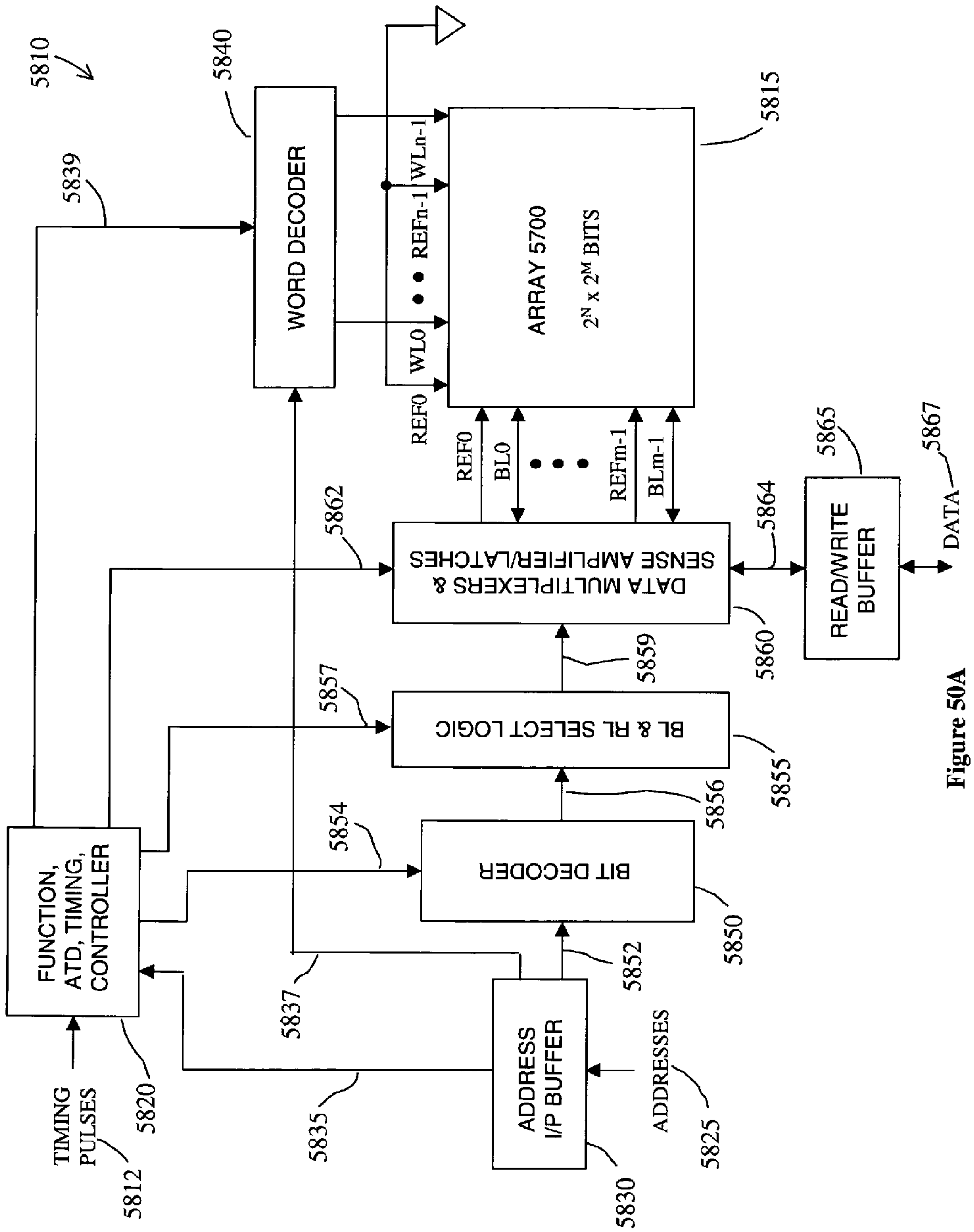
FIG. 50A illustrates a diagram outlining a memory array system according to one aspect of the invention.

Non-volatile NT-on-gate NRAM memory array 5700 with bit lines parallel to release lines is shown in FIG. 48 contains $2^N \times 2^M$ bits, is a subset of non-volatile NRAM memory system 5810 illustrated as memory array 5815 in FIG. 50A. NRAM memory system 5810 may be configured to operate like an industry standard asynchronous SRAM or synchronous SRAM because nanotube non-volatile storage cells 5000 shown in FIG. 47A, in memory array 5700, may be read in a non-destructive readout (NDRO) mode and therefore do not require a write-back operation after reading, and also may be written (programmed) at CMOS voltage levels (5, 3.3, and 2.5 volts, for example) and at nanosecond and sub-nanosecond switching speeds. NRAM read and write times, and cycle times, are determined by array line capacitance, and are not limited by nanotube switching speed. Accordingly, NRAM memory system 5810 may be designed with industry standard SRAM timings such as chip-enable, write-enable, output-enable, etc., or may introduce new timings, for example. Non-volatile NRAM memory system 5810 may be designed to introduce advantageous enhanced modes such as a sleep mode with zero current (zero power—power supply set to zero volts), information preservation when power is shut off or lost, enabling rapid system recovery and system startup, for example. NRAM memory system 5810 circuits are designed to provide the memory array 5700 waveforms 5800 shown in FIG. 49.

Figure 51:
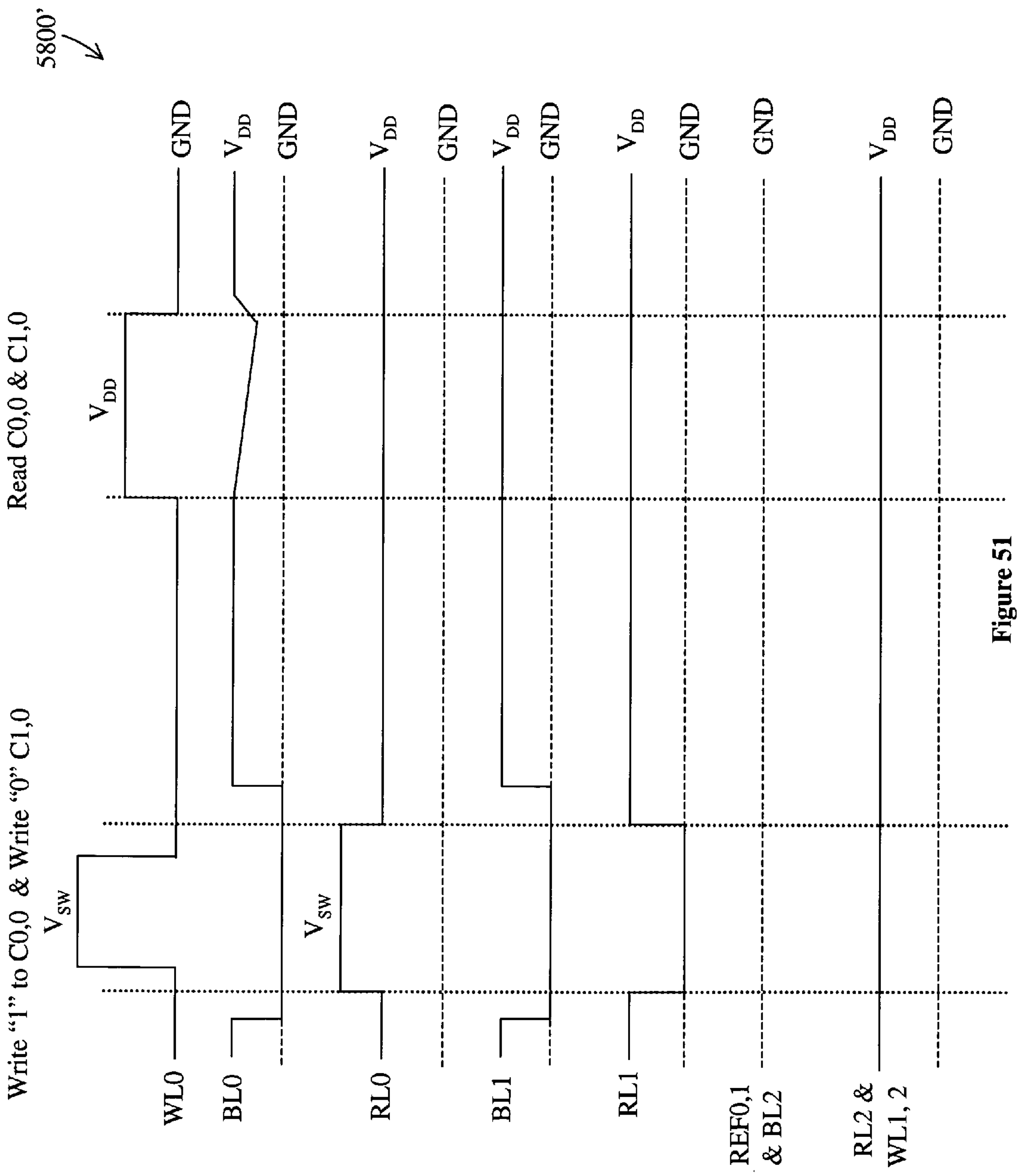
FIG. 51 illustrates operational waveforms of a memory array according to one aspect of the invention.

NRAM memory system 5810 accepts timing inputs 5812, accepts address inputs 5825, and accepts data 5867 from a computer, or provides data 5867 to a computer using a bidirectional bus sharing input/output (I/O) terminals. Alternatively, inputs and outputs may use separate (unshared) terminals (not shown). Address input (I/P) buffer 5830 receives address locations (bits) from a computer system, for example, and latches the addresses. Address I/P buffer 5830 provides word address bits to word decoder 5840 via address bus 5837; address I/P buffer 5830 provides bit addresses to bit decoder 5850 via address bus 5852; and address bus transitions provided by bus 5835 are detected by function generating, address transition detecting (ADT), timing waveform generator, controller (controller) 5820. Controller 5820 provides timing waveforms on bus 5839 to word decoder 5840. Word decoder 5840 selects the word address location within array 5815 and provides WL waveforms for both write-one, write-zero, read-one, and read-zero operations as illustrated by waveforms 5800' shown in FIG. 51. FIG. 51 NRAM memory system 5810 waveforms 5800' correspond to memory array 5700 waveforms 5800 shown in FIG. 49. Reference lines REF are grounded.

Bit address decoder 5850 is used to decode both bit lines BL and corresponding release lines RL (there is no need for a separate RL decoder) and drive bit line (BL) and release (RL) select logic 5855 via bus 5856. Controller 5820 provides timing waveforms on bus 5854 to bit decoder 5850. Controller 5820 also provides function and timing inputs on bus 5857 to BL & RL select logic 5855. BL & RL select logic 5855 uses inputs from bus 5856 and bus 5857 to generate data multiplexer select bits on bus 5859. The output of BL and RL select logic 5855 on bus 5859 is used to select control data multiplexers using combined data multiplexers & sense amplifiers/latches (MUXs & SAs) 5860. Controller 5820 provides function and timing inputs on bus 5862 to MUXs & SAs 5860, resulting in NRAM memory system 5810 on-chip BL and RL waveforms for both write-one, write-zero, read-one, and read-zero operations as illustrated by waveforms 5800' corresponding to memory array 5700 waveforms 5800 shown in FIG. 49. MUXs & SAs 5860 are used to write data provided by read/write buffer 5865 via bus 5864 in array 5815, and to read data from array 5815 and provide the data to read/write buffer 5865 via bus 5864 as illustrated in waveforms 5800', of FIG. 51.

Figure 50B:
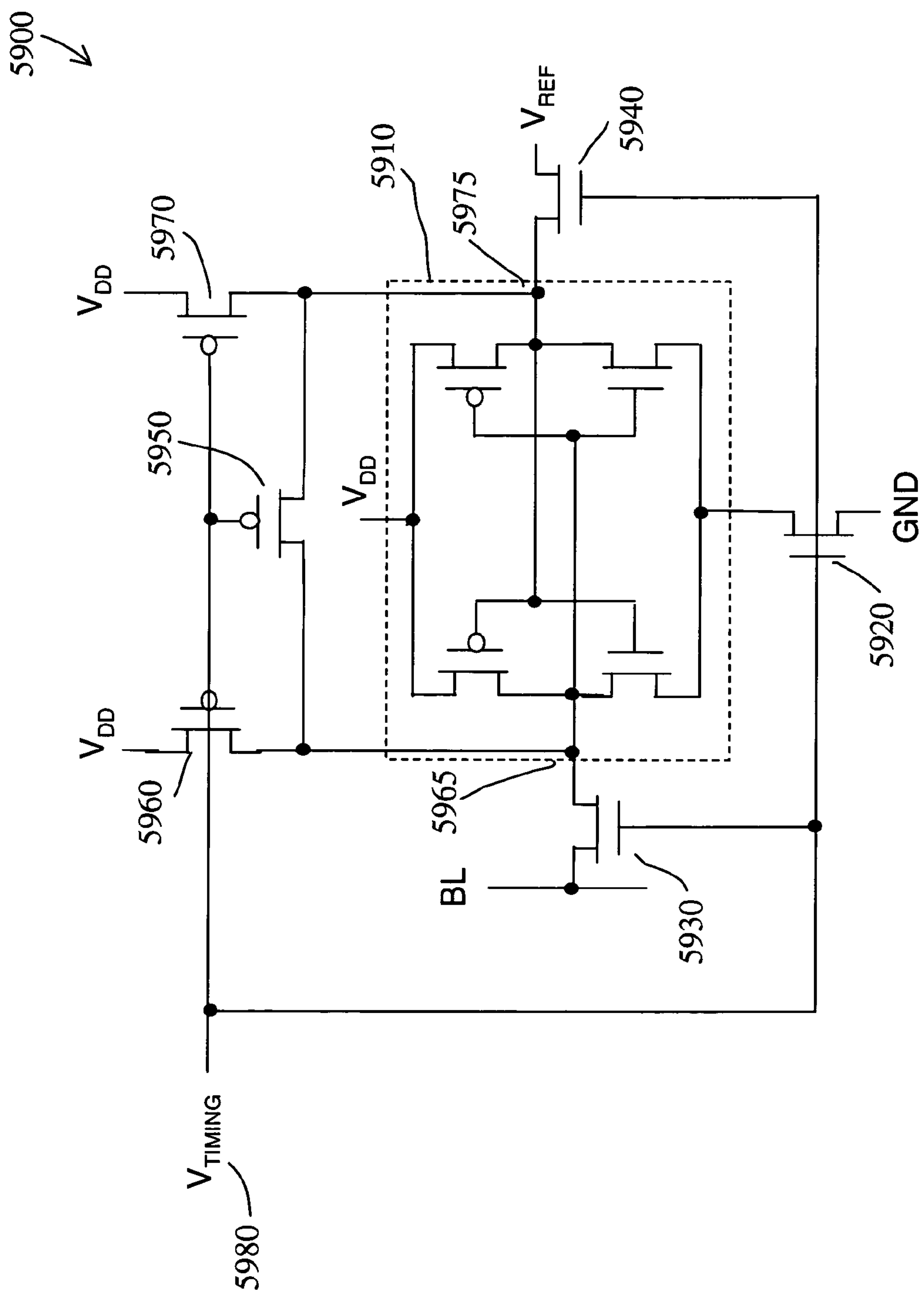
FIG. 50B is a schematic of a cell according to once aspect of the invention.

Sense amplifier/latch 5900 is illustrated in FIG. 50B. Flip flop 5910, comprising two back-to-back inverters is used to amplify and latch data inputs from array 5815 or from read/write buffer 5865. Transistor 5920 connects flip flop 5910 to ground when activated by a positive voltage supplied by control voltage $V_{TIMING}$ 5980, which is provided by controller 5820. Gating transistor 5930 connects a bit line BL to node 5965 of flip flop 5910 when activated by a positive voltage. Gating transistor 5940 connects reference voltage $V_{REF}$ to flip flop node 5975 when activated by a positive voltage. Transistor 5960 connects voltage $V_{DD}$ to flip flop 5910 node 5965, transistor 5970 connects voltage $V_{DD}$ to flip flop 5910 node 5975, and transistor 5950 ensures that small voltage differences are eliminated when transistors 5960 and 5970 are activated. Transistors 5950, 5960, and 5970 are activated (turned on) when gate voltage is low (zero, for example).

In operation, $V_{TIMING}$ voltage is at zero volts when sense amplifier 5900 is not selected. NFET transistors 5920, 5930, and 5940 are in the "OFF" (non-conducting) state, because gate voltages are at zero volts. PFET transistors 5950, 5960, and 5970 are in the "ON" (conducting) state because gate voltages are at zero volts. $V_{DD}$ may be 5, 3.3, or 2.5 volts, for example, relative to ground. Flip flop 5910 nodes 5965 and 5975 are at $V_{DD}$. If sense amplifier/latch 5900 is selected, $V_{TIMING}$ transitions to $V_{DD}$, NFET transistors 5920, 5930, and 5940 turn "ON", PFET transistors 5950, 5960, and 5970 are turned "OFF", and flip flop 5910 is connected to bit line BL and reference voltage $V_{REF}$. $V_{REF}$ is connected to $V_{DD}$ in this example. As illustrated by waveforms BL0 and BL1 of waveforms 5800',bit line BL is pre-charged prior to activating a corresponding word line (WL0 in this example). If cell 5000 of memory array 5700 (memory system array 5815) stores a "1", then bit line BL in FIG. 50B corresponds to BL0 in FIG. 51, BL is discharged by cell 5000, voltage droops below $V_{DD}$, and sense amplifier/latch 5900 detects a "1" state. If cell 5000 of memory array 5700 (memory system array 5815) stores a "0", then bit line BL in FIG. 50B corresponds to BL1 in FIG. 51, BL is not discharged by cell 5000, voltage does not droop below $V_{DD}$, and sense amplifier/latch 5900 detect a "0" state. The time from sense amplifier select to signal detection by sense amplifier/latch 5900 is referred to as signal development time. Sense amplifier/latch 5900 typically requires 100 to 200 mV relative to $V_{REF}$ in order to switch. It should be noted that cell 5000 requires a nanotube "OFF" resistance to "ON" resistance ratio of greater than 10 to 1 for successful operation. A typical bit line BL has a capacitance value of 250 fF, for example. A typical nanotube storage device (switch) or dimensions 0.2 by 0.2 um typically has 8 nanotube filaments across the suspended region, for example, as illustrated further below. For a combined contact and switch resistance of 50,000 Ohms per filament, as illustrated further below, the nanotube "ON" resistance of cell 5000 is 6,250 Ohms. For a bit line of 250 fF, the time constant RC=1.6 ns. The sense amplifier signal development time is less than RC, and for this example, is between 1 and 1.5 nanoseconds.

Non-volatile NRAM memory system 5810 operation may be designed for high speed cache operation at 5 ns or less access and cycle time, for example. Non-volatile NRAM memory system 5810 may be designed for low power operation at 60 or 70 ns access and cycle time operation, for example. For low power operation, address I/P buffer 5830 operation requires 8 ns; controller 5820 operation requires 16 ns; bit decoder 5850 operation plus BL & select logic 5855 plus MUXs & SA 5860 operation requires 12 ns (word decoder 5840 operation requires less than 12 ns) array 5815 delay is 8 ns; operation of sense amplifier 5900 requires 8 ns; and read/write buffer 5865 requires 12 ns, for example. The access time and cycle time of non-volatile NRAM memory system 5810 is 64 ns. The access time and cycle time may be equal because the NDRO mode of operation of nanotube storage devices (switches) does not require a write-back operation after access (read).

Method of Making Field Effect Device with Controllable Gate and NT-on-Gate Memory System and Circuits with Parallel Bit and Release Array Lines, and Parallel Word and Reference Array Lines NT-on-Gate memory cells are based on FED12 240 devices shown in FIG. 2L. Switch 250 may be displaced to contact a switch-plate 248, which is connected to a controllable gate 242. Switch 250 may be displaced to contact release-plate dielectric surface 256 on release-plate 254, which is connected to terminal T4. FED12 240 devices are interconnected to fabricate a NT-on-gate memory array.

Figure 52A:
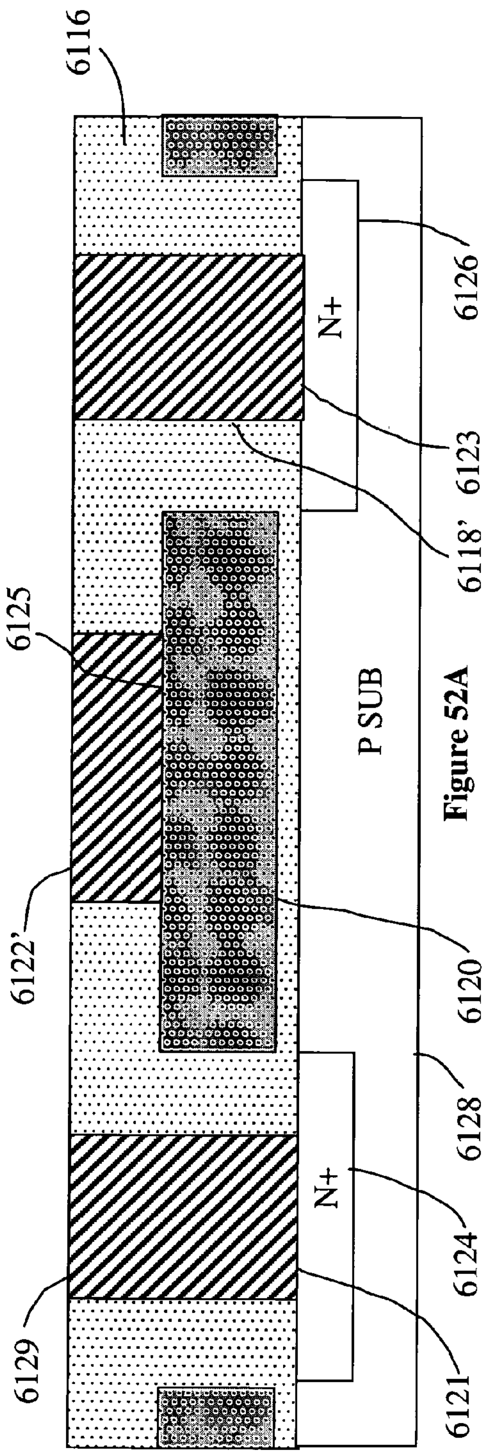
FIGS. 52A–G illustrate cross sections of exemplary structures according to aspects of the invention.
Figure 52B:
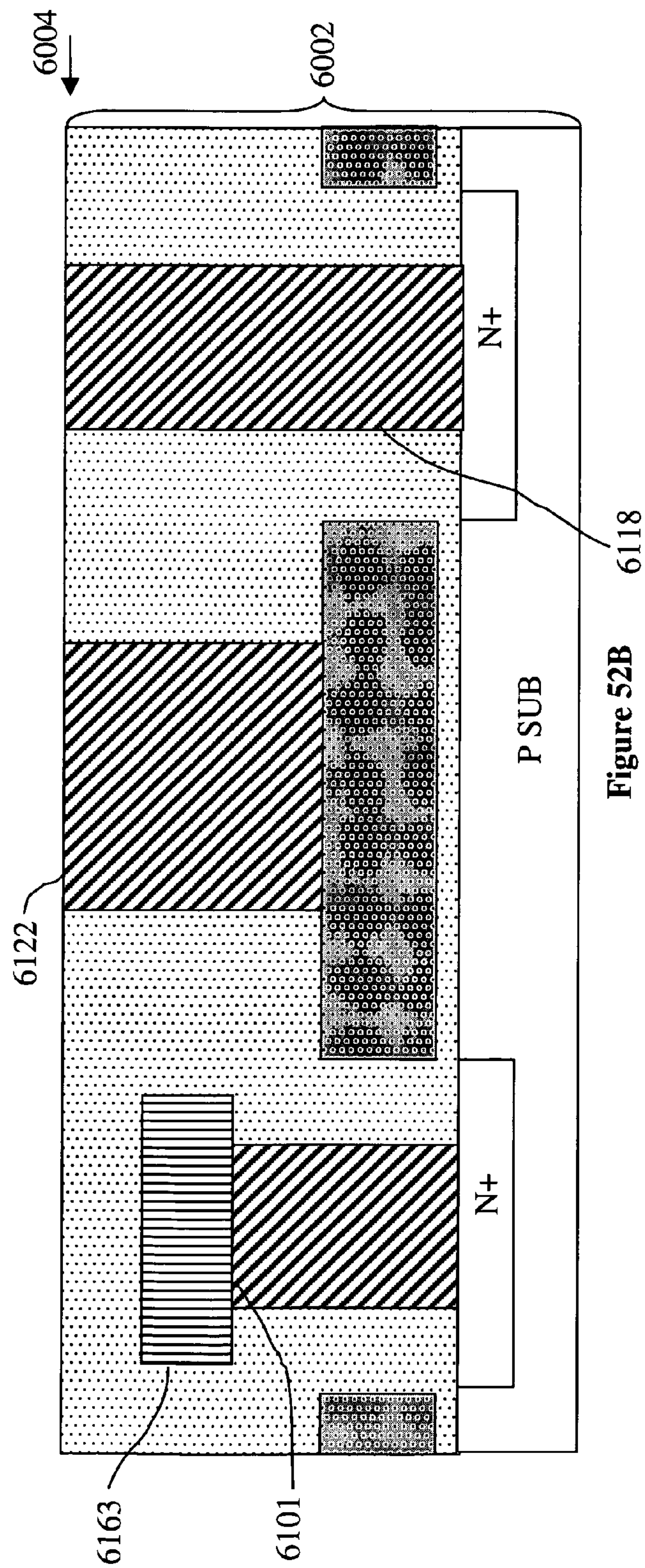

FIG. 22 describes a basic method 3000 of manufacturing preferred embodiments of the invention. In general, preferred methods first form 3002 a base structure including field effect device similar to a MOSFET, having drain, source, gate nodes, and conductive studs on source, drain, and gate structures for connecting to additional layers above the MOSFET device used to fabricate the nanotube switch. Base structure 3102' shown in FIG. 24A–24E is used when fabricating NT-on-source memory arrays. The nanotube switch structure is fabricated on planar surface 3104'. Base structure 3102''' shown in FIG. 44A is used when fabricating NT-on-drain memory arrays. The nanotube switch structure is fabricated on planar surface 3104''' using the same methods as used to fabricate the NT-on-source memory array. Base structure 6002 shown in FIG. 52B is used when fabricating NT-on-gate memory arrays. The nanotube switch structure is fabricated on planar surface 6004 using the same methods as used to fabricate the NT-on-source and NT-on-drain memory arrays.

Preferred methods first form 3002 base structure 6002 in two steps. First, MOSFET devices are formed using well known industry methods having a polysilicon (or metallic) gate 6120, for example, and source diffusion 6124 and drain diffusion 6126 in semiconductor substrate 6128, for example, as illustrated in FIG. 52A. Then studs (tungsten, aluminum, etc., for example) are embedded in dielectric 6116 ($SiO_2$, for example) using well known industry methods, and the surface is planarized. Stud 6129 contacts source 6124 at contact 6121, stud 6118' contacts drain 6126 at contact 6123, and stud 6122' contacts gate 6120 at contact 6125.

Next, reference array line (REF) 6163 is deposited and patterned using standard semiconductor process techniques, and contact stud 6129 at contact 6101 as illustrated in FIG. 52B. Standard semiconductor process methods insulate reference array line 6163. Next, standard semiconductor processes are used to open via holes to studs 6122' and 6118', fill via holes with metal, planarize, and pattern. Standard semiconductor processes deposit and insulator, such as SiO2, for example, and planarize. Stud 6122' and stud 6118' are thus extended in length above the top of reference array line 6163 to surface 6004 of base structure 6002 as illustrated in FIGS. 52A and 52B.

Once base structure 6002 is defined, then methods of fabricating NT-on-gate memory arrays are the same as those used to fabricate NT-on-source memory arrays. Preferred methods 3004 shown in FIGS. 23 and 23' and associated figures; methods 3036 shown in FIG. 26 and associated figures; methods 3006 shown in FIGS. 27 and 27' and associated figures; methods 3008 shown in FIGS. 28 and 28' and associated figures; and methods 3144 as illustrated in FIGS. 31A–31D. Conductors, semiconductors, insulators, and nanotubes are formed in the same sequence and are in the same relative position in the structure. Length, widths, thickness dimensions may be different, reflecting differences in design choices. Also, conductor materials may be different, for example. The function of some electrodes may be different for NT-on-source and NT-on-gate memory arrays. For example, reference array lines are connected to source diffusions. Alternatively, source diffusions may be used as reference array lines without a separate conductor layer, however, performance may be slower. Word array lines connect to different electrodes in the nanotube structure, the nanotube switch for example, as may be seen further below. For NT-on-gate memory arrays, the switch-plate of the nanotube structure is connected to the gate diffusion of the FET device. However, for NT-on-drain memory arrays, the switch-plate of the nanotube structure is connected to the drain diffusion of the FET device, and for NT-on-source memory arrays, the switch-plate of the nanotube structure is connected to the source diffusion of the FET device, as may be seen further below.

Figure 52C:
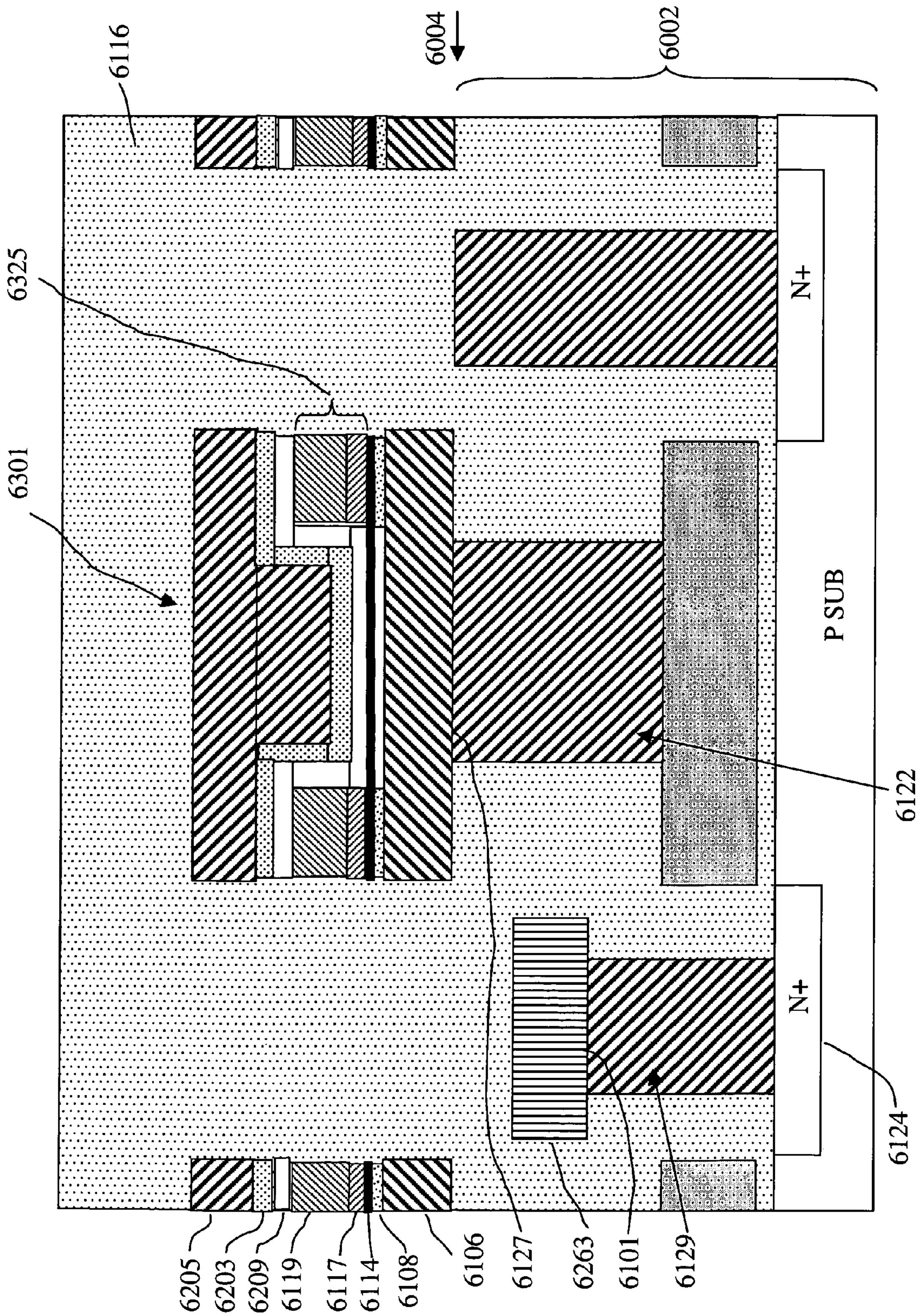

The nanotube switch region of the NT-on-gate cross section illustrated in FIG. 52C corresponds to the nanotube switch region of the NT-on-source cross section illustrated in FIG. 30F' after the formation of first and second gap regions, sealing of the fluid communication paths, and planarizing as discussed with respect to FIG. 30J'. Switch-plate 6106 is in electrical communication with FET gate 6120 by means of contact 6127, stud 6122, and contact 6125, (see FIGS. 52A and 52B). Insulator 6108 is between switch-plate 6106 and nanotube fabric 6114. Conductors 6117 and 6119 form composite conductor 6325, with an opening to form a picture frame opening used to suspend nanotube fabric 6114. Gap region 6209 is between the top of conductor 6119 and insulator 6203 on the bottom of release-plate 6205, in the combined nanotube/device switching region 6301. Reference array line 6263 is in electrical contact with source 6124 by means of contact 6101 and stud 6129. Insulator 6116, with a planarized surface, encapsulates the nanotube switch structure and array wiring.

Figure 52D:
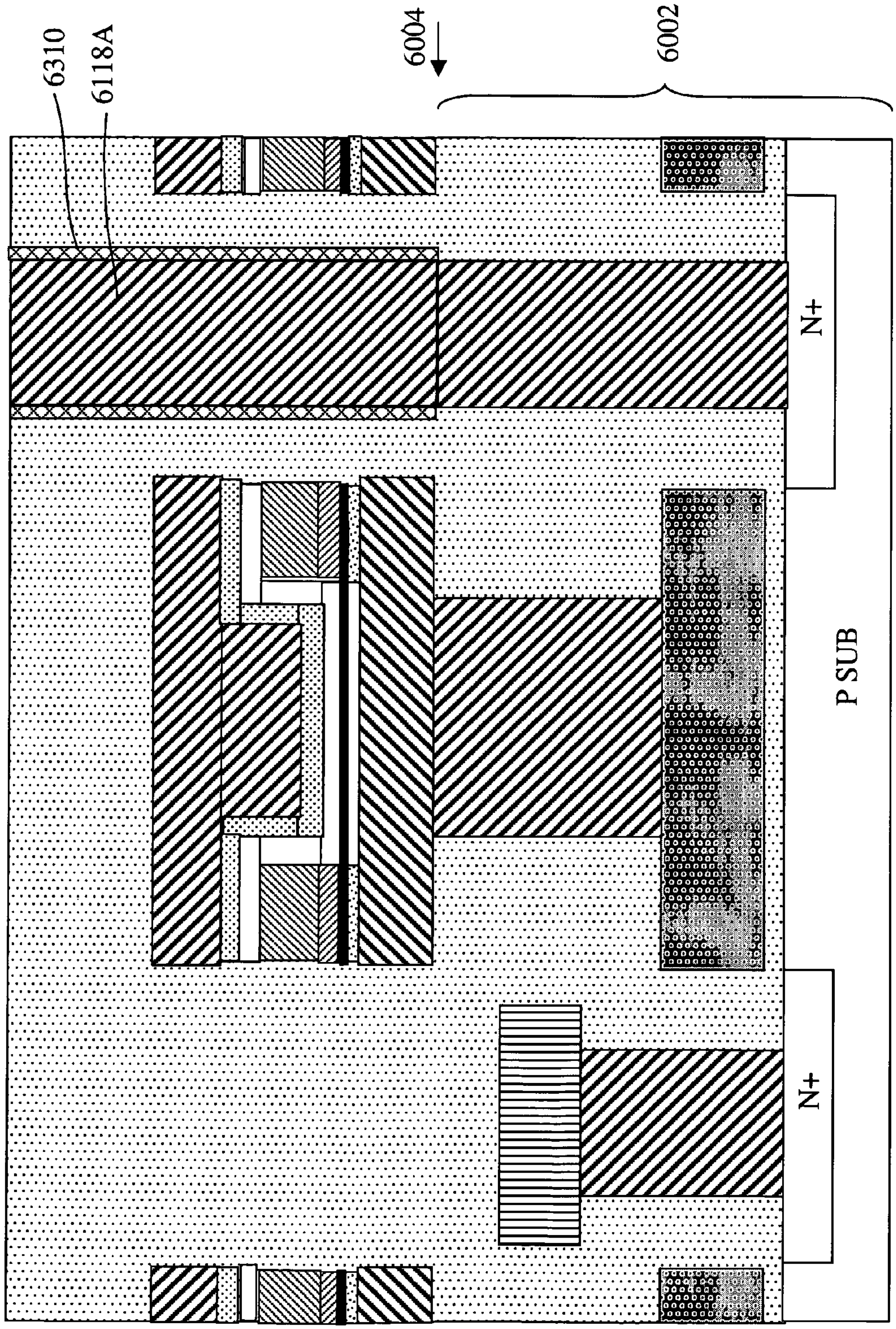

FIG. 52D illustrates the structure of FIG. 52C with extended stud 6118A contacting stud 6118 and reaching the planarized top surface of insulator 6116. Extended stud 6118A is surrounded by insulator 6310 to ensure that stud 6118A does not connect to regions of combined nanotube/device structure 6301 if stud 6118A is misaligned. Insulator 6310 is a conformal insulating layer deposited in the via hole reaching the top surface of stud 6118. A directional etch (RIE, for example) removes the insulator region in contact with 6118. The via hole is filled with a conductor, and the top surface is planarized as illustrated in FIG. 52D. Bit line 6138 is deposited and patterned forming structure 6000 illustrated in FIG. 52E. Differences between NT-on-source and NT-on-gate memory arrays may be seen by comparing FIGS. 33A and 52E; FIGS. 33B and 52F; FIGS. 33C and 52G; and FIGS. 33D and 52H.

Figure 52E:
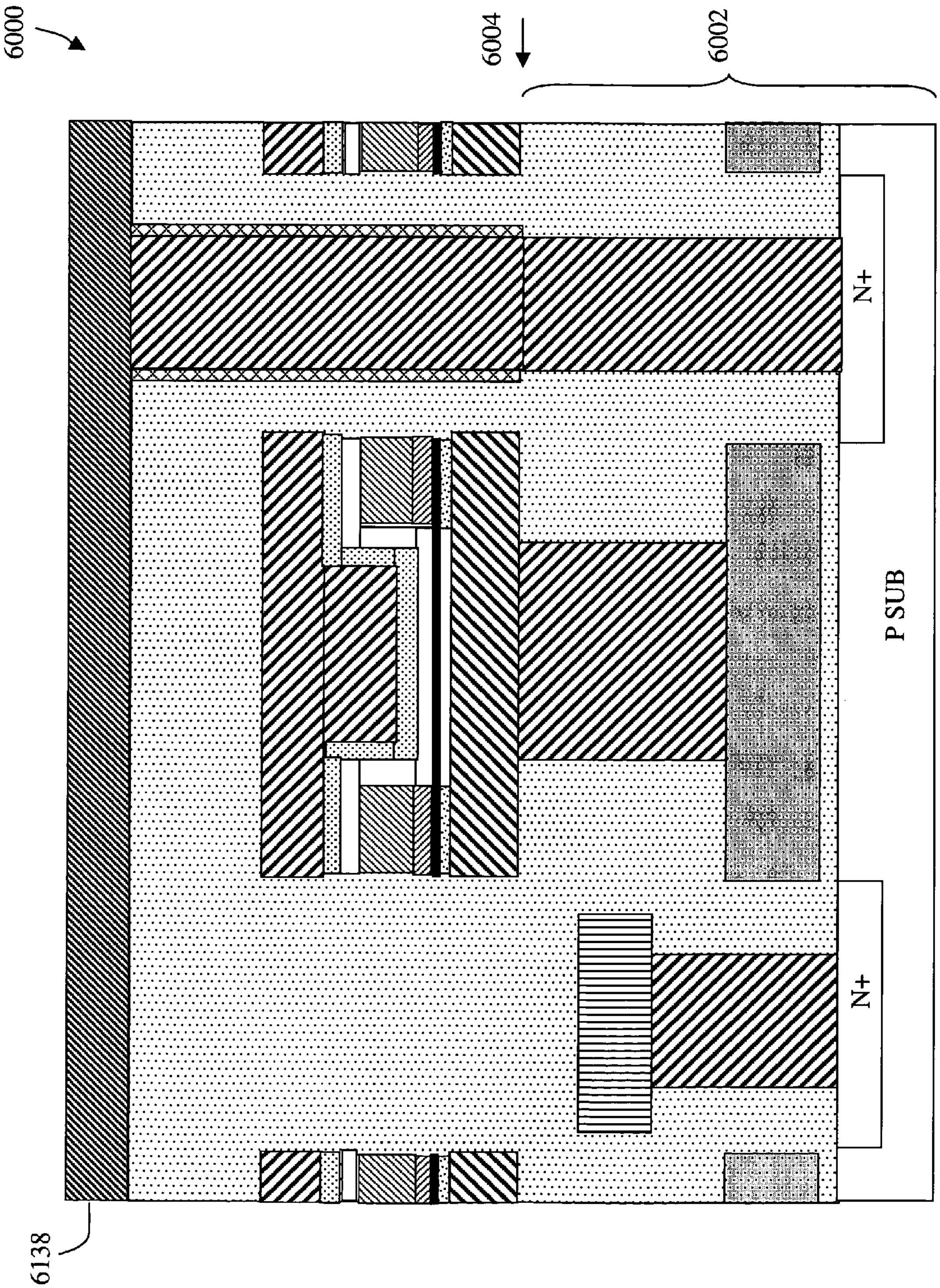
Figure 52F:
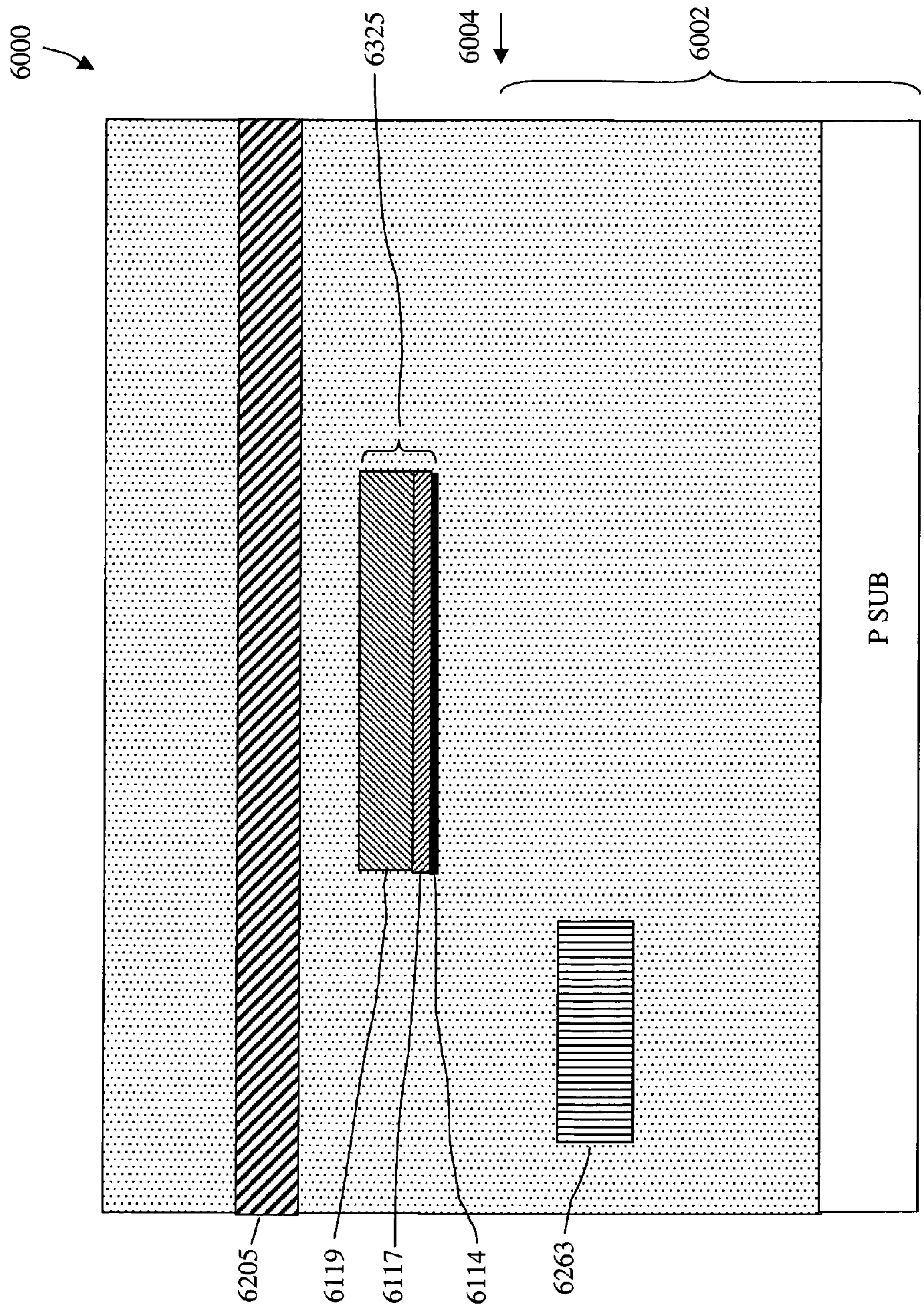
Figure 52G:
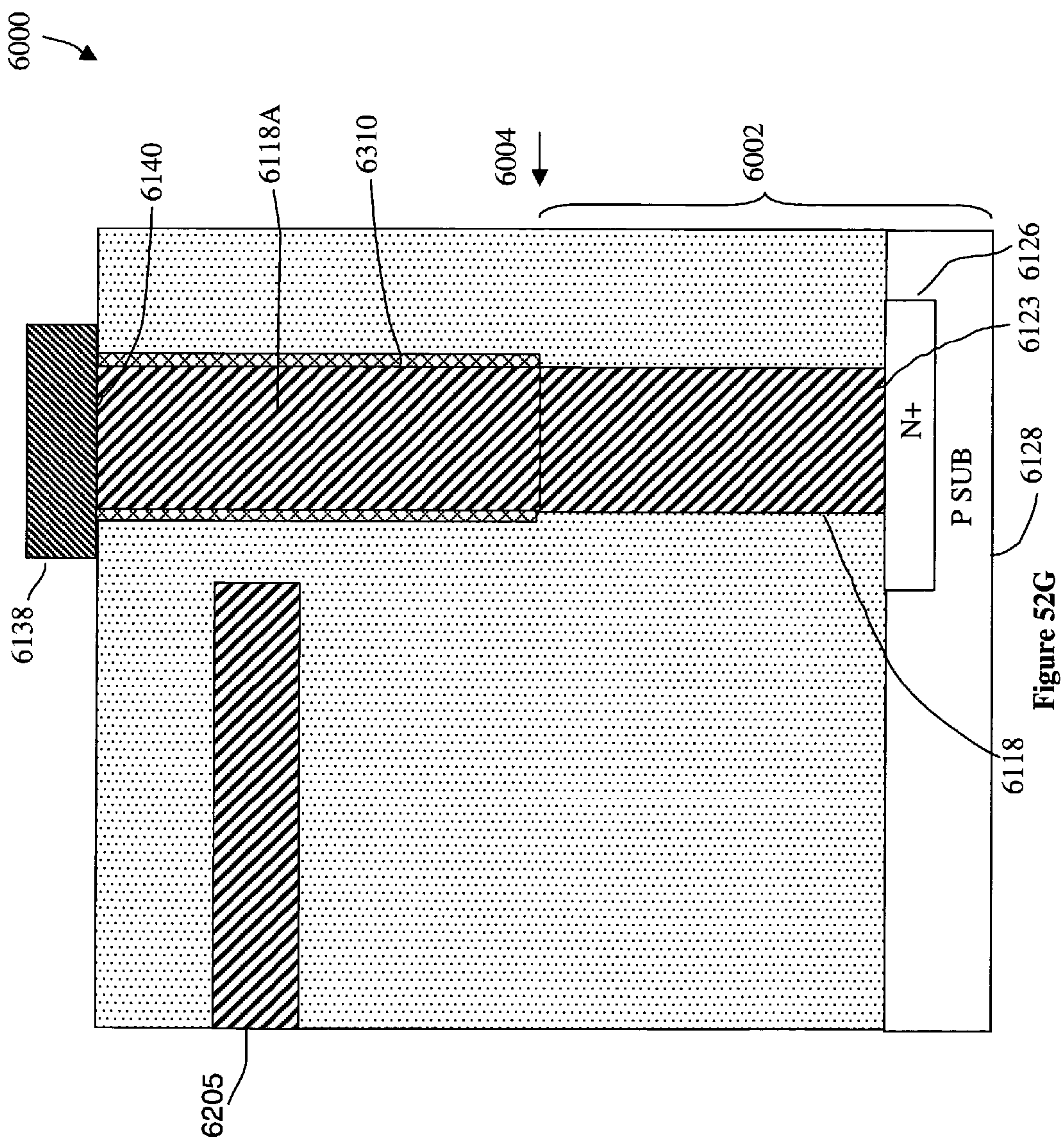
Figure 52H:
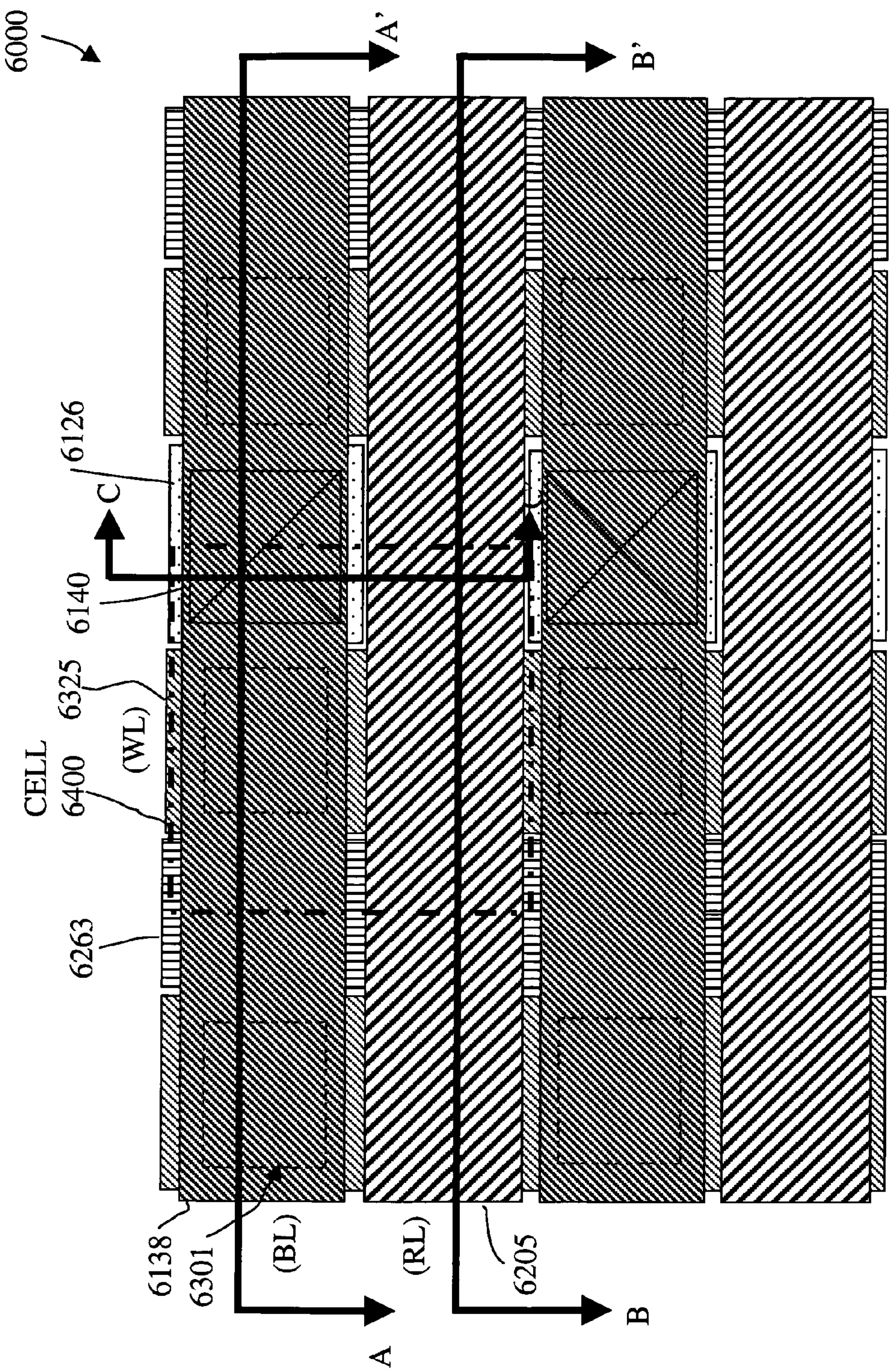
FIG. 52H illustrates a plan view of an exemplary structure according to one aspect of the invention.

FIG. 52E illustrates cross section A–A' of array 6000 taken at A–A' of the plan view of array 6000 illustrated in FIG. 52H, and shows reduced area (smaller) combined nanotube/device switch region 6301 in the FET length, interconnections and insulators. A smaller picture frame opening is formed in combined conductors 6119 and 6117 by applying sub-lithographic method 3036 shown in FIG. 26 and corresponding sub-lithographic structures shown in FIGS. 29D, 29E, and 29F during the fabrication of combined nanotube/device switch structure 6301. FIG. 52F illustrates cross section B–B' of array 6000 taken at B–B' of plan view of array 6000 illustrated in FIG. 52H, and shows word line 6325 comprising conductive layers 3117 and 3119. Conductive layers 6117 and 6119 of word line 6325 are extended to form the picture frame region of nanotube device structure. FIG. 52F also illustrates release line 6205, and reference array line 6263. FIG. 52G illustrates cross section C–C' of array 6000 taken at C–C' of the plan view of array 6000 illustrated in FIG. 52H. Bit line 6138 is connected to drain diffusion 6126 through contact 6140, to stud 6118A, to stud 6118, and through contact 6123. In order to achieve greater array density, there is a small spacing between stud 6118A and release line 6205. Insulator 6310 is used to prevent electrical shorting between stud 6118A and release line 6205 if stud 6118A is misaligned. FIG. 52H illustrates a plan view of array 6000 including exemplary cell 6400 region, with bit array line 6138 contacting drain 6126 as illustrated in FIG. 52G, release array line 6205 parallel to bit line 6138 but on a different array wiring level (wiring plane). Reference array line 6263 is parallel to word array line 6325. Release line 6205 contacts and forms a portion of release electrode 6205 as illustrated in the nanotube switching region of FIG. 52E. NT-on-gate exemplary cell 6400 area (region) is smaller (denser) than corresponding exemplary nanotube-on-source cell 3169 area shown in FIG. 33D and corresponding NT-on-drain exemplary cell 4769 area shown in FIG. 46D, and therefore corresponding array 6000 is denser (occupies less area) than corresponding array areas of array 3231 and 4731. The greater density of array 6000 results in higher performance, less power, less use of silicon area, and therefore lower cost as well. In terms of minimum technology feature size, NT-on-gate cell 6400 is approximately 7 to 9 $F^2$. Nanotube-on-gate array 6000 structures illustrated in FIGS. 52E–52H correspond to nanotube-on-gate array 5700 schematic representation illustrated in FIG. 48. Bit line 6138 structures correspond to any of bit lines BL0 to BLm-1 schematic representations; reference line 6263 structures correspond to any of reference lines REF0 to REFm-1 schematic representations; word line 6325 structures correspond to any of word lines WL0 to WLn-1 schematic representations; release line 6205 structures correspond to any of release lines RL0 to RLn-1 schematic representations; source contact 6140 structures correspond to any of source contacts 5740 schematic representations; combined nanotube/device switch structure 6301 correspond to any of combined nanotube/select devices NT0,0 to NTm-1,n-1 schematic representations; and exemplary cell 6400 corresponds to any of cells C0,0 to cell Cm-1,n-1 schematic representations.

Nanotube Random Access Memory Using More than One FED Per Cell with Controllable Sources Nanotube Random Access Memory (NRAM) Systems and Circuits, with Same Non-volatile field effect devices (FEDs) 20, 40, 60, and 80 with controllable sources may be used as the cells of one FED device and interconnected into arrays to form non-volatile nanotube random access memory (NRAM) systems as illustrated further above. In operation, cells with a single FED require a partial (or half-select) mode of operation as illustrated by array 1700 shown in FIG. 18 and corresponding waveforms 1800 shown in FIG. 19, for example. Memory cells that contain two select device (transistors) T and T', and two non-volatile nanotube storage element NT and NT' (2T/2NT cells) use full cell select operation, and do not require nanotube partial (or half-select) operation. By using full select operation, nanotube electrical characteristics such as threshold voltage and resistance may be operated over a wider range of values, and sensing may be faster because true and complement bit lines BL and BLb, respectively, are used in a differential signal mode. Cell size (area), however, is increased significantly (by more than two times single FED cell area). By way of example, two FED4 80 (FIG. 2D) devices are used to form a non-volatile NRAM memory cell that is also referred to as a two device NT-on-Source memory cell. Two FED device NT-on-drain cells using non-volatile field effect devices (FEDs) 100, 120, 140, and 180 and two FED device NT-on-gate cells using non-volatile field effect devices (FEDs) 180, 200, 220, and 240 may also be used (not shown). More than two non-volatile field effect devices (FEDs) per cell may be used for additional performance advantages, for example. Four devices, for example, with separate (non-shared) read and write cell terminals may be used (not shown), however, cell size (area) is increased significantly (by more than four times single FED cells).

Two FED Device NT-on-Source NRAM Memory Systems and Circuits with Parallel Bit and Reference Lines, and Parallel Word and Release Lines NRAM 2T/2NT memory arrays are wired using three sets of unique array lines (a set of word lines and two sets of complementary bit lines), and one group of shared reference lines all at the same voltage, zero (ground) in this example. Read and write word line WL is used to gate select devices T and T', read and write bit line BL is attached to a shared drain between two adjacent select T devices, and read and write complementary bit line BLb (or BL') is attached to a shared drain between two adjacent select T' devices. Reference line REF is used to control the NT switch voltage of storage element NT and NT' and is grounded (zero volts). Voltages applied to the switch-plates and release-plates of NT and NT' are controlled by transistor T and T' sources. True bit array lines BL and complementary bit array lines BLb (bit line bar) are parallel to each other, and orthogonal to array word lines WL. Reference array lines may be parallel to bit lines or to word lines, or alternatively, a conductive layer (plane) may be used.

Figure 53A:
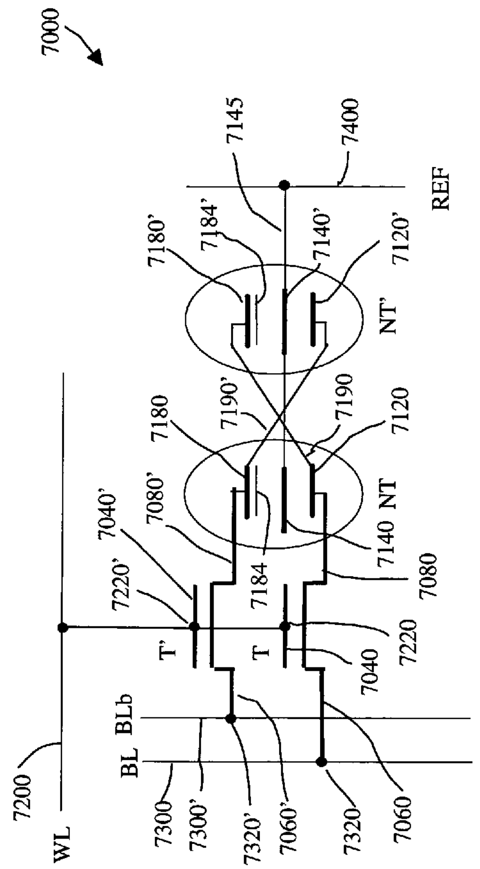
FIGS. 53A–C illustrate schematics of circuitry for two controlled source non-volatile field effect devices according to certain aspects of the invention.

FIG. 53A depicts two controlled source non-volatile field effect devices, FED4 80 (FIG. 2D) and memory cell wiring to form non-volatile 2T/2NT NT-on-Source memory cell 7000 schematic. A first FED device and associated elements and nodes is referred to as FED4 device 80, and a second FED device and associated elements and nodes is referred to as FED4' device 80'. Memory cell 7000 is configured as two controlled source FED devices sharing a common gate input provided by a common word line WL, with two independent drain connections each connected to complementary bit lines. Word line (WL) 7200 connects to terminal T1 of FED4 80 and also to terminal T1' of FED4 80'; bit line (BL) 7300 connects to terminal T2 of FED4 80 and complementary bit line (BLb) 7300' connects to terminal T2' of FED4 80'; reference line (REF) 7400 connects to terminal T3 of FED4 80 and terminal T3' of FED4 80'. Memory cell 7000 performs write and read operations, and stores the information in a non-volatile state. The FED4 80 and FED4 80' layout dimensions and operating voltages are selected to optimize memory cell 7000. Memory cell 7000 FET select device (T) gate 7040 and select device (T') gate 7040' correspond to gate 82; drains 7060 and 7060' correspond to drain 84; and controllable sources 7080 and 7080' correspond to controllable source 86. Memory cell 7000 nanotube (NT) switch-plates 7120 and 7120' correspond to switch-plate 88; NT switches 1140 and 1140' correspond to NT switch 90; release-plate insulator layer surfaces 7184 and 7184' correspond to release-plate insulator layer surface 96; and release-plates 7180 and 7180' correspond to release-plate 94. The interconnections between the elements of memory cell 7000 schematic correspond to the interconnection of the corresponding interconnections of the elements of FED4 80. BL 7300 connects to drain 7060 through contact 7320 and BLb 7300' connects to drain 7060' through contact 7320'; REF 7400 connects to NT switch 7140 and in parallel to NT' switch 7141' through connector 7145; WL 7200 interconnects to gate 7040 by contact 7220 and interconnects to gate 7040' by contact 7220'. Alternatively, WL 7200 may form and interconnect gates 1040 and 1040', requiring no separate contacts, as shown further below. Transistor T source 7080 connects to nanotube NT switch-plate 7120 and connects to nanotube NT' release-plate 7180' through connector 7190. Transistor T' source 7080' connects to nanotube NT release-plate 7180 and connects to nanotube NT' switch-plate 7120' through connector 7190'.

Figure 53B:
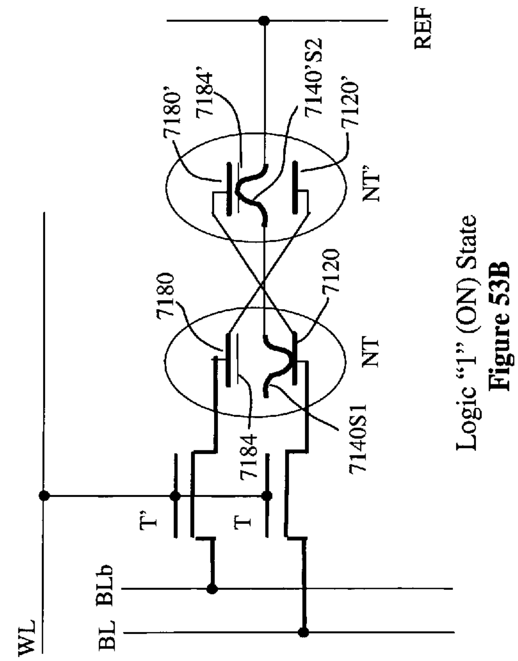
Figure 53C:
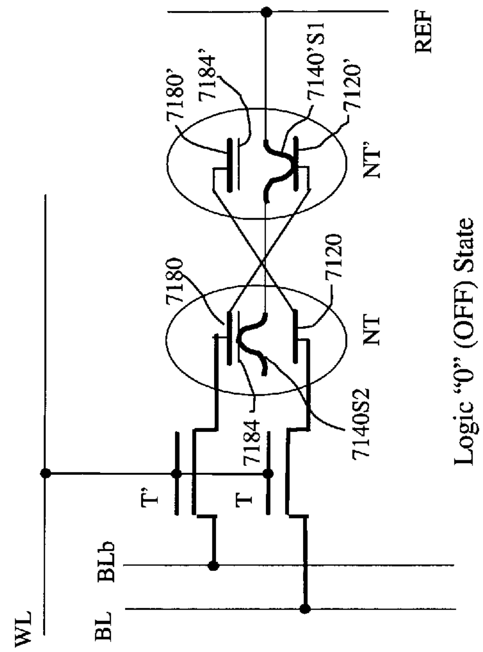

In operation, the non-volatile NT switching element 7140 may be caused to deflect to switch-plate surface 7120 via electrostatic forces to closed ("ON") position 7140S1, and non-volatile NT' switching element 7140' may be caused to deflect to insulator 7184' on release-plate 7180' via electrostatic forces to open ("OFF") position 7140'S2, to store a logic "1" state as illustrated in FIG. 53B. That is, a logic "1" state for the two FED cell 7000 consists of NT in closed ("ON") position 7140S1 and NT' in open ("OFF") position 7140'S2, as illustrated in FIG. 53B. The van der Waals forces hold nanotube switches 7140 and 7140' in positions 7140S1 and 7140'S2, respectively. Alternatively, the non-volatile NT switching element 7140 may be caused to deflect toward release-plate 7180 via electrostatic forces to open ("OFF") position 7140S2, and non-volatile switching element 1140' may be caused to deflect toward switch-plate 7120' to closed ("ON") position 7140'S1, to store a logic "0" state as illustrated in FIG. 53C. That is, a logic "0" state for the two FED cell 7000 consists of NT in open ("OFF") position 7140S2 and NT' in closed ("ON") position 7140'S1, as illustrated in FIG. 53C. The van der Waals forces hold nanotube switches 1140 and 1140' in positions 7140S2 and 7140'S1, respectively. The non-volatile element switching via electrostatic forces is as depicted by element 90 in FIG. 2D with voltage waveforms 311 used to generate the required electrostatic forces illustrated in FIG. 4.

NT-on-Source schematic 7000 forms the basis of a non-volatile 2T/2NT storage (memory) cell. The non-volatile 2T/2NT memory cell may be switched between storage state "1" and storage state "0", which means the controllable sources may be written to an unlimited number of times as desired, and that the memory cell will retain stored information if power is removed (or lost). In this way, the device may be used as a basis for a non-volatile nanotube random access memory, which is referred to here as a NRAM array, with the 'N' representing the inclusion of nanotubes.

Figure 54:
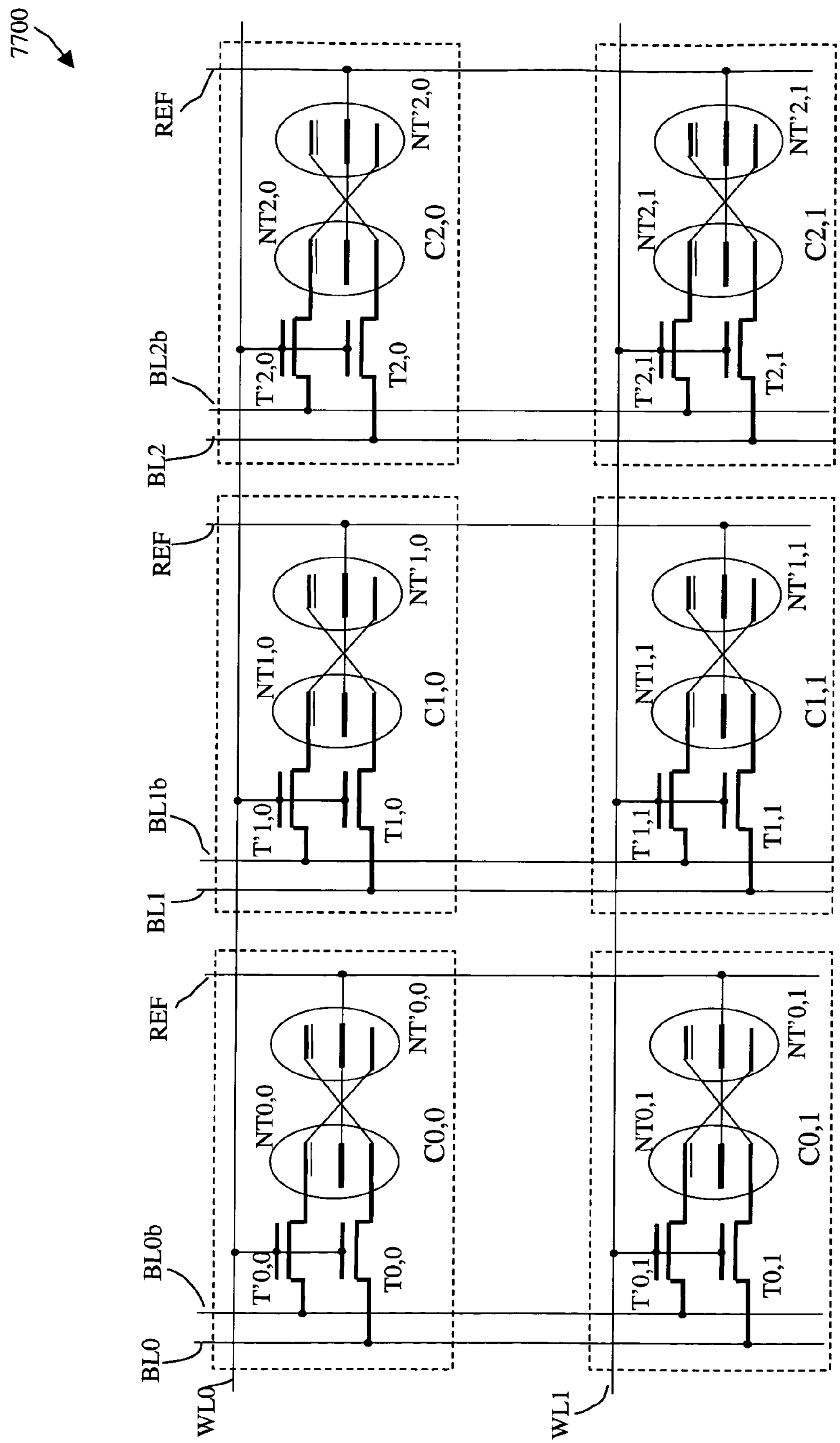
FIG. 54 illustrates a schematic of an NRAM system according to one aspect of the invention.

FIG. 54 represents an NRAM array system 7700, according to preferred embodiments of the invention. Under this arrangement, an m×n cell array is formed, with only an exemplary 3×2 potion of non-volatile cells ranging from cell C0,0 to cell C2,1 being shown. To access selected cells, array 7700 uses read and write word lines (WL0 and WL1), read and write bit lines (BL0, BL1, and BL2) and read and write complementary bit lines (BLb0, BLb1, and BLb2. Reference lines REF are all at the same reference voltage, zero volts in this example. Non-volatile cell C0,0 includes select devices T0,0 and T'0,0, and non-volatile storage elements NT0,0 and NT'0,0. The gates of T0,0 and T'0,0 are coupled to WL0, the drain of T0,0 is coupled to BL0, and the drain of T'0,0 is coupled to BLb0. NT0,0 is the non-volatilely switchable storage element where the NT0,0 switch-plate is coupled to the source of T0,0, the switching NT element is coupled to REF, and the release-plate is coupled to the source of T'0,0. NT'0,0 is the non-volatilely switchable storage element where the NT'0,0 switch-plate is coupled to the source of T'0,0, the switching NT element is coupled to REF, and the release-plate is coupled to the source of T0,0. Word and bit decoders/drivers, sense amplifiers, and controller circuits are explained further below.

Under preferred embodiments, nanotubes in array 7700 may be in the "ON", "1" state or the "OFF", "0" state. The NRAM memory allows for unlimited read and write operations per bit location. A write operation includes both a write function to write a "1" and a release function to write a "0". By way of example, a write "1" to cell C0,0 and a write "0" to cell C1,0 is described. For a write "1" operation to cell C0,0, select devices T0,0 and T'0,0 are activated when WL0 transitions from 0 to $V_{SW}+V_{FET-TH}$, after BL0 has transitioned to $V_{SW}$ volts and after BL0*b* has transitioned to zero volts. REF voltage is at zero volts. The NT0,0 switch element release-plate is at zero volts, the switch-plate is at $V_{SW}$ volts, and the NT switch is at zero volts. The NT'0,0 switch element release-plate is at $V_{SW}$ volts, the switch-plate is at zero volts, and the NT' switch is at zero volts. The BL0 $V_{SW}$ voltage is applied to the switch-plate of non-volatile storage element NT0,0 and the release-plate of non-volatile storage element NT'0,0 by the controlled source of select device T0,0. The zero BL0*b* voltage is applied to the release-plate of non-volatile storage element NT0,0, and to the switch-plate of non-volatile storage element NT'0,0, by the controlled source of select device T'0,0. The difference in voltage between the NT0,0 switch-plate and NT switch is $V_{SW}$ and generates an attracting electrostatic force. The voltage difference between the release-plate and NT switch is zero so there is no electrostatic force. The difference in voltage between NT'0,0 release-plate and NT' switch is $V_{SW}$ and generates an attracting electrostatic force. The voltage difference between the switch-plate and NT' switch is zero so there is no electrostatic force. If $V_{SW}$ exceeds the nanotube threshold voltage $V_{NT-TH}$, the nanotube structure switches to "ON" state or logic "1" state, that is, the nanotube NT switch and switch-plate of non-volatile storage element NT0,0 are electrically connected as illustrated in FIG. 53B, and the nanotube NT switch and release-plate dielectric of non-volatile storage element NT'0,0 are in contact as illustrated in FIG. 53B. The near-Ohmic connection between switch-plate 7120 and NT switch 7140 in position 7140S1 represents the "ON" state or "1" state. If the power source is removed, cell C0,0 remains in the "ON" state.

For a write "0" operation to cell C1,0, select devices T1,0 and T'1,0 are activated when WL0 transitions from 0 to $V_{SW}+V_{FET-TH}$, after BL1 has transitioned to zero volts and after BL1*b* has transitioned to $V_{SW}$ volts. REF voltage is at zero volts. The NT1,0 switch element release-plate is at $V_{SW}$ volts, the switch-plate is at zero volts, and the NT switch is at zero volts. The NT'1,0 switch element release-plate is at zero volts, the switch-plate is at $V_{SW}$ volts, and the NT' switch is at zero volts. The BL1 zero volts is applied to the switch-plate of non-volatile storage element NT1,0 and the release-plate of non-volatile storage element NT'1,0 by the controlled source of select device T1,0. The $V_{SW}$ BL0*b* voltage is applied to the release-plate of non-volatile storage element NT1,0, and to the switch-plate of non-volatile storage element NT'1,0, by the controlled source of select device T'1,0. The difference in voltage between the NT1,0 switch-plate and NT switch is zero and generates no electrostatic force. The voltage difference between the release-plate and NT switch is $V_{SW}$ so there is an attracting electrostatic force. The difference in voltage between NT'1,0 release-plate and NT' switch is zero volts and generates no electrostatic force. The voltage difference between the switch-plate and NT' switch is $V_{SW}$ so there is an attracting electrostatic force. If $V_{SW}$ exceeds the nanotube threshold voltage $V_{NT-TH}$, the nanotube structure switches to "OFF" state or logic "0" state, that is, the nanotube NT' switch and switch-plate of non-volatile storage element NT'1,0 are electrically connected as illustrated in FIG. 53C, and the nanotube NT switch and release-plate dielectric of non-volatile storage element NT1,0 are in contact as illustrated in FIG. 53C. The near-Ohmic connection between switch-plate 7120' and NT' switch 7140' in position 7140'S1 represents the "OFF" state or "0" state. If the power source is removed, cell C1,0 remains in the "ON" state.

An NRAM read operation does not change (destroy) the information in the activated cells, as it does in a DRAM, for example. Therefore the read operation in the NRAM is characterized as a non-destructive readout (or NDRO) and does not require a write-back after the read operation has been completed. For a read operation of cell C0,0, BL0 and BL0*b* are driven high to $V_{DD}$ and allowed to float. WL0 is driven high to $V_{DD}+V_{FET-TH}$ and select devices T0,0 and T'0,0 turn on. REF0 is at zero volt. If cell C0,0 stores an "ON" state ("1" state) as illustrated in FIG. 53B, BL0*b* remains unchanged, and BL0 discharges to grounded REF line through a conductive path that includes select device T0,0 and non-volatile storage element NT0,0, the BL0 voltage drops, and the "ON" state or "1" state is detected by a sense amplifier/latch circuit (shown further below) that records the voltage drop of BL0 relative to BL0*b* by switching the latch to a logic "1" state. BL0 is connected by the select device T0,0 conductive channel of resistance $R_{FET}$ to the switch-plate of NT0,0. The switch-plate of NT0,0 is in contact with the NT switch with a contact resistance $R_{SW}$ and the NT switch contacts reference line REF0 with contact resistance $R_C$. The total resistance in the discharge path is $R_{FET}+R_{SW}+R_C$. Other resistance values in the discharge path, including the resistance of the NT switch, are much small and may be neglected.

For a read operation of cell C1,0, BL1 and BL1*b* are driven high to $V_{DD}$ and allowed to float. WL0 is driven high to $V_{DD}+V_{TH}$ and select devices T1,0 and T'1,0 turn on. REF1 is at zero volts. If cell C1,0 stores an OFF state ("0" state) as illustrated in FIG. 53C, BL1 remains unchanged, and BL1*b* discharges to grounded REF line through a conductive path that includes select device T'1,0 and non-volatile storage element NT'1,0, the BL1*b* voltage drops, and the OFF state or "0" state is detected by a sense amplifier/latch circuit (shown further below) that records the voltage drop of BL1*b* relative to BL1 by switching the latch to a logic "0" state. BL1*b* is connected by the select device T'1,0 conductive channel of resistance $R_{FET}$ to the switch-plate of NT'1,0. The switch-plate of NT'1,0 is in contact with the NT' switch with a contact resistance $R_{SW}$ and the NT' switch contacts reference line REF0 with contact resistance $R_C$. The total resistance in the discharge path is $R_{FET}+R_{SW}+R_C$. Other resistance values in the discharge path, including the resistance of the NT switch, are much small and may be neglected.

Figure 55:
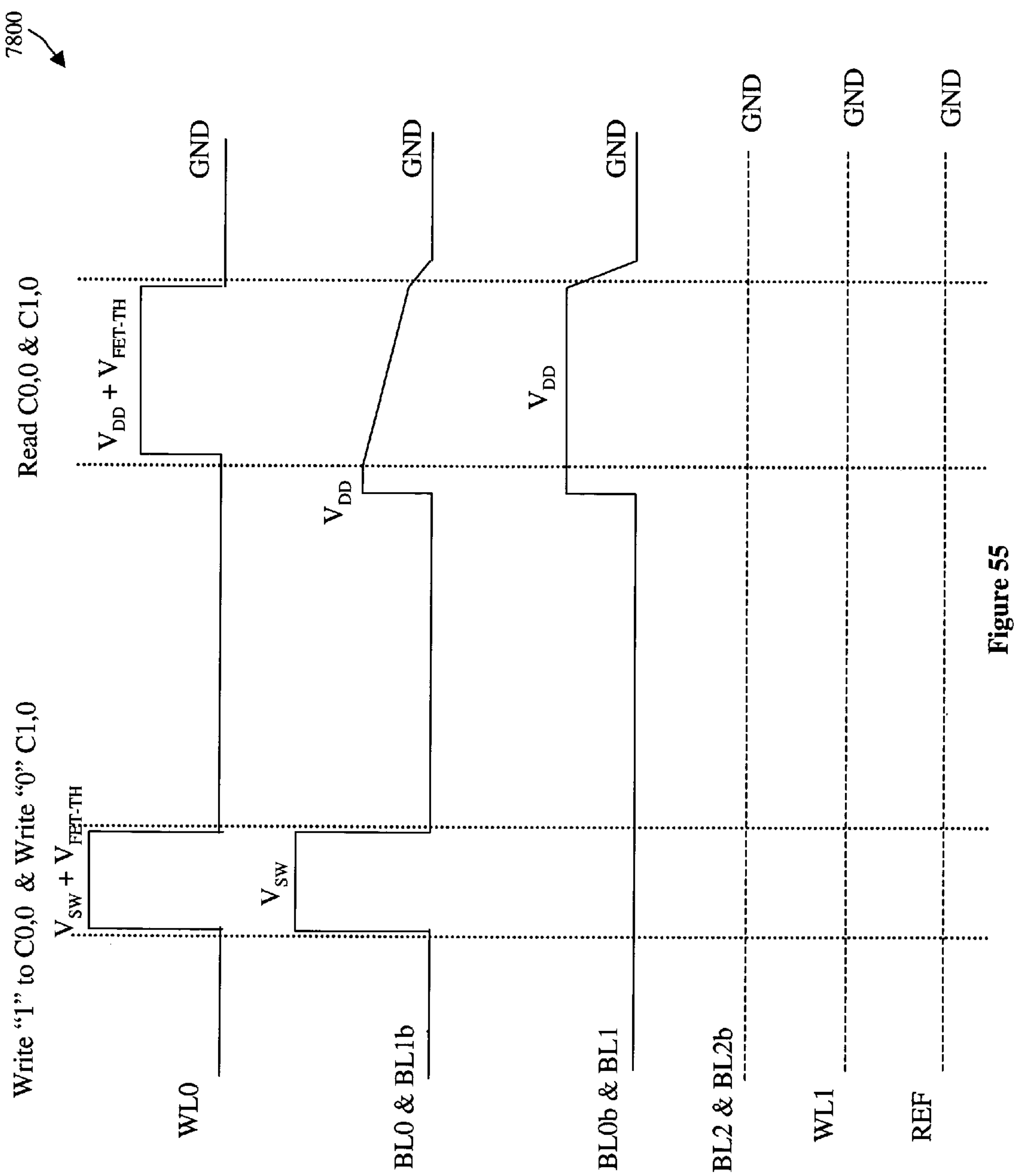
FIG. 55 illustrates the operational waveforms of a memory array according to one aspect of the invention.

FIG. 55 illustrates the operational waveforms 7800 of memory array 7700 shown in FIG. 54 during read "1", read "0", write "1", and write "0" operations for selected cells, while not disturbing unselected cells (no change to unselected cell stored logic states). Waveforms 7800 illustrate voltages and timings to write logic state "1" in cell C0,0, write a logic state "0" in cell C1,0, read cell C0,0 which is in the "1" state, and read cell C1,0 which is in the "0" state. Waveforms 7800 also illustrate voltages and timings to prevent disturbing the stored logic states (logic "1" state and logic "0" state) along selected word line WL0 in this example. Word line WL0 turns on transistors T2,0 and T'2,0 of cell C2,0 after bit lines BL2 and BL2*b* have been set to zero volts. No voltage difference exists between NT and NT' switches and corresponding switch-plates and release-plates because REF is also at zero volts, and the stored state of cell C2,0 is not disturbed. All other unselected cells along active word line WL0 are also not disturbed. Word line WL1 is not selected and is held at zero volts, therefore all select transistors along word line WL1 are in the OFF state and do not connect bit lines BL and BL' to corresponding source terminals. Therefore, cells C0,1, C1,1, C2,1, and any other cells along word line WL1 are not disturbed. Cells in memory array 7700 tolerate unlimited read and write operations at each memory cell location with no stored state disturbs, and hold information in a non-volatile mode (without applied power).

Figure 56A:
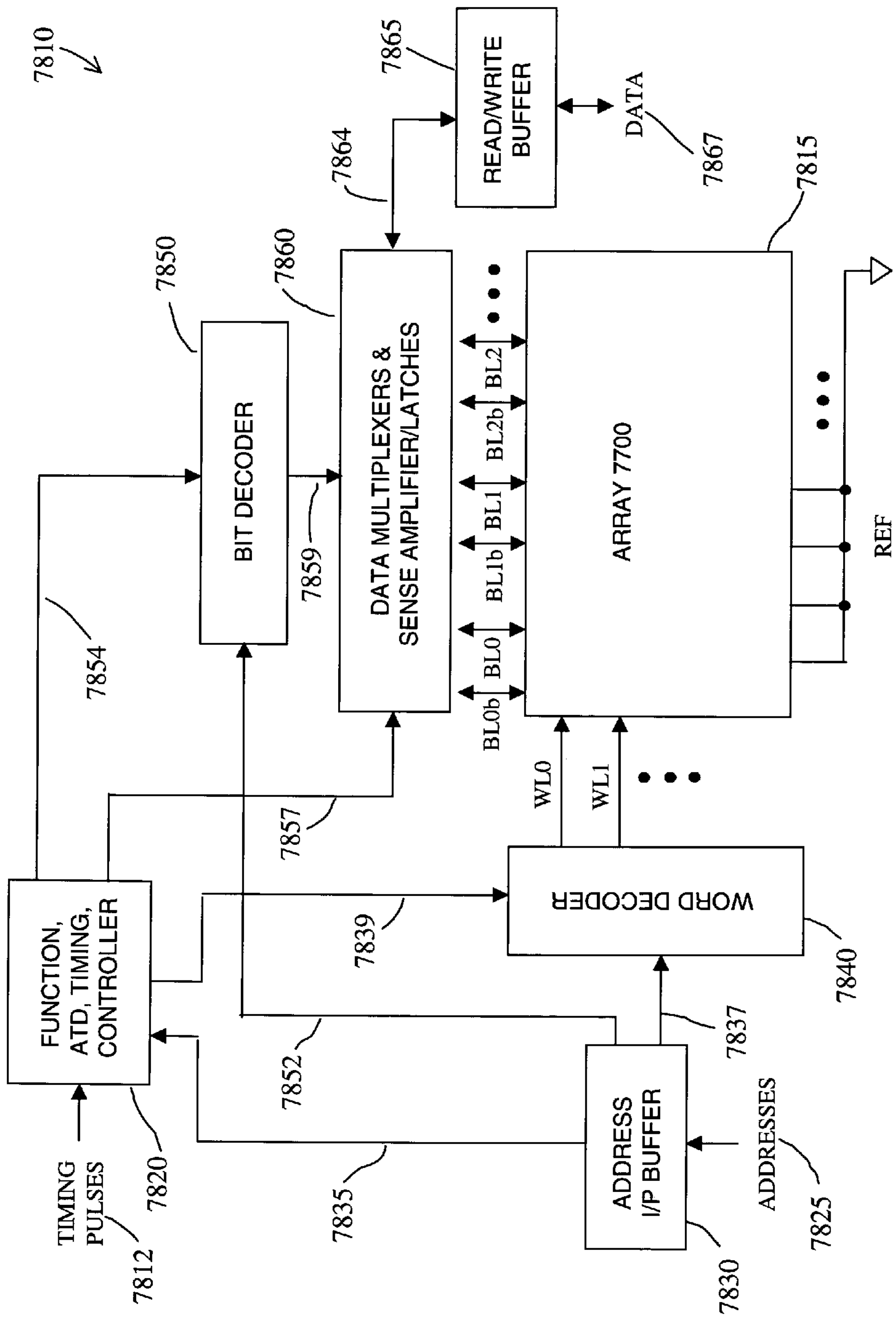
FIG. 56A illustrates a diagram outlining a memory array system according to one aspect of the invention.

Non-volatile NT-on-source NRAM memory array 7700 with bit lines parallel to reference lines is shown in FIG. 54 contains 6 bits, a subset of a $2^N \times 2^M$ array 7700, and is a subset of non-volatile NRAM memory system 7810 illustrated as memory array 7815 in FIG. 56A. NRAM memory system 7810 may be configured to operate like an industry standard asynchronous SRAM or synchronous SRAM because nanotube non-volatile storage cells 7000 shown in FIG. 53A, in memory array 7700, may be read in a non-destructive readout (NDRO) mode and therefore do not require a write-back operation after reading, and also may be written (programmed) at CMOS voltage levels (5, 3.3, and 2.5 volts, for example) and at nanosecond and sub-nanosecond switching speeds. NRAM read and write times, and cycle times, are determined by array line capacitance, and are not limited by nanotube switching speed. Accordingly, NRAM memory system 7810 may be designed with industry standard SRAM timings such as chip-enable, write-enable, output-enable, etc., or may introduce new timings, for example. Non-volatile NRAM memory system 7810 may be designed to introduce advantageous enhanced modes such as a sleep mode with zero current (zero power—power supply set to zero volts), information preservation when power is shut off or lost, enabling rapid system recovery and system startup, for example. NRAM memory system 7810 circuits are designed to provide the memory array 7700 waveforms 7800 shown in FIG. 55.

Figure 57:
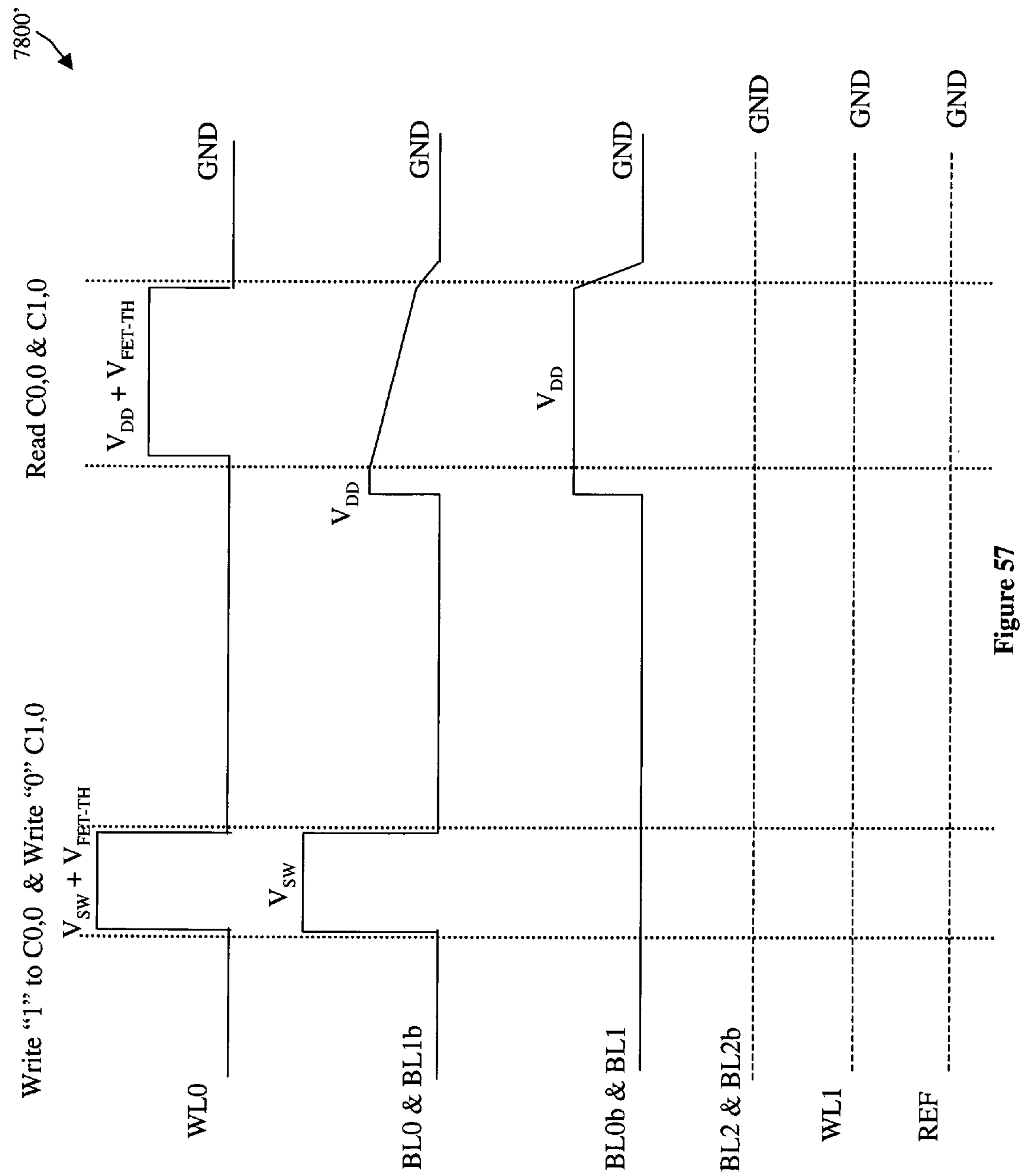
FIG. 57 illustrates the operational waveforms of a memory array according to one aspect of the invention.

NRAM memory system 7810 accepts timing inputs 7812, accepts address inputs 7825, and accepts data 7867 from a computer, or provides data 7867 to a computer using a bidirectional bus sharing input/output (I/O) terminals. Alternatively, inputs and outputs may use separate (unshared) terminals (not shown). Address input (I/P) buffer 7830 receives address locations (bits) from a computer system, for example, and latches the addresses. Address I/P buffer 7830 provides word address bits to word decoder 7840 via address bus 7837; address I/P buffer 7830 provides bit addresses to bit decoder 7850 via address bus 7852; and address bus transitions provided by bus 7835 are detected by function generating, address transition detecting (ATD), timing waveform generator, controller (controller) 7820. Controller 7820 provides timing waveforms on bus 7839 to word decoder 7840. Word decoder 7840 selects the word address location within array 7815. Word address decoder 7840 is used to decode word lines WL and drives word line (WL) using industry standard circuit configurations resulting in NRAM memory system 7810 on-chip WL waveforms for both write-one, write-zero, read-one, and read-zero operations as illustrated by waveforms 7800' shown in FIG. 57. FIG. 57 NRAM memory system 7810 waveforms 7800' correspond to memory array 7700 waveforms 7800 shown in FIG. 55.

Bit address decoder 7850 is used to decode bit lines BL. Controller 7820 provides timing waveforms on bus 7854 to bit decoder 7850. BL decoder 7850 uses inputs from bus 7854 and bus 7857 to generate data multiplexer select bits on bus 7859. The output of BL decoder 7850 on bus 7859 is used to select control data multiplexers using combined data multiplexers & sense amplifiers/latches (MUXs & SAs) 7860. Controller 7820 provides function and timing inputs on bus 7857 to MUXs & SAs 7860, resulting in NRAM memory system 7810 on-chip BL waveforms for both write-one, write-zero, read-one, and read-zero operations as illustrated by waveforms 7800' shown in FIG. 57 corresponding to memory array 7700 waveforms 7800 shown in FIG. 55. MUXs & SAs 7860 are used to write data provided by read/write buffer 7865 via bus 7864 in array 7815, and to read data from array 7815 and provide the data to read/write buffer 7865 via bus 7864 as illustrated in waveforms 7800'.

Figure 56B:
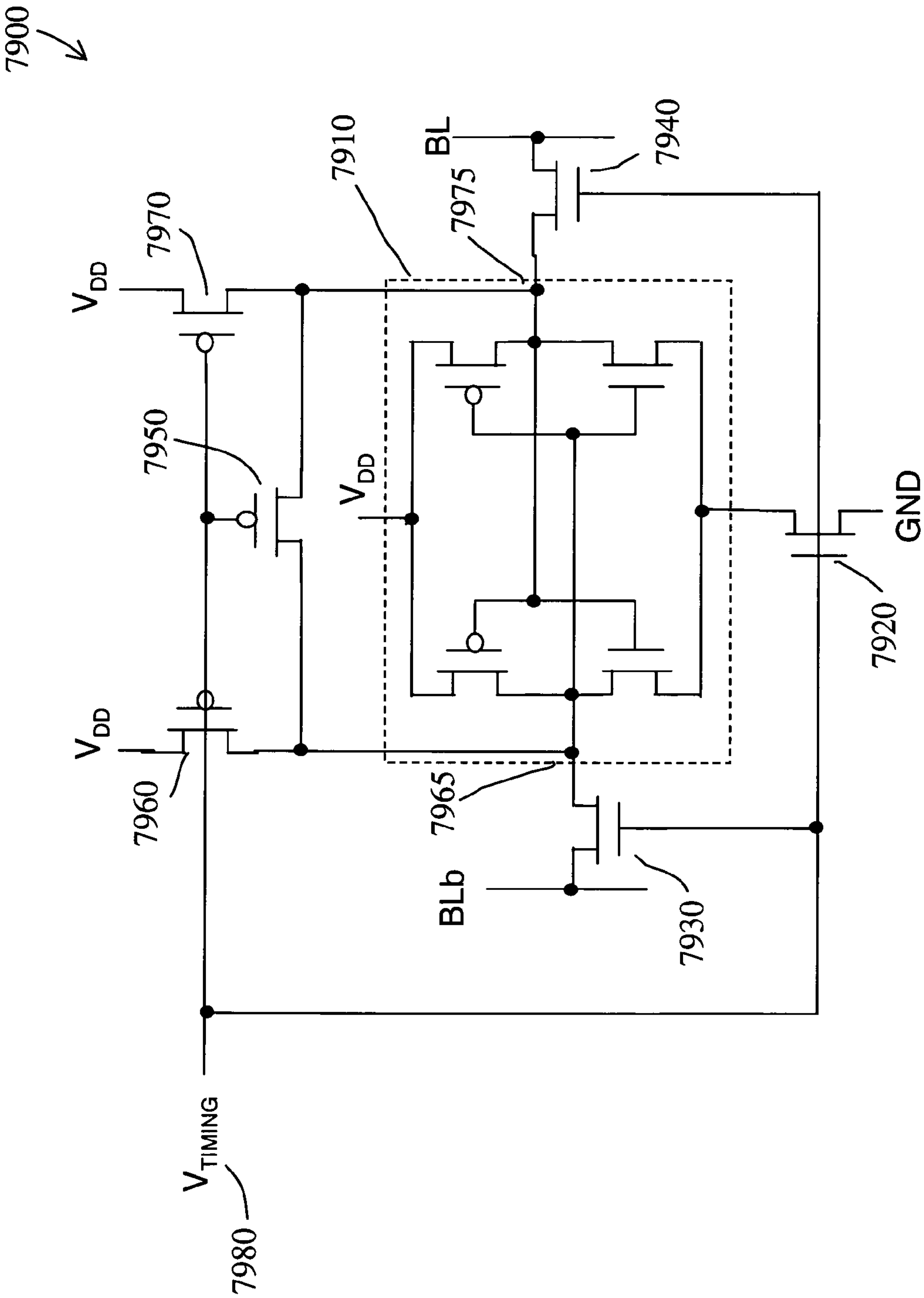
FIG. 56B is a schematic of a cell according to once aspect of the invention.

Sense amplifier/latch 7900 is illustrated in FIG. 56B. Flip flop 7910, comprising two back-to-back inverters is used to amplify and latch data inputs from array 7815 or from read/write buffer 7865. Transistor 7920 connects flip flop 7910 to ground when activated by a positive voltage supplied by control voltage $V_{TIMING}$ 7980, which is provided by controller 7820. Gating transistor 7930 connects a bit line BL to node 7965 of flip flop 7910 when activated by a positive voltage. Gating transistor 7940 connects a bit line BLb to flip flop node 7975 when activated by a positive voltage. Transistor 7960 connects voltage $V_{DD}$ to flip flop 7910 node 7965, transistor 7970 connects voltage $V_{DD}$ to flip flop 7910 node 7975, and transistor 7950 ensures that small voltage differences are eliminated when transistors 7960 and 7970 are activated. Transistors 7950, 7960, and 7970 are activated (turned on) when gate voltage is low (zero, for example).

In operation, $V_{TIMING}$ voltage is at zero volts when sense amplifier 7900 is not selected. NFET transistors 7920, 7930, and 7940 are in the "OFF" (non-conducting) state, because gate voltages are at zero volts. PFET transistors 7950, 7960, and 7970 are in the "ON" (conducting) state because gate voltages are at zero volts. $V_{DD}$ may be 5, 3.3, or 2.5 volts, for example, relative to ground. Flip flop 7910 nodes 7965 and 7975 are at $V_{DD}$. If sense amplifier/latch 7900 is selected, $V_{TIMING}$ transitions to $V_{DD}$, NFET transistors 7920, 7930, and 7940 turn "ON", PFET transistors 7950, 7960, and 7970 are turned "OFF", and flip flop 7910 is connected to bit line BL and to bit line BLb. As illustrated by waveforms BL0, BL0$b$, BL1, and BL1$b$ of waveforms 7800', bit line BL and BLb are pre-charged prior to activating a corresponding word line (WL0 in this example). If cell 7000 of memory array 7700 (memory system array 7815) stores a "1", then bit line BL and BLb in FIG. 56B correspond to BL0 and BLb, respectively, in FIG. 54. BL is discharged by cell 7000, voltage droops below $V_{DD}$, BLb is not discharged, and sense amplifier/latch 7900 detects a "1" state. If cell 7000 of memory array 7700 (memory system array 7815) stores a "0", then bit line BL and BLb in FIG. 20B corresponds to BL1 and BL1$b$, respectively, in FIG. 54. BLb is discharged by cell 7000, voltage droops below $V_{DD}$, BL is not discharged, and sense amplifier/latch 7900 detect a "0" state. The time from sense amplifier select to signal detection by sense amplifier/latch 7900 is referred to as signal development time. Sense amplifier/latch 7900 typically requires 75 to 100 mV difference voltage in order to switch. It should be noted that cell 7000 requires a nanotube "OFF" resistance to "ON" resistance ratio of greater than 10 to 1 for successful operation. A typical bit line BL has a capacitance value of 250 fF, for example. A typical nanotube storage device (switch) or dimensions 0.2 by 0.2 um typically has 8 nanotube filaments across the suspended region, for example, as illustrated further below. For a combined contact and switch resistance of 50,000 ohms per filament, as illustrated further below, the nanotube "ON" resistance of cell 7000 is 6,250 ohms. For a bit line of 250 fF, the time constant RC=1.6 ns. The sense amplifier signal development time is less than RC, and for this example, is between 1 and 1.5 nanoseconds.

Non-volatile NRAM memory system 7810 operation may be designed for high speed cache operation at 5 ns or less access and cycle time, for example. Non-volatile NRAM memory system 7810 may be designed for low power operation at 60 or 70 ns access and cycle time operation, for example. For low power operation, address I/P buffer 7830 operation requires 8 ns; controller 7820 operation requires 16 ns; bit decoder 7850 plus MUXs & SA 7860 operation requires 12 ns (word decoder 7840 operation requires less than 12 ns); array 7815 delay is 8 ns; sensing 7900 operation requires 8 ns; and read/write buffer 7865 requires 12 ns, for example. The access time and cycle time of non-volatile NRAM memory system 7810 is 64 ns. The access time and cycle time may be equal because the NDRO mode of operation of nanotube storage devices (switches) does not require a write-back operation after access (read).

Method of Making Two FED Device NT-on-Source Memory System and Circuits

Two FED4 80 (FIG. 2D) controllable source devices are interconnected to form a non-volatile two transistor, two nanotube (2T/2NT) NRAM memory cell that is also referred to as a two device NT-on-source memory cell. The 2T/2NT NT-on-source NRAM memory array is fabricated using the same method steps used to fabricate 1T/1NT NT-on-source memory structure 3225 shown in FIG. 30M'.

Figure 58A:
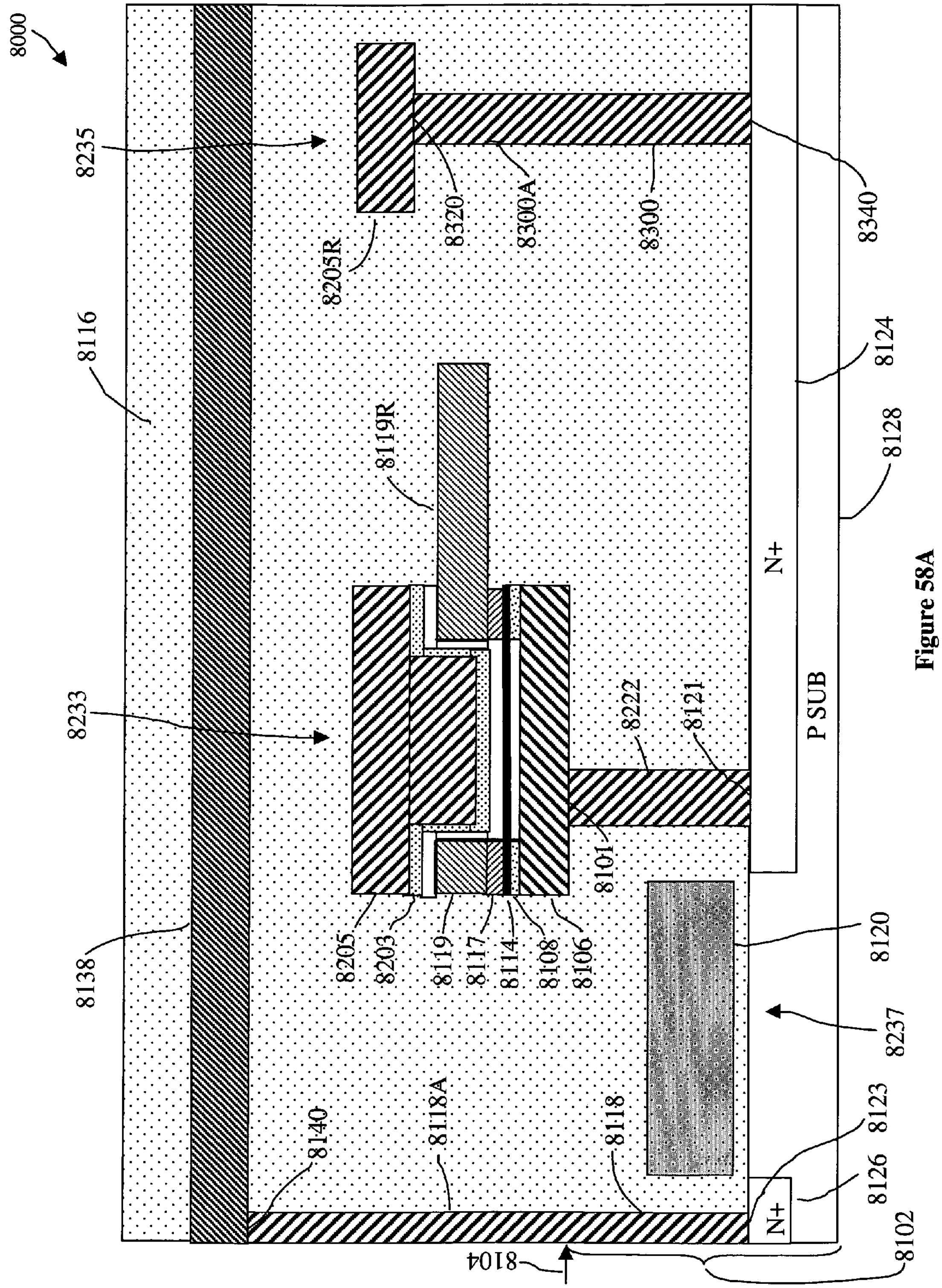
FIGS. 58A–C illustrate cross sections of exemplary structures according to aspects of the invention.

FIG. 22 describes the basic method 3000 of manufacturing preferred embodiments of the invention. In general, preferred methods first form 3002, a base structure including field effect devices similar to a MOSFET, having drain, source, gate nodes, and conductive studs on source and drain diffusions for connecting to additional layers above the MOSFET device that are used to connect to the nanotube switch fabricated above the MOSFET device layer, bit lines, and other structures. Base structure 8102 with surface 8104 illustrated in FIG. 58A is similar to base structure 3102' with surface 3104' shown in FIG. 30M' with transistors, except source diffusions have been elongated to accommodate connection to a NT-on-source nanotube switch structure 8233 and a cell interconnect structure 8235. The cell interconnect structure 8235 contacts source diffusion region 8124 and is formed in the same way as drain contact structure 8118 and 8118A, and is used for internal (local) cell wiring as is explained further below.

Figure 58B:
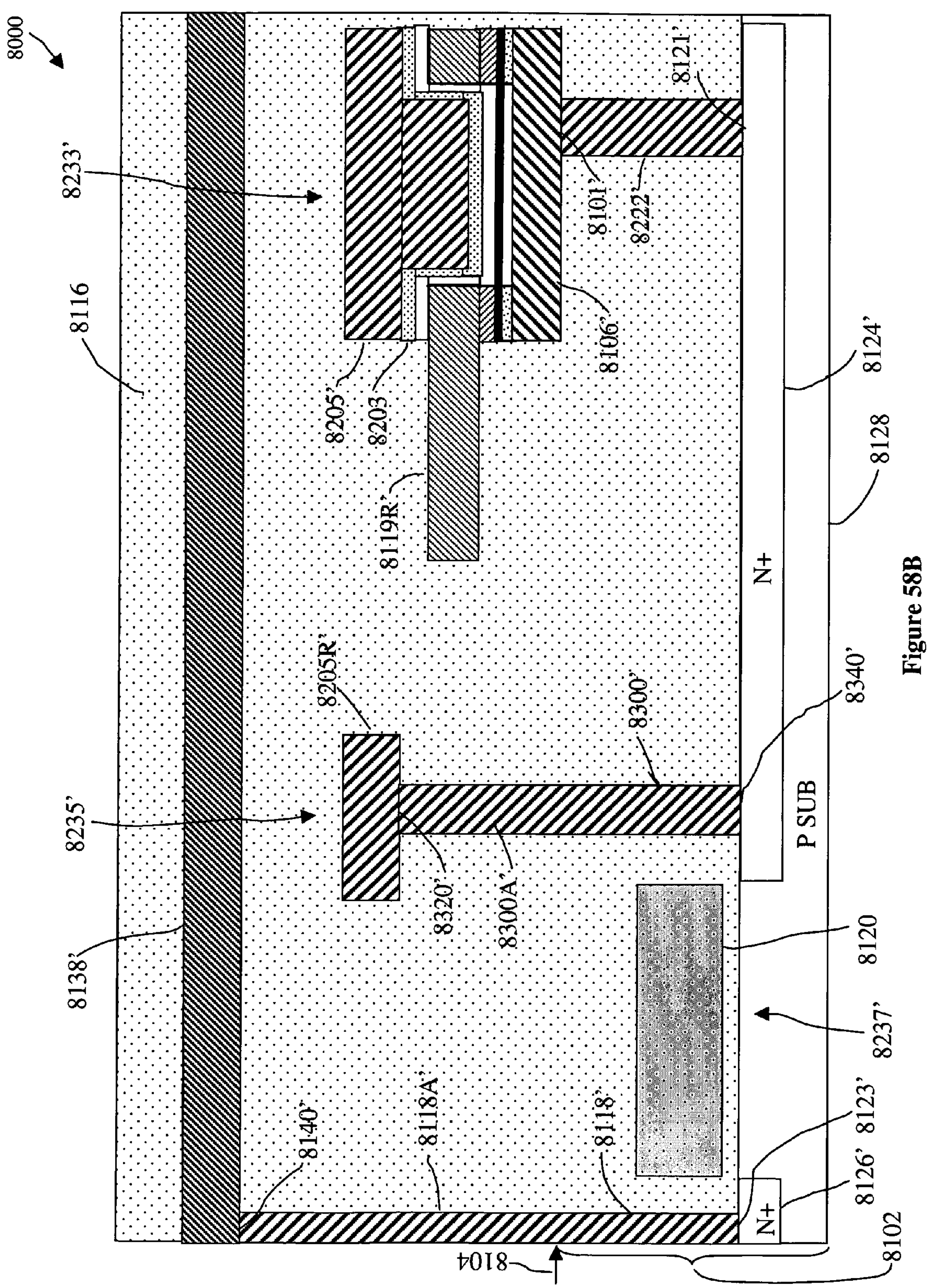

Once base structure 8102 is defined, then methods of fabricating 2T/2NT NT-on-source memory arrays is the same as methods of fabricating 1T/1NT NT-on-source memory arrays already described. Preferred methods 3004 shown in FIGS. 23, 23', and 23" and associated figures; methods 3036 shown in FIG. 26 and associated figures; methods 3006 shown in FIGS. 27 and 27' and associated figures; and methods 3008 shown in FIGS. 28 and 28' and associated figures. Conductors, semiconductors, insulators, and nanotubes are formed in the same sequence and are in the same relative position in the structure. Length, width, thickness dimensions may be different and the choice of conductor material may be different reflecting differences in design choices. Also, interconnections may be different because of cell differences. The function of electrodes are the same, however, interconnections may be different. FIGS. 58A and 58B cross sections illustrated further below correspond to FIG. 30M' of 1T/1NT NT-on-source cross section.

Figure 58C:
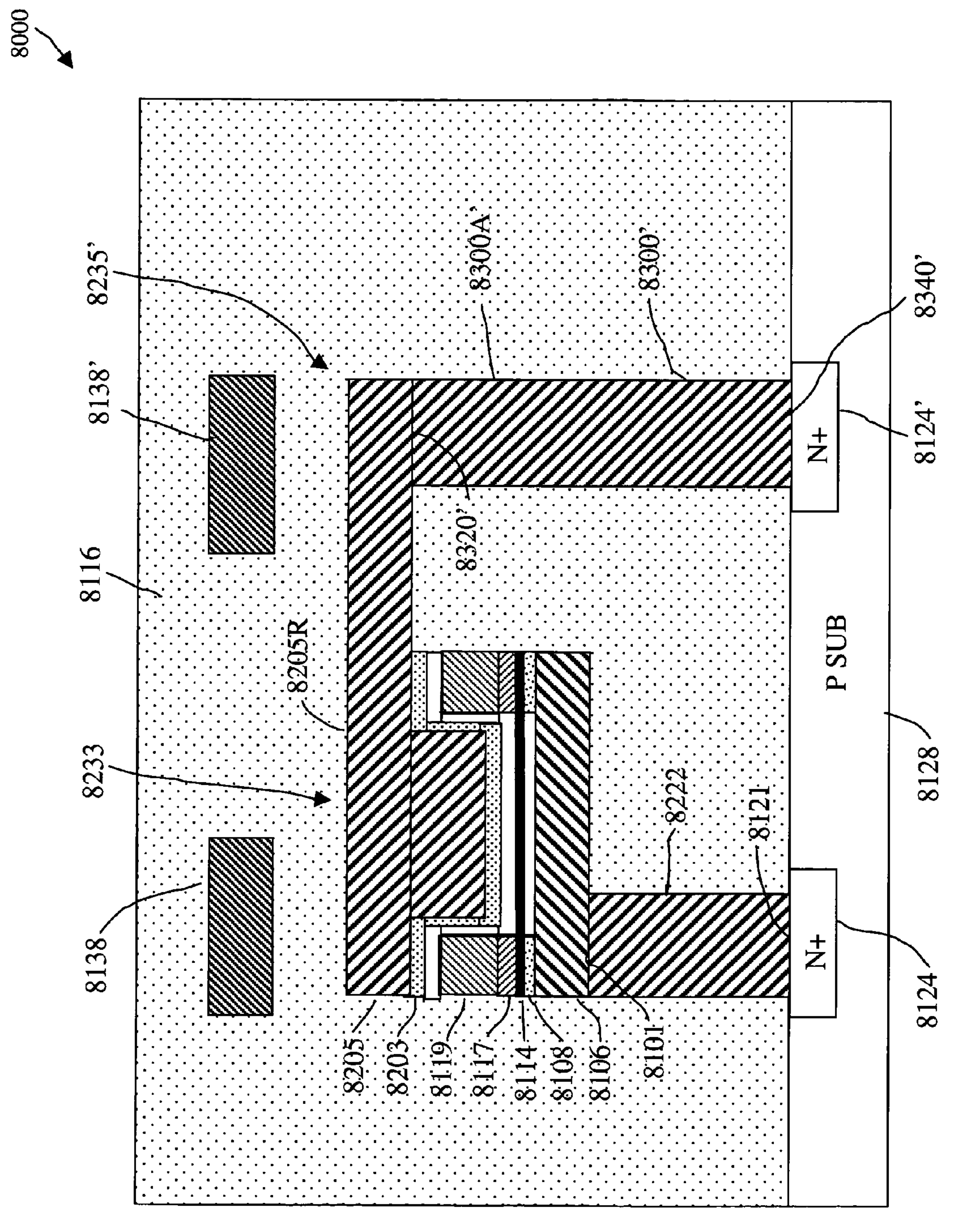
Figure 58D:
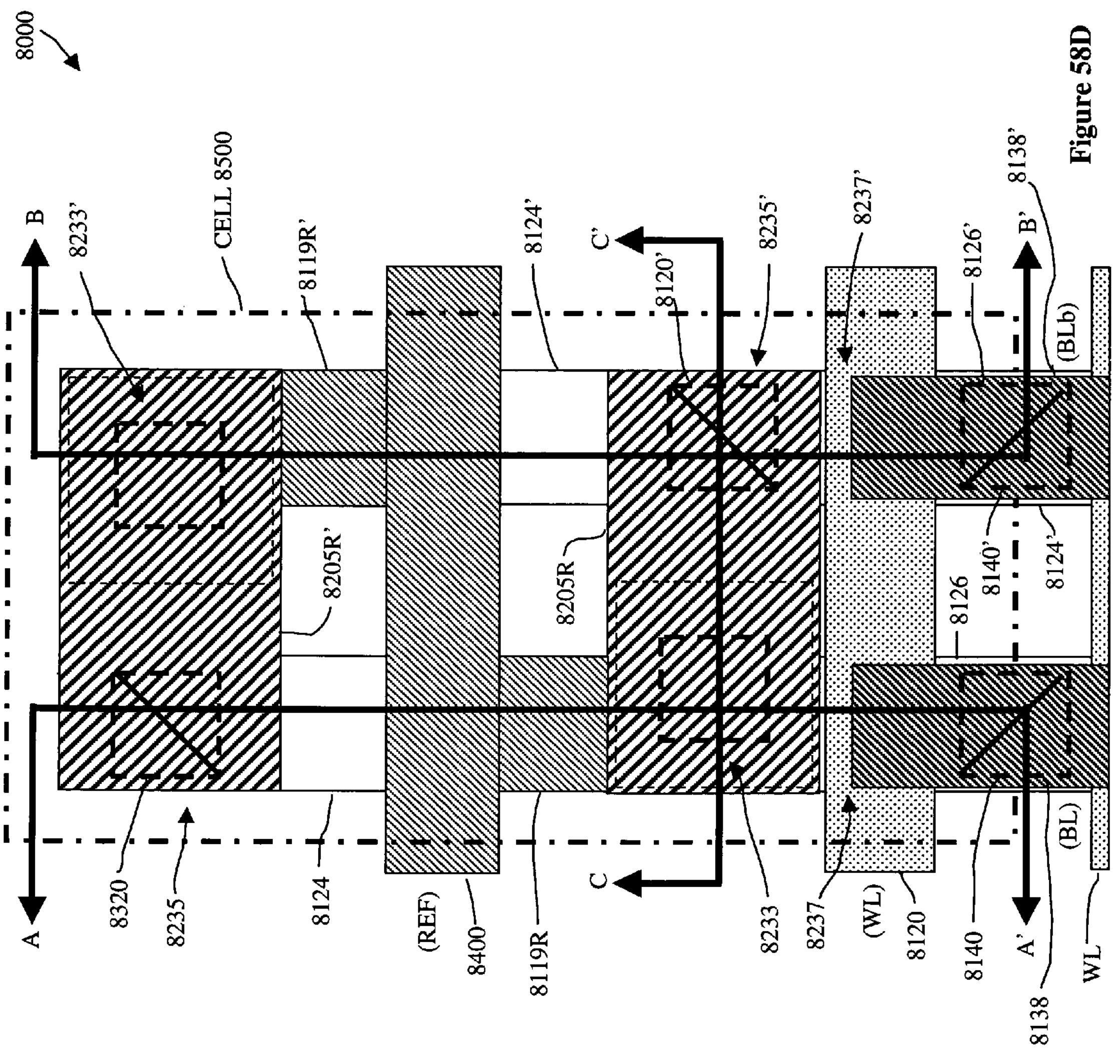
FIG. 58D illustrates a plan view of an exemplary structure according to one aspect of the invention.

FIG. 58A illustrates cross section A–A' of array 8000 taken at A–A' of the plan view of array 8000 illustrated in FIG. 58D, and shows FET device region 8237 in the FET length direction, elongated source 8124 to accommodate nanotube switch structure 8233 and cell interconnect region 8235. Bit line 8138 contacts drain 8126 through contact 8140, conducting studs 8118A and 8118, and contact 8123. When FET device region 8237 FET channel is formed in substrate 8128 below FET gate 8120, bit line 8138 is electrically connected to elongated source diffusion 8124, which connects to switch-plate 8106 through contact 8121, conducting stud 8222, and contact 8101, and to release-plate extension 8205R through contact 8340, conducting studs 8300 and 8300A, and contact 8320, as illustrated in 54A. Nanotube switch structure 8233 corresponds to nanotube switch structure 3133 in FIG. 30M' with switch-plate 8106, dielectric layer 8108 between nanotube 8114 layer and switch plate 8106, combined conductors 8119 and 8117 forming a picture frame region contacting nanotube 8114 layer, insulator 8203 insulates the underside of release-plate 8205. Nanotube reference (picture-frame) region extension 8119R contacts and is a part of reference array line 8400 shown in FIG. 58D. Structures are embedded in dielectric layer 8116, $SiO_2$ for example, except for gap regions above and below nanotube layers in the nanotube switching region. FIG. 58B illustrates cross section B–B' of array 8000 taken at B–B' of the plan view of array 8000 illustrated in FIG. 58D, and shows FET device region 8237' in the FET length direction, elongated source 8124' to accommodate nanotube switch structure 8233' and cell interconnect region 8235'. Bit line 8138' contacts drain 8126' through contact 8140', conductive studs 8118A' and 8118', and contact 8123'. When FET device region 8237' FET channel is formed in substrate 8128 below FET gate 8120, bit line 8138' is electrically connected to elongated source diffusion 8124', which connect to switch-plate 8106' through contact 8121', conducting stud 8222', and contact 8101', and to release-plate extension 8205R' through contact 8340', conductive studs 8300' and 8300A', and contact 8320', as illustrated in FIG. 58B. Nanotube switch structure 8233' corresponds to nanotube switch structure 8233 and structure 3133 in FIG. 30M'. Nanotube reference (picture-frame) region extension 8119R' contacts and is a part of reference array line 8400 shown in FIG. 58D. FIG. 58C illustrates cross section C–C' of array 8000 taken at C–C' of plan view of array 8000 illustrated in FIG. 58D, and shows nanotube switch structure 8233 with switch-plate 8106 connected to source diffusion 8124 as further described with respect to FIG. 58A. Release-plate 8205 extension 8205R connects release-plate 8205 to source diffusion 8124' through contact 8320', conducting studs 8300A' and 8300', and contact 8340', all within cell 8500 boundaries. Thus, source 8124 diffusion is electrically connected to switch-plate 8106 of nanotube switch structure 8233, and source 8124' diffusion is electrically connected to release-plate 8205 of nanotube switch structure 8233 as illustrated in FIG. 58C, and FIG. 58D. A corresponding interconnection means is used to electrically connect source 8124' to switch-plate 8106' of nanotube switch structure 8233', and also to electrically connect source 8124 to release plate 8205' of nanotube switch structure 8233' as illustrated in FIG. 58D. FIG. 58D illustrates a plan view of non-volatile 2T/2NT NT-on-source array 8000 including two interconnected NT-on-source FED4 80 structures having two transistor regions 8237 and 8237' and two nanotube switch structures 8233 and 8233'; two cell interconnect regions

8235 and 8235' including release-plate interconnect extensions 8205R and 8205R', and nanotube reference (picture-frame) region extensions 8119R and 8119R' contacting array reference line REF 8400; array word line 8120A forms gates 8120 and 8120' of the FET select devices; bit line BL 8138 contacting drain 8126 through contact 8140 and underlying stud and contact shown in FIG. 58A; bit line BLb 8138' contacting drain 8126' through contact 8140' and underlying stud and contact shown in FIGS. 58B; in terms of minimum technology feature size, 2T/2NT NT-on-source cell 8500 area is approximately 45 $F^2$. If sub-minimum technology features are used in the NT switch structure (not shown), the minimum cell 8500 area in terms of minimum technology feature size is 30 $F^2$. Nanotube-on-source array 8000 structures illustrated in FIGS. 58A, 58B, 58C, and 58D correspond to 2T/2NT nanotube-on-source array 7700 schematic representations illustrated in FIG. 54. Bit line 3138 structures correspond to any of bit lines BL0 to BL2 schematic representations; bit line 8138' structures correspond to any of bit lines BL0*b* to BLb2 schematic representations; common reference line 8400 structures correspond to common reference lines REF schematic representations; word line 3120A structures correspond to any of word lines WL0 and WL1 schematic representations; nanotube switch structures 3233 and 3233' correspond to any of NT0,0 to NT2,1 and NT'0,0 to NT'2,1 schematic representations, respectively; FET 3237 and 3237' structures correspond to any of FETs T0,0 to T2,1 and T'0,0 to T'2,1 schematic representations, respectively; and exemplary cell 8500 corresponds to any of cells C0,0 to cell C2,1 schematic representations.

Methods to increase the adhesion energies through the use of ionic, covalent or other forces may be used to alter the interactions with the electrode surfaces. These methods can be used to extend the range of stability within these junctions.

Nanotubes can be functionalized with planar conjugated hydrocarbons such as pyrenes which may then aid in enhancing the internal adhesion between nanotubes within the ribbons. The surface of the substrate used can be derivatized/functionalized to create a more hydrophobic or hydrophilic environment to promote better adhesion of nanotubes. The nature of the substrate allows control over the level of dispersion of the nanotubes to generate monolayer nanotube fabric.

Preferred nanofabrics have a plurality of nanotubes in contact so as to form a non-woven fabric. Gaps in the fabric, i.e., between nanotubes either laterally or vertically, may exist. The fabric preferably has a sufficient amount of nanotubes in contact so that at least one electrically conductive, semi-conductive or mixed conductive and semi-conductive pathway exists from a given point within a ribbon or article to another point within the ribbon or article (even after patterning of the nanofabric).

Though certain embodiments prefer single-walled nanotubes in the nanofabrics, multi-walled nanotubes may also be used. In addition, certain embodiments prefer nanofabrics that are primarily a monolayer with sporadic bilayers and trilayers, but other embodiments benefit from thicker fabrics with multiple layers.

It will be further appreciated that the scope of the present invention is not limited to the above-described embodiments but rather is defined by the appended claims, and that these claims will encompass modifications and improvements to what has been described.

What is claimed is:

1. A method of making a non-volatile field effect device, comprising the acts of:

providing a substrate with a semiconductor field effect device formed therein, said semiconductor field effect device including a source, drain and gate with a field-modulatable channel between the source and drain, wherein the field-modulatable channel is a semiconductive region on the substrate between the source and drain and which changes its conductive properties in response to an electric field from the gate;

forming an electromechanically-deflectable, nanotube switching element over the semiconductor field effect device, wherein said nanotube switching element is constructed to non-volatilely store its state;

providing terminals and corresponding interconnect to correspond to each of the source, drain and gate of the semiconductor field effect device such that the nanotube switching element is electrically positioned between one of the source, drain and gate and its corresponding terminal, and such that the others of said source, drain and gate are directly connected to their corresponding terminals.

2. The method of claim 1, wherein forming an electromechanically-deflectable, nanotube switching element includes forming an article from nanotube fabric.

3. The method of claim 2 wherein the nanotube fabric is a porous nanotube fabric.

4. The method of claim 2 wherein forming an electromechanically-deflectable, nanotube switching element includes forming a fourth terminal to control operation of said nanotube switching element.

5. The method of claim 4 wherein said fourth terminal is covered with a dielectric material on a surface facing the article of nanotube fabric.

6. The method of claim 2 wherein the nanotubes are single-walled carbon nanotubes.

7. The method of claim 2 wherein the fabric is substantially a monolayer of nanotubes.

8. The method of claim 1 wherein forming an electromechanically-deflectable, nanotube switching element includes forming an article of nanofabric that is positioned between the fourth terminal and the one of the source, drain and gate.

9. The method of claim 1 wherein forming an electromechanically-deflectable, nanotube switching element includes forming an article of nanofabric that is suspended between the fourth terminal and the one of the source, drain and gate.

10. The method of claim 1 wherein forming an electromechanically-deflectable, nanotube switching element includes forming an article of nanofabric that is positioned between the fourth terminal and the one of the source, drain and gate, and wherein there is a gap between the article and the fourth terminal.

11. The method of claim 1 wherein forming an electromechanically-deflectable, nanotube switching element includes forming an article of nanofabric that is positioned between the fourth terminal and the one of the source, drain and gate, and wherein there is a gap between the one of the source, drain and gate.

12. The method of claim 1 wherein forming an electromechanically-deflectable, nanotube switching element includes forming an article of nanofabric that is horizontally suspended relative to a horizontal substrate surface and wherein the article is electrically positioned between the fourth terminal and the one of the source, drain and gate.

13. The method of claim 12 wherein the article is formed to have a suspended length that is sub-lithographic.

14. The method of claim 1 wherein forming an electromechanically-deflectable, nanotube switching element includes forming an sacrificial layer and then forming a porous fabric of nanotubes thereover, said fabric subsequently being lithographically patterned and subsequent to that said sacrificial material being removed to suspend the article with a gap existing where the sacrificial material previously existed.

15. The method of claim 14 further including forming a second sacrificial layer on a side of the patterned article opposite the side of the sacrificial layer, wherein both the sacrificial layer and the second sacrificial layer are removed to form gaps on either side of the article.

16. The method of claim 14 wherein the sacrificial material is anisotropically etchable.

17. The method of claim 16 wherein the sacrificial material is poly.

18. A method of making a non-volatile field effect device, comprising the acts of:

providing a substrate with a semiconductor field effect device formed therein, said semiconductor field effect device including a source, drain and gate with a field-modulatable channel between the source and drain, wherein the field-modulatable channel is a semiconductive region on the substrate between the source and drain and which changes its conductive properties in response to an electric field from the gate;

providing terminals and corresponding interconnect to correspond to each of the source, drain and gate of the semiconductor field effect device;

connecting the drain and gate directly to their corresponding terminals;

forming an electromechanically-deflectable, nanotube switching element over the semiconductor field effect device, wherein said nanotube switching element is constructed to non-volatilely store its state; and connecting the nanotube switching element such that it is electrically positioned in series between the source and the terminal corresponding to the source.

19. The method of claim 18 wherein forming an electromechanically-deflectable, nanotube switching element includes forming an article of nanofabric that is positioned between a control terminal and the source, such that the article is deflectable into contact with one of the control terminal and the source.

20. A method of making a non-volatile field effect device, comprising the acts of:

providing a substrate with a semiconductor field effect device formed therein, said semiconductor field effect device including a source, drain and gate with a field-modulatable channel between the source and drain, wherein the field-modulatable channel is a semiconductive region on the substrate between the source and drain and which changes its conductive properties in response to an electric field from the gate;

providing terminals and corresponding interconnect to correspond to each of the source, drain and gate of the semiconductor field effect device;

connecting the source and gate directly to their corresponding terminals;

forming an electromechanically-deflectable, nanotube switching element over the semiconductor field effect device, wherein said nanotube switching element is constructed to non-volatilely store its state; and connecting the nanotube switching element such that it is electrically positioned in series between the drain and the terminal corresponding to the drain.

21. The method of claim 20 wherein forming an electromechanically-deflectable, nanotube switching element includes forming an article of nanofabric that is positioned between a control terminal and the drain, such that the article is deflectable into contact with one of the control terminal and the drain.

22. A method of making a non-volatile field effect device, comprising the acts of:

providing a substrate with a semiconductor field effect device formed therein, said semiconductor field effect device including a source, drain and gate with a field-modulatable channel between the source and drain, wherein the field-modulatable channel is a semiconductive region on the substrate between the source and drain and which changes its conductive properties in response to an electric field from the gate;

providing terminals and corresponding interconnect to correspond to each of the source, drain and gate of the semiconductor field effect device;

connecting the source and drain directly to their corresponding terminals;

forming an electromechanically-deflectable, nanotube switching element over the semiconductor field effect device, wherein said nanotube switching element is constructed to non-volatilely store its state; and connecting the nanotube switching element such that it is electrically positioned in series between the gate and the terminal corresponding to the gate.

23. The method of claim 22 wherein forming an electromechanically-deflectable, nanotube switching element includes forming an article of nanofabric that is positioned between a control terminal and the gate, such that the article is deflectable into contact with one of the control terminal and the gate.

* * * * *

UNITED STATES PATENT AND TRADEMARK OFFICE

CERTIFICATE OF CORRECTION

PATENT NO. : 7,112,493 B2 Page 1 of 1
APPLICATION NO. : 10/864751
DATED : September 26, 2006
INVENTOR(S) : Bertin et al.

It is certified that error appears in the above-identified patent and that said Letters Patent is hereby corrected as shown below:

Column 1, line 25, after “Serial No.”, delete “10/811,356”, and insert --10/811,373 --.

Signed and Sealed this

Fifth Day of December, 2006

JON W. DUDAS
*Director of the United States Patent and Trademark Office*